(12) United States Patent
Song et al.

(10) Patent No.: US 9,780,914 B2
(45) Date of Patent: *Oct. 3, 2017

(54) TRANSMITTING SYSTEM AND METHOD OF PROCESSING DIGITAL BROADCAST SIGNAL IN TRANSMITTING SYSTEM, RECEIVING SYSTEM AND METHOD OF RECEIVING DIGITAL BROADCAST SIGNAL IN RECEIVING SYSTEM

(71) Applicant: LG ELECTRONICS INC., Seoul (KR)

(72) Inventors: Jae Hyung Song, Seoul (KR); Byoung Gill Kim, Seoul (KR); Jin Woo Kim, Seoul (KR); Won Gyu Song, Seoul (KR); Hyoung Gon Lee, Seoul (KR); In Hwan Choi, Seoul (KR); Chul Kyu Mun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 127 days.

This patent is subject to a terminal disclaimer.

(21) Appl. No.: 14/723,150

(22) Filed: May 27, 2015

(65) Prior Publication Data

US 2015/0270929 A1    Sep. 24, 2015

Related U.S. Application Data

(63) Continuation of application No. 13/936,813, filed on Jul. 8, 2013, now Pat. No. 9,077,379, which is a
(Continued)

(51) Int. Cl.
*G06F 11/00* (2006.01)
*H04L 1/00* (2006.01)
*H03M 13/15* (2006.01)
*H03M 13/27* (2006.01)
(Continued)

(52) U.S. Cl.
CPC .......... *H04L 1/0042* (2013.01); *H03M 13/05* (2013.01); *H03M 13/13* (2013.01); *H03M 13/1515* (2013.01); *H03M 13/2703* (2013.01); *H03M 13/2966* (2013.01); *H03M 13/2972* (2013.01); *H03M 13/373* (2013.01); *H03M 13/3715* (2013.01); *H03M 13/6538* (2013.01); *H04L 1/004* (2013.01); *H04L 1/0047* (2013.01);
(Continued)

(58) Field of Classification Search
CPC .......... H03M 13/6538; H03M 13/2972; H04L 1/004; H04L 1/0042; H04L 1/0057; H04L 1/0059; H04L 1/065
See application file for complete search history.

(56) References Cited

U.S. PATENT DOCUMENTS 5,872,798 A    2/1999    Baggen et al.
7,934,244 B2   4/2011    Kim et al.
(Continued)

*Primary Examiner* — Michael Maskulinski
(74) *Attorney, Agent, or Firm* — Lee, Hong, Degerman, Kang & Waimey

(57) ABSTRACT

Methods and apparatus for transmitting and receiving broadcast signals are provided. The method for transmitting a broadcast signal includes encoding mobile data for forward error correction (FEC), encoding signaling data, forming data groups including the encoded mobile data and the encoded signaling data and transmitting a signal frame that includes the data groups.

7 Claims, 86 Drawing Sheets

Related U.S. Application Data continuation of application No. 12/907,649, filed on Oct. 19, 2010, now Pat. No. 8,489,961.

(60) Provisional application No. 61/253,042, filed on Oct. 19, 2009.

(51) Int. Cl.
    *H03M 13/29*     (2006.01)
    *H03M 13/37*     (2006.01)
    *H03M 13/00*     (2006.01)
    *H03M 13/13*     (2006.01)
    *H03M 13/05*     (2006.01)

(52) U.S. Cl.
    CPC .......... *H04L 1/0057* (2013.01); *H04L 1/0059* (2013.01); *H04L 1/0065* (2013.01); *H04L 1/0071* (2013.01); *H04L 2001/0093* (2013.01)

(56) References Cited

U.S. PATENT DOCUMENTS

| | | |
|---|---|---|
| 8,391,314 B2 | 3/2013 | Song et al. |
| 8,406,338 B2 | 3/2013 | Limberg |
| 8,418,022 B2 | 4/2013 | Limberg |
| 8,804,805 B2 | 8/2014 | Jeong et al. |
| 2010/0149427 A1* | 6/2010 | Limberg ............ H04N 21/4382 348/724 |
| 2010/0238916 A1 | 9/2010 | Zurek-Terhardt et al. |
| 2010/0254449 A1 | 10/2010 | Rusch-Ihwe |
| 2010/0296001 A1 | 11/2010 | Kwon et al. |
| 2010/0296506 A1 | 11/2010 | Ryu et al. |
| 2012/0069892 A1 | 3/2012 | Kim et al. |
| 2012/0192241 A1 | 7/2012 | Cho et al. |
| 2014/0032995 A1 | 1/2014 | Song et al. |

* cited by examiner

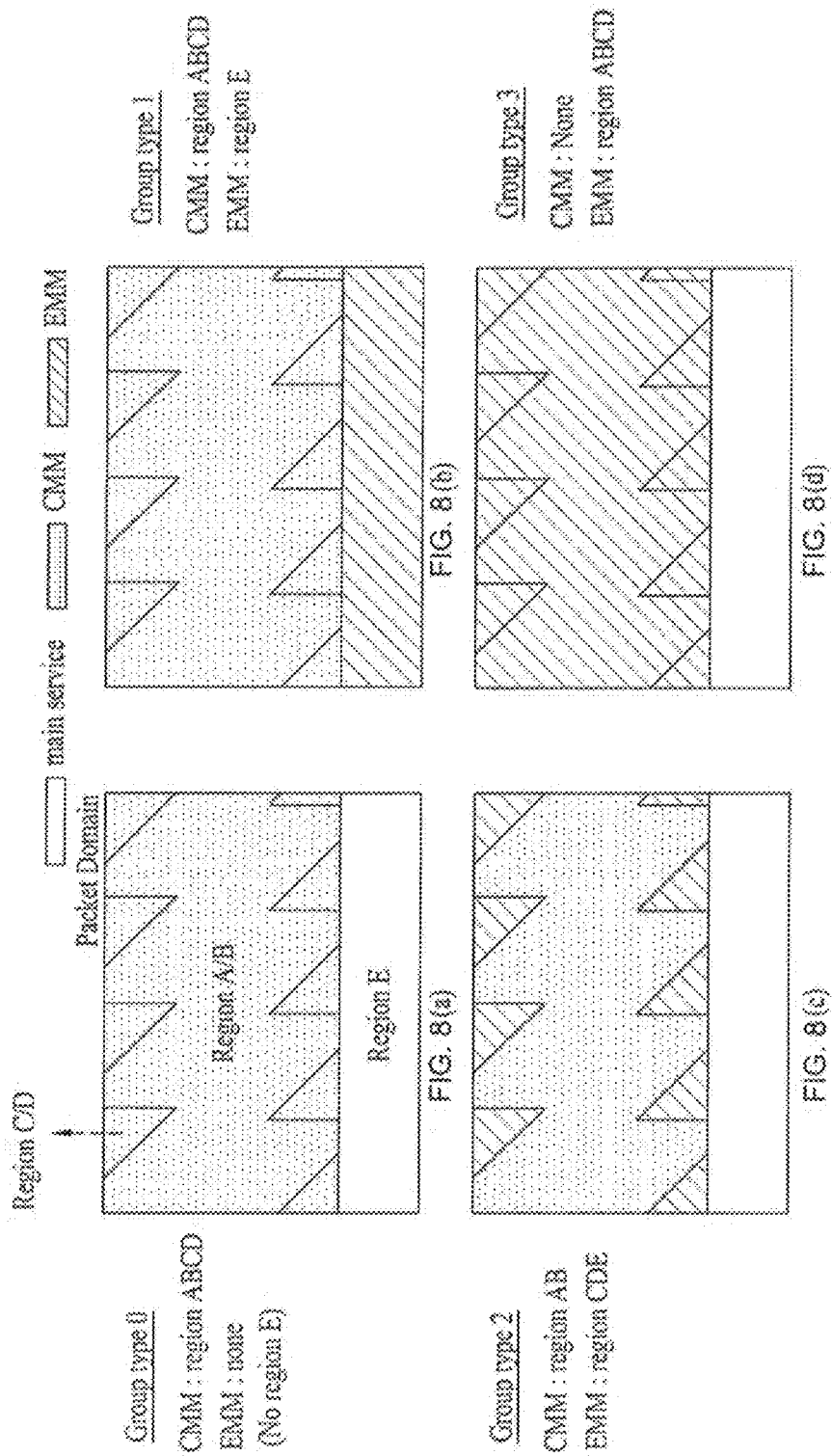

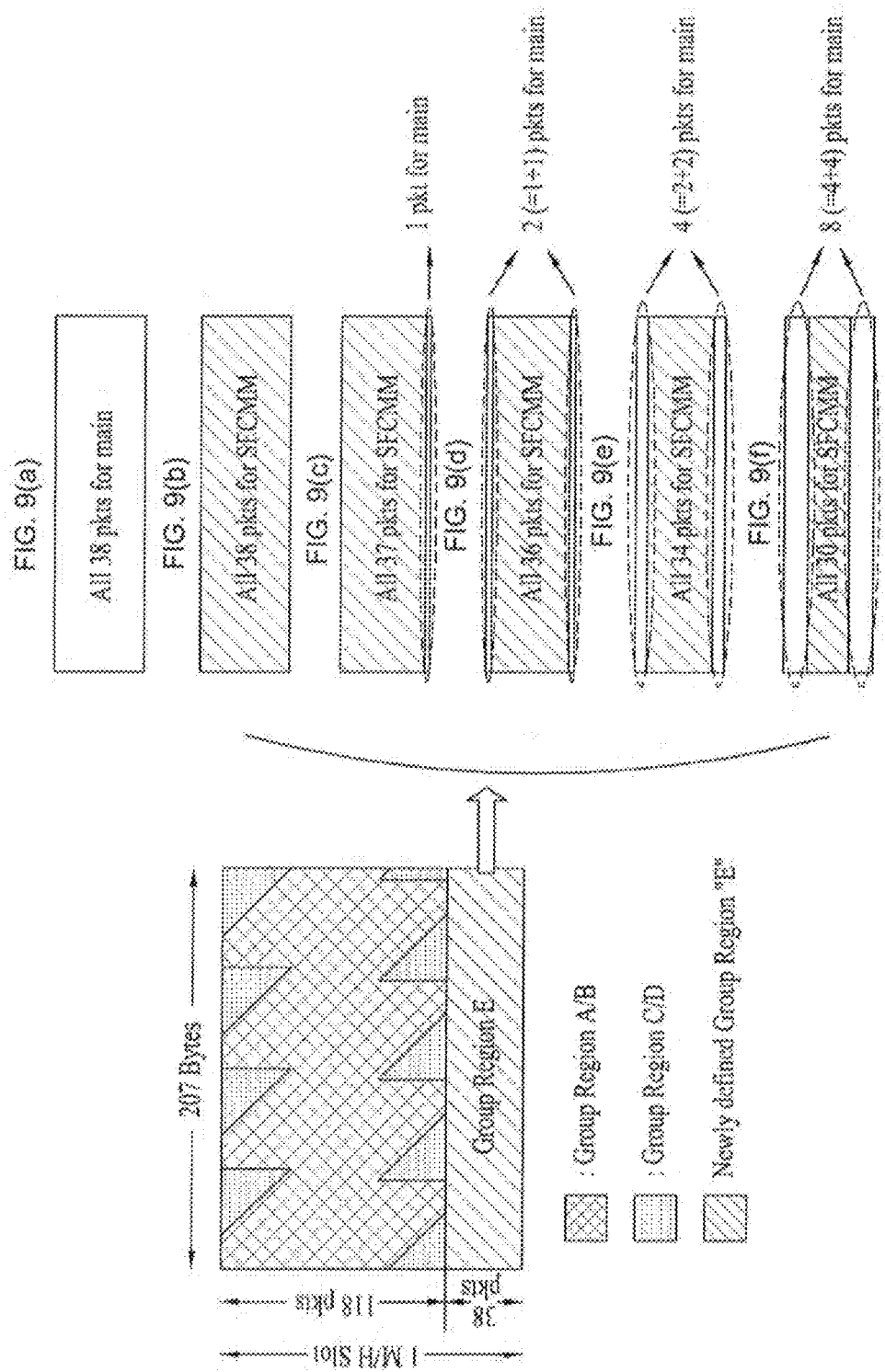

FIG. 10

| Group Type | Group Division | | Group Format | # pkt./Slot | | Description |
|---|---|---|---|---|---|---|
| | Primary ABCD/AB | Secondary -/CD | | M/H | Main | |
| 0 | ABCD/AB | -/CD | G0 | 118 | 38 | CMM (no Region E) |
| 1-0 | ABCD | E | G1-0 | 156 | 0 | Region ABCD: CMM<br>Region E: EMM |
| 1-1 | ABCD | E | G1-1 | 155 | 1 | |
| 1-2 | ABCD | E | G1-2 | 154 | 2 | |
| 1-4 | ABCD | E | G1-4 | 152 | 4 | |
| 1-8 | ABCD | E | G1-8 | 148 | 8 | |
| 2-0 | AB | CDE | G2-0 | 156 | 0 | Region AB: CMM<br>Region CDE: EMM |
| 2-1 | AB | CDE | G2-1 | 155 | 1 | |
| 2-2 | AB | CDE | G2-2 | 154 | 2 | |
| 2-4 | AB | CDE | G2-4 | 152 | 4 | |
| 2-8 | AB | CDE | G2-8 | 148 | 8 | |
| 3-0 | ABCD | - | G2-0 | 156 | 0 | All Region: EMM |
| 3-1 | ABCD | - | G2-1 | 155 | 1 | |
| 3-2 | ABCD | - | G2-2 | 154 | 2 | |
| 3-4 | ABCD | - | G2-4 | 152 | 4 | |
| 3-8 | ABCD | - | G2-8 | 148 | 8 | |
| 4 | ABCD | - | G3 | 156 | 0 | Increased Bandwidth Mode (Special Use Case)<br>No MPEG2 Headers, no VSB RS parities<br>Output packet of Pre-processor has 207 bytes not 188 bytes |

Black: A/153-compatible (CMM)
Bold: A/153-non-compatible (EMM)

Note: A Parade consists of Group Divisions from Groups having an identical Group Type

FIG. 41

| Syntax | No.of Bits | Format |
|---|---|---|
| TPC_data { | | |
|   sub-frame_number | 3 | uimsbf |
|   slot_number | 4 | uimsbf |
|   parade_id | 7 | uimsbf |
|   if(sub-frame_number≤1) { | | |
|     current_starting_group_number | 4 | uimsbf |
|     current_number_of_groups_minus_1 | 3 | uimsbf |
|   } | | |
|   if(sub-frame_number≥2) { | | |
|     next_starting_group_number | 4 | uimsbf |
|     next_number_of_groups_minus_1 | 3 | uimsbf |
|   } | | |
|   parade_repetition_cycle_minus_1 | 3 | uimsbf |
|   if(sub-frame_number≤1) { | | |
|     current_rs_frame_mode | 2 | bslbf |
|     current_rs_code_mode_primary | 2 | bslbf |
|     current_rs_code_mode_secondary | 2 | bslbf |
|     current_sccc_block_mode | 2 | bslbf |
|     current_sccc_outer_code_mode_a | 2 | bslbf |
|     current_sccc_outer_code_mode_b | 2 | bslbf |
|     current_sccc_outer_code_mode_c | 2 | bslbf |
|     current_sccc_outer_code_mode_d | 2 | bslbf |
|   } | | |
|   if(sub-frame_number≥2) { | | |
|     next_rs_frame_mode | 2 | bslbf |
|     next_rs_code_mode_primary | 2 | bslbf |
|     next_rs_code_mode_secondary | 2 | bslbf |
|     next_sccc_block_mode | 2 | bslbf |
|     next_sccc_outer_code_mode_a | 2 | bslbf |
|     next_sccc_outer_code_mode_b | 2 | bslbf |
|     next_sccc_outer_code_mode_c | 2 | bslbf |
|     next_sccc_outer_code_mode_d | 2 | bslbf |
|   } | | |
|   fic_version | 5 | uimsbf |
|   parade_continuity_counter | 4 | uimsbf |
|   if(sub-frame_number≤1) { | | |
|     current_TNoG | 5 | uimsbf |
|     reserved | 5 | bslbf |
|   } | | |
|   if(sub-frame_number≥2) { | | |
|     next_TNoG | 5 | uimsbf |
|     current_TNoG | 5 | uimsbf |
|   } | | |
|   if(tpc_protocol_version == '11000') { | | |
|     if(sub-frame_number<1) { | | |
|     current_scalable_mode | 3 | uimsbf |
|   } | | |
|     if(sub-frame_number≥2) { | | |
|     next_scalable_mode | 3 | uimsbf |
|   } | | |
|     sccc_block_extension_mode | 2 | uimsbf |
|     reserved | 11 | bslbf |
|   } | | |
|   if(tpc_protocol_version == '11111') { | | |
|     reserved | 16 | bslbf |
|     ~~reserved~~ | | |
|   } | | |
|   tpc_protocol_version | 5 | bslbf |
| } | | |

| Syntax | No. of Bits | Format |
|---|---|---|
| FIC_chunk() { | | |
|    FIC_chunk_header() | 5*8 | |
|    FIC_chunk_payload() | var | |
| } | | |

FIG. 45

| Syntax | No. of Bits | Format |
|---|---|---|
| FIC_segment_header() { | | |
| FIC_segment_type | 2 | uimsbf |
| reserved | 2 | '11' |
| FIC_chunk_major_protocol_version | 2 | uimsbf |
| current_next_indicator | 1 | bslbf |
| error_indicator | 1 | bslbf |
| FIC_segment_num | 4 | uimsbf |
| FIC_last_segment_num | 4 | uimsbf |
| } | | |

FIG. 46

| Syntax | No. of Bits | Format |
|---|---|---|
| FIC_segment_header() { | | |
| FIC_chunk_major_protocol_version | 2 | uimsbf |
| FIC_chunk_minor_protocol_version | 3 | uimsbf |
| FIC_chunk_header_extension_length | 3 | uimsbf |
| ensemble_loop_header_extension_length | 3 | uimsbf |
| MH_service_loop_extension_length | 3 | uimsbf |
| reserved | 1 | '1' |
| current_next_indicator | 1 | bslbf |
| transport_stream_id | 16 | uimsbf |
| num_SFCMM_ensembles | 8 | uimsbf |
| num_ensembles | 8 | uimsbf |
| } | | |

FIG. 47

| Syntax | No. of Bits | Format |
|---|---|---|
| FIC_chunk_payload() { | | |
|   for (i=0; i<num_ensembles; i++) { | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++) { | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   GAT_ensemble_indicator | | |
|     ensemble_id | 8 | uimsbf |
|     reserved | 3 | '111' |
|     ensemble_protocol_version | 5 | uimsbf |
|     SLT_ensemble_indicator | 1 | bslbf |
|     GAT_ensemble_indicator | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++) { | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing() | var | |
| } | | |

FIG. 48A

| Syntax | No. of Bits | Format |
|---|---|---|
| FIC_segment_header() { | | |
|     FIC_segment_type | 2 | uimsbf |
|     reserved | 2 | '11' |
|     FIC_chunk_major_protocol_version | 2 | '01' |
|     current_next_indicator | 1 | bslbf |
|     error_indicator | 1 | bslbf |
|     FIC_segment_num | 4 | uimsbf |
|     FIC_last_segment_num | 4 | uimsbf |
| } | | |

FIG. 48B

| Syntax | No. of Bits | Format |
|---|---|---|
| FIC_segment_header() { | | |
|     FIC_chunk_major_protocol_version | 2 | '01' |
|     FIC_chunk_minor_protocol_version | 3 | '000' |
|     FIC_chunk_header_extension_length | 3 | '000' |
|     ensemble_loop_header_extension_length | 3 | uimsbf |
|     MH_service_loop_extension_length | 3 | uimsbf |
|     reserved | 1 | '1' |
|     current_next_indicator | 1 | bslbf |
|     transport_stream_id | 16 | uimsbf |
|     num_FMM_ensembles | 8 | uimsbf |
| } | | |

FIG. 48C

| Syntax | No. of Bits | Format |
|---|---|---|
| FIC_chunk_payload() { | | |
|   for (i=0; i<num_ensembles; i++) { | | |
|     ensemble_protocol_version | 8 | uimsbf |
|     SLT_ensemble_indicator | 3 | '111' |
|     GAT_ensemble_indicator | 5 | uimsbf |
|     ensemble_id_type | 1 | bslbf |
|     ensemble_id (ensemble_type) | 1 | bslbf |
|     reserved | 1 | '1' |
|     MH_service_signaling_channel_version | 5 | uimsbf |
|     num_MH_services | 8 | uimsbf |
|     for (j=0; j<num_MH_services; j++) { | | |
|       MH_service_id | 16 | uimsbf |
|       reserved | 3 | '111' |
|       multi_ensemble_service | 2 | uimsbf |
|       MH_service_status | 2 | uimsbf |
|       SP_indicator | 1 | bslbf |
|     } | | |
|   } | | |
|   FIC_chunk_stuffing() | | |
| } | | |

EMM portion only (No CMM portion)

FIG. 50A

| Syntax | No. of Bits | Format |
|---|---|---|
| service_map_table_MH_section() { | | |
|   table_id | 8 | 0xDB |
|   section_syntax_indicator | 1 | '0' |
|   private_indicator | 1 | '1' |
|   reserved | 2 | '11' |
|   section_length | 12 | uimsbf |
|   table_id_extension { | | |
|     SMT_MH_protocol_version | 8 | uimsbf |
|     ensemble_id | 8 | uimsbf |
|   } | | |
|   reserved | 2 | '11' |
|   version_number | 5 | uimsbf |
|   current_next_indicator | 1 | bslbf |
|   section_number | 8 | uimsbf |
|   last_section_number | 8 | uimsbf |
|   num_MH_services | 8 | uimsbf |
|   for (i=0; i<num_MH_services; i++) | | |
|   { | | |
|     MH_service_id | 16 | uimsbf |
|     multi_ensemble_service | 2 | uimsbf |
|     MH_service_status | 2 | uimsbf |
|     SP_indicator | 1 | bslbf |
|     short_MH_service_name_length /* m */ | 3 | uimsbf |
|     short_MH_service_name | 16*m | bslbf |
|     reserved | 2 | '11' |
|     MH_service_category | 5 | uimsbf |
|     num_components | 5 | uimsbf |
|     IP_version_flag | 1 | bslbf |
|     service_source_IP_address_flag | 1 | bslbf |
|     service_destination_IP_address_flag | 1 | bslbf |
|     if (service_source_IP_address_flag) | | |
|       service_source_IP_address | 32 or 128 | uimsbf |
|     if (service_destination_IP_address_flag) | | |
|       service_destination_IP_address | 32 or 128 | uimsbf |
|     for (j=0; j<num_components; j++) | | |

FIG. 50B

| | | |
|---|---|---|
| { | | |
| component_source_IP_address_flag | 1 | bslbf |
| essential_component_indicator | 1 | bslbf |
| component_destination_IP_address_flag | 1 | bslbf |
| port_num_count | 5 | uimsbf |
| component_destination_UDP_port_num | 15 | uimsbf |
| if(component_source_IP_address_flag) | | |
|    component_source_IP_address | 32 or 128 | uimsbf |
| if(component_destination_IP_address_flag) | | |
|    component_destination_IP_address | 32 or 128 | uimsbf |
| reserved | 4 | '1111' |
| num_component_level_descriptors | 4 | uimsbf |
| for (k=0; k<num_component_level_descriptors; k++) | | |
| { | | |
|    component_level_descriptor() | var | |
| } | | |
| } | | |
| reserved | 4 | '1111' |
| num_MH_service_level_descriptors | 4 | uimsbf |
| for (m=0; m<num_MH_service_level_descriptors; m++) | | |
| { | | |
|    MH_service_level_descriptor() | var | |
| } | | |
| } | | |
| reserved | 4 | '1111' |
| num_ensemble_level_descriptors | 4 | uimsbf |
| for (n=0; n<num_ensemble_level_descriptors; n++) { | | |
| { | | |
|    ensemble_level_descriptor() | var | |
| } | | |
| } | | |

FIG. 51

| Syntax | No. of Bits | Format |
|---|---|---|
| service_Map_table_MH_section() { | | |
|    table_id | 8 | 0XDB |
|    ... | | |
|    section_length | 12 | uimsbf |
|    table_id_extension { | | |
|       SMT_MH_protocol_version | 8 | '0X01' |
|       ensemble_id_MSB | 8 | uimsbf |
|    } | | |
|    ... | | |
|    last_section_number | 8 | |
|    reserved | 5 | |
|    ensemble_id_type | 3 | uimsbf |
|    if (ensemble_id_type >= '100') { | | '11111' |
|       ensemble_id_LSB | 8 | uimsbf |
|    } | | |
|    num_MH_services | 8 | uimsbf |
|    ... | | |

FIG. 52A

| Syntax | No. of Bits | Format |
|---|---|---|
| cell_information_table_MH_section() { | | |
|   table_id | 8 | 0xDD |
|   section_syntax_indicator | 1 | '0' |
|   private_indicator | 1 | '1' |
|   reserved | 2 | '11' |
|   section_length | 12 | uimsbf |
|   table_id_extension { | 15 | uimsbf |
|     CIT_MH_protocol_version | 8 | uimsbf |
|     ensemble_id | 8 | uimsbf |
|   } | | |
|   reserved | 2 | '11' |
|   version_number | 5 | uimsbf |
|   current_next_indicator | 1 | bslbf |
|   section_number | 8 | uimsbf |
|   last_section_number | 8 | uimsbf |
|   num_home_cell_transmitters | 8 | uimsbf |
|   for (n=0; n<num_home_cell_transmitters; n++) { | | |
|     transmitter_latitude | 24 | signed int |
|     transmitter_longitude | 24 | signed int |
|     transmitter_AERP | 6 | uimsbf |
|     transmitter_relative_pattern_depth | 2 | uimsbf |
|     transmitter_null_positions | 8 | bslbf |
|   } | | |
|   num_MH_services | 8 | uimsbf |
|   for (j=0; j<num_MH_services; j++) { | | |
|     MH_service_id | 16 | uimsbf |
|     num_cells | 8 | uimsbf |

FIG. 52B

| | | |
|---|---|---|
| for (j=0; j<num_cells; j++) { | | |
|     cell_latitude | 24 | signed int |
|     cell_longitude | 24 | signed int |
|     transport_stream_id | 16 | uimsbf |
|     transmitter_AERP | 6 | uimsbf |
|     transmitter_relative_pattern_depth | 2 | uimsbf |
|     transmitter_null_positions | 8 | bslbf |
|     PTC_num | 8 | uimsbf |
|     cell_ensemble_id | 8 | uimsbf |
|     cell_MH_service_id | 15 | uimsbf |
|     reserved | 4 | '1111' |
|     num_descriptors | 4 | uimsbf |
|     for (k=0; k<num_descriptors; k++) { | | |
|         descriptor() | var | |
|     } | | |
| } | | |
| reserved | 4 | '1111' |
| num_additional_descriptors | 4 | uimsbf |
| for (m=0; m<N; m++) { | | |
|     additional_descriptor() | var | |
| } | | |
| } | | |

FIG. 53

| Syntax | No. of Bits | Format |
|---|---|---|
| cell_information_table_MH_section() { | | |
|   table_id | 8 | 0xDD |
|   ... | | |
|   section_length | 12 | uimsbf |
|   table_id_extension { | | |
|     CIT_MH_protocol_version | 8 | '0x01' |
|     ensemble_id | 8 | uimsbf |
|   } | | |
|   ... | | |
|   last_section_number | 8 | uimsbf |
|   reserved | 5 | '11111' |
|   ensemble_id_type | 3 | uimsbf |
|   if(ensemble_id_type >= '100') { | | |
|     ensemble_id_LSB | 8 | uimsbf |
|   } | | |
|   num_home_cell_transmitters | 8 | uimsbf |
|   ... | | |
|   num_MH_services | 8 | uimsbf |
|   for(i=0; i<num_MH_services; i++) { | | |
|     ... | | |
|     for(i=0; i<num_cells; i++) { | | |
|       ... | | |
|       PTC_num | 8 | uimsbf |
|       reserved | 5 | '11111' |
|       ensemble_id_type | 3 | uimsbf |
|       cell_ensemble_id (ensemble_id_type) | 8 or 16 | uimsbf |
|       cell_MH_service_id | 16 | uimsbf |
|   ... | | |

FIG. 54

| Syntax | No. of Bits | Format |
|---|---|---|
| service_labeling_table_MH_section() { | | |
|     table_id | 8 | 0xDE |
|     section_syntax_indicator | 1 | '0' |
|     private_indicator | 1 | '1' |
|     reserved | 2 | '11' |
|     section_length | 12 | uimsbf |
|     table_id_extension { | | |
|         SLT_MH_protocol_version | 8 | uimsbf |
|         reserved | 8 | '11111111' |
|     } | | |
|     reserved | 2 | '11' |
|     version_number | 5 | uimsbf |
|     current_next_indicator | 1 | bslbf |
|     section_number | 8 | uimsbf |
|     last_section_number | 8 | uimsbf |
|     num_MH_services | 8 | uimsbf |
|     for (i=0; i<num_MH_services; i++) { | | |
|         reserved | 2 | '11' |
|         MH_service_category | 6 | uimsbf |
|         MH_service_id | 16 | uimsbf |
|         reserved | 5 | '11111' |
|         short_MH_service_name_length /* m */ | 3 | uimsbf |
|         short_MH_service_name | 16*m | bslbf |
|         reserved | 4 | '1111' |
|         num_descriptors | 4 | uimsbf |
|         for (m=0; m<num_descriptors; m++) { | | |
|             MH_service_descriptor() | var | |
|         } | | |
|     } | | |
| } | | |

L: Number of parts
N: Length of each part

FIG. 71

```
Index     : 0  1   2   3   ...  11997 11998 11999 12000 12001 12002 ... 23997 23998 23999 ;
Output    : 0  89 267 534  ...   6267  6089  6000  6000  6089  6267 ...   267    89     0 ;
Direction : : <------------- forward -------------><------------- reverse ------------->;
```

Interleaver Operation

Deinterleaver Operation

--- Addressing path
--- Data path

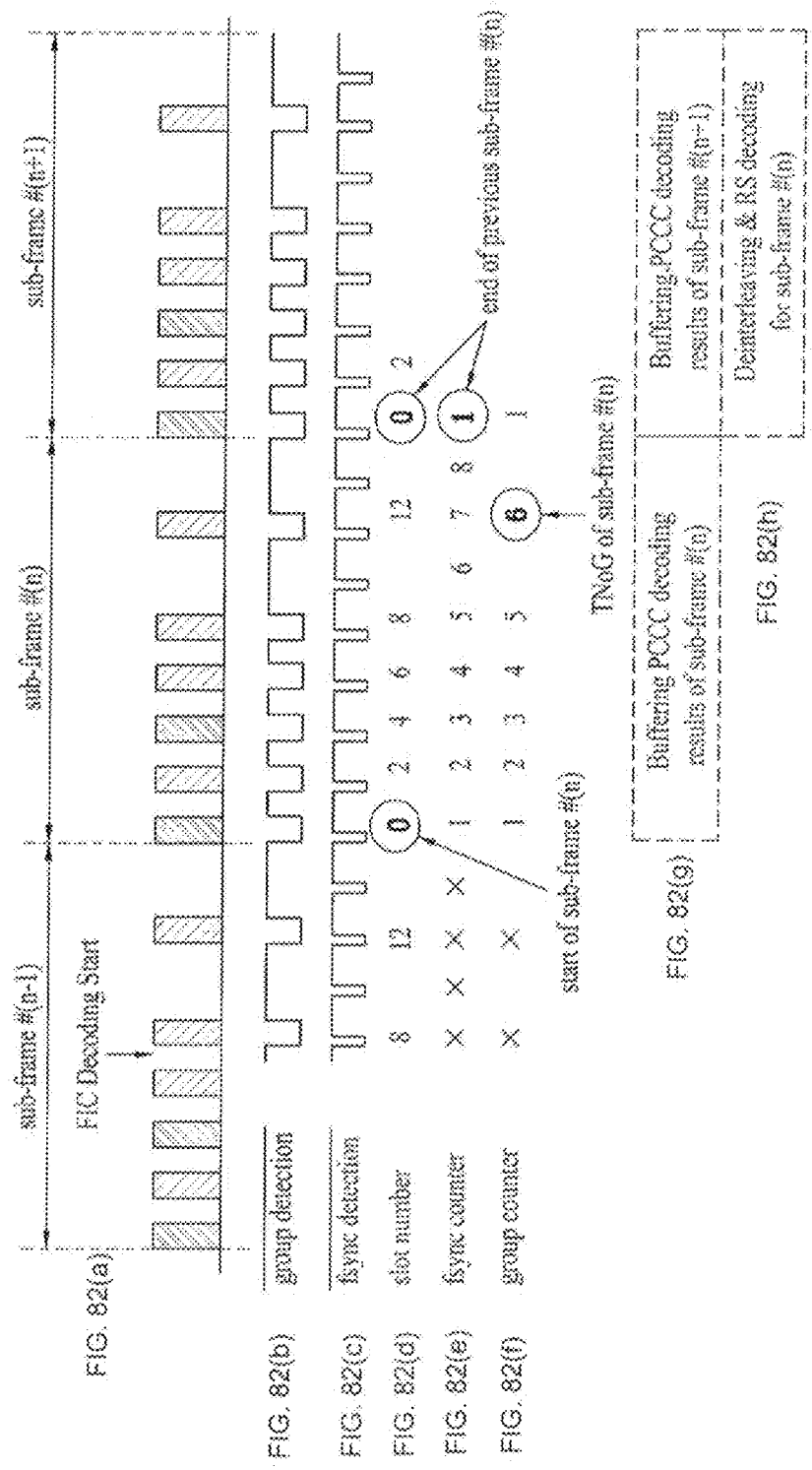

TRANSMITTING SYSTEM AND METHOD OF PROCESSING DIGITAL BROADCAST SIGNAL IN TRANSMITTING SYSTEM, RECEIVING SYSTEM AND METHOD OF RECEIVING DIGITAL BROADCAST SIGNAL IN RECEIVING SYSTEM

This application is a continuation of U.S. application Ser. No. 12/907,649, filed Oct. 19, 2010, now U.S. Pat. No. 9,077,379, which claims the benefit of U.S. Provisional Application No. 61/253,042, filed on Oct. 19, 2009, the contents of which are hereby incorporated by reference herein in their entireties.

FIELD OF THE INVENTION

The present invention relates to a digital broadcasting system for transmitting and receiving a digital broadcast signal, and more particularly, to a transmitting system for processing and transmitting the digital broadcast signal, and a method of processing data in the transmitting system and the receiving system.

DESCRIPTION OF THE RELATED ART

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting system and a method of processing a digital broadcast signal in a transmitting system that substantially obviate one or more problems due to limitations and disadvantages of the related art.

An object of the present invention is to provide a transmission system which is able to transmit additional mobile service data while simultaneously maintaining the compatibility with a conventional system for transmitting a digital broadcast signal, and a method for processing a broadcast signal.

Another object of the present invention is to signal mapping information between an ensemble and a mobile service using an FIC chunk, to segment the FIC chunk into FIC segment units, and to transmit the segments through an FIC, thereby performing fast service acquisition in a reception system.

Another object of the present invention is to transmit a plurality of FIC segments segmented from an FIC chunk through one subframe or a plurality of subframes so as to prevent the FIC segments from being wasted if the amount of data of the FIC chunk is less or greater than the amount of data of FIC segments transmitted through one subframe.

Another object of the present invention is to transmit protocol version information of an FIC chunk corresponding to an FIC segment through a header of the FIC segment so as to accurately restore the FIC chunk using the FIC segments configured by the protocol version in a reception system even when FIC chunks of different protocol versions coexist in one M/H frame.

Another object of the present invention is to transmit identification information identifying whether signaling information transmitted through a payload of an FIC segment through a header of the FIC segment is signaling information of a current M/H frame or signaling information of a next M/H frame so as to accurately restore an FIC chunk using the FIC segments of the M/H frame in a reception system even when an FIC chunk for signaling ensemble configuration information of the current M/H frame and an FIC chunk for signaling ensemble information of the next M/H frame coexist in one M/H frame.

Another object of the present invention is to secure robust resilience to errors encountered when mobile service data is transmitted through a channel, to determine whether or not additional mobile data packets are included using signaling information in a receiver, and to secure compatibility if the additional packets are not present.

Another object of the present invention is to receive mobile service data without error even when faced with poor channel quality due to ghosts and noises, by including an additional mobile data block in a data group.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for transmitting a broadcast signal in a transmitter includes encoding mobile data for forward error correction (FEC) to build a Reed-Solomon (RS) frame and dividing the built RS frame into RS frame portions, dividing the RS frame portions into Serially Concatenated Convolutional Code (SCCC) blocks and mapping the SCCC blocks to data blocks and scalable data blocks, corresponding to a plurality of data segments, wherein at least one of the SCCC blocks includes one of the data blocks and one of the scalable data blocks, encoding signaling data including a header and a payload, forming data groups including the data blocks and the scalable data blocks, wherein specific data blocks of the data blocks in the data groups include the signaling data having information for a number of ensembles being a collection of services transmitted through the data groups, interleaving data in the data groups, wherein the interleaved data includes a plurality of data segments, and wherein at least one of the plurality of data segments includes a part of one of the data blocks and a part of one of the scalable data blocks and transmitting the interleaved data during slots in a transmission frame.

In this invention, the payload includes information corresponding to a number of ensembles transmitted through data groups including the scalable data blocks.

In this invention, the signaling data are divided into a plurality signaling data segment payloads.

In this invention, one of the data groups includes a segment header for one of the plurality of signaling data segments and the one of the plurality of signaling data segment payloads.

In other example for this invention, the RS frame including a primary RS frame or a secondary RS frame depending on RS frame mode, wherein the RS frame mode indicates whether or not to build the primary RS frame, or build the primary RS frame and secondary RS frame.

In another aspect of the present invention, an apparatus for transmitting a broadcast signal, includes a first encoder configured to encode mobile data for forward error correction (FEC) to build a Reed-Solomon (RS) frame and dividing the built RS frame into RS frame portions, a divider configured to divide the RS frame portions into Serially Concatenated Convolutional Code (SCCC) blocks and mapping the SCCC blocks to data blocks and scalable data blocks, corresponding to a plurality of data segments, wherein at least one of the SCCC blocks includes one of the data blocks and one of the scalable data blocks, a second encoder configured to encode signaling data including a header and a payload, a group formatter configured to form data groups including the data blocks and the scalable data blocks, wherein specific data blocks of the data blocks in the data groups include the signaling data having information for a number of ensembles being a collection of services transmitted through the data groups, an interleaver configured to interleave data in the data groups, wherein the interleaved data includes a plurality of data segments and wherein at least one of the plurality of data segments includes a part of one of the data blocks and a part of one of the scalable data blocks, a transmission unit configured to transmit the interleaved data during slots in a transmission frame.

In this invention, the payload includes information corresponding to a number of ensembles transmitted through data groups including the scalable data blocks.

In this invention, the signaling data are divided into a plurality of signaling data segment payloads.

In this invention, one of the data groups includes a header for one of the plurality of signaling data segments and the one of the plurality of signaling data segment payloads.

In other example for this invention, the RS frame includes a primary RS frame or a secondary RS frame depending on RS frame mode, wherein the RS frame mode indicates whether or not to build the primary RS frame, or build the primary RS frame and secondary RS frame.

And to achieve these objects and other advantages and in accordance with the purpose of the invention, as embodied and broadly described herein, a method for receiving a broadcast signal in a receiver includes receiving a broadcast signal including a transmission frame, wherein a parade of data groups in the broadcast signal is received during slots within the transmission frame, each data group including data blocks and scalable data blocks, corresponding to a plurality of data segments, wherein at least one of the plurality of data segments includes a part of one of the data blocks and a part of one of the scalable data blocks, wherein specific data blocks of the data blocks in the data groups include the signaling data having information for a number of ensembles being a collection of services transmitted through the each data group, wherein the each data group includes signaling data segments having a segment payload, demodulating the broadcast signal and obtaining the signaling data segments in the each data group and decoding the signaling data in the signaling data segments.

In this invention, the signaling data includes a payload including information corresponding to a number of ensembles transmitted through the each data group including the scalable data blocks.

In other example of this invention, when the each data group only includes the data blocks, receiver skips the information corresponding to a number of ensembles transmitted through the each data group including the scalable data blocks.

In another aspect of the present invention, an apparatus for receiving a broadcast signal includes a receiver configured to receive a broadcast signal including a transmission frame, wherein a parade of data groups in the broadcast signal is received during slots within the transmission frame, each data group including data blocks and scalable data blocks, corresponding to a plurality of data segments, wherein at least one of the plurality of data segments includes a part of one of the data blocks and a part of one of the scalable data blocks, wherein specific data blocks of the data blocks in the data groups include the signaling data having information for a number of ensembles being a collection of services transmitted through the each data group, wherein the each data group includes signaling data segments, each signaling data segment including a segment payload, a demodulator configured to demodulate the broadcast signal and obtaining the signaling data segments in the each data group and a decoder configured to decode the signaling data in the signaling data segments.

In this invention, the signaling data includes a payload including information corresponding to a number of ensembles transmitted through the each data group including the scalable data blocks.

In other example of this invention, when the each data group only includes the data blocks, receiver skips the information corresponding to a number of ensembles transmitted through the each data group including the scalable data blocks.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 8 (*a*), 8 (*b*), 8 (*c*) and 8 (*d*) illustrate various examples of mobile service data of a first mobile mode and mobile service data of a second mobile mode being allocated to a group.

FIGS. 9 (*a*), 9 (*b*), 9 (*c*), 9 (*d*), 9 (*e*) and 9 (*f*) illustrate an example of a mobile service data packet being allocated to region E within the data group according to an embodiment to the present invention.

FIG. 10 illustrates an example of each group type being segmented based upon the size of region E according to an embodiment of the present invention.

FIG. 41 illustrates a syntax structure of a TPC data field for signaling digital broadcast data according to an embodiment of the present invention.

FIG. 45 is a diagram showing an embodiment of a syntax structure of an FIC segment header according to the present invention.

FIG. 46 is a diagram showing an embodiment of a syntax structure of an FIC chunk header according to the present invention.

FIG. 47 is a diagram showing an embodiment of a syntax structure of an FIC chunk payload according to the present invention.

FIGS. 48A, 48B and 48C illustrate a diagram showing another embodiment of a syntax structure of an FIC segment header, an FIC chunk header and an FIC payload.

FIGS. 50A and 50B illustrate a diagram showing an embodiment of a service map table (SMT) according to the present invention;

FIG. 51 is a diagram showing another embodiment of a service map table (SMT) according to the present invention;

FIGS. 52A and 52B illustrate a diagram showing an embodiment of a cell information table (CIT) according to the present invention.

FIG. 53 is a diagram showing another embodiment of a cell information table (CIT) according to the present invention.

FIG. 54 is a diagram showing an embodiment of a service label table (SLT) according to the present invention.

FIG. 71 illustrates an example of a symbol interleaving pattern when an offset value is set to '0' according to an embodiment of the present invention.

FIGS. 82 (*a*), 82 (*b*), 82 (*c*), 82 (*d*), 82 (*e*), 82 (*f*), 82 (*g*) and 82 (*h*) illustrate a detailed embodiment of a process of extracting a TNoG according to an embodiment of the present invention.

DESCRIPTION OF THE PREFERRED EMBODIMENTS

Figure 1:
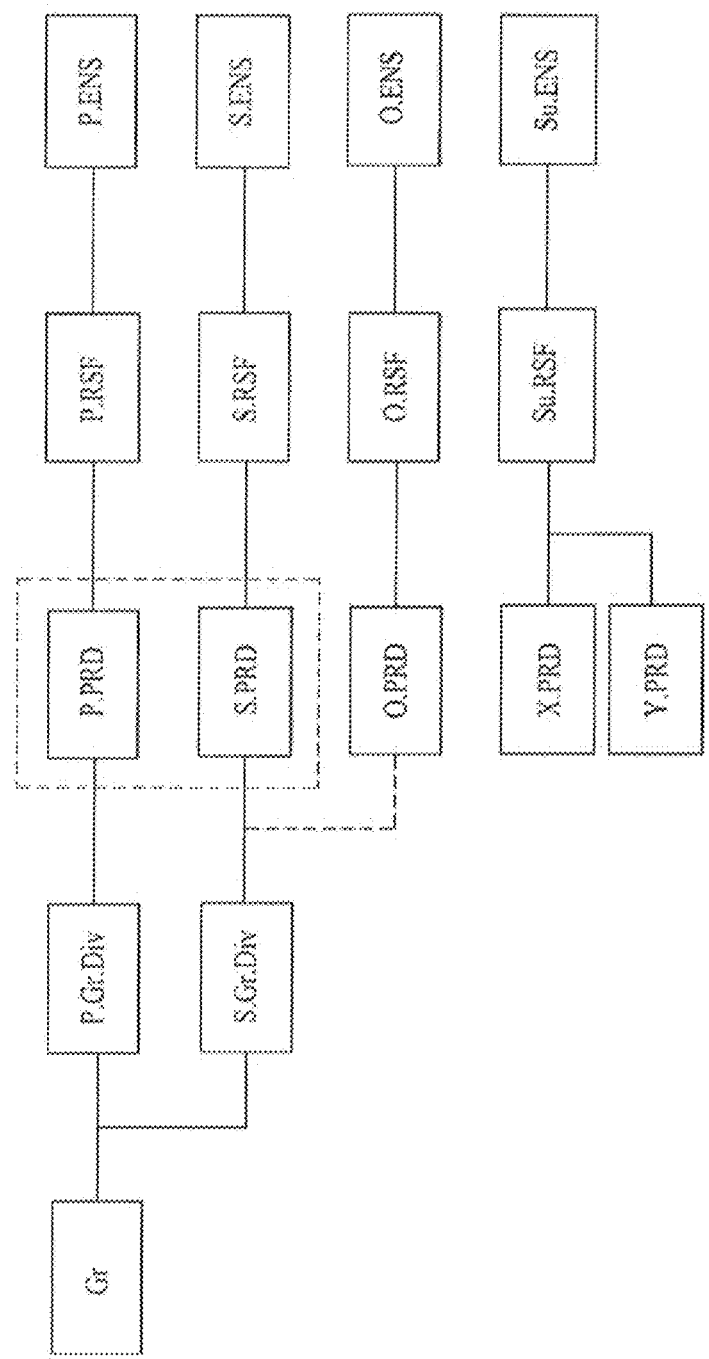
FIG. 1 illustrates the relation between an ensemble, an RS frame, a parade, a group division, and a group according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

For convenience of description and better understanding of the present invention, abbreviations and terms to be use in the present invention are defined as follows.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Additionally, in the embodiment of the present invention, a group (also referred to as an M/H group or a data group) corresponds to a collection (or group) of data packets confined within a slot (also referred to as an M/H slot).

A group division refers to a set of group regions within a slot. Herein, a group division is categorized into a Primary Group Division or a Secondary Group Division. At this point, a collection of primary group divisions within an M/H frame configures (or forms) a primary parade, whereas a collection of secondary group divisions configures (or forms) a secondary parade or an overlay parade.

A group type is determined by the configuration of a group division within a single group.

A parade (also referred to as an M/H parade) refers to a collection of groups that have the same FEC parameters. More specifically, a parade refers to a collection of group divisions of groups having the same group type.

A primary parade (also referred to as a primary M/H parade) corresponds to a collection of primary group divisions, and a secondary parade (also referred to as a secondary M/H parade) corresponds to a collection of secondary group divisions. Each of the secondary group divisions is carried (or transported) through the same slot with its respectively paired primary group division. The secondary parade has the same parade identifier (ID) as its respective primary parade (i.e., the secondary parade shares the same parade ID with its respective primary parade)

An overlay parade (also referred to as an overlay M/H parade) corresponds to a collection of secondary group divisions. And, in this case, the secondary group divisions are not paired with any of the primary group divisions.

An RS frame corresponds to a two (2)-dimensional (2D) data frame, wherein an RS frame payload is RS-CRC encoded.

In a primary RS frame, a primary RS frame parade is RS-CRC encoded. The primary RS frame is transmitted (or carried) through a primary parade.

In a secondary RS frame, a secondary RS frame parade is RS-CRC encoded. The secondary RS frame is transmitted (or carried) through a secondary parade.

In an overlay RS frame, an overlay RS frame payload is RS-CRC encoded. The overlay RS frame is transmitted (or carried) through an overlay parade.

A super RS frame corresponds to an RS frame wherein a super RS frame payload is RS-CRC encoded. The super RS frame is transported (or carried) through two arbitrary parades.

An ensemble (also referred to as an M/H ensemble) refers to a collection of RS frames having the same FEC codes. Herein, each RS frame encapsulates a collection of IP streams. A primary ensemble corresponds to a collection of consecutive primary RS frames.

A secondary ensemble corresponds to a collection of consecutive secondary RS frames.

An overlay ensemble corresponds to a collection of consecutive overlay RS frames.

A super ensemble (also referred to as a super M/H ensemble) corresponds to a collection of consecutive super RS frames.

In the embodiment of the present invention, data for mobile services may be transmitted by using a portion of the channel capacity that was used to transmit data for main services. Alternatively, data for mobile service may also be transmitted by using the entire channel capacity that was used to transmit data for main services. The data for mobile services correspond to data required for mobile services. Accordingly, the data for mobile services may include actual mobile service data as well as known data, signaling data, RS parity data for error-correcting mobile service data, and so on. In the description of the embodiment of the present invention, the data for mobile services will be referred to as mobile service data or mobile data for simplicity.

The mobile service data may be categorized as mobile service data of a first mobile mode or Core Mobile Mode (CMM) and mobile service data of a second mobile mode or Extended Mobile Mode (EMM) or Scalable Full Channel Mobile Mode (SFCMM).

Furthermore, when the second mobile mode is used along with the first mobile mode, the above-described two modes may be collectively defined as the Scalable Full Channel Mobile Mode (SFCMM).

The first mobile mode is a mode in which Mobile DTV services are transmitted while reserving at least 38 of the 156 packets in each M/H Slot for legacy A/53-compatible services. The second mobile mode is a mode in which Mobile DTV services are transmitted while reserving fewer than 38 of the 156 packets in some or all M/H Slots for legacy A/53-compatible services.

According to the definition of CMM, SFCMM, Ensemble and Parade, the CMM ensemble is a Primary or Secondary Ensemble that is compatible with the CMM system. A CMM Ensemble carries a collection of CMM Services and the SFCMM ensemble is a Primary or Secondary Ensemble that carries a collection of SFCMM Services and is backwards compatible with, but not recognizable by, a CMM receiver/decoder.

And also, the CMM Parade is an M/H Parade that is compatible with the CMM system. A CMM Parade consists of DATA Groups, where each DATA Group does not include the Group Region E and carries an entire RS Frame belonging to the corresponding CMM Ensemble.

The SFCMM Parade is an M/H Parade that is backwards compatible with, but not recognizable by, a CMM system receiver/decoder. An SFCMM Parade consists of DATA Groups, where each DATA Group contains the Group Region E and carries an entire RS Frame belonging to the corresponding SFCMM Ensemble.

The CMM Service is an M/H Service that is compatible with the CMM system. A CMM Service is delivered through a CMM Ensemble. And the CMM Service is an M/H Service that is compatible with the CMM system. A CMM Service is delivered through a CMM Ensemble.

Also, according to an embodiment of the present invention, a group (also referred to as an M/H group or a data group) corresponds to a collection of M/H Encapsulated (MHE) data packets confined within a slot (also referred to as an M/H slot).

A group division corresponds to a collection (or set) of group regions (also referred to as M/H group regions) within a slot. Herein, a group division is categorized into a Primary Group Division or a Secondary Group Division.

A group region corresponds to a collection (or set) of DATA blocks or extended DATA blocks.

A group type is determined by the configuration of a group division within a single group.

Known data—Known data is pre-recognized by an agreement between a transmission system and a reception system, and may be used for channel equalization, etc.

FEC—FEC is an abbreviation of a Forward Error Correction, and is a generic name of technologies wherein a reception end can spontaneously correct an error of a digital signal transmitted from the transmission end to the reception end without retransmission of a corresponding signal by the transmission end.

TPC—TPC is an abbreviation of a Transmission Parameter Channel. TPC is contained in each data group, and then transmitted. The TPC provides information about a data frame and a data group to the reception end, and performs signaling of the provided information.

TS—TS is an abbreviation of a Transport Stream.
RS—RS is an abbreviation of Reed-Solomon.
CRC—CRC is an abbreviation of a Cyclic Redundancy Check.
SCCC—SCCC is an abbreviation of a Serial Concatenated Convolutional Code.
PCCC—PCCC is an abbreviation of a Parallel Concatenated Convolutional Code.
FIC—FIC is an abbreviation of a Fast information channel. FIC carries cross-layer information. This information primarily includes channel binding information between ensembles and services.
M/H Ensemble (or simply "Ensemble")—A collection of consecutive RS Frames with the same FEC codes, where each RS Frame encapsulates a collection of IP streams.
CMM Ensemble—A Primary or Secondary Ensemble that is compatible with the CMM system. A CMM Ensemble carries a collection of CMM Services.
SFCMM Ensemble—A Primary or Secondary Ensemble that carries a collection of SFCMM Services and is backwards compatible with, but not recognizable by, a CMM receiver/decoder.
M/H Service—A package of packetized streams transmitted via an M/H Broadcast, which package is composed of a sequence of events which can be broadcast as part of a schedule.
CMM Service—An M/H Service that is compatible with the CMM system. A CMM Service is delivered through a CMM Ensemble.

SFCMM Service—An M/H Service that is delivered through an SFCMM Ensemble and therefore is not recognizable by a CMM receiver/decoder.

M/H Service Signaling Channel—A single stream incorporated within each M/H Ensemble. The current version of the M/H SSC uses a IP multicast stream to deliver M/H Service Signaling tables that include IP-level M/H Service access information.

Embodiments of the present invention will hereinafter be described with reference to the annexed drawings.

FIG. 1 illustrates the relation between an ensemble, an RS frame, a parade, a group division, and a group according to an embodiment of the present invention.

Referring to FIG. 1, a primary ensemble and a primary RS frame and a primary parade are mapped to a one-to-one-to-one (1:1:1) ratio. A secondary ensemble and a secondary RS frame and a secondary parade are mapped to a one-to-one-to-one (1:1:1) ratio. Also, an overlay ensemble and an overlay RS frame and an overlay parade are mapped to a one-to-one-to-one (1:1:1) ratio. However, a super ensemble and a super RS frame and a super parade are mapped to a one-to-one-to-two (1:1:2) ratio.

According to the embodiment of the present invention, a primary RS frame payload is RS-CRC encoded so as to configure (or form) a primary RS frame. Herein, the primary RS frame is carrier (or transported) through the primary parade. At this point, the primary parade is allocated and transmitted to a plurality of groups. Most particularly, the primary parade is allocated and transmitted to a primary group division of each group.

Also, a secondary RS frame payload is RS-CRC encoded so as to configure (or form) a secondary RS frame. Herein, the secondary RS frame is carrier (or transported) through the secondary parade. At this point, the secondary parade is allocated and transmitted to a secondary group division of each group.

Furthermore, an overlay RS frame payload is RS-CRC encoded so as to configure (or form) an overlay RS frame. Herein, the overlay RS frame is carrier (or transported) through the overlay parade. At this point, the overlay parade is allocated and transmitted to a secondary group division of each group.

More specifically, one group is divided into a primary group division and a secondary group division. At this point, data of a primary parade are allocated to the primary group division. Conversely, data of a secondary parade or data of an overlay parade are allocated to the secondary group division. In other words, one group may transmit data of a primary parade and data of a secondary parade, and the group may also transmit data of a primary parade and data of an overlay parade.

According to another embodiment of the present invention, regions A, B, C, D, and E belonging to a data group may all (or entirely) belong to a primary group division. And, according to yet another embodiment of the present invention, regions A and B within a data group may belong to the primary group division, and regions C, D, and E may belong to the secondary group division.

Figure 2:
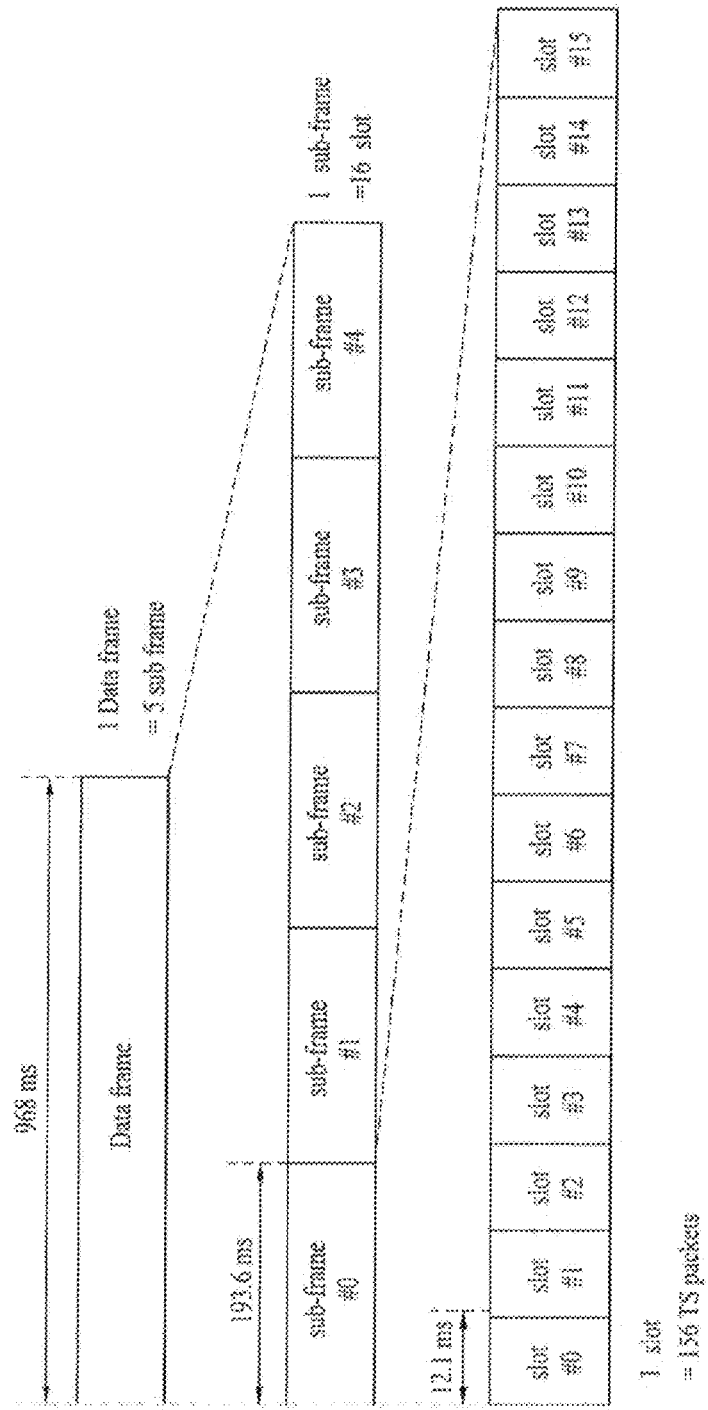
FIG. 2 illustrates a data frame (M/H frame) structure for transmitting/receiving mobile service data according to one embodiment of the present invention.

FIG. 2 illustrates a data frame (M/H frame) structure for transmitting/receiving mobile service data according to one embodiment of the present invention.

In the embodiment of the present invention, the mobile service data are first multiplexed with main service data in data frame units and, then, modulated in a VSB mode and transmitted to the receiving system.

The term "data frame" mentioned in the embodiment of the present invention may be defined as the concept of a time during which main service data and mobile service data are transmitted. For example, one data frame may be defined as a time consumed for transmitting 20 VSB data frames.

At this point, one data frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

In the example shown in FIG. 2, one data frame consists of 5 sub-frames, wherein each sub-frame includes 16 slots. In this case, the data frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of payload data as payload data of a segment, a data packet prior to being interleaved may also be used as a data segment.

156 data packets contained in a slot may be composed of 156 main service data packets, may be composed of 118 mobile service data packets and 38 main service data packets, or may be composed of (118+M) mobile service data packets and L main service data packets. In this case, the sum of M and L may be set to 38 according to one embodiment of the present invention. In addition, M may be zero '0' or a natural number of 38 or less.

One data group is transmitted during a single slot. In this case, the transmitted data group may include 118 mobile service data packets or (118+M) mobile service data packets.

That is, a data group may be defined as a set of data units including mobile service data present in one slot. In this case, the mobile service data may be defined as pure mobile service data, or may be defined as the concept that includes data for transmitting mobile service data, such as signaling data, known data, etc.

Figure 3:
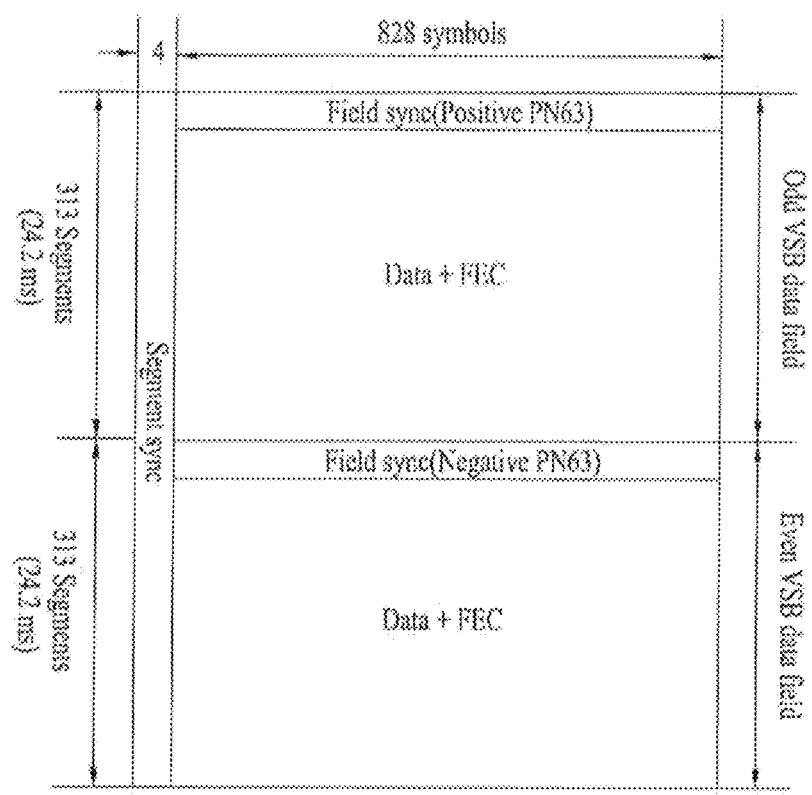
FIG. 3 illustrates an exemplary structure of a VSB frame, wherein one VSB frame consists of 2 VSB fields (i.e., an odd field and an even field). Herein, each VSB field includes a field synchronization segment and 312 data segments.

FIG. 3 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

Figure 4:
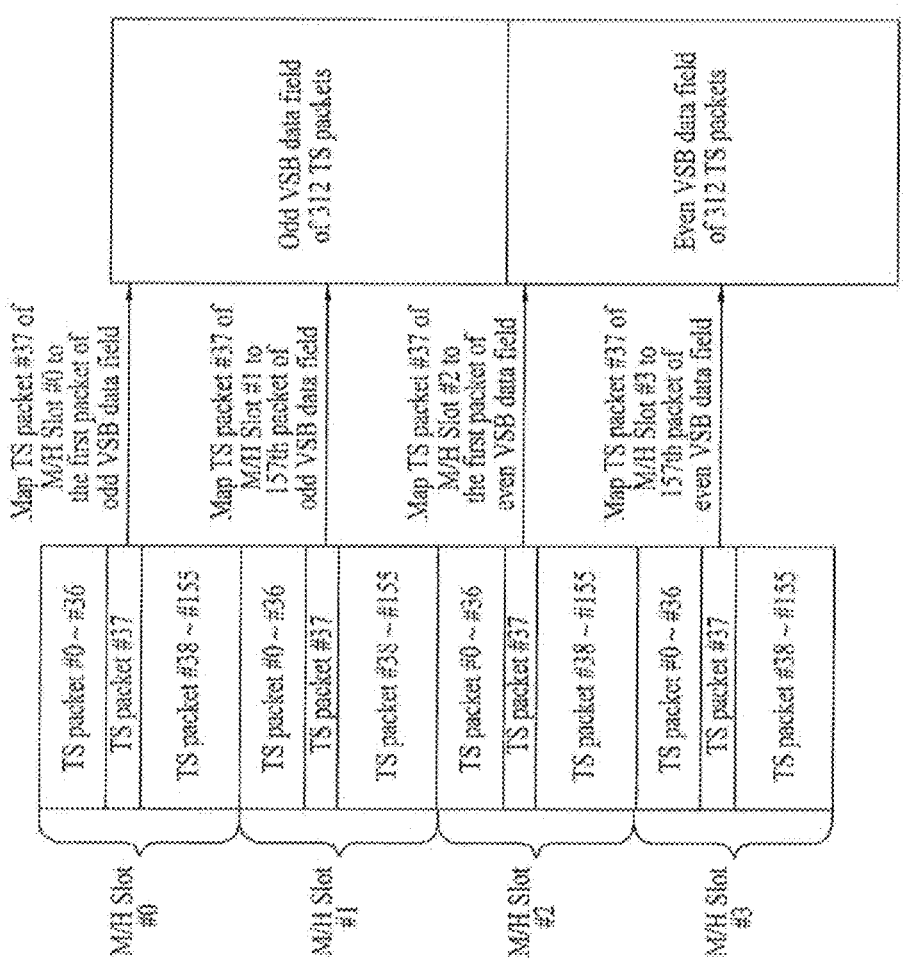
FIG. 4 illustrates a mapping example of the positions to which the first 4 slots of a sub-frame are assigned with respect to a VSB frame in a space region.

FIG. 4 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time period for multiplexing the mobile service data and the main service data. Herein, one slot may either include the mobile service data or be configured only of the main service data.

If one M/H frame is transmitted during one slot, the first 118 data packets within the slot correspond to a data group. And, the remaining 38 data packets become the main service data packets. In another example, when no data group exists in a slot, the corresponding slot is configured of 156 main service data packets.

Meanwhile, when the slots are assigned to a VSB frame, an offset exists for each assigned position.

FIG. 4 illustrates a mapping example of the positions to which the first 4 slots of a sub-frame are assigned with respect to a VSB frame in a space region. And, FIG. 5 illustrates a mapping example of the positions to which the first 4 slots of a sub-frame are assigned with respect to a VSB frame in a time region.

Figure 5:
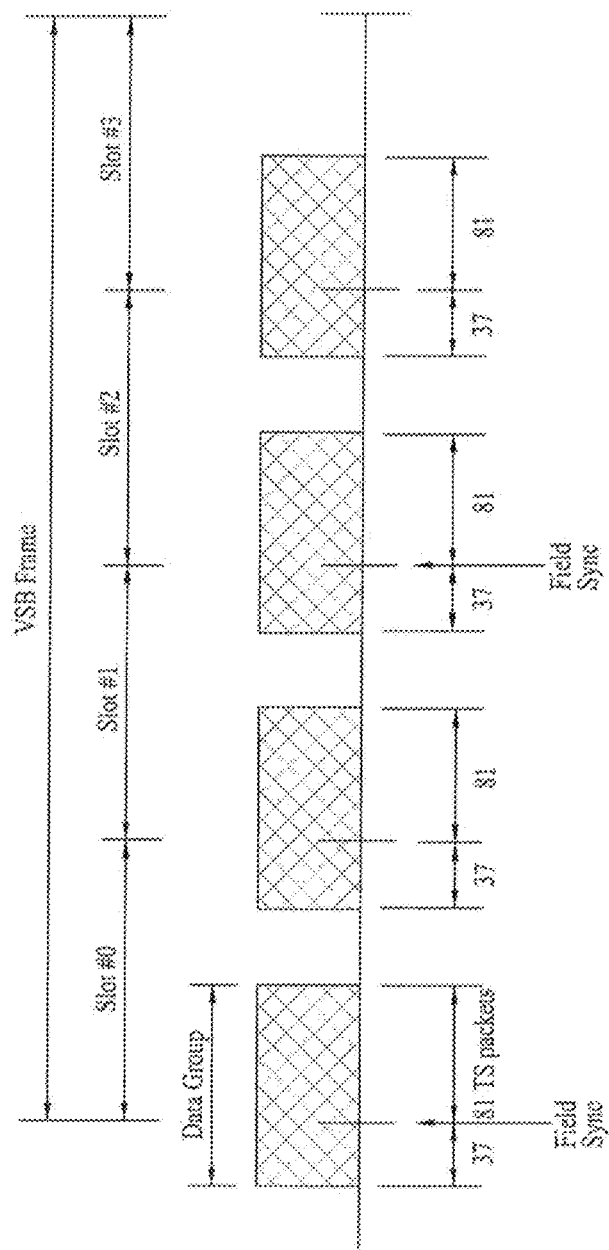
FIG. 5 illustrates a mapping example of the positions to which the first 4 slots of a sub-frame are assigned with respect to a VSB frame in a time region.

Referring to FIG. 4 and FIG. 5, a 38th data packet (TS packet #37) of a 1st slot (Slot #0) is mapped to the 1st data packet of an odd VSB field. A 38th data packet (TS packet #37) of a 2nd slot (Slot #1) is mapped to the 157th data packet of an odd VSB field. Also, a 38th data packet (TS packet #37) of a 3rd slot (Slot #2) is mapped to the 1st data packet of an even VSB field. And, a 38th data packet (TS packet #37) of a 4th slot (Slot #3) is mapped to the 157th data packet of an even VSB field. Similarly, the remaining 12 slots within the corresponding sub-frame are mapped in the subsequent VSB frames using the same method.

Meanwhile, one data group may be divided into at least one or more hierarchical regions. And, depending upon the characteristics of each hierarchical region, the type of mobile service data being inserted in each region may vary. For example, the data group within each region may be divided (or categorized) based upon the receiving performance.

According to the embodiment of the present invention, a data group prior to being processed with data interleaving is divided into regions A, B, C, and D. At this point, the data group may further include region E. Herein, the size of region E is variable, and each group may include a number of data packets equal to or less than 38. More specifically, according to the embodiment of the present invention, region E may include a maximum of 38 data packets within a single group.

Figure 6:
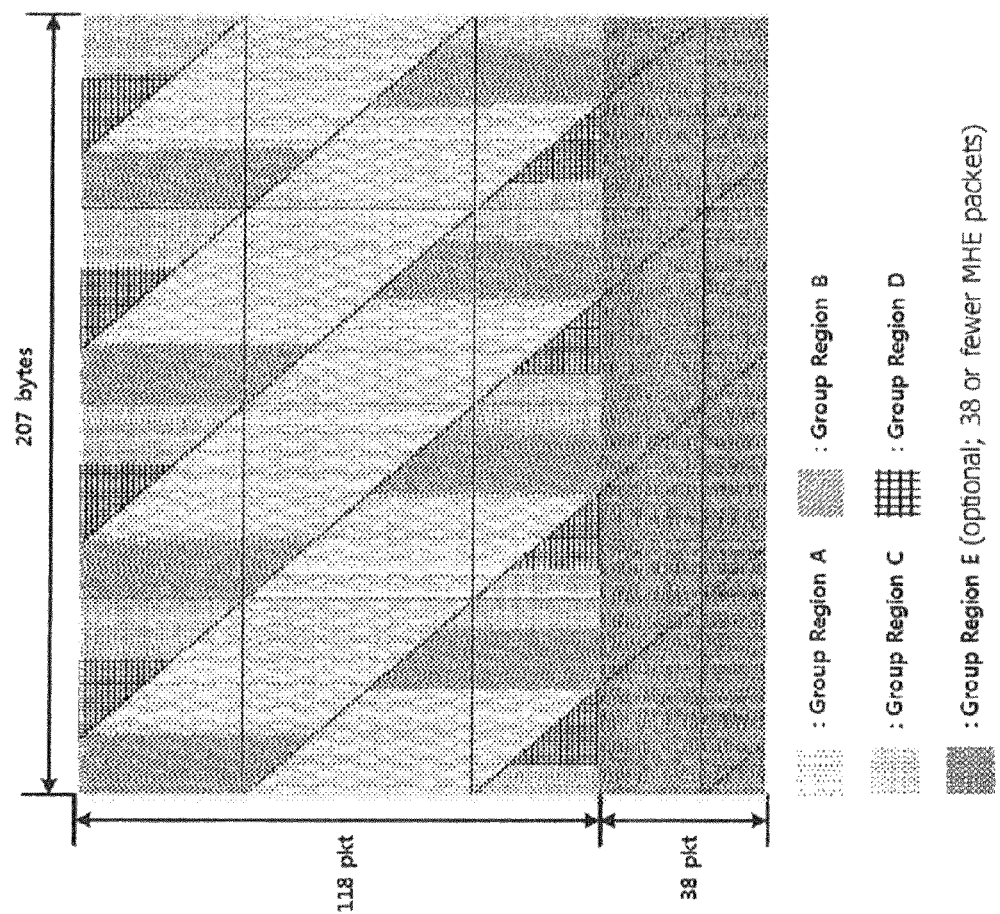
FIG. 6 illustrates a data group including (118+M) mobile service data packets according to an embodiment of the present invention.

FIG. 6 illustrates a data group including (118+M) mobile service data packets according to an embodiment of the present invention.

Referring to FIG. 6, the data group includes A, B, C, D and E regions. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<38) as shown in FIG. 6, a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

Also, the mobile service data being allocated to one group may be broadly divided into two types of mobile modes. Herein, one of the mobile modes is referred to as a first mobile mode or a Core Mobile Mode (CMM), and the other mobile mode is referred to as a second mobile mode or an Extended Mobile Mode (EMM) or a Scalable Full Channel Mobile Mode (SFCMM). Furthermore, the first mobile mode and the second mobile mode may be collectively referred to as the Scalable Full Channel Mobile Mode (SFCMM). At this point, the mobile service data of the first mobile mode and the mobile service data of the second mobile mode may be encoded at a coding rate of $\frac{1}{2}$, $\frac{1}{3}$, or $\frac{1}{4}$.

The first mobile mode corresponds to a mode that is compatible with the conventional mobile broadcasting system. And, the second mobile mode may be either compatible or non-compatible with the conventional mobile service data. However, the second mobile mode corresponds to a mode that transmits data that cannot be recognized (or acknowledged) by the conventional mobile broadcasting system.

Only mobile service data of the first mobile mode may be allocated to one group, or only mobile service data of the second mobile mode may be allocated to the one group. Alternatively, both the mobile service data of the first mobile mode and the mobile service data of the second mobile mode may both be allocated to one group.

Figure 7:
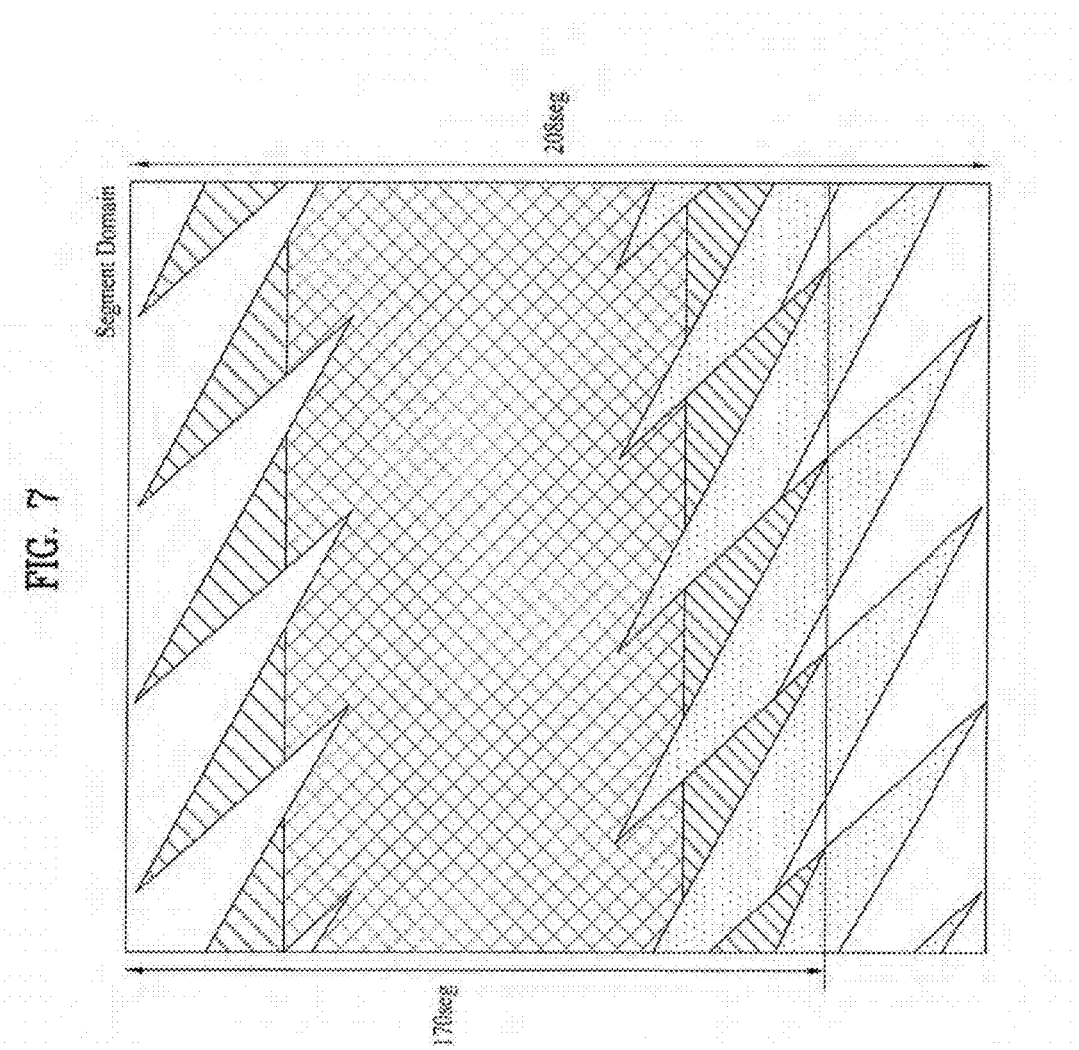
FIG. 7 illustrates a structure of a data group after being processed with interleaving according to the embodiment of the present invention, wherein the data group includes (118+M) number of mobile service data packets.

FIG. 7 illustrates a structure of a data group after being processed with interleaving according to the embodiment of the present invention, wherein the data group includes (118+M) number of mobile service data packets.

A data group structure shown in FIG. 7 is transmitted to the receiving system. More specifically, one data packet is data-interleaved and dispersed (or distributed) to a plurality of segments, thereby being transmitted to the receiving system. FIG. 7 shows an example of a single group distributed to 208 data segments. At this point, since one data packet of 207 bytes has the same data size of one data segment, a packet prior to being data-interleaved may be used as the concept of a packet.

FIG. 8 illustrates various examples of mobile service data of the first mobile mode and mobile service data of the second mobile mode being allocated to a group.

According to the embodiment of the present invention, as shown in FIG. 8, the mobile service data of the first mobile mode and the mobile service data of the second mobile mode are allocated as shown in FIG. 8 (a) to FIG. 8 (d).

FIG. 8 shows an example wherein the mobile service data of the first mobile mode are allocated to regions A, B, C, and D within the data group, and wherein the mobile service data of the second mobile mode are not allocated. In this case, region E does not exist in the group, and main service data are allocated (or assigned) to the respective region. According to the embodiment of the present invention, this exemplary case will be referred to as group type 0. More specifically, when it is assumed that the number of mobile service data packets forming one data group corresponds to (118+M), then in case FIG. 8 (a), the value of M is equal to 0.

FIG. 8 shows an example wherein the mobile service data of the first mobile mode are allocated (or assigned) to regions A, B, C, and D within the data group, and wherein the mobile service data of the second mobile mode are allocated to region E. According to the embodiment of the present invention, this exemplary case will be referred to as group type 1. More specifically, the mobile service data being transmitted through regions A, B, C, and D within the data group may be validly used in the conventional mobile broadcasting system.

FIG. 8 shows an example wherein the mobile service data of the first mobile mode are allocated (or assigned) to regions A and B, within the data group, and wherein the mobile service data of the second mobile mode are allocated to regions C, D, and E. According to the embodiment of the present invention, this exemplary case will be referred to as group type 2. More specifically, the mobile service data being transmitted through regions A and B within the data group may be received and validly decoded by the conventional mobile broadcasting system. However, the mobile service data being transmitted through regions C, D, and E within the data group are not processed as valid information by the conventional mobile broadcasting system.

FIG. 8 shows an example wherein the mobile service data of the second mobile mode are allocated to regions A, B, C, D, and E within the data group, and wherein the mobile service data of the first mobile mode are not allocated. According to the embodiment of the present invention, this exemplary case will be referred to as group type 3. Herein, the mobile service data being transmitted through regions A, B, C, D, and E within the data group are not processed as valid information by the conventional mobile broadcasting system.

As described above, the group type is decided depending upon how the 156 data packets being included in one data group are used. In other words, the group type is decided depending upon which one of regions A, B, C, and D will be used for the mobile service data of the second mobile mode.

Meanwhile, one data group may include a maximum of 156 data packets. Herein, among the 156 data packets, 118 data packets are assigned to regions A, B, C, and D, and a portion of the remaining 38 data packets or all of the remaining 38 data packets are assigned to region E. At this point, none of the data packets may be assigned to region E. In this case, as shown in FIG. 8 (a), region E does not exist in the corresponding data group. In the data group that does not include a region E, mobile service data of the first mobile mode are assigned (or allocated) to the 118 data packets included in region A, B, C, and D, and main service data are assigned to the remaining 38 data packets. More specifically, in the data group that does not include region E, mobile service data of the second mobile mode are not assigned.

This indicates that only the mobile service data of the second mobile mode are assigned to region E within the data group, as shown in FIG. 8 (b) to FIG. 8 (d). More specifically, the mobile service data of the first mobile mode Furthermore, in a data group including region E, the mobile service data of the second mobile mode may be further assigned to at least one of regions A, B, C, and D.

If the mobile service data of the second mobile mode are assigned to all of the regions A, B, C, D, and E, as shown in FIG. 8 (d), mobile service data of the first mobile mode cannot be assigned to the corresponding data group. With the exception for the case wherein the mobile service data of the second mobile mode are assigned to all of the regions A, B, C, D, and E, as shown in FIG. 8 (*d*), the mobile service data of the first mobile mode are assigned to at least one of regions A, B, C, and D.

Also, even when region E does not exist is a specific data group, the number of data packets included in region E may vary. More specifically, region E may include a number of data packets ranging from a minimum of 0 data packet to a maximum of 38 data packets.

FIG. 9 illustrates an example of a mobile service data packet being allocated to region E within the data group according to an embodiment to the present invention.

FIG. 9 shows an example of region E not being assigned (or allocated). Herein, main service data are assigned to the 38 data packets within the corresponding data group. More specifically, data packets that are used for mobile services of the second mobile mode do not exist. In this case, according to the embodiment of the present invention, regions, A, B, C, and D of the corresponding group are also not used for the mobile services of the second mobile mode.

FIG. 9 shows an example of 38 data packets being assigned to region E. In this case, main service data are not assigned to the corresponding group. More specifically, the 38 data packets that are included in region E may be used for mobile services of the second mobile mode.

FIG. 9 shows an example of 37 data packets being assigned to region E. In this case, main service data are assigned to one data packet within the corresponding data group. According to the embodiment of the present invention, among the 38 data packets, the slowest data packet (i.e., the data packet chronologically placed in the last position) is excluded from region E, and the one data packet that is excluded from region E is used for the main service. More specifically, the 37 data packets included in region E may be used for the mobile services of the second mobile mode.

FIG. 9 shows an example of 36 data packets being assigned to region E. In this case, main service data are assigned to two data packets within the corresponding data group. According to the embodiment of the present invention, among the 38 data packets, the fastest data packet (i.e., the data packet chronologically placed in the first position) and the slowest data packet (i.e., the data packet chronologically placed in the last position) are excluded from region E, and the two data packets that are excluded from region E are used for the main services. More specifically, the 36 data packets included in region E may be used for the mobile services of the second mobile mode.

FIG. 9 shows an example of 34 data packets being assigned to region E. In this case, main service data are assigned to four (4) data packets within the corresponding data group. According to the embodiment of the present invention, among the 38 data packets, the two fastest data packets (i.e., the two data packets chronologically placed in the first two positions) and the two slowest data packets (i.e., the two data packets chronologically placed in the last two positions) are excluded from region E, and the four data packets that are excluded from region E are used for the main services. More specifically, the 34 data packets included in region E may be used for the mobile services of the second mobile mode.

FIG. 9 shows an example of 30 data packets being assigned to region E. In this case, main service data are assigned to eight (8) data packets within the corresponding data group. According to the embodiment of the present invention, among the 38 data packets, the four fastest data packets (i.e., the four data packets chronologically placed in the first four positions) and the four slowest data packets (i.e., the four data packets chronologically placed in the last four positions) are excluded from region E, and the eight data packets that are excluded from region E are used for the main services. More specifically, the 30 data packets included in region E may be used for the mobile services of the second mobile mode.

More specifically, among the remaining 38 data packets excluding the 118 data packets within the data group, region E includes the data packets that are used for the mobile service of the second mobile mode.

According to the embodiment of the present invention, each group type is further segmented based upon the size of region E.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<38), a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

FIG. 10 illustrates an example of each group type being segmented based upon the size of region E according to an embodiment of the present invention.

At this point, group type 0 corresponds to when region E does not exist, and, in this case, further segmentation is not performed. In the data group of group type 0, a primary group division includes regions A, B, C, and D or includes regions A and B. Also, either a secondary group division does not exist, or a secondary group division includes regions C and D.

Depending upon the size of region E, group type 1 may be further segmented to 5 group types (i.e., group types 1-0, 1-1, 1-2, 1-4, and 1-8). In the data group of group type 1, a primary group division includes regions A, B, C, and D, and a secondary group division includes region E.

At this point, group type 1-0 (G1-0) corresponds to a group type configured by combining FIG. 8 (*b*) and FIG. 9 (*b*). Herein, the mobile service data of the second mobile mode are assigned (or allocated) only to region E, and region E includes 38 data packets. Group type 1-1 (G1-1) corresponds to a group type configured by combining FIG. 8 (*b*) and FIG. 9 (*c*). Herein, the mobile service data of the second mobile mode are assigned (or allocated) only to region E, and region E includes 37 data packets. Group type 1-2 (G1-2) corresponds to a group type configured by combining FIG. 8 (*b*) and FIG. 9 (*d*). Herein, the mobile service data of the second mobile mode are assigned (or allocated) only to region E, and region E includes 36 data packets. Group type 1-4 (G1-4) corresponds to a group type configured by combining FIG. 8 (*b*) and FIG. 9 (*e*). Herein, the mobile service data of the second mobile mode are assigned (or allocated) only to region E, and region E includes 34 data packets. And, group type 1-8 (G1-8) corresponds to a group type configured by combining FIG. 8 (*b*) and FIG. 9 (*f*). Herein, the mobile service data of the second mobile mode are assigned (or allocated) only to region E, and region E includes 30 data packets.

Depending upon the size of region E, group type 2 may be further segmented to 5 group types (i.e., group types 2-0, 2-1, 2-2, 2-4, and 2-8). In the data group of group type 2, a primary group division includes regions A and B, and a secondary group division includes regions C, D, and E.

At this point, group type 2-0 (G2-0) corresponds to a group type configured by combining FIG. 8 (*c*) and FIG. 9 (*b*). Herein, the mobile service data of the second mobile mode are assigned (or allocated) only to regions C, D, and E. Herein, region E includes 38 data packets. Group type 2-1 (G2-1) corresponds to a group type configured by combining FIG. 8 (*c*) and FIG. 9 (*c*). Herein, the mobile service data of the second mobile mode are assigned (or allocated) only to regions C, D, and E. Herein, region E includes 37 data packets. Group type 2-2 (G2-2) corresponds to a group type configured by combining FIG. 8 (*c*) and FIG. 9 (*d*). Herein, the mobile service data of the second mobile mode are assigned (or allocated) only to regions C, D, and E. Herein, region E includes 36 data packets. Group type 2-4 (G2-4) corresponds to a group type configured by combining FIG. 8 (*c*) and FIG. 9 (*e*). Herein, the mobile service data of the second mobile mode are assigned (or allocated) only to regions C, D, and E. Herein, region E includes 34 data packets. And, group type 2-8 (G2-8) corresponds to a group type configured by combining FIG. 8 (*c*) and FIG. 9 (*f*). Herein, the mobile service data of the second mobile mode are assigned (or allocated) only to regions C, D, and E. Herein, region E includes 30 data packets.

Depending upon the size of region E, group type 3 may be further segmented to 5 group types (i.e., group types 3-0, 3-1, 3-2, 3-4, and 3-8). In the data group of group type 3, a primary group division includes regions A, B, C, D, and E, and a secondary group division does not exist.

At this point, group type 3-0 (G3-0) corresponds to a group type configured by combining FIG. 8 (*d*) and FIG. 9 (*b*). Herein, the mobile service data of the second mobile mode are assigned (or allocated) only to regions A, B, C, D, and E. Herein, region E includes 38 data packets. Group type 3-1 (G3-1) corresponds to a group type configured by combining FIG. 8 (*d*) and FIG. 9 (*c*). Herein, the mobile service data of the second mobile mode are assigned (or allocated) only to regions A, B, C, D, and E. Herein, region E is configured of 37 data packets. Group type 3-2 (G3-2) corresponds to a group type configured by combining FIG. 8 (*d*) and FIG. 9 (*d*). Herein, the mobile service data of the second mobile mode are assigned (or allocated) only to regions A, B, C, D, and E. Herein, region E includes 36 data packets. Group type 3-4 (G3-4) corresponds to a group type configured by combining FIG. 8 (*d*) and FIG. 9 (*e*). Herein, the mobile service data of the second mobile mode are assigned (or allocated) only to regions A, B, C, D, and E. Herein, region E includes 34 data packets. And, group type 3-8 (G3-8) corresponds to a group type configured by combining FIG. 8 (*d*) and FIG. 9 (*f*). Herein, the mobile service data of the second mobile mode are assigned (or allocated) only to regions A, B, C, D, and E. Herein, region E includes 30 data packets.

More specifically, the group format of group type 2 and the group format group type 3 are identical to one another. In other words, the same group map may be used for group type 2 and group type 3.

In FIG. 10, group type 4 (G3) is not further segmented to a lower-level group type. And, in this case, the 156 data packets are all used for the mobile service data. At this point, mobile service data are also assigned to an MPEG header and RS parity data positions within the 156 data packets.

In other words, in the case where the data group does not include main service data, the RS parity and the MPEG header for backward compatibility need not be used, such that an area reserved for the RS parity and the MPEG header is allocated to an area for mobile service data and forms a block contained in the E region.

At this point, a parade includes group divisions of groups having the same group type. For example, an arbitrary primary parade is configured of primary group divisions of groups corresponding to group type 1-1. In other words, the data of one parade are assigned and transmitted to group divisions of groups having the same group type. For example, the data of an arbitrary primary parade are assigned and transmitted to a primary group division of groups having the same group type.

Meanwhile, the primary parade and the second parade according to the embodiment of the present invention share the same parade identifier and the same Number Of Group (NOG). Herein, the NOG refers to a number of groups within one subframe. For example, when the NOG of the primary parade is equal to 4, the NOG of the secondary parade should also be equal to 4. More specifically, the secondary parade always forms a pair with the primary parade and is dependent to the primary parade. Therefore, each of the secondary parades is transmitted through the same slot as that of its paired primary parade.

Conversely, the overlay parade is not paired with the primary parade. More specifically, although the secondary parade and the overlay parade are both transmitted through a secondary group division within a group, the overlay parade is not dependent to the corresponding primary parade. Therefore, each of the primary parade and the overlay parade has a different parade identifier, and the NOG of each of the primary parade and the overlay parade may either be identical to one another or be different from one another. More specifically, the NOG boundary of the primary parade may be different from the NOG boundary of the overlay parade. Nevertheless, the overlay parade includes secondary group divisions of groups having the same group type. In other words, the data of the overlay parade are transmitted through the secondary group divisions of groups having the same group type. Accordingly, in order to have the receiving system receive and process the overlay parade, signaling information of the overlay parade is required. The signaling information may correspond to a number of overlay parades being assigned to one subframe, an identifier of each overlay parade, and so on. According to the embodiment of the present invention, the signaling information of the overlay parade is inserted in at least one of a field synchronization region and a signaling information region within a group, so as to be transmitted. The signaling method of the overlay parade will be described in detail later on.

At this point, a method of assigning (or allocating) groups to each slot may be identically applied to all subframes within a single M/H frame. Alternatively, the method of assigning (or allocating) groups to each slot may be differently applied for each subframe. At this point, when it is assumed that group assignment (or allocation) is identically applied to all subframes within the M/H frame, the number of groups being assigned to one M/H frame becomes a multiple of 5.

Also, according to the embodiment of the present invention, a plurality of groups included in one parade is assigned to be spaced apart as far away from one another as possible within the subframe. Thus, the data may be able to respond with robustness against burst errors that may occur within a subframe.

For example, when it is assumed that 3 groups are assigned (or allocated) to one subframe, each group is assigned to a first slot (Slot #0), a fifth slot (Slot #4), and a ninth slot (Slot #8) within the corresponding subframe. Accordingly, when it is assumed that 16 groups are assigned to one subframe by using the above-described assignment (or allocation) rule, the 16 groups are assigned by the order of Slot #0, Slot #4, Slot #8, Slot #12, Slot #2, Slot #6, Slot #10, Slot #14, Slot #1, Slot #5, Slot #9, Slot #13, Slot #3, Slot #7, Slot #11, and Slot #15.

Equation 1 below shows the above-described rule for assigning a plurality of groups to one sub-frame in the form of a mathematical equation.

$$j = (4i + O) \bmod 16 \quad \text{[Equation 1]}$$

Herein, $O = 0$ if $i < 4$,
$= 2$ else if $i < 8$
$= 1$ else if $i < 12$,
$= 3$ else.

Also, j indicates the slot number within one subframe. Herein, j may have a value ranging from 0 to 15. Furthermore, i represents a group number. Herein, i may have a value also ranging from 0 to 15.

At this point, groups respective to one parade may be assigned to one subframe. Alternatively, groups respective to a plurality of parades may also be assigned to one subframe. The assignment of groups respective to a plurality of parades is no different from (or identical to) the assignment of group respective to a single parade. More specifically, groups within another parade being assigned to one M/H frame are respectively assigned at a cycle period of 4 slots. At this point, the group of the other parade may be assigned in a type of circular method starting from a slot that is not assigned with a group of a previous parade.

Furthermore, according to the embodiment of the present invention, when a plurality of parades is assigned to one subframe, the overlay parade is first assigned.

At this point, the corresponding group may include only primary group divisions, or may include both primary group divisions and secondary group divisions. Also, data of a primary parade may be assigned to the primary group divisions, and data of a secondary parade or an overlay parade may be assigned to the secondary group divisions. More specifically, data of one parade or data of two parades may be assigned to one group.

FIG. 11 illustrates a data group including (118+M) mobile service data packets according to an embodiment of the present invention.

Referring to FIG. 11 (a), the data group includes A, B, C, D and E regions. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions as shown in FIG. 6.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

Figure 11A:
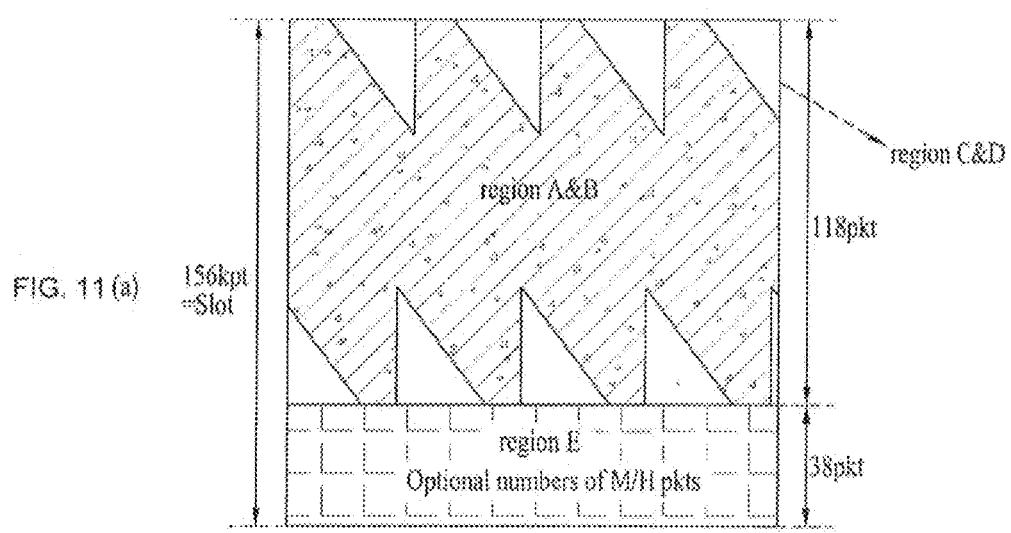
FIGS. 11 (*a*) and 11 (*b*) illustrate a data group including (118+M) mobile service data packets according to an embodiment of the present invention.

The mapping format of the mobile service data packets in the E region may be changed according to the intention of a designer. In other words, according to one embodiment of the present invention, when the number of mobile service data packets is 38 or less (i.e., M<38) as shown in FIG. 11(a), a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

Figure 11B:
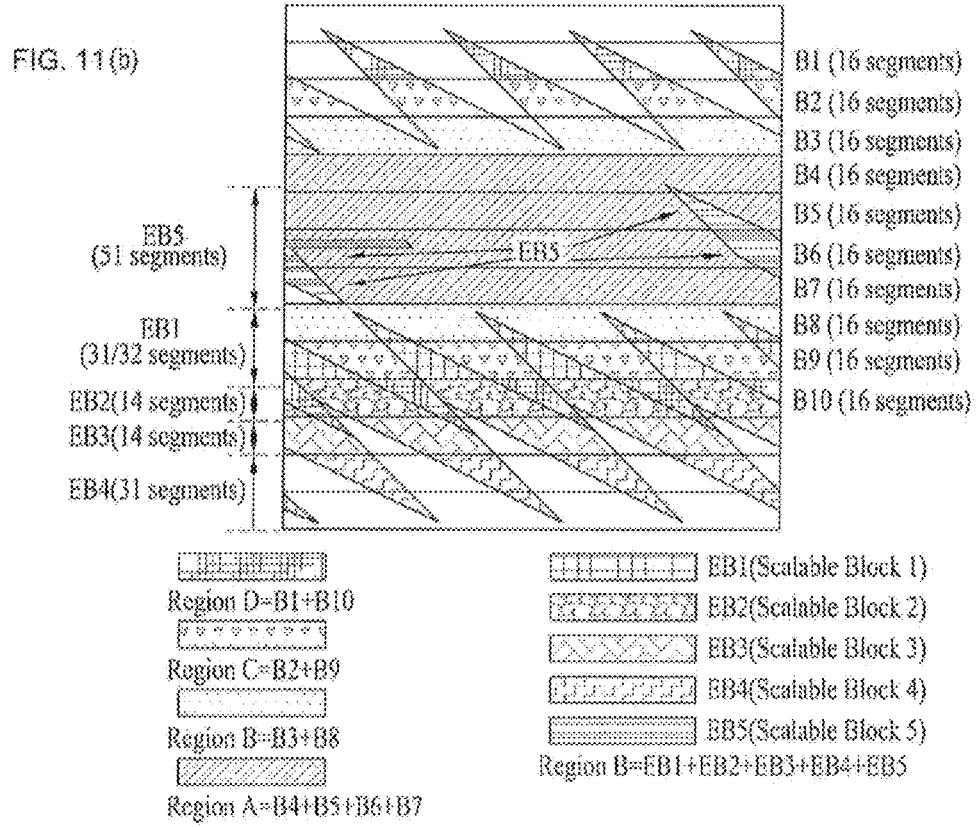

FIG. 11(b) illustrates a structure acquired after the data group including the E region as shown in FIG. 11(a) is interleaved.

As can be seen from FIG. 11(b), the data group including 118 mobile service data packets can be divided into four regions A, B, C and D. The A region is located at the center of the data group, and the B region is located at the exterior of the A region using the A region as a reference line. The C region is located at the exterior of the B region on the basis of the A and B regions. The D region is located at the exterior of the C area on the basis of the A, B, and C regions. The data group further includes the E region in which a plurality of blocks includes the scalable number of mobile data packets.

Referring to FIG. 11(b), 10 blocks (B1~B10) contained in the data group form A, B, C and D regions using the same pattern as in the data group shown in FIG. 6. However, the E region including M scalable mobile service data packets is formed as an additional block.

As can be seen from FIG. 11(b), the E region belonging to the data group may be contained in a plurality of blocks, and respective blocks may correspond to a scalable number of VSB segments. Mobile service data additionally transmitted through the E region is distributed to 4 or 5 blocks.

Meanwhile, in the case where the data group does not include main service data, the E region includes a block which includes an area of a place-holder that includes not only an RS parity but also an MPEG header for backward compatibility with a conventional digital broadcast system. In other words, in the case where the data group does not include main service data, the RS parity and the MPEG header for backward compatibility need not be used, such that an area reserved for the RS parity and the MPEG header is allocated to an area for mobile service data and forms a block contained in the E region.

Although 5 blocks are contained in the E region as shown in FIG. 11(b), the scope or spirit of the present invention is not limited only thereto. That is, the number of segments contained in each block of the E region may be scalable, such that the number of blocks contained in the E regions may also be scalable.

In the meantime, according to the present invention, the E region contained in the data group is determined by M scalable mobile service data packets, such that an appropriate number of mobile service data packets can be transmitted according to an amount of mobile service data to be transmitted, resulting in an increased transmission efficiency.

In addition, additional mobile service data packets are transmitted through the E regain of the data group, such that the demand of a user who desires to use a high-quality mobile service that requires a large amount of data can be satisfied.

In the present invention, the blocks included in the A, B, C and D regions may be referred to as first blocks or B1, B2, . . . , and the blocks included in the E region may be referred to as second blocks, E blocks (EBs) or scalable blocks.

Figure 12:
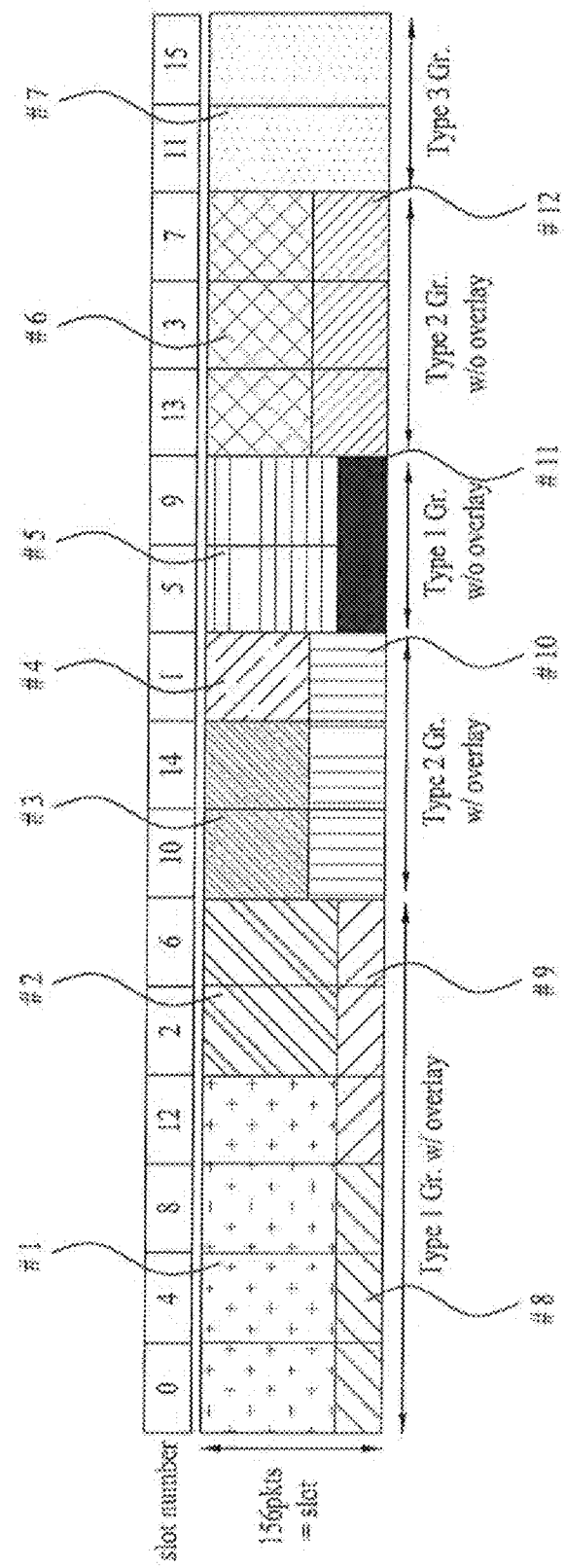
FIG. 12 illustrates an example of allocating a plurality of parades to one subframe within an M/H frame according to an embodiment of the present invention.

Referring to FIG. 11(b), one segment may be shared between different blocks. In the B8 block, the B9 block and the EB1 block, the B8 block and the B9 block include 16 segments and the EB1 block includes 31 or 32 segments. The 31 or 32 segments included in the EB1 block become segments including data included in the B8 block and the B9 block in a row direction. In the data group, one segment may be shared between the mobile data block and the scalable block. FIG. 12 illustrates an example of allocating a plurality of parades to one subframe within an M/H frame according to an embodiment of the present invention.

As shown in FIG. 12, groups of a plurality of parades may be assigned to slot positions according to the assignment rule of Equation 1.

Referring to FIG. 12, 7 primary parades (Parade #1 to Parade #7), 3 overlay parades (Parade #8 to Parade #10), and 2 secondary parades (Parade #11 and Parade #12) are assigned to 16 slots.

At this point, groups of group type 1 are assigned to Slot #0, Slot #4, Slot #8, Slot #12, Slot #2, and Slot #6, and groups of group type 2 are assigned to Slot #10, Slot #14, and Slot #1. Also, groups of group type 1 are assigned to Slot #5 and Slot #9, groups of group type 2 are assigned to Slot #13, Slot #3, and Slot #7, and groups of group type 3 are assigned to Slot #11 and Slot #15. More specifically, the secondary group division of the groups being assigned to Slot #0, Slot #4, Slot #8, Slot #12, Slot #2, and Slot #6 includes region E. And, mobile service data of the second mobile mode are transmitted to region E.

For example, data of primary parade #1 are assigned to a primary group division of the groups being assigned to Slot #0, Slot #4, Slot #8, and Slot #12, and data of primary parade #2 are assigned to a primary group division of the groups being assigned to Slot #2 and Slot #6. More specifically, the NOG of primary parade #1 is equal to 4, and the NOG of primary parade #2 is equal to 2. Conversely, data of overlay parade #8 are assigned to a secondary group division of the groups being assigned to Slot #0, Slot #4, and Slot #8, and data of overlay parade #9 are assigned to a secondary group division of the groups being assigned to Slot #12, Slot #2, and Slot #6. More specifically, the NOG of overlay parade #8 is equal to 3, and the NOG of overlay parade #9 is also equal to 3. As described above, the overlay parades are not dependent to the primary parades. And, accordingly, the NOG values are also different from one another. In some cases, however, the NOG values may be identical. Nevertheless, the parade identifiers are different from one another.

In another example, since the groups assigned to Slot #0, Slot #4, Slot #8, Slot #12, Slot #2, and Slot #6 correspond to the same group type (e.g., group type 1), the groups assigned to Slot #0, Slot #4, Slot #8, Slot #12, Slot #2, and Slot #6 may be included in a single overlay parade as a collection of secondary group divisions of the groups assigned to Slot #0, Slot #4, Slot #8, Slot #12, Slot #2, and Slot #6.

Furthermore, data of primary parade #3 are assigned to the primary group division of the groups being transmitted to Slot #10 and Slot #14. And, data of primary parade #4 are assigned to the primary group division of the group being transmitted to Slot #1. More specifically, the NOG of primary parade #3 is equal to 2, and the NOG of primary parade #4 is equal to 1. Conversely, data of overlay parade #10 are assigned to a secondary group division of the groups being assigned to Slot #10, Slot #14, and Slot #1. More specifically, the NOG of overlay parade #10 is equal to 3.

In yet another example, data of primary parade #5 are assigned to the primary group division of the groups being transmitted to Slot #5 and Slot #9. And, data of secondary parade #11 are assigned to the secondary group division of the groups being transmitted to Slot #5 and Slot #9. More specifically, the NOG of primary parade #5 and the NOG of secondary parade #11 are both equal to 2. As described above, the secondary parade forms a pair with the primary parade, and the primary parade and the secondary parade share the same NOG and the same parade identifier.

In yet another example, data of primary parade #6 are assigned to the primary group division of the groups being transmitted to Slot #13, Slot #3, and Slot #7. And, data of secondary parade #13 are assigned to the secondary group division of the groups being transmitted to Slot #13, Slot #3, and Slot #7. More specifically, the NOG of primary parade #6 and the NOG of secondary parade #13 are both equal to 3.

In yet another example, the groups being transmitted to Slot #11 and Slot #15 are included in the primary group division, and data of the primary parade #7 are assigned to the primary group division. More specifically, the primary group division of the groups being transmitted to Slot #11 and Slot #15 includes regions A, B, C, D, and E. And, mobile service data of the second mobile mode are assigned to regions A, B, C, D, and E.

As described above, groups of a plurality of parades may be assigned to one M/H frame. And, the assignment of the groups in one subframe is performed in series (or serially performed) from left to right having a group space of 4 slots. Also, when an overlay parade is included in the plurality of parades being assigned to one subframe, the groups of the overlay parade are assigned first. In case of FIG. 12, the groups of group type 1 including the secondary group division having data of overlay parade #8 assigned thereto are assigned first. Then, the groups of group type 1 including the secondary group division having data of overlay parade #9 assigned thereto are assigned afterwards. Thereafter, the groups of group type 2 including the secondary group division having data of overlay parade #10 assigned thereto are assigned. In case a plurality of overlay parades are assigned to one subframe, the order of assignment may be arbitrarily decided, or the order of assignment may be decided based upon a pre-arranged agreement.

Figure 13:
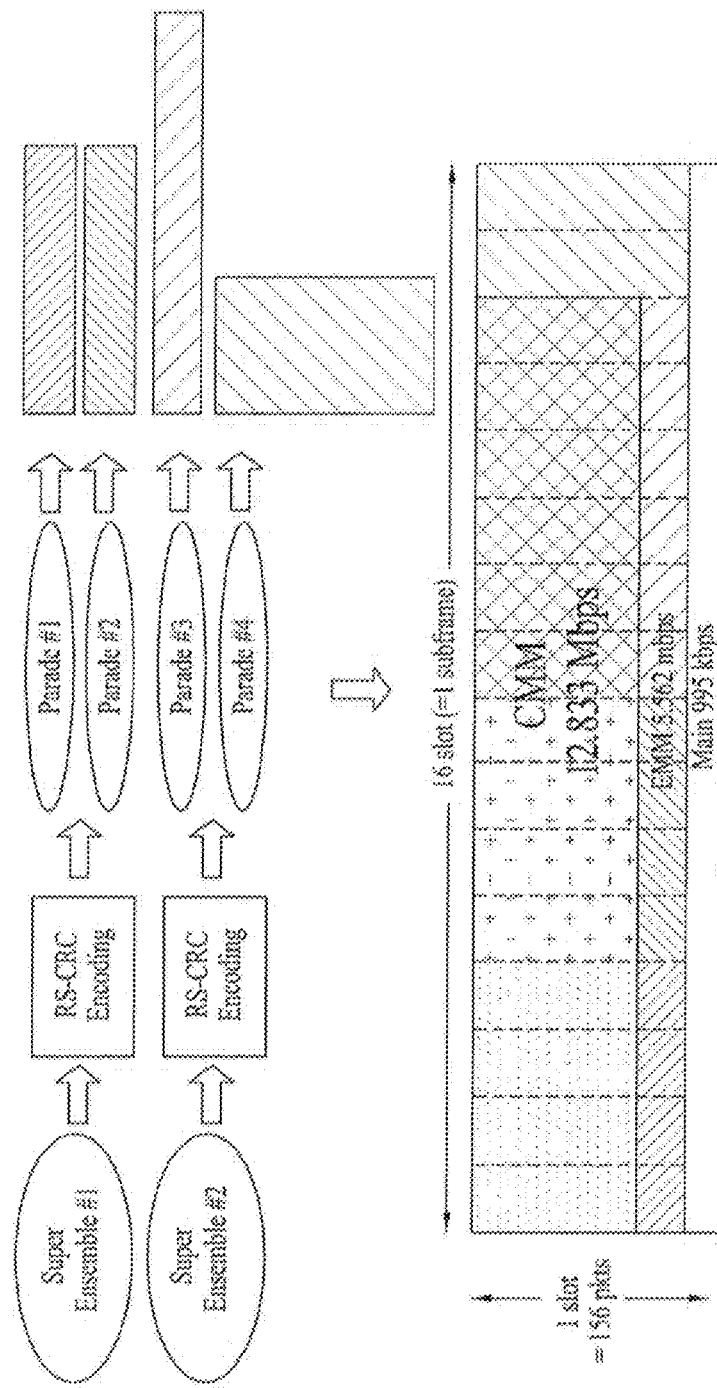
FIG. 13 illustrates the relation between a super ensemble, a super RS frame, and two parades according to an embodiment of the present invention.

FIG. 13 illustrates the relation between a super ensemble, a super RS frame, and two parades according to an embodiment of the present invention.

The super RS frame payload corresponds to a super RS frame, which is processed with RS-CRC encoding. Also, the super RS frame is transmitted through 2 random parades. At this point, the parade type of the two parades may be identical to one another or may be different from one another.

More specifically, super RS frame payload #1 is RS-CRC encoded so as to form super RS frame #1. And, super RS frame #1 is transmitted through parade #1 and parade #2. At this point, the parade types of parade #1 and parade #2 may not be identical to one another. For example, parade #1 may correspond to a secondary parade, and parade #2 may correspond to an overlay parade. In other words, parade #1 and parade #2 may be used to form one super RS frame.

Also, super RS frame payload #2 is RS-CRC encoded so as to form super RS frame #2. And, super RS frame #2 is transmitted through parade #3 and parade #4. At this point, also, the parade types of parade #3 and parade #4 may not be identical to one another. For example, parade #3 may correspond to a secondary parade, and parade #4 may correspond to a primary parade. In other words, parade #3 and parade #4 may be used to form one super RS frame.

As described above, the parade types of the two parades that transmit a single super RS frame are independent from one another.

Figure 14:
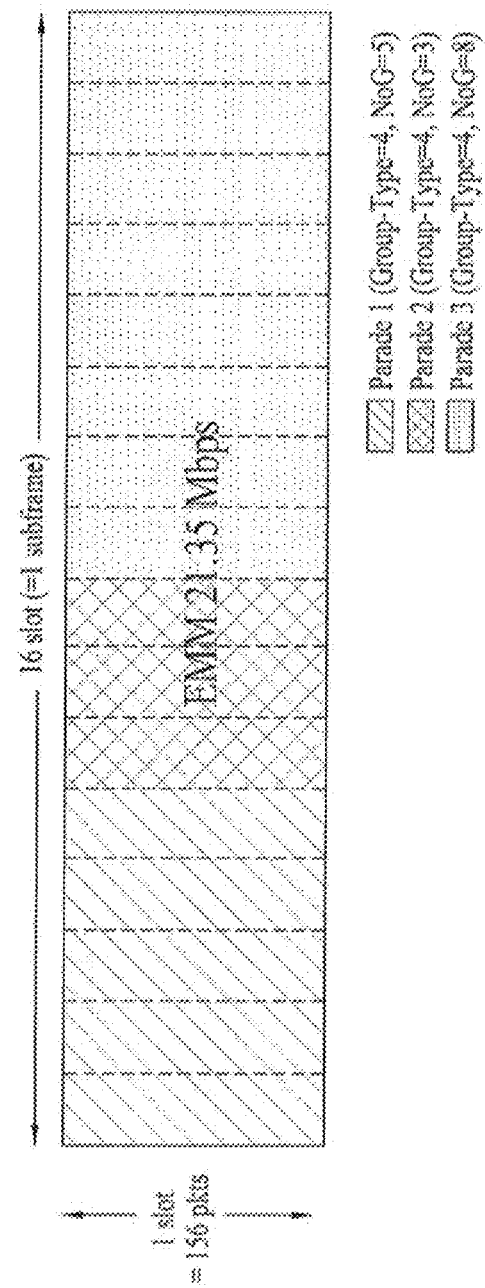
FIG. 14 illustrates an example of allocating parade #1 of group type 4 and having an NOG of 5, parade #2 of group type 4 and having an NOG of 3, and parade #3 of group type 4 and having an NOG of 8 to a subframe according to an embodiment of the present invention.

FIG. 14 illustrates an example of allocating parade #1 of group type 4 and having an NOG of 5, parade #2 of group type 4 and having an NOG of 3, and parade #3 of group type 4 and having an NOG of 8 to a subframe according to an embodiment of the present invention.

When it is assumed that the conventional data transmission rate is equal to 19.39 Mbps, and if the group corresponds to group type 4, the data transmission rate of group type 4 becomes greater than 19.39 Mbps. FIG. 14 shows an example of the data transmission rate increasing to 21.35 Mbps.

Meanwhile, among the above-described group types, group type 4 corresponds to a 100% full-channel mobile mode. Herein, the mobile service data being assigned to the group of group type 4 are not required to be backward compatible with the main service. Also, in order to increase the mobile channel capacity, only the actual mobile service data are assigned to the group of group type 4, and, accordingly, the MPEG header (i.e., TS packet header) or RS parity data are not assigned. More specifically, mobile service data are also assigned MPEG header and RS parity data positions.

Figure 15:
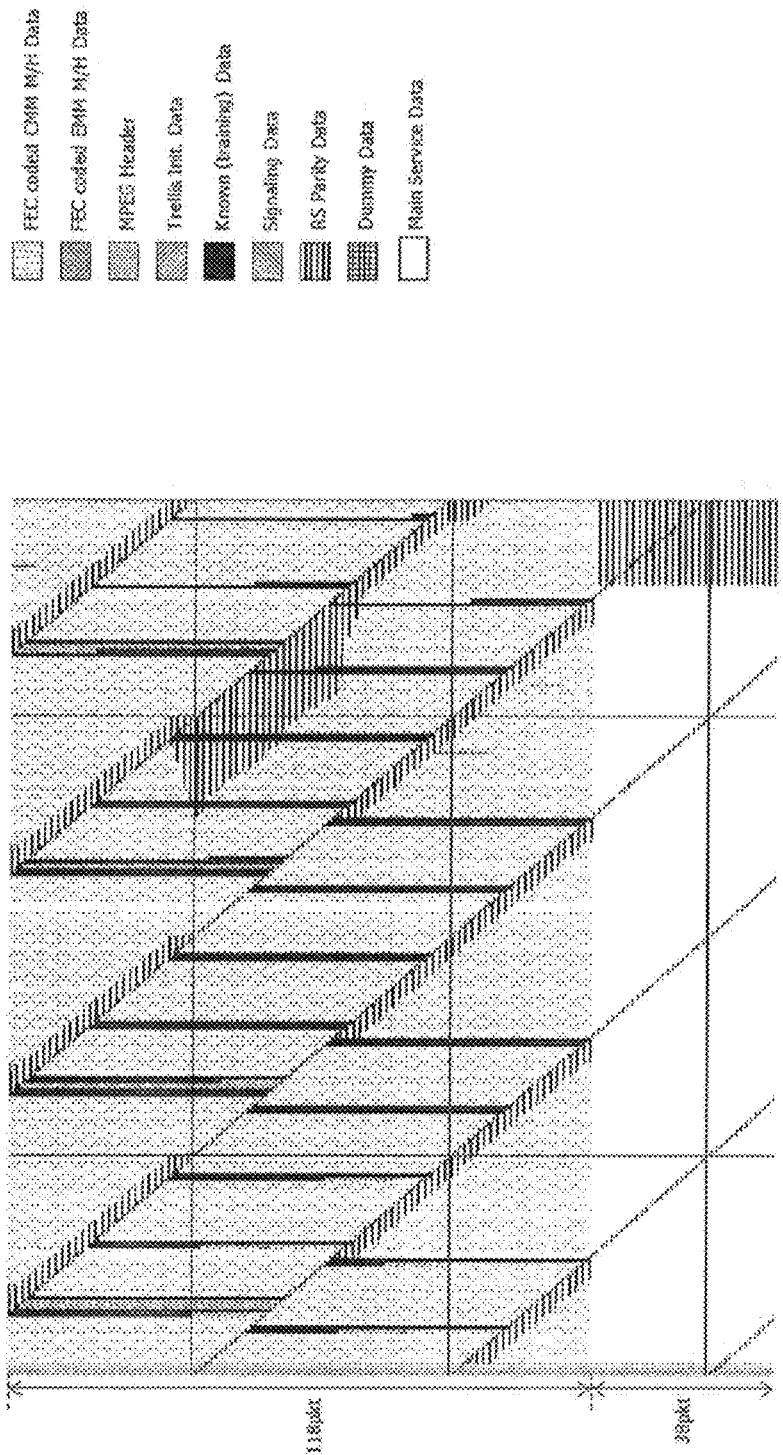
FIG. 15 illustrates group type 0 of data group, according to an embodiment of the present invention.

FIG. 15 illustrates group type 0 of data group, according to an embodiment of the present invention.

According to FIG. 15, a structure acquired before a data group is interleaved, when the data group includes 118 mobile service data packets.

Referring to FIG. 15, the data group includes 118 TS packets that include at least one of FEC-encoded mobile service data, MPEG header, trellis initialization data, known data, signaling data, RS parity data and dummy data. For convenience of description and better understanding of the present invention, a TS packet contained in the data group is defined as a mobile service data packet according to the present invention.

The data group shown in FIG. 15 includes 118 mobile service data packets, such that it can be recognized that the slot via which the above-mentioned data group is transmitted is used for transmitting 38 main service data packets.

Figure 16:
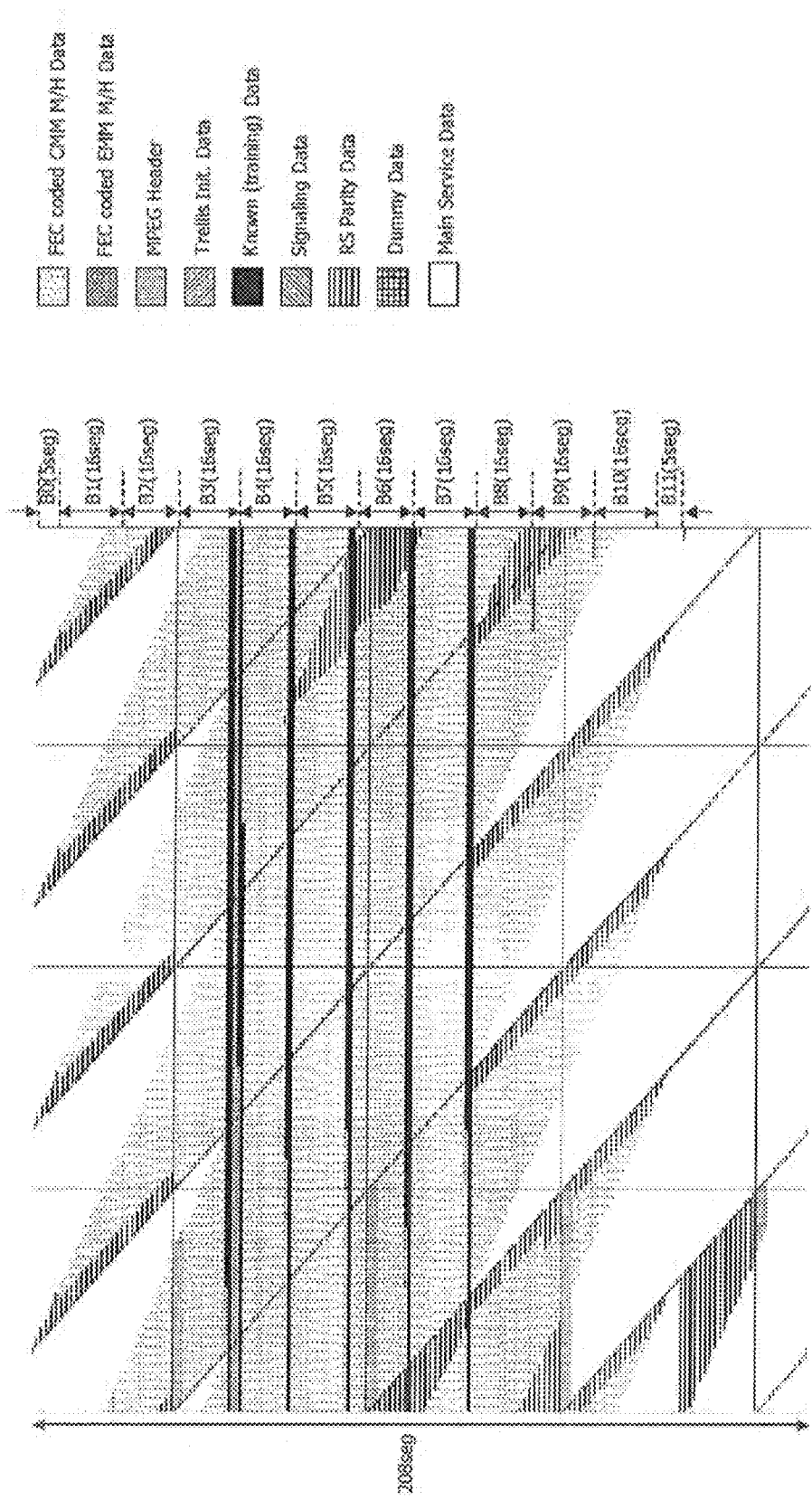
FIG. 16 illustrates a structure acquired after a group type 0 of data group data group is interleaved, when the data group includes 118 mobile service data packets, according to an embodiment of the present invention.

FIG. 16 illustrates a structure acquired after a group type 0 of data group data group is interleaved, when the data group includes 118 mobile service data packets, according to an embodiment of the present invention.

Referring to FIG. 16, the data group including 118 mobile service data packets is interleaved such that a data group including 170 segments is formed.

In this case, the above-mentioned example in which 118 mobile service data packets are distributed to 170 segments has been disclosed only for illustrative purposes and better understanding of the present invention. The number of data segments formed after the data group is interleaved may be changed to another according to the degree of interleaving.

FIG. 16 shows an example of dividing a data group prior to being data-interleaved into 10 data blocks (i.e., data block 1 (B1) to data block 10 (B10)). In other word, data block can be defined as a transmission block containing mobile service data or main and mobile service data in segment level. In this example, each data block has the length of 16 segments. Referring to FIG. 16, only the RS parity data are allocated to a portion of 5 segments before the data block 1 (B1) and 5 segments behind the data block 10 (B10 ). The RS parity data are excluded in regions A to D of the data group.

More specifically, when it is assumed that one data group is divided into regions A, B, C, and D, each data block may be included in any one of region A to region D depending upon the characteristic of each data block within the data group. At this point, according to an embodiment of the present invention, each DATA block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 16, data block 4 (B4) to data block 7 (B7) correspond to regions without interference of the main service data. Data block 4 (B4) to data block 7 (B7) within the data group shown in FIG. 16 correspond to a region where no interference from the main service data occurs. In this example, a long known data sequence is inserted at both the beginning and end of each data block. In the description of the present invention, the region including data block 4 (B4) to data block 7 (B7) will be referred to as "region A (=B4+B5+B6+B7)". As described above, when the data group includes region A having a long known data sequence inserted at both the beginning and end of each data block, the receiving system is capable of performing equalization by using the channel information that can be obtained from the known data. Therefore, the strongest equalizing performance may be yielded (or obtained) from one of region A to region D.

In the example of the data group shown in FIG. 16, data block 3 (B3) and data block 8 (B8) correspond to a region having little interference from the main service data. Herein, a long known data sequence is inserted in only one side of each data block B3 and B8. More specifically, due to the interference from the main service data, a long known data sequence is inserted at the end of data block 3 (B3), and another long known data sequence is inserted at the beginning of data block 8 (B8). In the present invention, the region including data block 3 (B3) and data block 8 (B8) will be referred to as "region B (=B3+B8)". As described above, when the data group includes region B having a long known data sequence inserted at only one side (beginning or end) of each data block, the receiving system is capable of performing equalization by using the channel information that can be obtained from the known data. Therefore, a stronger equalizing performance as compared to region C/D may be yielded (or obtained).

Referring to FIG. 16, data block 2 (B2) and data block 9 (B9) correspond to a region having more interference from the main service data as compared to region B. A long known data sequence cannot be inserted in any side of data block 2 (B2) and data block 9 (B9). Herein, the region including data block 2 (B2) and data block 9 (B9) will be referred to as "region C (=B2+B9)".

Finally, in the example shown in FIG. 16, data block 1 (B1) and data block 10 (B10) correspond to a region having more interference from the main service data as compared to region C. Similarly, a long known data sequence cannot be inserted in any side of data block 1 (B1) and data block 10 (B10).

Referring to FIG. 16, it can be readily recognized that the regions A and B of the data group includes signaling data used for signaling at a reception end.

Figure 17:
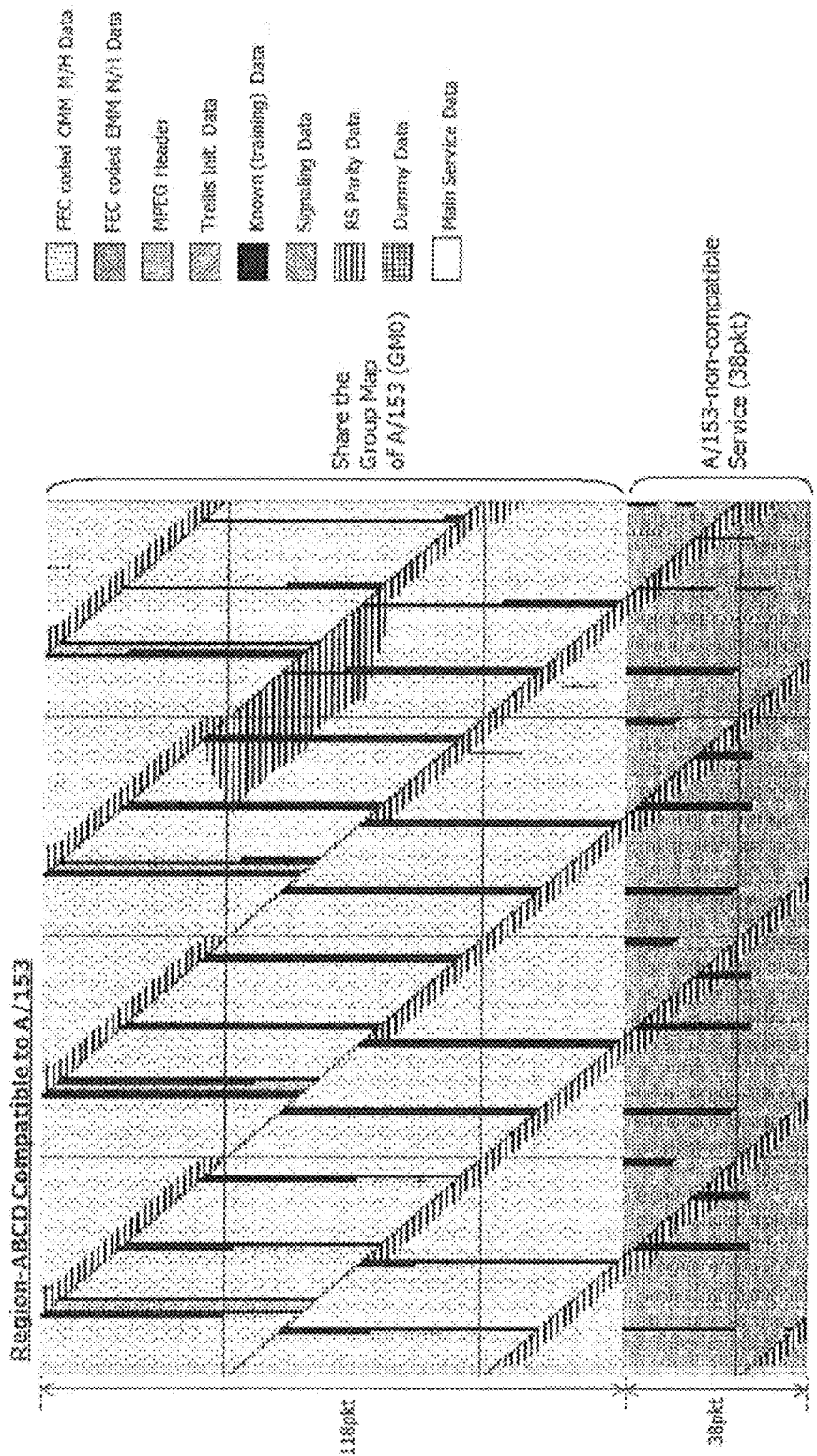
FIG. 17 illustrates group type 1-0 of data group, according to an embodiment of the present invention.

FIG. 17 illustrates group type 1-0 of data group, according to an embodiment of the present invention.

According to FIG. 17, a structure provided before a data group is interleaved, when the data group includes (118+38) mobile service data packets.

Referring to FIG. 17, the data group includes mobile service data of the A and B regions, mobile service data of the C and D regions, mobile service data of the E region, an MPEG header, trellis initialization data, known data, signaling data, RS parity data, and dummy data.

As shown in FIG. 17, the E region has no main service data packets, such that the region for the RS parity and the MPEG header is not present in the E region. Therefore, the above-mentioned regions may be adapted to transmit mobile service data, such that much more mobile service data can be transmitted.

Figure 18:
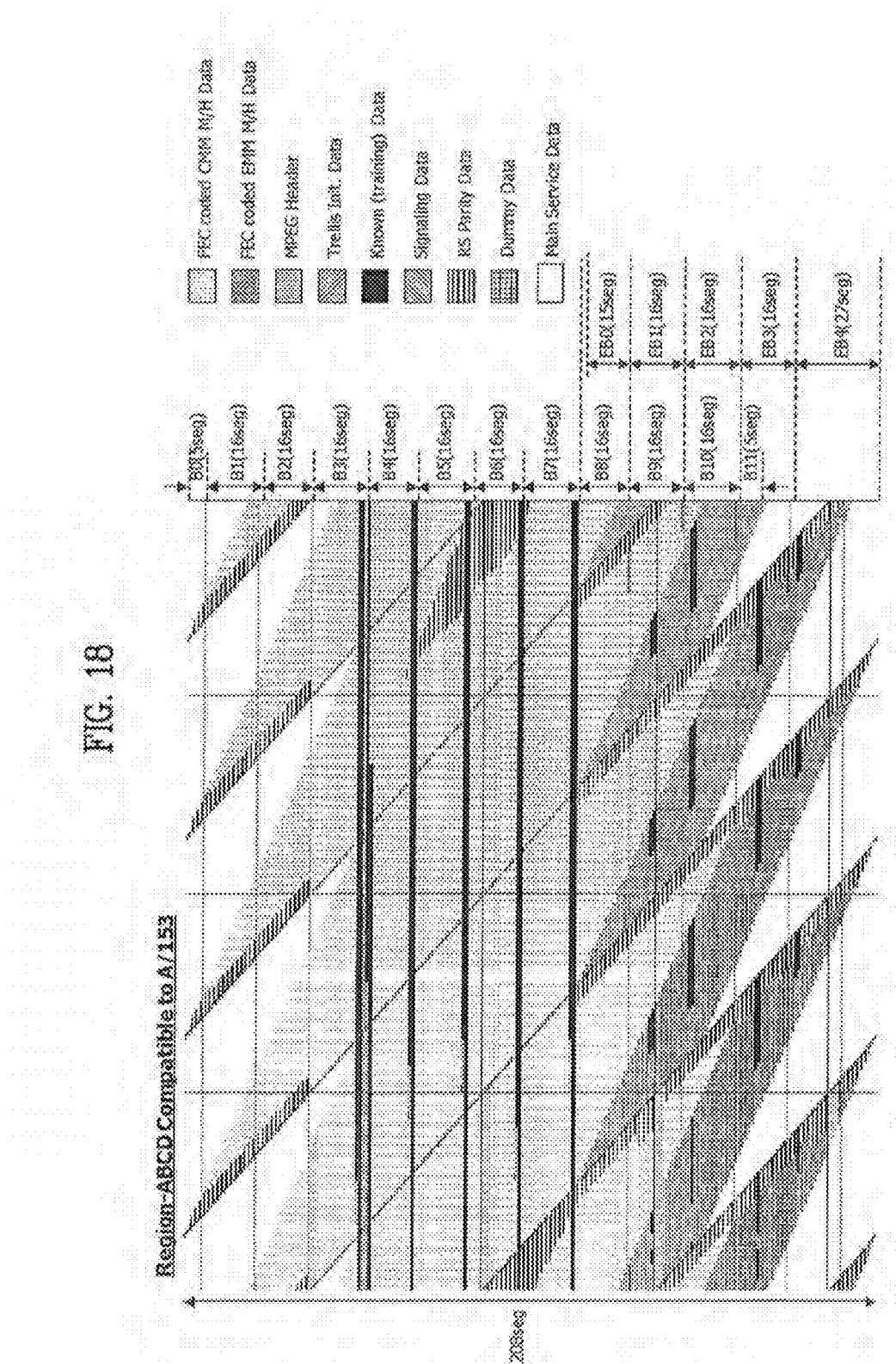
FIG. 18 illustrates a structure provided after a group type 1-0 of data group is interleaved when the data group includes (118+38) mobile service data packets according to an embodiment of the present invention.

FIG. 18 illustrates a structure provided after a group type 1-0 of data group is interleaved when the data group includes (118+38) mobile service data packets according to an embodiment of the present invention.

The structure shown in FIG. 18 is identical to a structure formed after the data group of FIG. 17 is interleaved.

As can be seen from the data group shown in FIG. 18, the primary ensemble is transmitted through the A, B, C and D regions of the data group, and the secondary ensemble is transmitted through the E region of the data group. Since the A, B, C and D regions are identical to those of a conventional data group, they can maintain the compatibility with a conventional digital mobile broadcast system. In addition, additional mobile service data can be transmitted through the E region.

Although the data group of FIG. 18 is divided into 10 blocks belonging to the A, B, C and D regions and five additional blocks belonging to the E region, the number of blocks belonging to the E block is not limited only to '5' and may be changed to another number not '5' according to the intention of a designer.

Referring to FIG. 18, known data is inserted into the E region. Therefore, the reception performance of the reception end is increased in the E region. As described above, mobile service data is inserted into the reserved area for both the RS parity and the MPEG header present in the E region, such that much more mobile service data can be transmitted.

Figure 19:
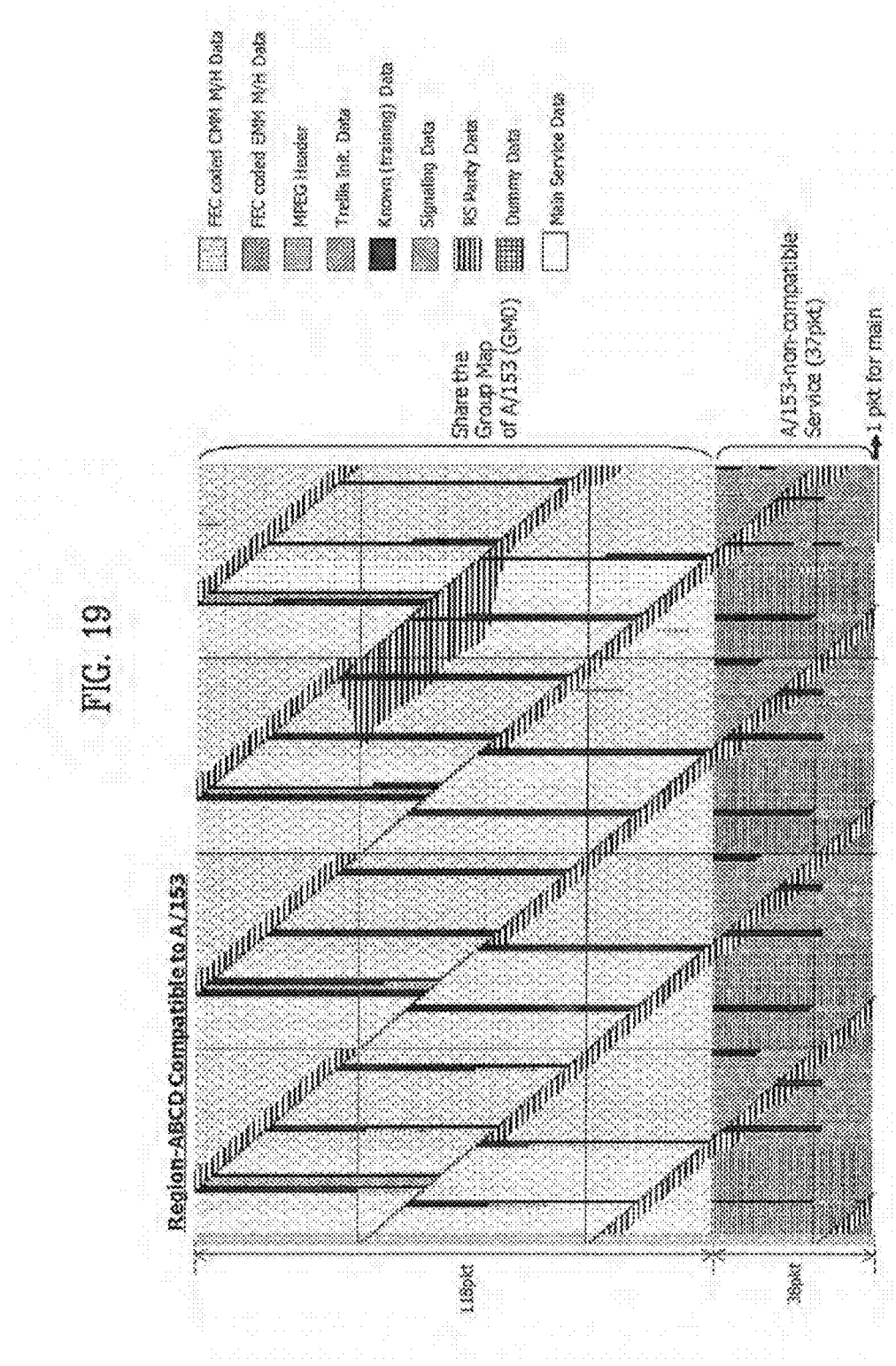
FIG. 19 illustrates group type 1-1 of data group, according to an embodiment of the present invention.

FIG. 19 illustrates group type 1-1 of data group, according to an embodiment of the present invention.

According to FIG. 19, a structure provided before a data group is interleaved, when the data group includes (118+37) mobile service data packets.

Referring to FIG. 19, the data group includes mobile service data of the A and B regions, mobile service data of the C and D regions, mobile service data of the E region, an MPEG header, trellis initialization data, known data, signaling data, RS parity data, and dummy data.

As shown in FIG. 19, one main service data packet may be inserted in region E. In the conventional broadcasting system, an error may occur when main data are not received for a long period of time. However, by inserting the main service data packet, as described above, such error may be prevented.

Figure 20:
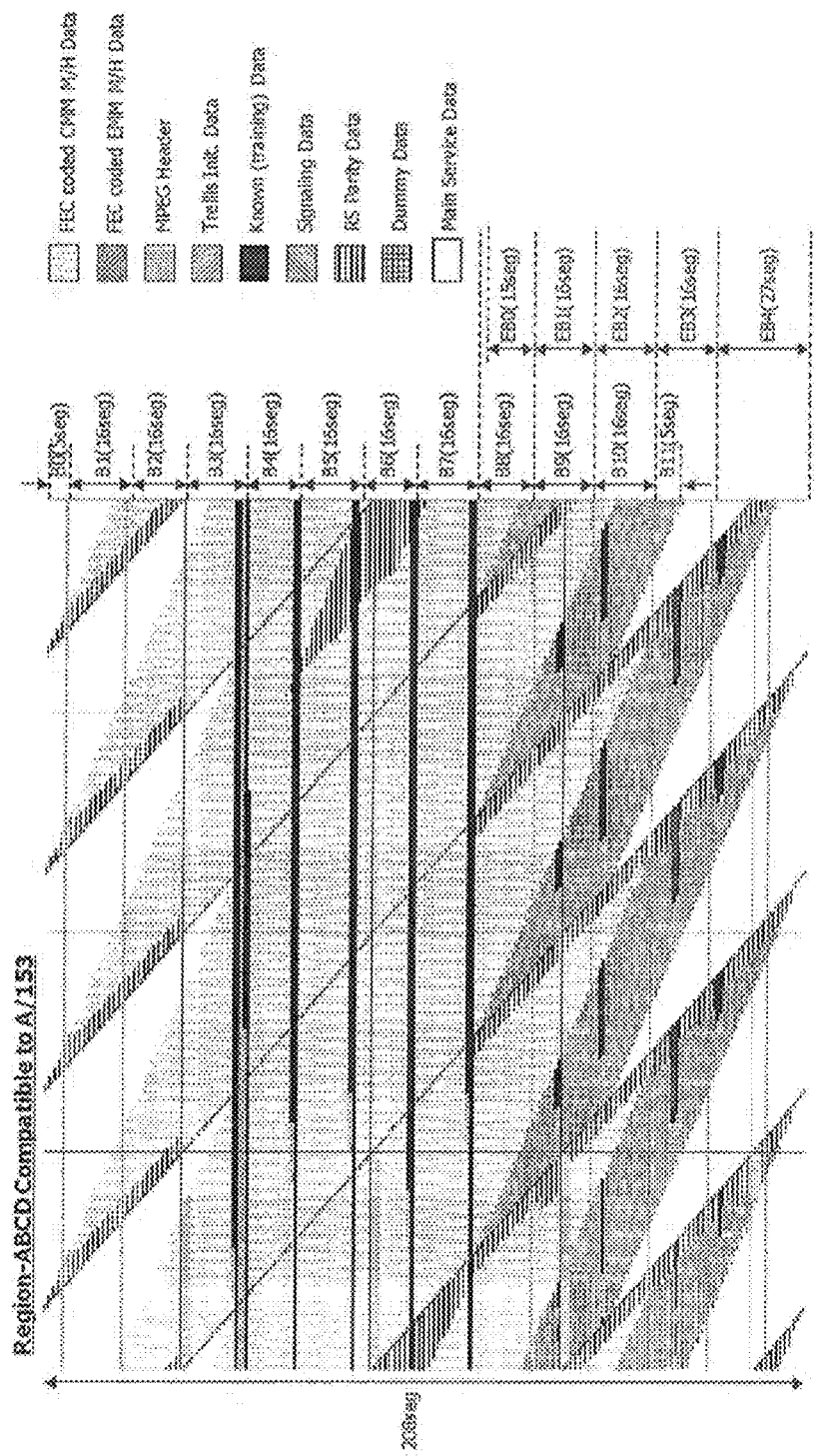
FIG. 20 illustrates a structure provided after a group type 1-1 of data group is interleaved when the data group includes (118+37) mobile service data packets according to an embodiment of the present invention.

FIG. 20 illustrates a structure provided after a group type 1-1 of data group is interleaved when the data group includes (118+37) mobile service data packets according to an embodiment of the present invention.

The structure shown in FIG. 20 is identical to a structure formed after the data group of FIG. 19 is interleaved.

As can be seen from the data group shown in FIG. 20, the primary ensemble is transmitted through the A, B, C and D regions of the data group, and the secondary ensemble is transmitted through the E region of the data group. Since the A, B, C and D regions are identical to those of a conventional data group, they can maintain the compatibility with a conventional digital mobile broadcast system. In addition, additional mobile service data can be transmitted through the E region.

Furthermore, the data that are transmitted through regions A, B, C, and D may be validly decoded by the conventional mobile broadcasting system. However, although the data that are transmitted through region E can be received by the conventional mobile broadcasting system, the corresponding data cannot be processed as valid information.

Although the data group of FIG. 20 is divided into 10 blocks belonging to the A, B, C and D regions and five additional blocks belonging to the E region, the number of blocks belonging to the E block is not limited only to '5' and may be changed to another number not '5' according to the intention of a designer.

Referring to FIG. 20, known data is inserted into the E region. Therefore, the reception performance of the reception end is increased in the E region. As described above, mobile service data is inserted into the reserved area for both the RS parity and the MPEG header present in the E region, such that much more mobile service data can be transmitted.

Figure 21:
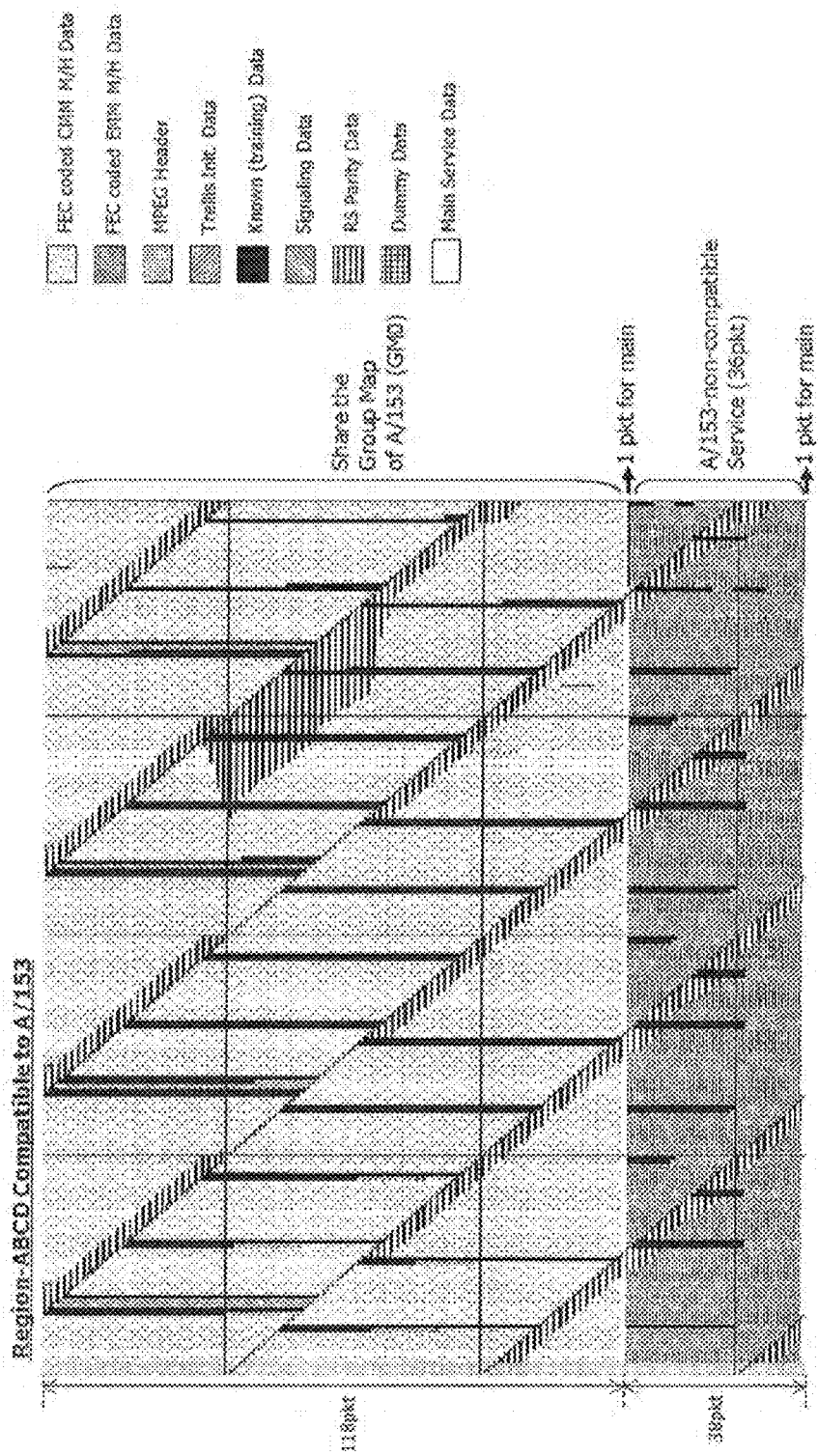
FIG. 21 illustrates group type 1-2 of data group, according to an embodiment of the present invention.

FIG. 21 illustrates group type 1-2 of data group, according to an embodiment of the present invention.

According to FIG. 21, a structure provided before a data group is interleaved, when the data group includes (118+36) mobile service data packets.

Figure 22:
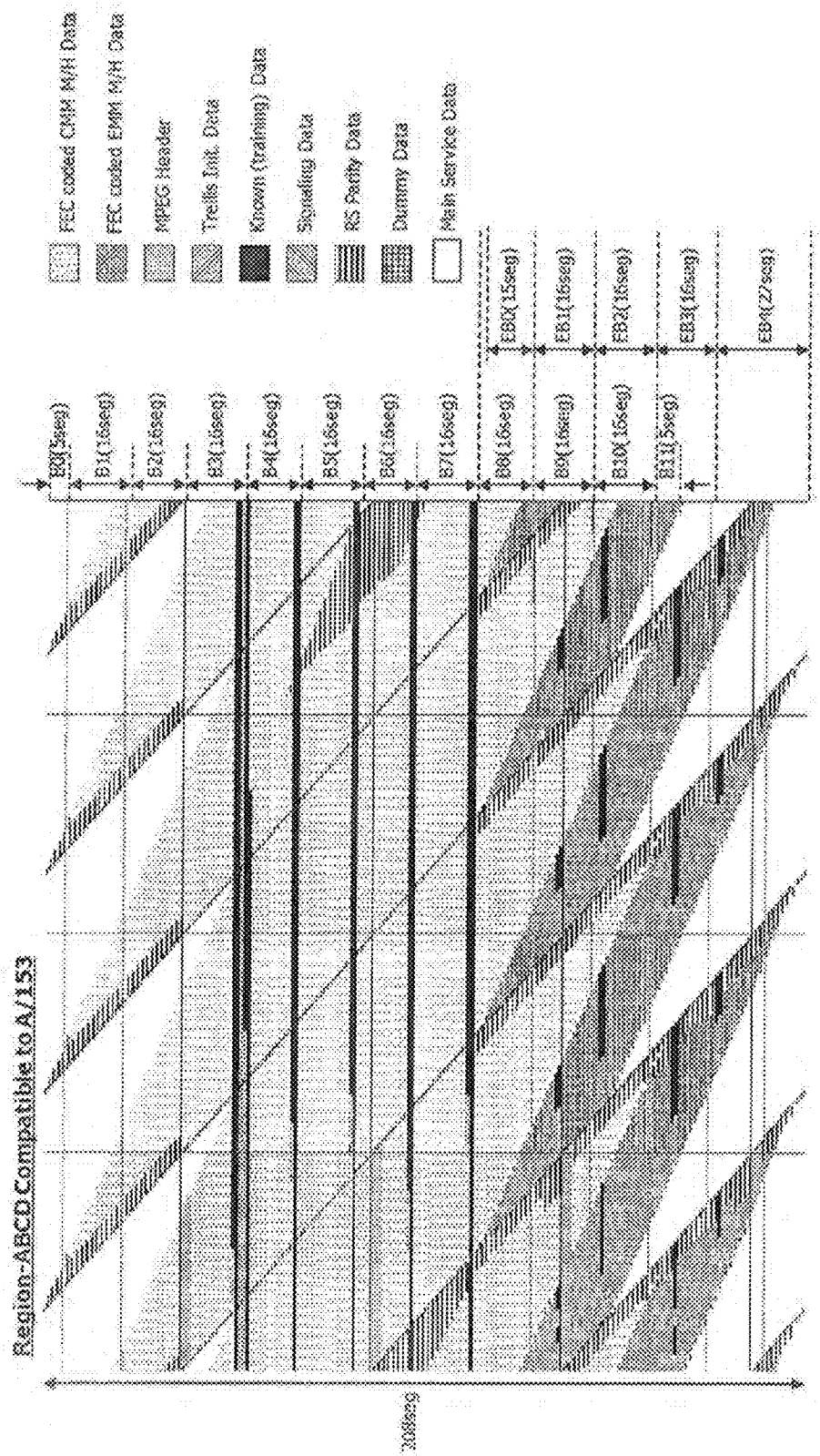
FIG. 22 illustrates a structure provided after a group type 1-2 of data group is interleaved when the data group includes (118+36) mobile service data packets according to an embodiment of the present invention.

FIG. 22 illustrates a structure provided after a group type 1-2 of data group is interleaved when the data group includes (118+36) mobile service data packets according to an embodiment of the present invention.

The structure shown in FIG. 22 is identical to a structure formed after the data group of FIG. 21 is interleaved.

Figure 23:
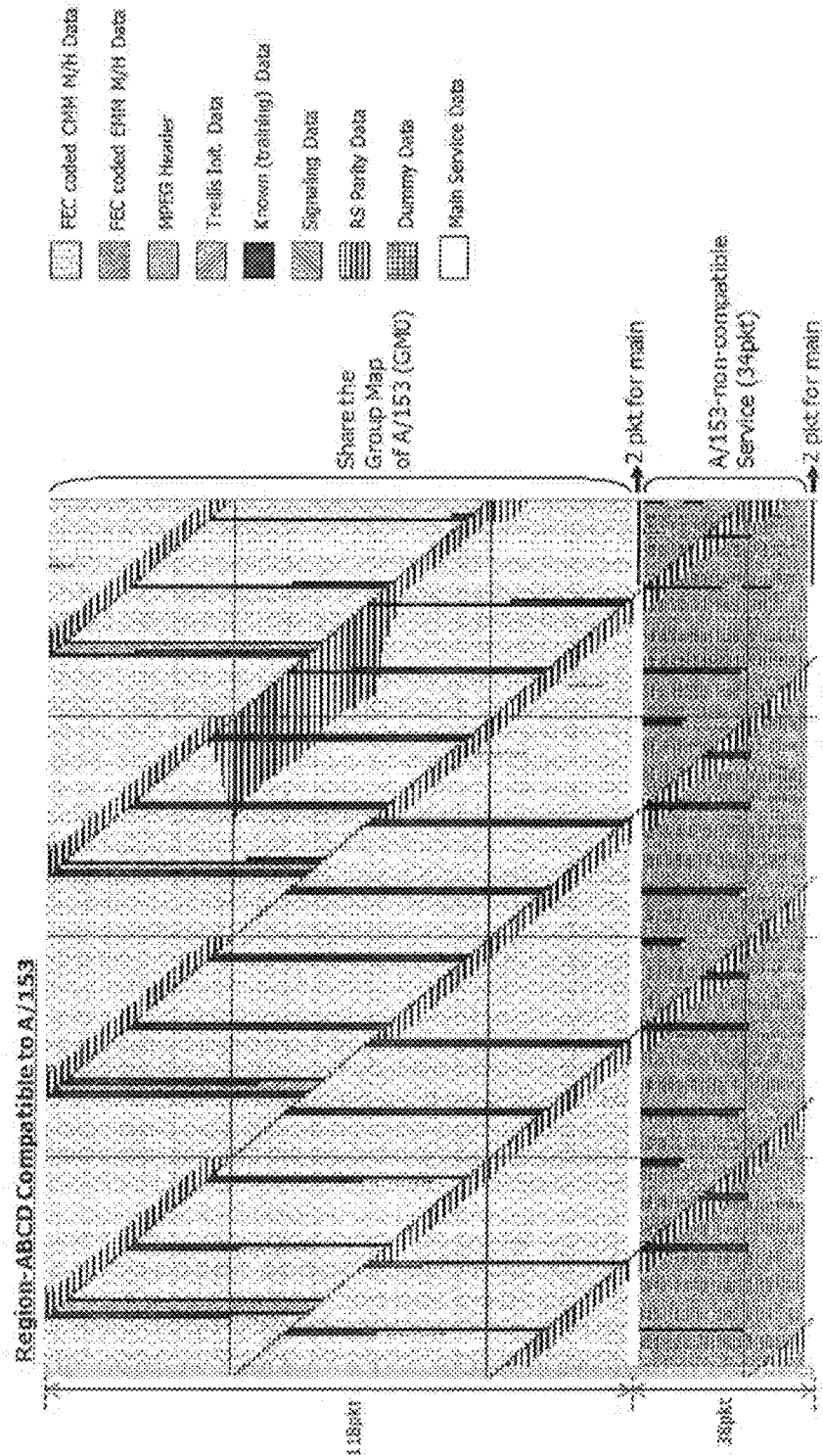
FIG. 23 illustrates group type 1-4 of data group, according to an embodiment of the present invention.

FIG. 23 illustrates group type 1-4 of data group, according to an embodiment of the present invention.

According to FIG. 23, a structure provided before a data group is interleaved, when the data group includes (118+34) mobile service data packets.

Figure 24:
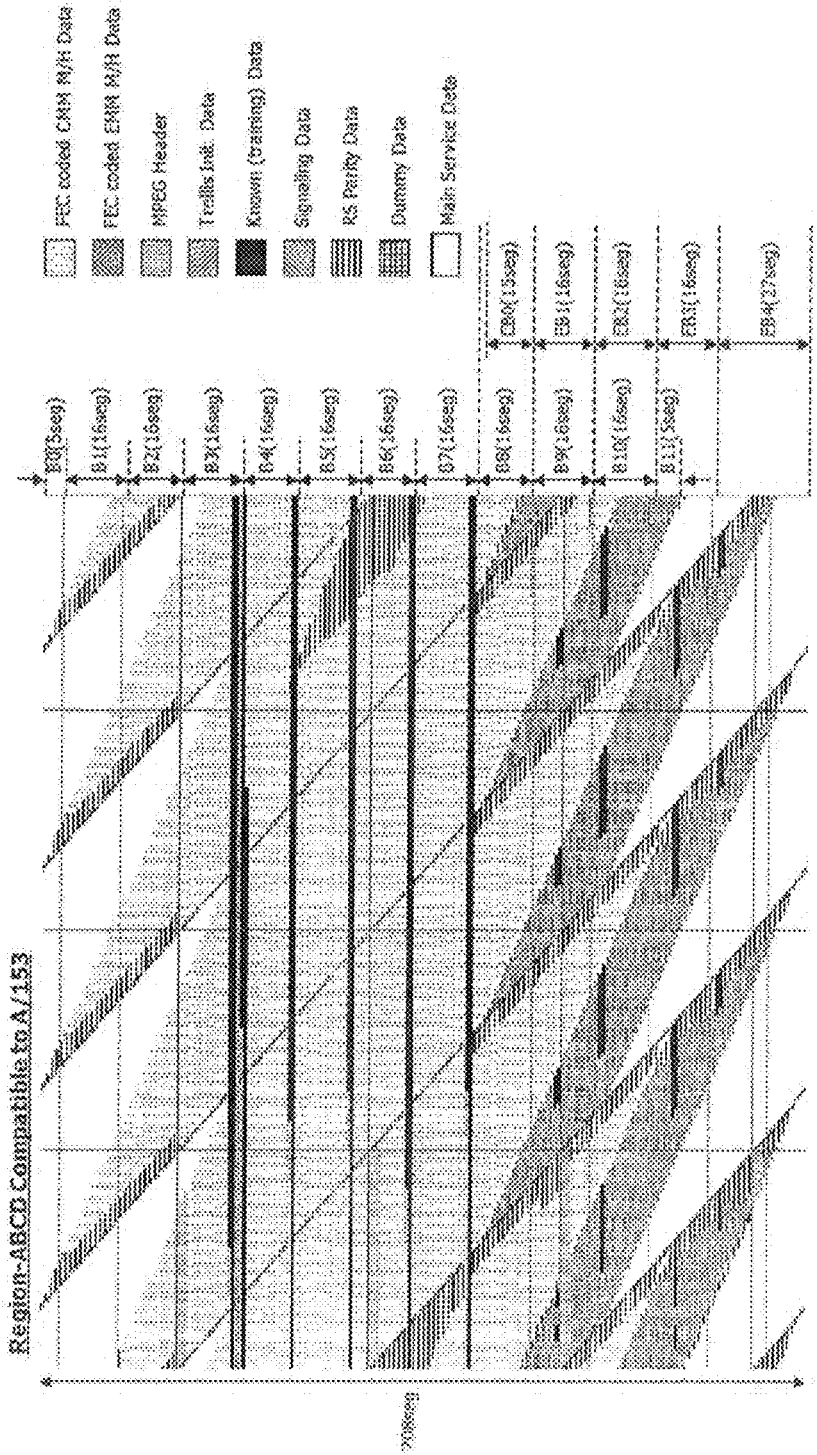
FIG. 24 illustrates a structure provided after a group type 1-4 of data group is interleaved when the data group includes (118+34) mobile service data packets according to an embodiment of the present invention.

FIG. 24 illustrates a structure provided after a group type 1-4 of data group is interleaved when the data group includes (118+34) mobile service data packets according to an embodiment of the present invention.

The structure shown in FIG. 24 is identical to a structure formed after the data group of FIG. 23 is interleaved.

Figure 25:
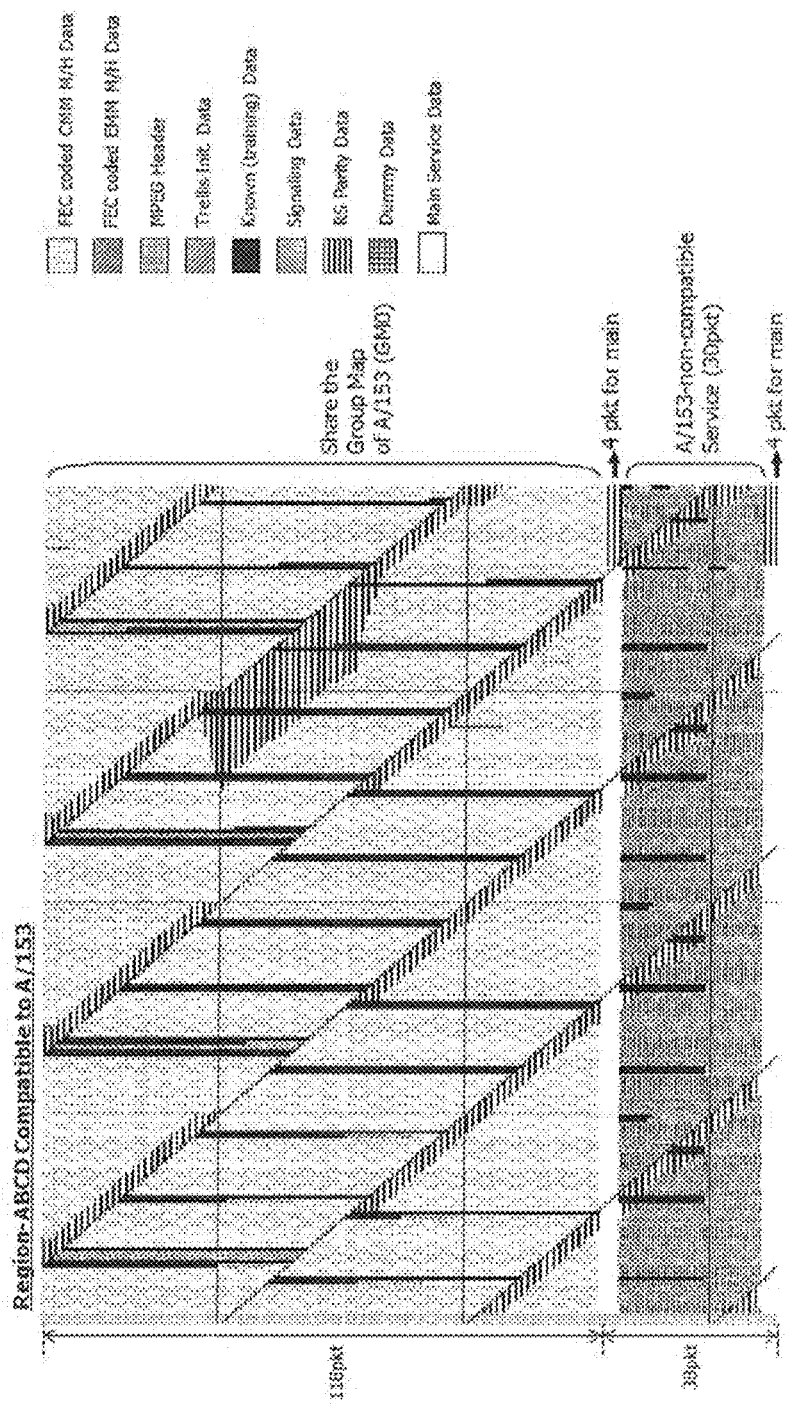
FIG. 25 illustrates group type 1-8 of data group, according to an embodiment of the present invention.

FIG. 25 illustrates group type 1-8 of data group, according to an embodiment of the present invention.

According to FIG. 25, a structure provided before a data group is interleaved, when the data group includes (118+30) mobile service data packets.

Figure 26:
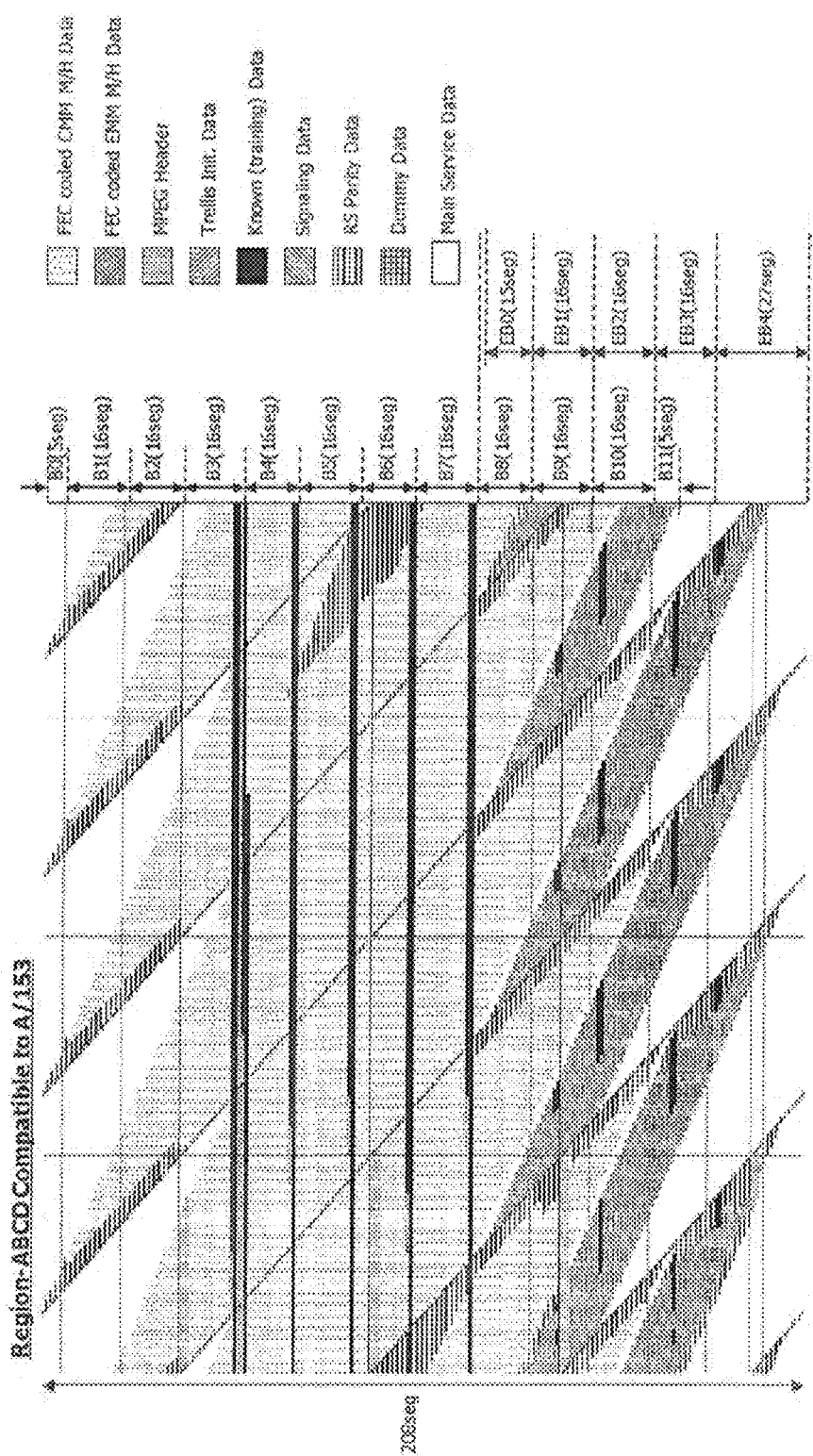
FIG. 26 illustrates a structure provided after a group type 1-8 of data group is interleaved when the data group includes (118+30) mobile service data packets according to an embodiment of the present invention.

FIG. 26 illustrates a structure provided after a group type 1-8 of data group is interleaved when the data group includes (118+30) mobile service data packets according to an embodiment of the present invention.

The structure shown in FIG. 26 is identical to a structure formed after the data group of FIG. 25 is interleaved.

The descriptions of FIG. 18 and FIG. 19 may be similarly applied to the data groups shown in FIG. 20 to FIG. 26.

In the description of FIG. 17 to FIG. 26, although number of main service data packets included in a data group is limited to a specific number, the number is merely exemplary. Therefore, the present invention will not be limited only to the limited number of data packets proposed in the description of the present invention.

Figure 27:
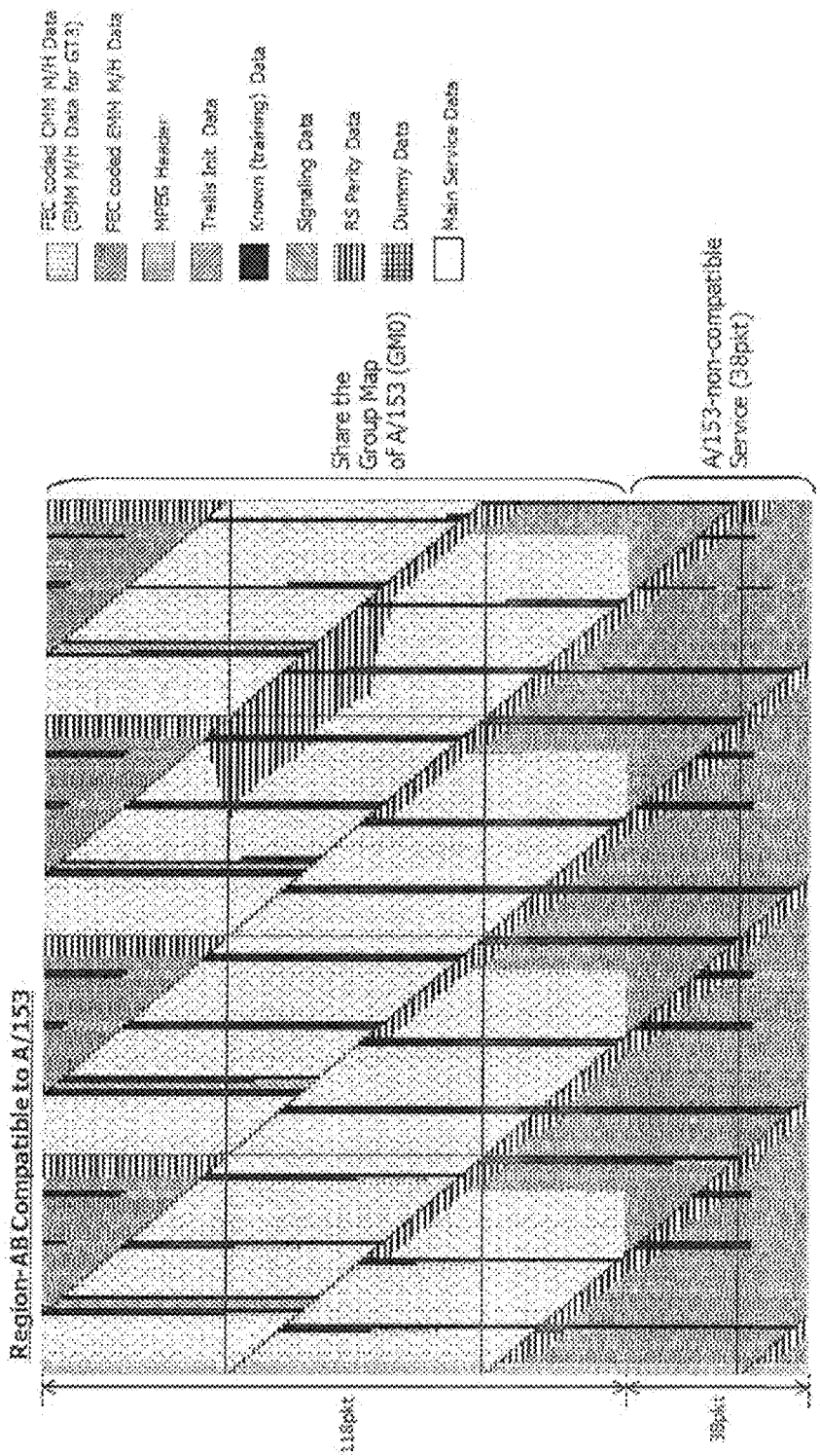
FIG. 27 illustrates group type 2-0 of data group, according to an embodiment of the present invention.

FIG. 27 illustrates group type 2-0 of data group, according to an embodiment of the present invention.

According to FIG. 27, a structure provided before a data group is interleaved, when the data group includes (118+38) mobile service data packets.

Referring to FIG. 27, the data group includes mobile service data of the A and B regions, mobile service data of the C and D regions, mobile service data of the E region, an MPEG header, trellis initialization data, known data, signaling data, RS parity data, and dummy data.

Figure 28:
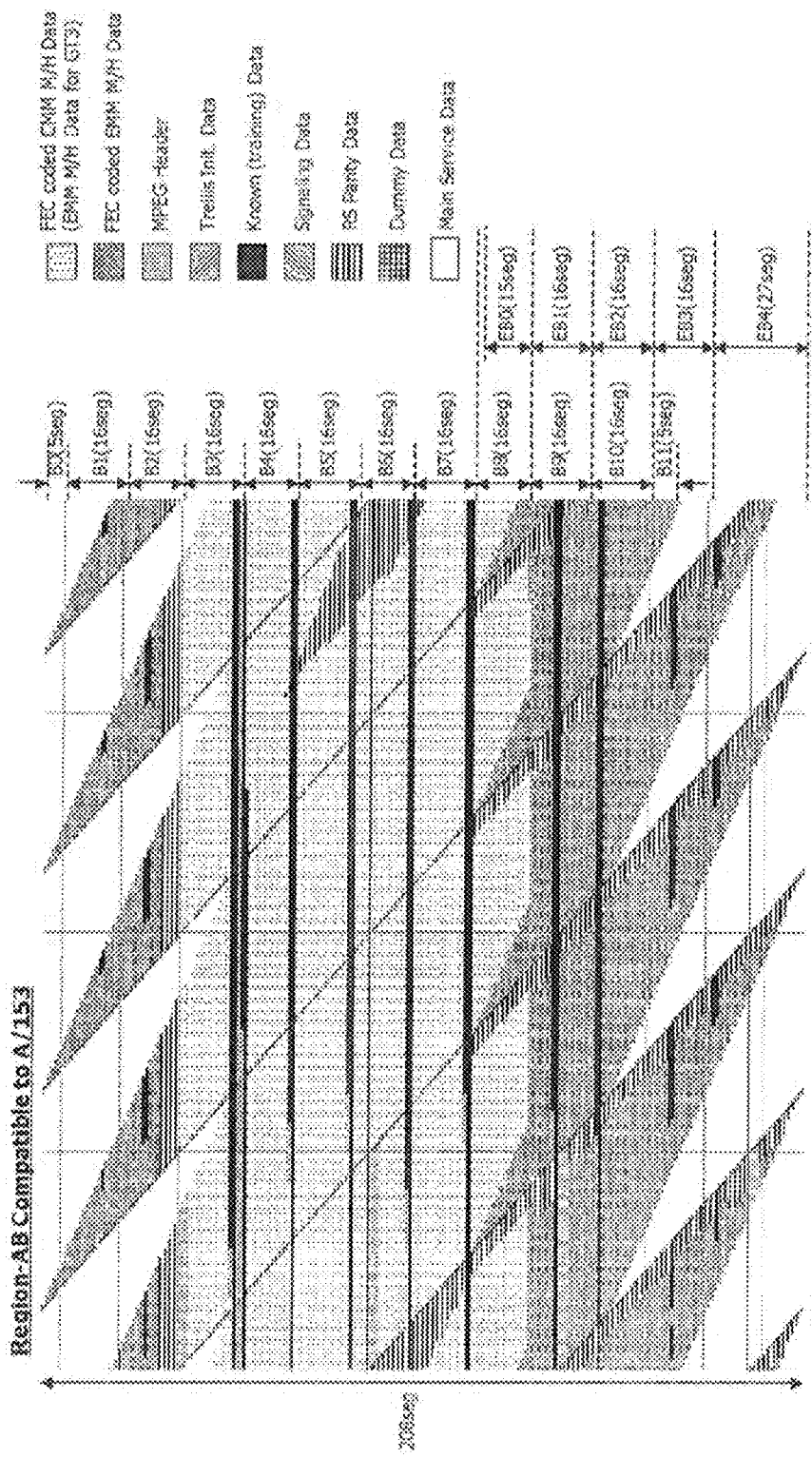
FIG. 28 illustrates a structure provided after a group type 2-0 of data group is interleaved, when the data group includes (118+38) mobile service data packets, according to an embodiment of the present invention.

FIG. 28 illustrates a structure provided after a group type 2-0 of data group is interleaved, when the data group includes (118+38) mobile service data packets, according to an embodiment of the present invention.

The structure shown in FIG. 28 is identical to a structure formed after the data group of FIG. 27 is interleaved.

As can be seen from the data group shown in FIG. 28, the primary ensemble is transmitted through the A and B regions of the data group, and the secondary ensemble is transmitted through the C, D and E region of the data group. Since the A and B regions include the RS parity and the MPEG header, they can maintain the compatibility with a conventional digital mobile broadcast system.

Furthermore, the data that are transmitted through regions A and B may be validly decoded by the conventional mobile broadcasting system. However, although the data that are transmitted through regions C, D, and E can be received by the conventional mobile broadcasting system, the corresponding data cannot be processed as valid information.

Although the data group of FIG. 28 is divided into 10 blocks belonging to the A, B, C and D regions and five additional blocks belonging to the E region, the number of blocks belonging to the E block is not limited only to '5' and may be changed to another number not '5' according to the intention of a designer.

Referring to FIG. 28, additional known data is inserted into the C and D regions in addition to the A and B regions. The data group shown in FIG. 28 is not affected by main service data, such that successive known data sequences can be contained in the C and D regions differently from the data group shown in FIG. 18. Therefore, the reception performance of mobile service data transmitted through the C and D regions at the reception end can be greatly increased.

In accordance with the present invention, the number of known data sequences inserted into the C and D regions is not limited only to a specific number. Therefore, according to the intention of a designer, a proper number of known data sequences required for enhancing the reception performance of the reception end can be inserted. In accordance with one embodiment of the present invention, 3 known data sequences are inserted into the C region, and 2 known data sequences are inserted into the D region.

Figure 29:
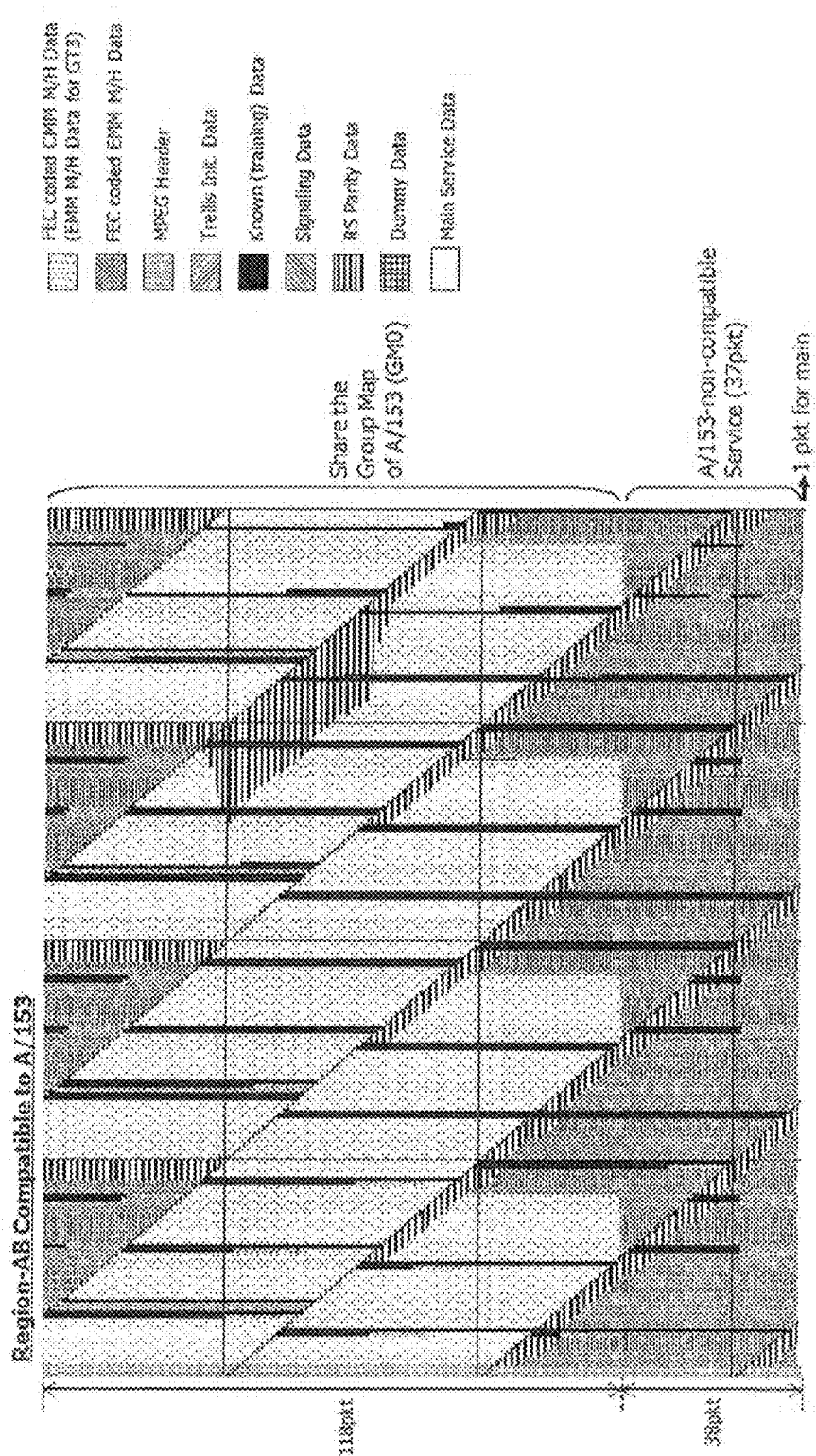
FIG. 29 illustrates group type 2-1 of data group, according to an embodiment of the present invention.

FIG. 29 illustrates group type 2-1 of data group, according to an embodiment of the present invention.

According to FIG. 29, a structure provided before a data group is interleaved, when the data group includes (118+37) mobile service data packets.

Referring to FIG. 29, the data group includes mobile service data of the A and B regions, mobile service data of the C and D regions, mobile service data of the E region, an MPEG header, trellis initialization data, known data, signaling data, RS parity data, and dummy data.

As shown in FIG. 29, one main service data packet may be inserted in region E. In the conventional broadcasting system, an error may occur when main data are not received for a long period of time. However, by inserting the main service data packet, as described above, such error may be prevented.

Figure 30:
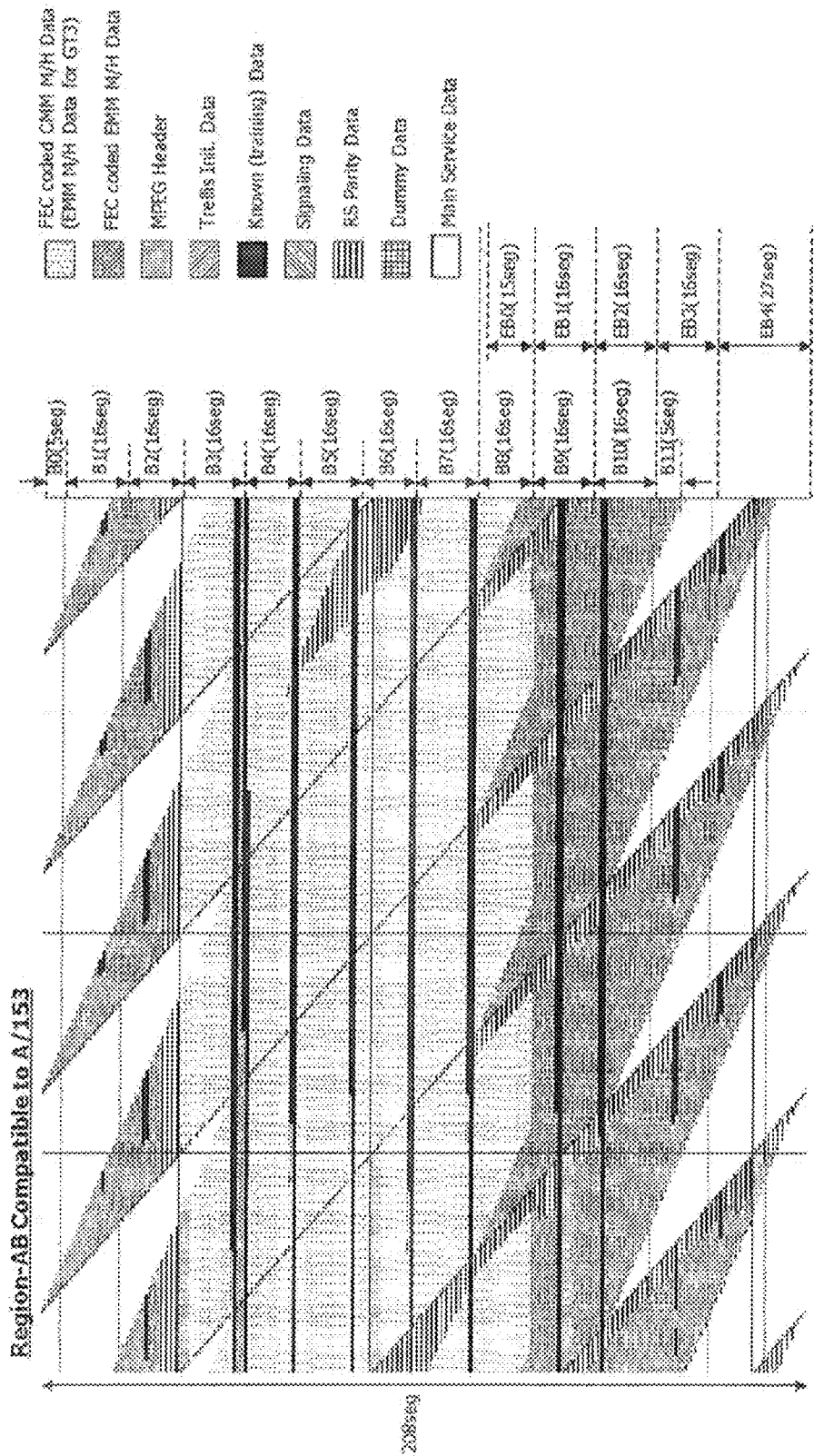
FIG. 30 illustrates a structure provided after a group type 2-1 of data group is interleaved when the data group includes (118+37) mobile service data packets according to an embodiment of the present invention.

FIG. 30 illustrates a structure provided after a group type 2-1 of data group is interleaved when the data group includes (118+37) mobile service data packets according to an embodiment of the present invention.

The structure shown in FIG. 30 is identical to a structure formed after the data group of FIG. 29 is interleaved.

Figure 31:
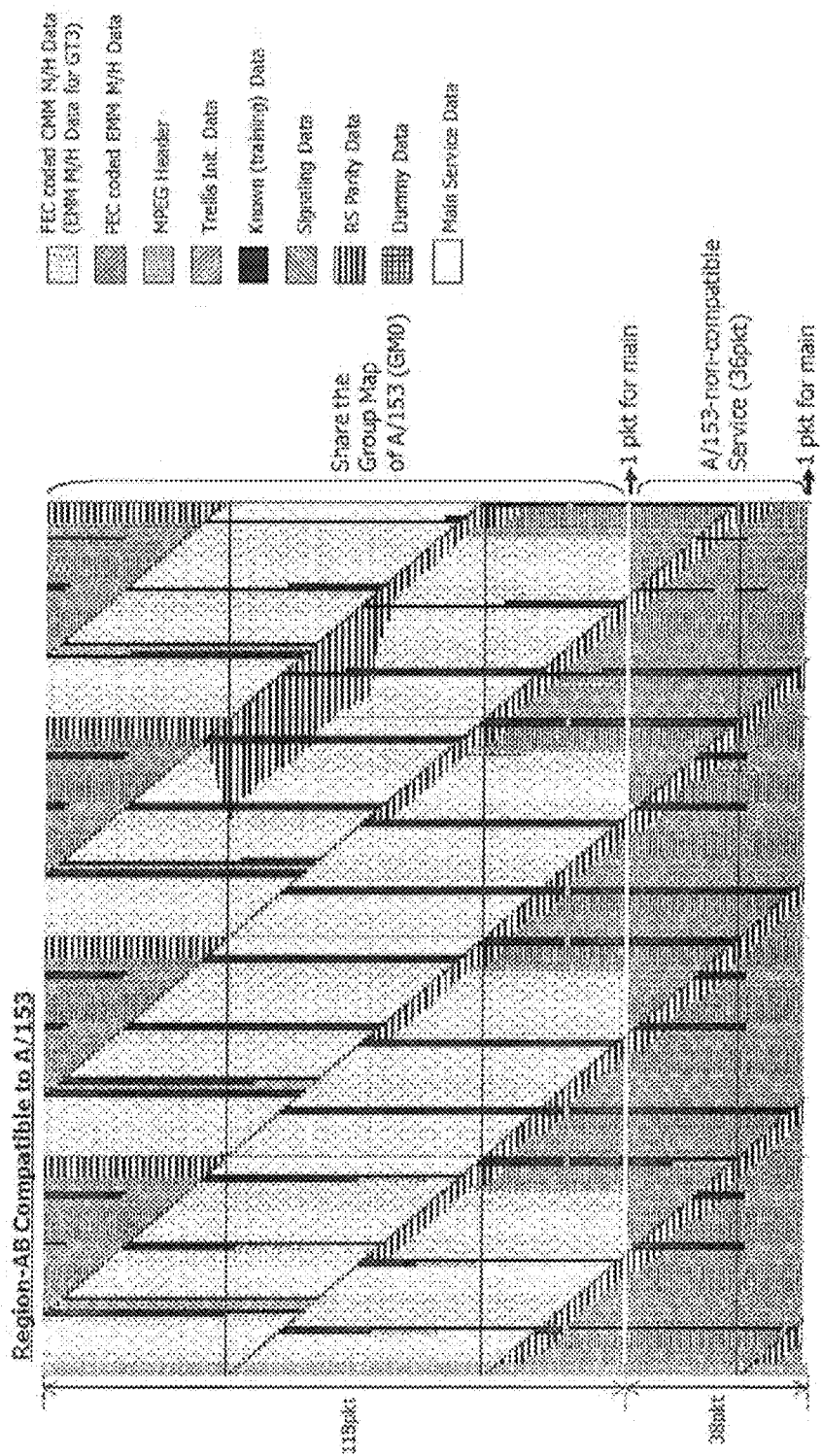
FIG. 31 illustrates group type 2-2 of data group, according to an embodiment of the present invention.

FIG. 31 illustrates group type 2-2 of data group, according to an embodiment of the present invention.

According to FIG. 31, a structure provided before a data group is interleaved, when the data group includes (118+36) mobile service data packets.

Figure 32:
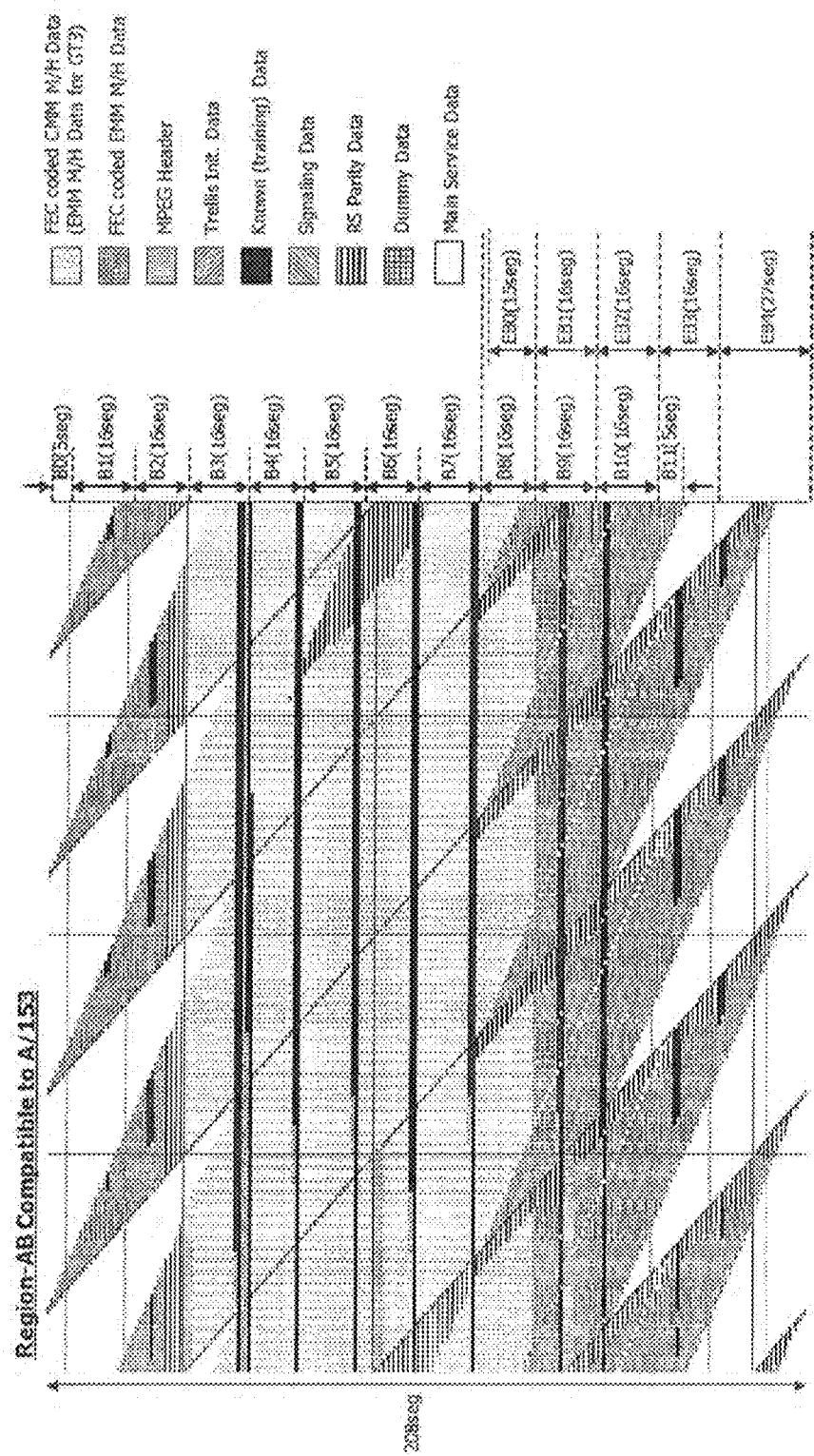
FIG. 32 illustrates a structure provided after a group type 2-2 of data group is interleaved when the data group includes (118+36) mobile service data packets according to an embodiment of the present invention.

FIG. 32 illustrates a structure provided after a group type 2-2 of data group is interleaved when the data group includes (118+36) mobile service data packets according to an embodiment of the present invention.

The structure shown in FIG. 32 is identical to a structure formed after the data group of FIG. 31 is interleaved.

Figure 33:
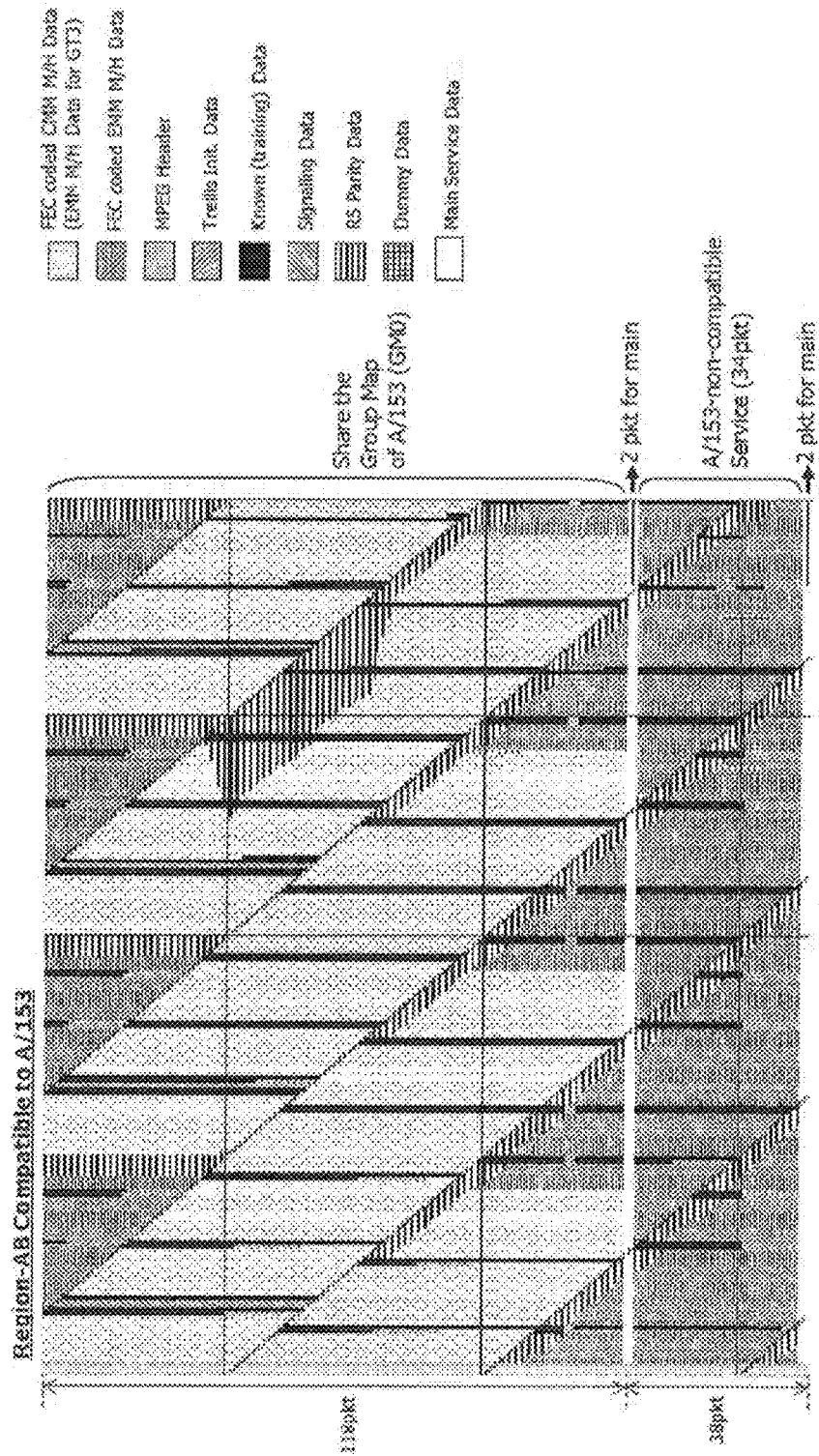
FIG. 33 illustrates group type 2-4 of data group, according to an embodiment of the present invention.

FIG. 33 illustrates group type 2-4 of data group, according to an embodiment of the present invention.

According to FIG. 33, a structure provided before a data group is interleaved, when the data group includes (118+34) mobile service data packets.

Figure 34:
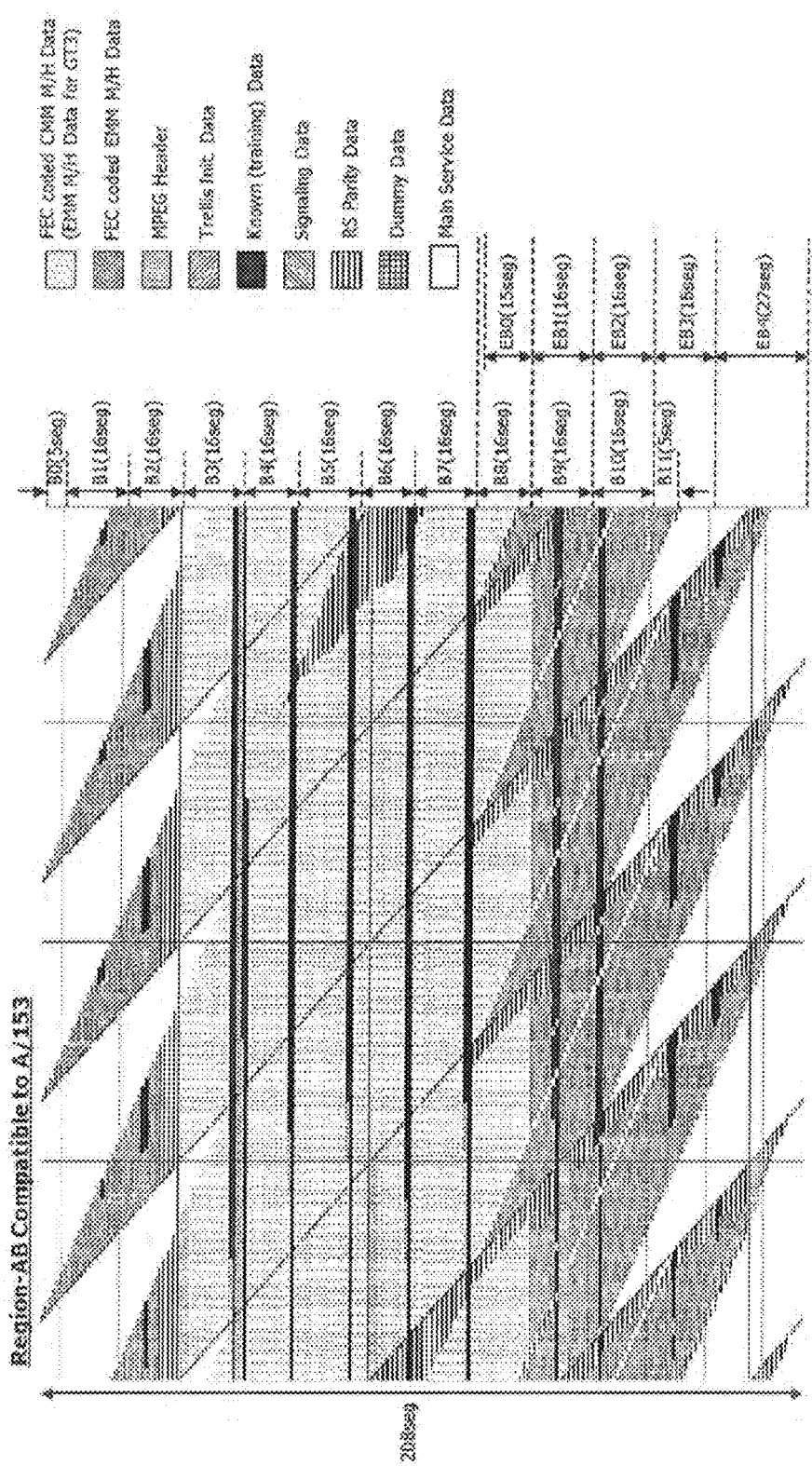
FIG. 34 illustrates a structure provided after a group type 2-4 of data group is interleaved when the data group includes (118+34) mobile service data packets according to an embodiment of the present invention.

FIG. 34 illustrates a structure provided after a group type 2-4 of data group is interleaved when the data group includes (118+34) mobile service data packets according to an embodiment of the present invention.

The structure shown in FIG. 34 is identical to a structure formed after the data group of FIG. 33 is interleaved.

Figure 35:
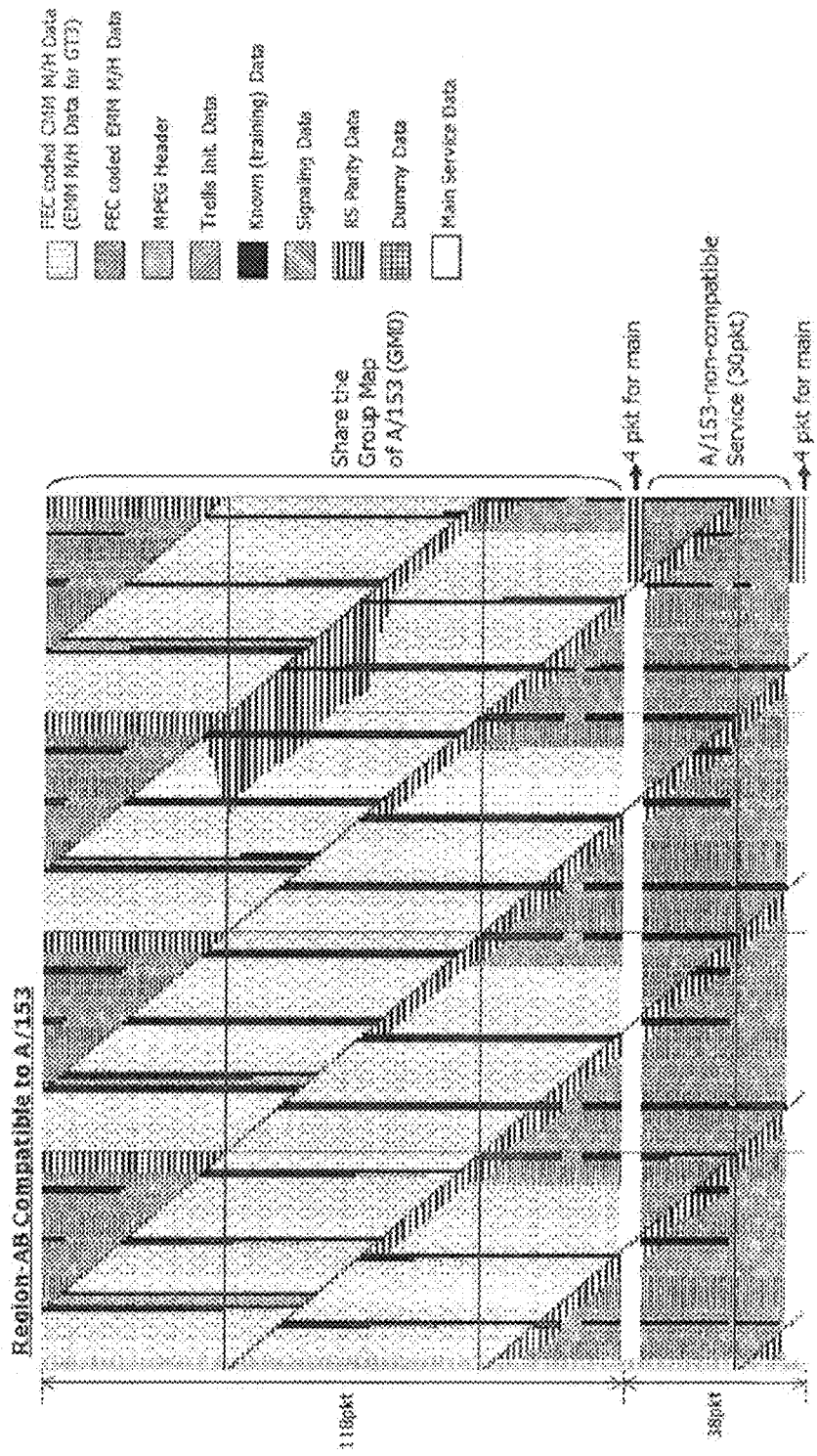
FIG. 35 illustrates group type 2-8 of data group, according to an embodiment of the present invention.

FIG. 35 illustrates group type 2-8 of data group, according to an embodiment of the present invention.

According to FIG. 35, a structure provided before a data group is interleaved, when the data group includes (118+30) mobile service data packets.

Figure 36:
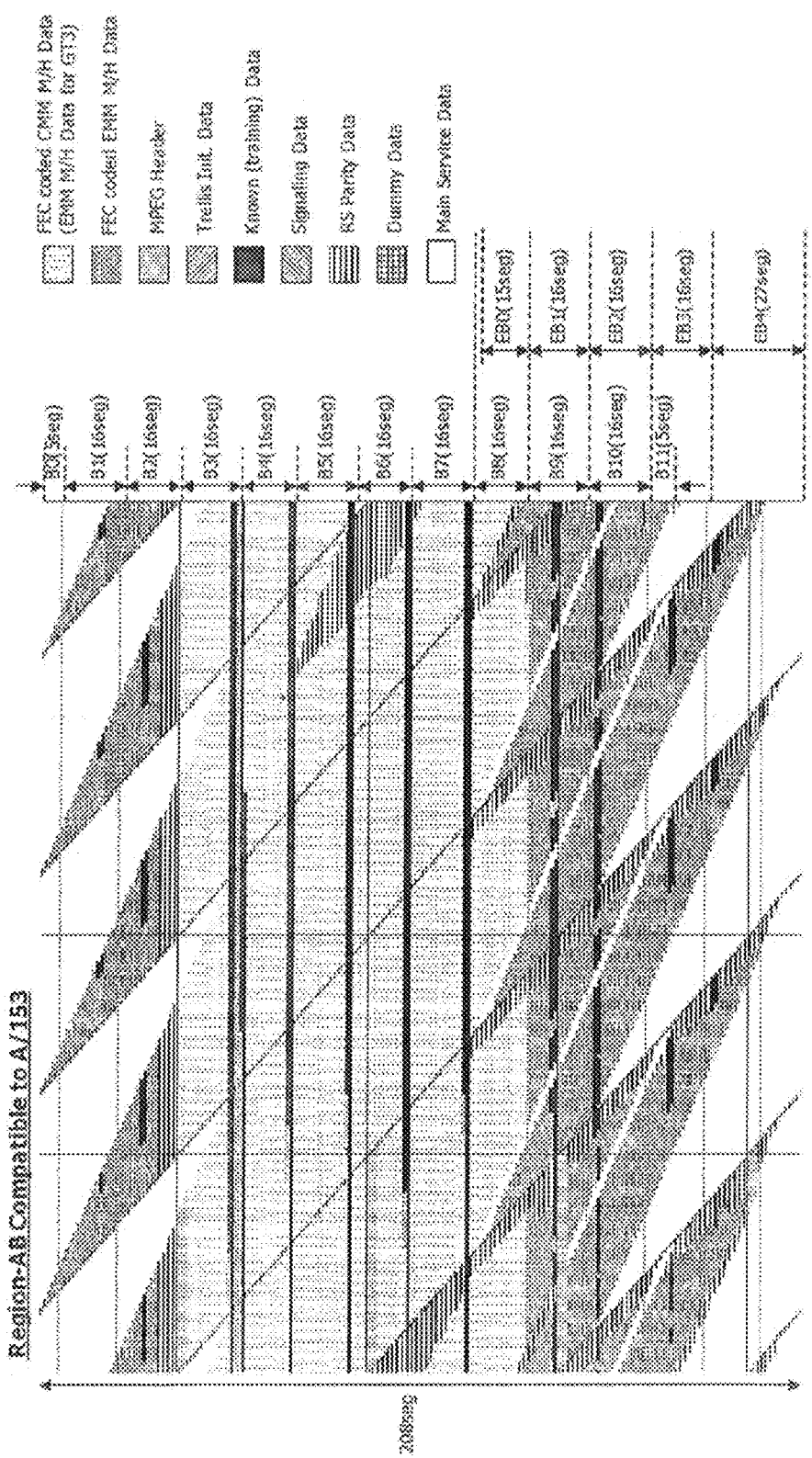
FIG. 36 illustrates a structure provided after a group type 2-9 of data group is interleaved when the data group includes (118+30) mobile service data packets according to an embodiment of the present invention.

FIG. 36 illustrates a structure provided after a group type 2-9 of data group is interleaved when the data group includes (118+30) mobile service data packets according to an embodiment of the present invention.

The structure shown in FIG. 36 is identical to a structure formed after the data group of FIG. 35 is interleaved.

Referring to the data group structure of FIG. 27 to FIG. 36, a group is divided into 12 DATA blocks (MH blocks B0 to B11) for the first mobile mode. Additionally, the group is also divided into 5 extended DATA blocks (MH blocks EB0 to EB4) for the second mobile mode.

At this point, the receiving system for the first mobile mode may receive and process only the data of 6 DATA blocks (MH blocks B3 to B8). And, the receiving system for the second mobile mode may receive all data of the 12 DATA blocks (MH blocks B0 to B11) and all data of the 5 extended DATA blocks (MH blocks EB0 to EB4), so as to process both the mobile data of the first mobile mode and the mobile data of the second mobile mode.

Meanwhile, group type 3 is segmented to 5 group types (group type 3-0, 3-1, 3-2, 3-4, and 3-8), depending upon the number of mobile service data packets of the region E. In the group of group type 3, the primary group division includes regions A, B, C, D, and E, and the secondary group division does not exist. More specifically, according to the embodiment of the present invention, in the primary group division, mobile service data for the second mobile mode are assigned to regions A, B, C, D, and E, and mobile service data of the first mobile mode are not assigned to the primary group division. At this point, the group format of group type 3 is identical to the group format of group type 2. Therefore, reference may be made to the descriptions of FIG. 27 to FIG. 36 for the description of the data groups of each sub group type 3-0, 3-1, 3-2, 3-4, and 3-8 of group type 3. However, the receiving system for the first mobile mode does not process group type 3. And, the receiving system for the second mobile mode may receive and process all data of the 12 DATA blocks (MH blocks B0 to B11) and the 5 extended DATA blocks (MH blocks EB0 to EB4).

Figure 37:
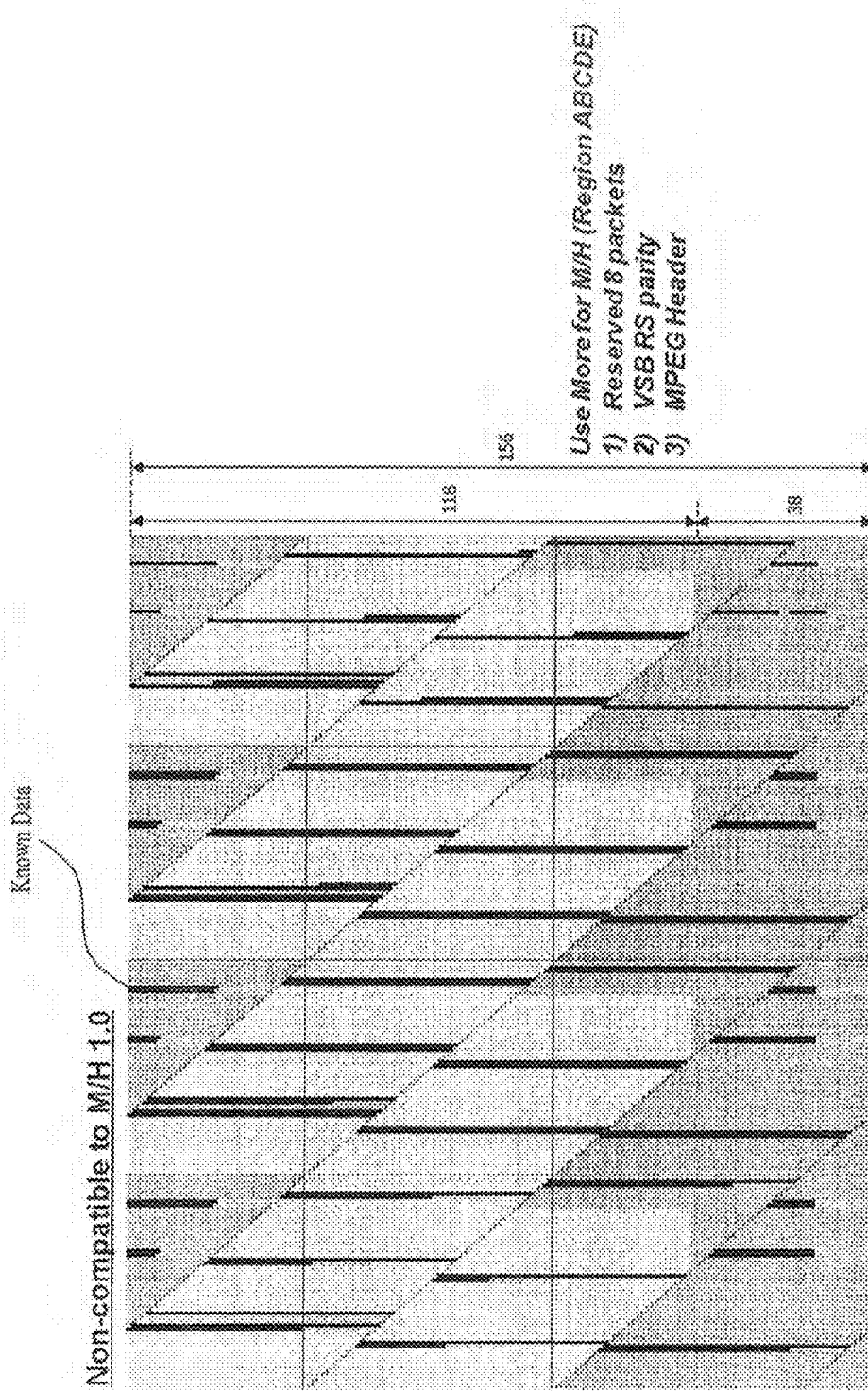
FIG. 37 illustrates group type 4 of data group, according to an embodiment of the present invention.

FIG. 37 illustrates group type 4 of data group, according to an embodiment of the present invention.

According to FIG. 37, a structure provided before a data group is interleaved, when the data group includes (118+38) mobile service data packets.

As for the data group shown in FIG. 37, on the condition that 16 slots contained in one sub-frame transmit a data group including 156 mobile service data packets, the data group of FIG. 37 may represent any one of data group types.

The data group shown in FIG. 37 includes mobile service data of the A and B regions, mobile service data of the C and D regions, mobile service data of the E region, trellis initialization data, known data, signaling data, and dummy data. That is, the data group of FIG. 37 does not include the RS parity and the MPEG header for backward compatibility.

As shown in FIG. 37, the A, B, C, D and E regions do not include the region for the RS parity and the MPEG header. Therefore, the above-mentioned regions can be used to transmit mobile service data, such that much more mobile service data can be transmitted.

Figure 38:
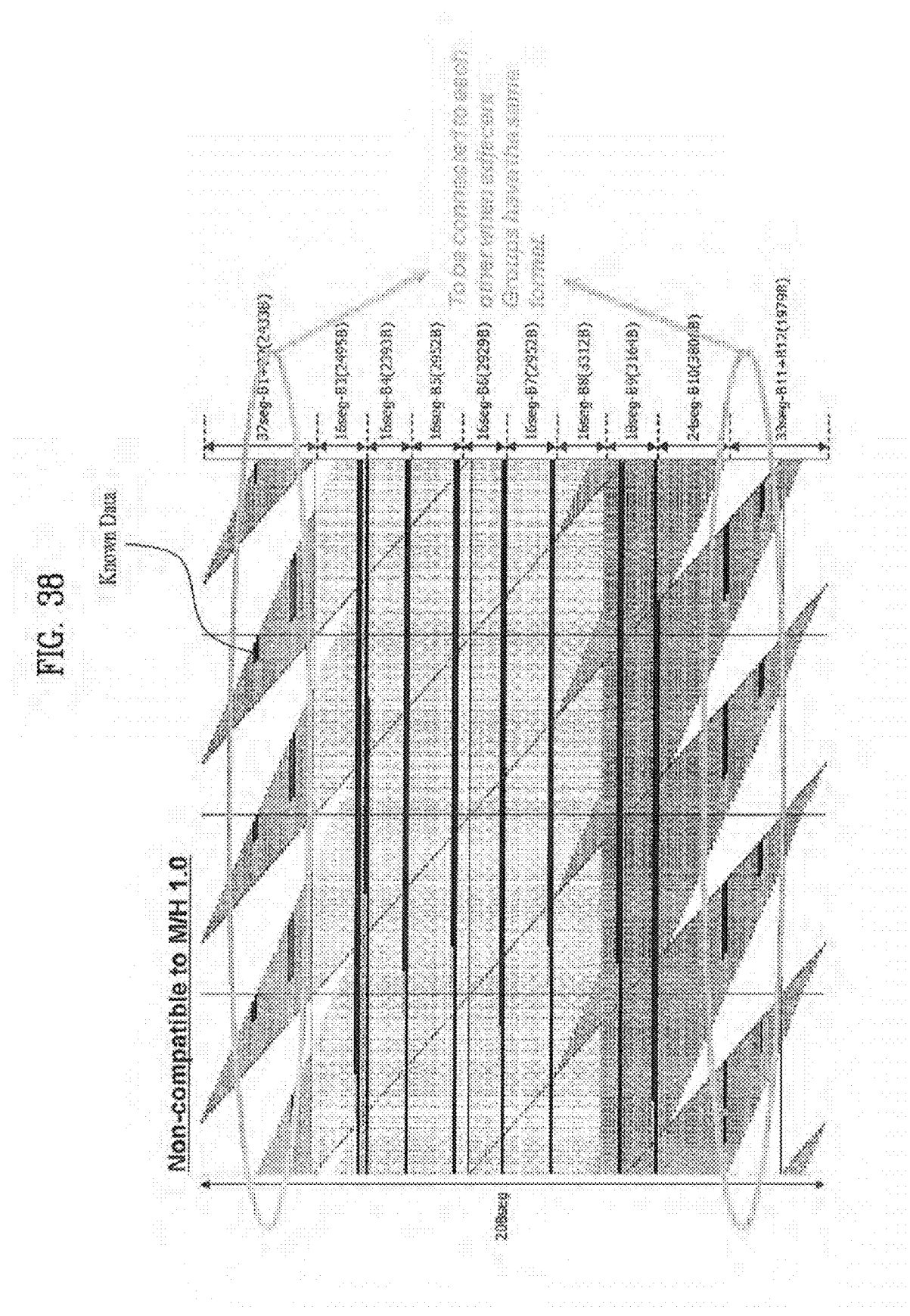
FIG. 38 illustrates a structure provided after a group type 4 of data group is interleaved, when the data group includes (118+38) mobile service data packets, according to an embodiment of the present invention.

FIG. 38 illustrates a structure provided after a group type 4 of data group is interleaved, when the data group includes (118+38) mobile service data packets, according to an embodiment of the present invention.

The structure shown in FIG. 38 is identical to a structure formed after the data group of FIG. 37 is interleaved.

Referring to FIG. 38, additional known data is inserted into the C and D regions in addition to the A and B regions. The data group shown in FIG. 38 is not affected by main service data, such that successive known data sequences can be contained in the C and D regions. Therefore, the reception performance of mobile service data transmitted through the C and D regions at the reception end can be greatly increased.

In addition, first known data present in the E region of the first data group may be connected to second known data present in the upper C and D regions of the second data group that is adjacent to the first data group. In this case, a known data sequence may be assigned to an overall area of the data group. As a result, the reception performance of mobile service data in the case of using the overall area of the group is higher than the reception performance of mobile service data in another case of using a conventional data group.

In accordance with another embodiment of the present invention, when known data of the first data group is connected to known data of the second group that is adjacent to the first data group, known data instead of trellis initialization data inserted in the front end of each known data may be additionally inserted. In this case, the trellis initialization data to be located at the front end of the connected known data sequence should be contained in the data group.

In addition, as shown in FIG. 38, in the A, B, C, D and E regions, mobile service data is inserted into the reserved area for the RS parity and the MPEG header, such that much more mobile service data can be transmitted within one data group.

Figure 39:
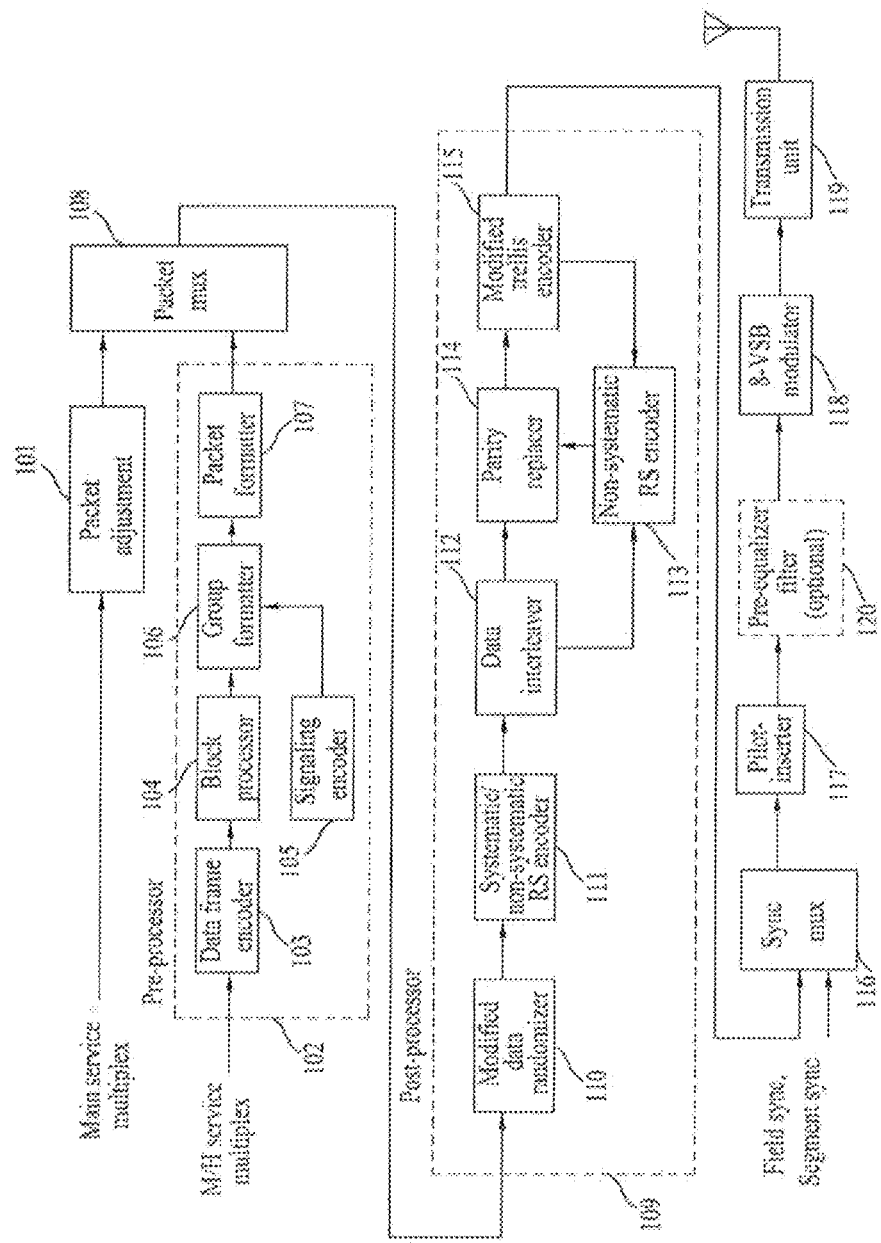
FIG. 39 is a block diagram illustrating a transmission system according to an embodiment of the present invention.

FIG. 39 is a block diagram illustrating a transmission system according to an embodiment of the present invention.

Referring to FIG. 39, the transmission system includes a packet adjustment unit 101, a pre-processor 102, a data frame encoder 103, a block processor 104, a signaling encoder 105, a group formatter 106, a packet formatter 107, a Packet multiplexer (Packet MUX) 108, a post-processor 109, a modified data randomizer 110, a systematic/non-systematic RS encoder 111, a data interleaver 112, a non-systematic RS encoder 113, a parity replacer 114, a modified trellis encoder 115, a synchronization multiplexer (Sync MUX) 116, a pilot inserter 117, a VSB modulator 118, and a Radio Frequency (RF) up-converter 119. In addition, the transmission system of FIG. 1 may further include a pre-equalizer filter 120.

When a mobile service data packet and a main service data packet are multiplexed, there may occur a displacement between a service stream packet including a mobile service stream and another service stream packet including no mobile service stream. In order to compensate for the displacement, the packet adjustment unit 101 may be used.

The pre-processor 102 configures mobile service data in a form of a mobile service structure for transmitting the mobile service data. In addition, the pre-processor 102 performs additional FEC coding of mobile service data. Also, the pre-processor 102 inserts known data. That is, the pre-processor 102 increases the stability of transmission and reception of mobile service data under a mobile environment.

The pre-processor 102 may include a data frame encoder (or RS frame encoder, or encoder) 103, a block processor 103, a block processor 104, a signaling encoder 105, a group formatter 106, a packet formatter 107, and a packet multiplexer (packet MUX) 108. In other words, the above-mentioned constituent components may be contained in the pre-processor 102, and may be configured separately from the pre-processor 102.

The data frame encoder 103 randomizes mobile service data, and performs RS encoding and CRC encoding of the mobile service data.

The block processor 104 converts an RS frame portion into an SCCC block. The block processor 104 converts a mobile service data byte contained in the SCCC block into bit-based mobile service data. The block processor 104 performs convolution encoding of ½, ⅓, or ¼ rate on the bit-based mobile service data. In this case, the ½ rate means an encoding process in which two bits are output in response to an input of one bit, the ⅓ rate means an encoding process in which three bits are output in response to an input of two bits, and the ¼ rate means an encoding process in which four bits are output in response to an input of four bits. Output bits are contained in a symbol. The block processor 104 performs interleaving of the convolution-encoded output symbol. The block processor 104 converts an interleaved symbol into byte-based data, and converts an SCCC block into a data block. A detailed description of the data block will hereinafter be described in detail.

The signaling encoder 105 generates signaling information for signaling at a reception end, performs FEC encoding and PCCC encoding of the generated signaling information, and inserts the signaling information into some regions of the data group. For example, examples of the signaling information may be a transmission parameter channel (TPC) data, fast information channel (FIC) data, and the like.

The group formatter 106 forms a data group using the output data of the block processor 104. The group formatter 106 maps FEC-encoded mobile service data to an interleaved form of a data group format. At this time, the above-mentioned mapping is characterized in that FEC-encoded mobile service data is inserted into either a data block of a corresponding group or a group region according to a coding rate of each FEC-encoded mobile service data received from the block processor 104. In addition, the group formatter 106 inserts signaling data, a data byte used for initializing the trellis encoder, and a known data sequence. Further, the group formatter 106 inserts main service data, and a place-holder for an MPEG-2 header and a non-systematic RS parity. The group formatter 106 may insert dummy data to generate a data group of a desired format. After inserting various data, the group formatter 106 performs deinterleaving of data of the interleaved data group. After performing the deinterleaving operation, the data group returns to an original group formed before the interleaving operation.

The packet formatter 107 converts output data of the group formatter 106 into a Transport Stream (TS) packet. In this case, the TS packet is a mobile service data packet. In addition, the output of the packet formatter 107 according to an embodiment of the present invention is characterized in that it includes (118+M) mobile service data packets in a single data group. In this case, M is 38 or less.

The packet multiplexer (Packet MUX) 108 multiplexes a packet including mobile service data processed by the pre-processor 102 and a packet including main service data output from the packet adjustment unit 101. In this case, the multiplexed packet may include (118+M) mobile service data packets and L main service data packets. For example, according to an embodiment of the present invention, M is any one of integers from 0 to 38, and the sum of M and L is set to 38. In other words, although the packet multiplexer (packet MUX) 108 may multiplex the mobile service data packet and the main service data packet, in the case where the number of input main service data packets is set to '0' (i.e., L=0), only the mobile service data packet is processed by the packet multiplexer (packet MUX) 108, such that the packet multiplexer (packet MUX) 108 outputs the processed mobile service data packet only.

The post-processor 109 processes mobile service data in such a manner that the mobile service data generated by the present invention can be backward compatible with a conventional broadcast system. In accordance with one embodiment of the present invention, the post-processor 109 may include a modified data randomizer 110, a systematic/non-systematic RS encoder 111, a data interleaver (or interleaver) 112, a non-systematic RS encoder 113, a parity replacer 114 and a modified trellis encoder 115. In other words, each of the above-mentioned constituent components may be located outside of the post-processor 109 according to the intention of a designer as necessary.

The modified data randomizer 110 does not perform randomizing of a mobile service TS packet, and bypasses a mobile service TS packet. The modified data randomizer 110 performs randomizing of the main service data TS packet. Therefore, according to one embodiment of the present invention, the randomizing operation is not performed when a data group generated by the pre-processor 102 has no main service data.

In the case where input data is a main service data packet, the systematic/non-systematic RS encoder 111 performs systematic RS encoding of the main service data packet acting as the input data, such that it generates RS FEC data. In the case where input data is a mobile service data packet, the systematic/non-systematic RS encoder 111 performs non-systematic RS encoding, such that it generates RS FEC data. In accordance with one embodiment of the present invention, the systematic/non-systematic RS encoder 111 generates RS FEC data having the size of 20 bytes during the systematic/non-systematic RS encoding process. The RS FEC data generated in the systematic RS encoding process is added to the end of a packet having the size of 187 bytes. RS FEC data generated in the non-systematic RS encoding process is inserted into the position of an RS parity byte predetermined in each mobile service data packet. Therefore, according to one embodiment of the present invention, in the case where the data group generated by the pre-processor has no main service data, the systematic RS encoder 111 for main service data performs no RS encoding. In this case, the non-systematic RS encoder 111 does not generate a non-systematic RS parity for backward compatibility.

The data interleaver 112 performs byte-based interleaving of data that includes main service data and mobile service data.

In the case where it is necessary to initialize the modified trellis encoder 115, the non-systematic RS encoder 113 receives an internal memory value of the modified trellis encoder 115 as an input, and receives mobile service data from the data interleaver 112 as an input, such that it changes initialization data of mobile service data to a memory value. The non-systematic RS encoder 113 performs non-systematic RS encoding of the changed mobile service data, and outputs the generated RS parity to the parity replacer 114.

In the case where it is necessary to initialize the modified trellis encoder 115, the parity replacer 114 receives mobile service data output from the data interleaver 112, and replaces an RS parity of the mobile service data with an RS parity generated from the non-systematic RS encoder 113.

In the case where the data group generated in the pre-processor does not include main service data at all, the data group need not have an RS parity for backward compatibility. Accordingly, in accordance with one embodiment of the present invention, the non-systematic RS encoder 113 and the parity replacer 114 do not perform each of the above-mentioned operations, and bypass corresponding data.

The modified trellis encoder 115 performs trellis encoding of output data of the data interleaver 112. In this case, in order to allow data formed after the trellis encoding to have known data pre-engaged between a transmission end and a reception end, a memory contained in the modified trellis encoder 115 should be initialized before the beginning of the trellis encoding. The above-mentioned initialization operation begins by trellis initialization data belonging to a data group.

The synchronization multiplexer (Sync MUX) 116 inserts a field synchronization signal and a segment synchronization signal into output data of the modified trellis encoder 115, and multiplexes the resultant data.

The pilot inserter 117 receives the multiplexed data from the synchronization multiplexer (Sync MUX) 116, and inserts a pilot signal, that is used as a carrier phase synchronization signal for demodulating a channel signal at a reception end, into the multiplexed data.

The VSB modulator 118 performs VSB modulation so as to transmit data.

The transmission unit 119 performs frequency up-conversion of the modulated signal, and transmits the resultant signal.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Figure 40A:
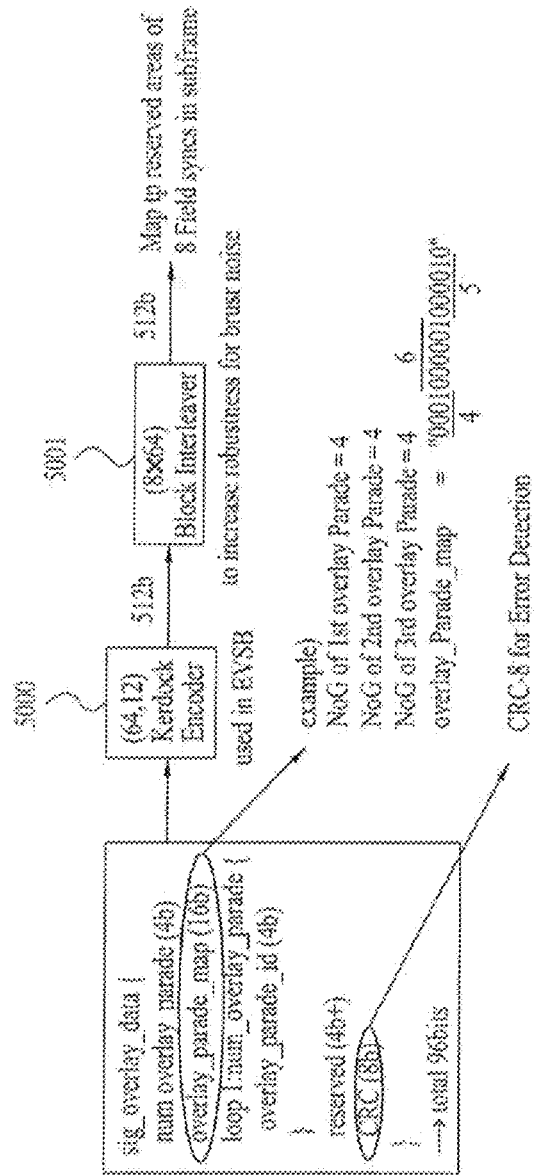
FIGS. 40A and 40B illustrate an embodiment of a bit stream syntax structure of signaling overlay data sig_overlay_data( ) for overlay parade related signaling information according to the present invention.

FIG. 40 illustrates an embodiment of a bit stream syntax structure of signaling overlay data sig_overlay_data( ) for overlay parade related signaling information according to the present invention.

Signaling overlay data sig_overlay_data( ) shown in FIG. 40 A provides signaling information of all overlay parades transmitted through one subframe.

A (4-bit) num_overlay_parade field in the signaling overlay data sig_overlay_data( ) indicates the number of overlay parades transmitted through one subframe.

A (16-bit) overlay_parade_map field indicates the NOG of each overlay parade transmitted through the subframe. In an embodiment of the present invention, one of the 16 bits, which corresponds to the NOG of a corresponding overlay parade, is set to "1" to indicate the NOG of the overlay parade.

For example, let us assume that the num_overlay_parade field value is 3, i.e., that 3 overlay parades are transmitted through the subframe. In addition, let us assume that the NOG of the first overlay parade is 4, the NOG of the second overlay parade is 6, and the NOG of the third overlay parade is 5. In this case, the fourth of the 16 bits of the overlay_parade_map field is set to "1", the sixth bit, counted from the fourth bit, is set to "1", and the fifth bit, counted from the sixth bit, is set to "1" and the overlay_parade_map field is then inserted into an FSSC of a corresponding field synchronization segment. That is, when the overlay_parade_map field value is "0001000001000010", the receiving system can determine that the NOG of the first overlay parade is 4, the NOG of the second overlay parade is 6, and the NOG of the third overlay parade is 5. In another example, the overlay_parade_map field value is "01001000010000" when the NOG of the first overlay parade is 2, the NOG of the second overlay parade is 3, and the NOG of the third overlay parade is 5.

The loop is performed a number of times corresponding to the num_overlay_parade field value to provide an identifier for each overlay parade. For example, when the num_overlay_parade field value is 3, the loop is repeated 3 times to provide three overlay parade identifiers. To accomplish this, the loop includes a (16-bit) overlay_parade_id field.

Then, an 8-bit CRC code for error correction is inserted.

Here, if the signaling information of the overlay parade signaled through the signaling overlay data sig_overlay_data( ) is less than 96 bits, a reserved field is used to increase the signaling information to 96 bits.

As shown in FIG. 40 B, the 96 bits are divided into 12-bit units which are then input to a (64, 12) Kerdock encoder 4000. The (64, 12) Kerdock encoder 4000 encodes 12 input bits using a Kerdock coding algorithm to create 64 bits and outputs the 64 bits to an (8×64) block interleaver 4001.

The block interleaver 4001 is a variable-length block interleaver that interleaves overlay parade signaling data, which has been Kerdock encoded and then has been input in units of 64 bits, in units of 8×64 blocks as shown in FIG. 40.

The block interleaver 4001 writes the 64-bit overlay parade signaling data in a left to right direction and then in a downward direction on a row by row basis and reads the overlay parade signaling data in a downward direction and then in a left to right direction on a column by column basis and outputs the read overlay parade signaling in units of 64 bits.

Figure 40B:
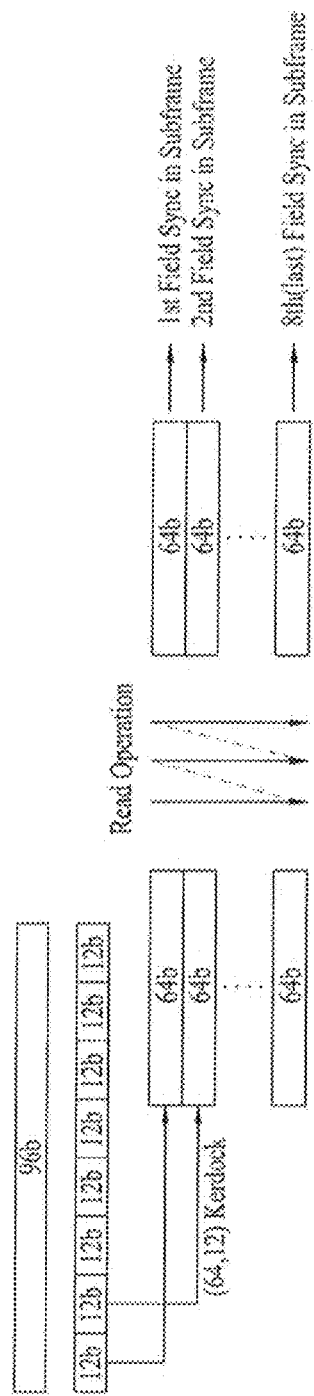

As shown in FIG. 40B, the provided 96-bit overlay parade signaling information is converted into 512 bits via the Kerdock encoder 5000 and the block interleaver 5001. In an embodiment of the present invention, the 512-bit overlay parade signaling information is divided into eight 64-bit units and the eight 64-bit units are then sequentially inserted into eight field Syncs in a corresponding subframe as shown in FIG. 40B.

On the other hand, in an embodiment of the present invention, 2 bits of the TPC data are used to indicate whether or not an overlay parade is present and version information of the overlay parade. In the present invention, the 2 bits are referred to as an "overlay_group_status field".

That is, since the overlay parade configuration may vary in each M/H frame, the overlay_group_status field indicates whether an overlay parade is present in the corresponding M/H frame. When an overlay parade is present, the overlay_group_status field also indicates version information of the overlay parade.

For example, when the overlay_group_status field has a value of "00", this indicates that an overlay parade is not present in the corresponding M/H frame. In this case, the receiving system does not need to analyze field synchronization to obtain overlay parade signaling information. When the overlay_group_status field has one of the values of "01", "10", and "11", this indicates that an overlay parade is present in the M/H frame. Here, let us assume that the overlay_group_status field in the current M/H frame has a value of "01". Also, let us assume that the overlay parade configuration has changed in a next M/H frame. In this case, the overlay_group_status field may be changed to "10" in the next M/H frame.

FIG. 41 illustrates a syntax structure of a TPC data field for signaling digital broadcast data according to an embodiment of the present invention.

The TPC data may include a sub-frame_number field, a slot_number field, a parade_id field, a starting_group_number (SGN) field, a number of groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode_B field, an SCCC_outer_code_mode_C field, an SCCC_outer_code_mode_D field, an FIC_version field, a parade_continuity_counter field, a TNoG field and a TPC_protocol_version field.

The Sub-Frame_number field shall be the current Sub-Frame number within the Transmission frame, which is transmitted for Transmission frame synchronization. Its value shall range from 0 to 4.

The Slot_number field is the current Slot number within the Sub-Frame, which is transmitted for Transmission frame synchronization. Its value shall range from 0 to 15.

The Parade_id field identifies the Parade to which this Group belongs. The value of this field may be any 7-bit value. Each Parade in a DATA transmission shall have a unique Parade_id. Communication of the Parade_id between the physical layer and the management layer shall be by means of an Ensemble_id formed by adding one bit to the left of the Parade_id. If the Ensemble_id is for the primary Ensemble delivered through this Parade, the added MSB shall be '0'. Otherwise, if it is for the secondary Ensemble, the added MSB shall be '1'.

The starting_Group_number (SGN) field shall be the first Slot_number for a Parade to which this Group belongs.

The number_of_Groups (NoG) field shall be the number of Groups in a Sub-Frame assigned to the Parade to which this Group belongs, minus 1, e.g., NoG=0 implies that one Group is allocated to this Parade in a Sub-Frame.

The Parade_repetition_cycle (PRC) field shall be the cycle time over which the Parade is transmitted, minus 1, specified in units of Transmission frames.

The RS_Frame_mode field represents that one parade transmits one RS frame or two RS frames.

The RS_code_mode_primary field shall be the RS code mode for the primary RS frame.

The RS_code_mode_secondary field shall be the RS code mode for the secondary RS frame.

The SCCC_Block_mode field represents how DATA blocks within a group are assigned to SCCC block.

The SCCC_outer_code_mode_A field corresponds to the SCCC outer code mode for Region A within a group.

The SCCC_outer_code_mode_B field corresponds to the SCCC outer code mode for Region B within the group.

The SCCC_outer_code_mode_C field corresponds be the SCCC outer code mode for Region C within the group.

The SCCC_outer_code_mode_D field corresponds to the SCCC outer code mode for Region D within the group.

The FIC_version field represents a version of FIC data.

The Parade_continuity_counter field counter may increase from 0 to 15 and then repeat its cycle. This counter shall increment by 1 every (PRC+1) Transmission frames. For example, as shown in Table 12, PRC=011 (decimal 3) implies that Parade_continuity_counter increases every fourth Transmission frame.

The TNoG field may be identical for all sub-frames in a Transmission frame.

The tpc_protocol_version field is a 5-bit unsigned integer field that represents the version of the structure of the TPC syntax.

TPC data according to the present invention may be extended such that it includes mobile service data of the E region. In this case, a version of the TPC syntax structure indicated by a 'tpc_protocol_version' field may be changed to another version.

TPC data is information for signaling. In the case where the E region is allocated to a transmission area of mobile service data in the group, the TPC data may further include associated information indicating the above case. One embodiment of the present invention assumes that scalable mode information is contained in TPC data. That is, scalable information indicating an M value from among information of (118+M) mobile service data packets is contained in the TPC data, such that the reception end can receive information about the group structure. For example, if the scalable mode is set to '000', M may be '11'. If the scalable mode is set to '001', M may be '20'. If the scalable mode is set to '010', M may be '29'. If the scalable mode is set to '011', M may be '38'. If the scalable mode is set to '111', M may be '38' in all groups transmitted during 16 slots in a sub frame.

In accordance with still another embodiment of the present invention, scalable mode information contained in TPC data may be classified into scalable mode information of a current frame and scalable mode information of the next frame. That is, TPC data contained in the current frame provides the possibility of estimating data to be received in the reception end through the next frame's scalable mode information, such that the receiver acting as the reception end can stably receive data.

However, the information included in the TPC data presented herein is merely exemplary. And, since the adding or deleting of information included in the TPC may be easily adjusted and modified by one skilled in the art, the present invention will, therefore, not be limited to the examples set forth herein. (56)

Figure 42:
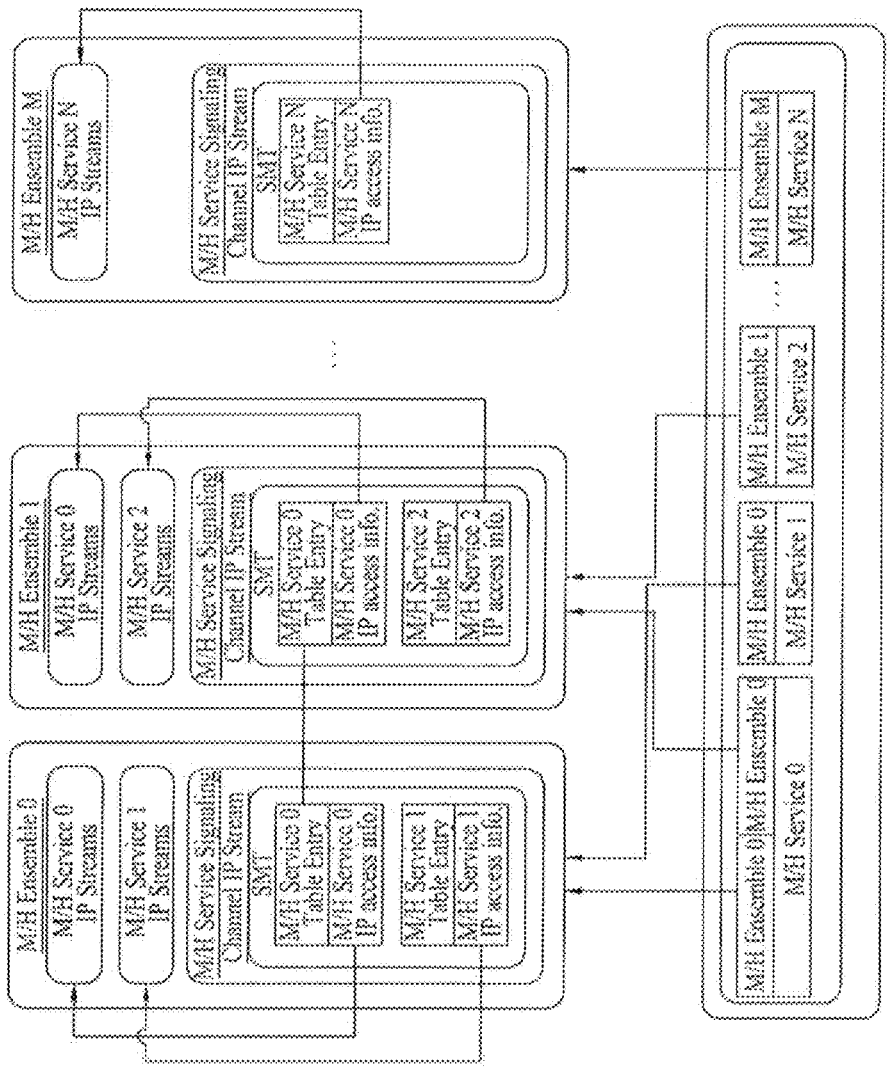
FIG. 42 is a diagram showing a hierarchical signaling structure according to an embodiment of the present invention.

FIG. 42 is a diagram showing a hierarchical signaling structure according to an embodiment of the present invention.

Mobile broadcast technology according to the embodiment of the present invention may utilize FIC and SMT signaling methods as shown in FIG. 41. This is called a hierarchical signaling structure in the present invention. That is, FIG. 42 shows a hierarchical signaling structure for providing data necessary for service acquisition through a service map table (SMT) of an FIC chunk and an IP-level mobile service signaling channel. As can be seen from FIG. 42, the FIC chunk rapidly delivers a mapping relationship between a mobile service and an ensemble to a reception system using. That is, the FIC chunk rapidly finds an ensemble for delivering a service desired by the reception system and provides signaling data for rapidly receiving RS frames of the ensemble to the reception system.

In addition, in the present invention, the ensemble includes a CMM ensemble and an SFCMM ensemble. The CMM ensemble is carried through a CMM data group and the SFCMM ensemble is carried through an SFCMM data group. The FIC chunk may provide information for enabling a CMM dedicated reception system or receiver to receive only the CMM ensemble and enabling an SFCMM dedicated reception system or receiver to receive both the SFCMM ensemble and the CMM ensemble. The SFCMM ensemble may include a conventional SFCMM (or EMM ensemble), an overlay ensemble, and a super ensemble according to parade formats. The ensemble ids of the ensembles are shown in the following <table 1>. The formats assigned to the id types may be changed according to design considerations.

FIG. 43 is a diagram showing an embodiment of a syntax structure of an FIC chunk according to the present invention.

A reception system of the present invention enables faster access to a currently broadcast mobile service using an FIC.

TABLE 1

| Ensemble Type | parade | ensemble_type | ensemble_id |
|---|---|---|---|
| Conventional Ensemble | P | '000' | 8-bit:'0'<parade_id> |
| (EMM only) | S | | 8-bit:'1'<parade_id> |
| OverlayEnsemble | O | '001' | 8-bit:'1111'<overlay_parade_id:4bit> |
| Super Ensemble | P + P | '001' | 16-bit:'0'<parade_id>'0' <parade_id> |
| | P + S | | 16-bit:'0'<parade_id>'1' <parade_id> |
| | S + S | | 16-bit:'1'<parade_id>'1' <parade_id> |
| | P + O | '101' | 16-bit:'0'<parade_id>'1111'<overlay_parade_id> |
| | S + O | | 16-bit: '1'<parade_id>'1111'<overlay_parade_id> |
| | O + O | '110' | 16-bit: '1111'<overlay_parade_id>'1111'<overlay_parade_id> |

Figures 43A, 43B:
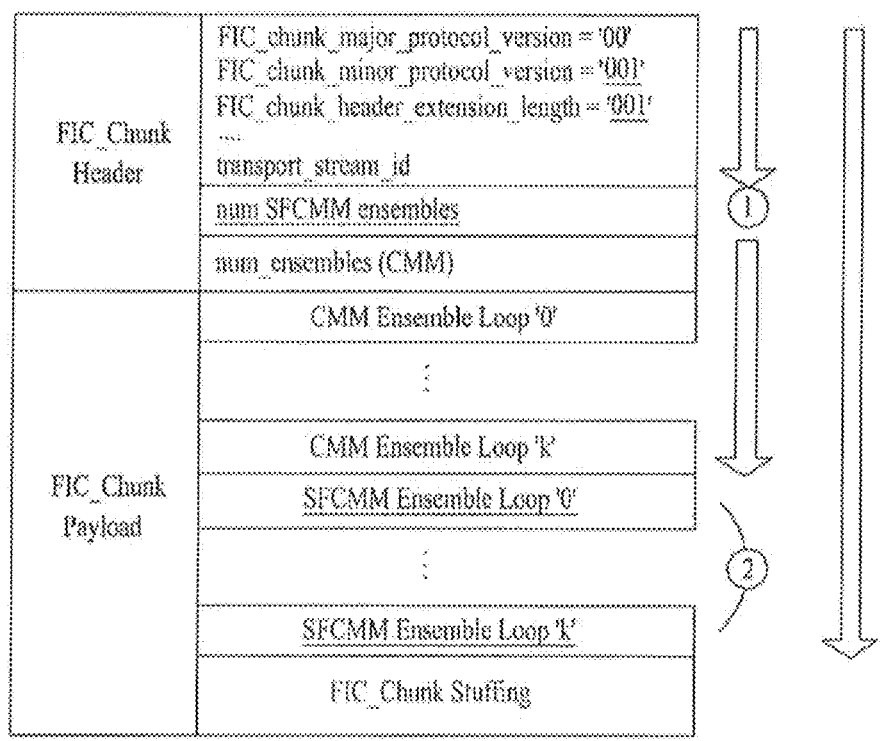
FIGS. 43A and 43B illustrate a diagram showing an embodiment of a syntax structure of an FIC chunk according to the present invention.

As shown in FIG. 43A, the syntax of the FIC chunk serves to map a mobile service and an ensemble through an FIC. The FIC chunk includes a 5-byte FIC chunk header and an FIC chunk payload having a variable length.

The FIC chunk header may signal a major protocol version change that is not backward compatible with the FIC chunk, signal a minor protocol version change that is backward compatible with the FIC chunk, and signal the respective lengths of extension of the FIC chunk header which may be generated by the minor protocol version change, extension of an ensemble loop header and extension of a mobile service loop.

FIG. 43 B shows a relationship between the FIC chunk header and the FIC chunk payload in case of the minor protocol version change. In the embodiment of the present invention, a reception system or receiver which is able to accept the minor protocol version change processes an extension field, but a legacy reception system or receiver which is not able to accept the minor protocol version change skips the extension field using the length information thereof. For example, a reception system which is able to accept the minor protocol version change can identify the content indicated by the extension field and perform an operation according to the content indicated by the extension field.

Accordingly, in the present invention, the CMM dedicated receiver may skip the extension field included in the FIC chunk. The extension field is associated with the value of the below-described FIC_Chunk_header_extension_length field. In addition, the CMM dedicated receiver may approximate the size of the FIC chunk using the number of CMM ensembles and the number of M/H service fields and apply the FIC chunk within the CMM receiver. That is, the CMM dedicated receiver may treat a plurality of SFCMM ensemble loops included in the FIC chunk payload as FIC chunk stuff bytes. As a result, the CMM dedicated receiver may skip the plurality of SFCMM ensemble loops.

Figure 44:
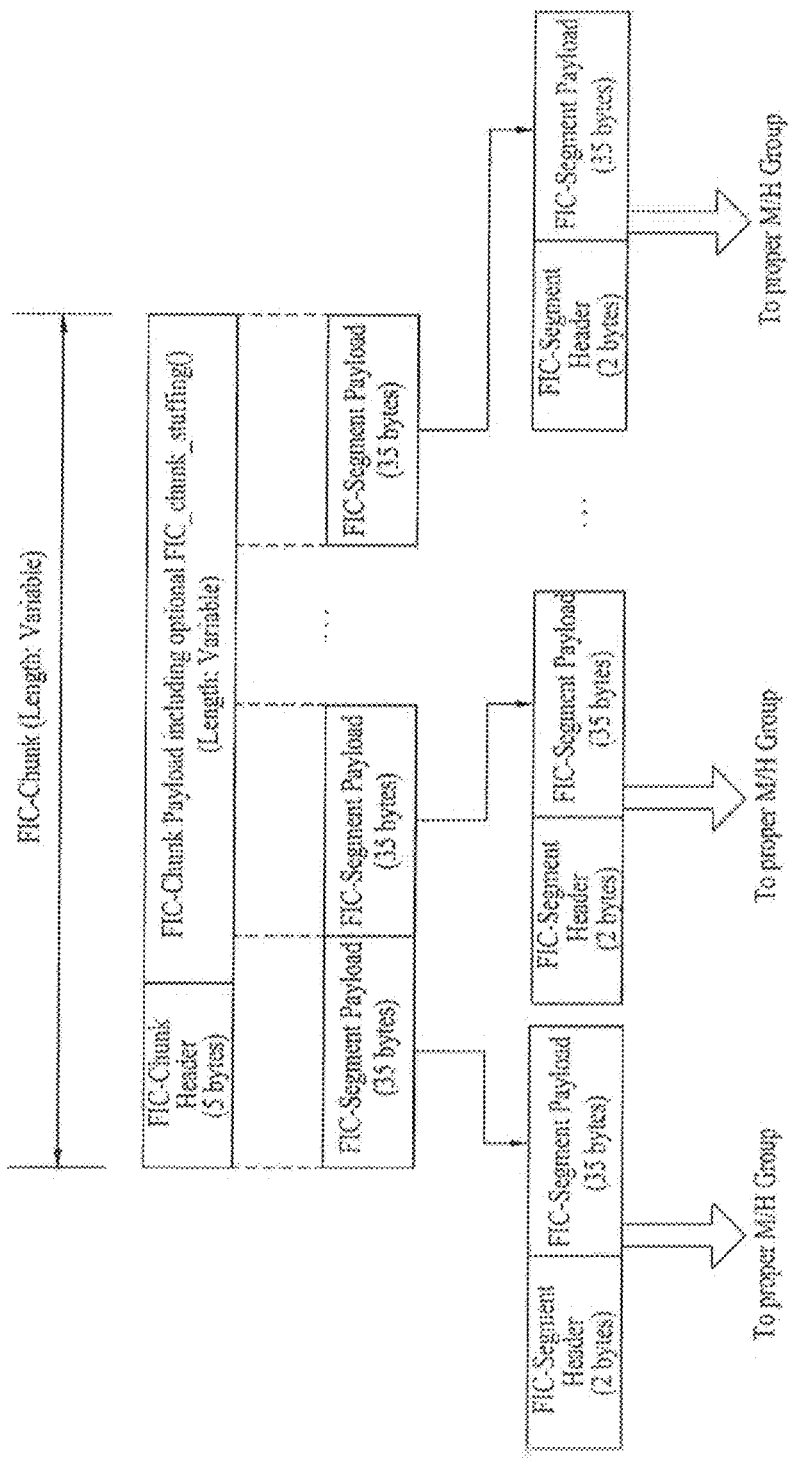
FIG. 44 is a block diagram showing an FIC chunk and FIC segments according to the present invention.

FIG. 44 is a block diagram showing an FIC chunk and FIC segments according to the present invention.

A transmission system according to the present invention segments the FIC chunk into a plurality of FIC segments as shown in FIG. 44 and transmits the FIC segments to a reception system. The size of each FIC segment unit is 37 bytes and each FIC segment includes a 2-byte FIC segment header and a 35-byte FIC segment payload. That is, as shown in FIG. 44, one FIC chunk including the FIC chunk header and the FIC chunk payload is segmented into 35 bytes. An FIC segment including the segmented 35 bytes and the 2-byte FIC segment header may be formed.

In one embodiment of the present invention, the length of the FIC chunk is variable. The length of the FIC chunk may be changed according to the number of ensembles carried through a physical transfer channel and the number of mobile services included in each ensemble. The FIC chunk payload may include stuffing data (or stuffing bytes). In this case, the stuffing data is used for alignment between the FIC chunk and a boundary of a last FIC segment among FIC segments belonging to the FIC chunk. If the length of the stuffing data is minimized, it is possible to reduce waste of FIC segments.

In one embodiment of the present invention, the FIC segments segmented from one FIC chunk may be carried through one subframe or through a plurality of subframes as shown in FIG. 44. If the FIC chunk is carried using the latter method, all necessary signaling data can be carried through the FIC chunk even when the amount of data to be carried through the FIC chunk is greater than the amount of FIC segments carried through one subframe (corresponding to the case where a plurality of services having a very low bit rate is executed).

FIG. 45 is a diagram showing an embodiment of a syntax structure of an FIC segment header according to the present invention.

The FIC segment header may include an FIC_segment_type field, an FIC_Chunk_major_protocol_version field, a Current_next indicator field, an error_indicator field, an FIC_segment_num field, and an FIC_last_segment_num field.

These fields will now be described.

FIC_segment_type—A two-bit field indicating the type of data carried in this FIC-Segment. When the value of this field is set to '00', this indicates that the payload of the FIC-Segment is carrying a portion of an FIC-Chunk. When the value of this field is set to '11', this indicates that the FIC-Segment is a NULL FIC-Segment that does not have any meaningful data in its payload. Other values are reserved for future extension.

FIC_chunk_major_protocol_version—A two-bit field, which indicates the major protocol version of the FIC-Chunk which is being carried in part through the payload of this FIC-Segment. The value of this field is equal to the value of the FIC_chunk_major_protocol_version field of the FIC_chunk_header( ).

current_next_indicator—A one-bit field, which indicates the current/next status of the FIC-Chunk which is being carried in part through the payload of this FIC-Segment. The value of this field is equal to the value of the current_next_indicator field of the FIC_chunk_header( ).

error_indicator—This 1-bit indicator shall indicate whether any error was detected in this FIC-Segment. A value of '0' indicates that no error was detected. A value of '1' indicates that an error was detected.

FIC_segment_num—A 4-bit unsigned integer field which gives the number of this FIC-Segment. For the first FIC-Segment of an FIC-Chunk, the value of this field is set to 0x0. This field is incremented by one with each additional FIC-Segment belonging to an FIC-Chunk.

FIC_last_segment_num—A 4-bit unsigned integer field which gives the number of the last FIC-Segment (i.e., the FIC-Segment with the highest FIC_segment_num) of the complete FIC-Chunk.

FIG. 46 is a diagram showing an embodiment of a syntax structure of an FIC chunk header according to the present invention.

In one embodiment of the present invention, the minor protocol version change of the FIC chunk is performed by additionally inserting a field to an end portion of each of the FIC chunk header, the ensemble loop header and the mobile service loop in the FIC chunk of the previous minor protocol version. In one embodiment of the present invention, if the length of the additional field is not represented by the extension length of the FIC chunk header, that is, if a specific field in the FIC chunk payload is removed, or if the number of bits assigned to that field is changed or the definition of that field is changed, the major protocol version of the FIC chunk is updated.

In addition, the FIC chunk header signals information indicating whether the data of the FIC chunk payload contains mapping information between the mobile service and the ensemble in a current M/H frame or mapping information between a mobile service and an ensemble in the next M/H frame, and signals the number of ensembles carried through a mobile broadcast and a transport stream ID of a mobile broadcast through which the FIC chunk is currently carried.

The FIC chunk header includes an FIC_chunk_major_protocol_version field, an FIC_chunk_minor_protocol_version field, an FIC_chunk_header_extension_length field, an ensemble_loop_header_extension_length field, an M/H_service_loop_extension_length field, a current_next_indicator field, a transport_stream_id field, a num_SFCMM ensemble field and a num_ensembles field.

The FIC_major_protocol_version field is, for example, a two-bit unsigned integer that represents the major version level of the syntax of the FIC Chunk. A change in the major version level shall indicate a non-backward-compatible level of change. When this field is updated, legacy receivers who can process the prior major version of the FIC-Chunk protocol shall avoid attempting to process the FIC Chunk.

The FIC_minor_protocol_version field is, for example, a three-bit unsigned integer that represents the minor version level of the syntax of the FIC-Chunk. A change in the minor version level shall indicate a backward-compatible level of change. If this field is updated, legacy receivers who can process the same major version of FIC Chunk protocol may process a part of the FIC Chunk.

The FIC_Chunk_header_extension_length field is a 3-bit unsigned integer that identifies the length of the FIC-Chunk header extension in bytes caused by the minor protocol version update of the FIC-Chunk, where the extension bytes are appended to the end of the FIC-Chunk header.

The ensemble_header_extension_length field is a 3-bit unsigned integer that identifies the length of the ensemble header extension in bytes caused by the minor protocol version update of the FIC-Chunk, where the extension bytes are appended to the end of the ensemble loop header.

The M/H_service_loop_extension_length field is a 3-bit unsigned integer that identifies the length of the ensemble header extension in bytes caused by the minor protocol version update of the M/H service loop, where the extension bytes are appended to the end of the M/H service loop.

The current_next_indicator field is a one-bit indicator, which when set to "1" indicates that this FIC-Chunk is currently applicable. When the bit is set to "0", this indicates that this FIC-Chunk will be applicable for the next M/H Frame. In the latter case, the most recent version of FIC-Chunk transmitted with the current_next_indicator bit set to "1" is currently applicable. That is, if the value of this field is set to "1", this indicates that the FIC chunk carries signaling data of a current M/H frame. If the value of this field is set to "0", this indicates that the FIC chunk carries signaling data of a next M/H frame. In the present invention, when generating a reconfiguration in which the mapping information between the mobile service and the ensemble in the current M/H frame and the mapping information between the mobile service and the ensemble in the next M/H frame are changed, the M/H frame before reconfiguration occurs is referred to as a current M/H frame and the M/H frame in which the reconfiguration occurs is referred to as a next M/H frame.

The transport_stream_id field is a 16-bit unsigned integer that represents a transport stream ID of a mobile broadcast through which the current FIC chunk is carried. That is, this field serves as a label to identify this M/H broadcast. The value of this field is equal to the value of the transport_stream_id field in the Program Association Table (PAT) in the MPEG-2 transport stream of the main ATSC broadcast.

The num_SFCMM ensembles field is an 8-bit unsigned integer that represents the number of SFCMM ensembles carried through the physical transport channel, the value of which equals the number of SFCMM Ensembles carried through this M/H Broadcast that are not available to CMM receiver devices, including the SFCMM Ensembles where the value of the PRC for the corresponding M/H Parades is greater than 0 and that do not have any M/H Groups in the M/H Frame to which this FIC-Chunk refers.

The num_ensembles field is an 8-bit unsigned integer that represents the number of CMM ensembles carried through the physical transport channel, the value of which shall equal the number of CMM Ensembles carried through the M/H Broadcast, including the M/H Ensembles where the value of the PRC for the corresponding M/H Parades is greater than 0 and that do not have any M/H groups in the M/H Frame to which this FIC-Chunk refers.

FIG. 47 is a diagram showing an embodiment of a syntax structure of an FIC chunk payload according to the present invention.

In particular, FIG. 47 shows the syntax structure of the FIC chunk payload in the minor protocol version according to the present invention.

The FIC chunk payload includes ensemble configuration information and information about the mobile service carried through each ensemble, with respect to the SFCMM ensembles and the CMM ensembles respectively corresponding to the num_SFCMM ensembles field and the num_ensembles field in the FIC chunk header of FIG. 46. The FIC chunk payload may include a CMM ensemble loop, a mobile service loop under the CMM ensemble loop, an SFCMM ensemble loop, and a mobile service loop under the SFCMM ensemble loop. Through the FIC chunk payload, the reception system may check through which ensemble a desired mobile service is carried (by mapping between the ensemble_id and the M/H_service_id) and receive RS frames belonging to the ensemble. Accordingly, as described above, the SFCMM ensemble loop is not allowed in the CMM receiver.

The ensemble loop (or the CMM ensemble loop) and the SFCMM ensemble loop of the FIC chunk payload includes an ensemble_id field, an ensemble_protocol_version field, an SLT_ensemble_indicator field, a GAT_ensemble_indicator field, an M/H_service_signaling channel_version field, a num_M/H_services field, a mobile service loop, and an FIC_Chunk_stuffing field, all of which are repeated by the value of the num_ensembles field. The mobile service loop may include a multi_ensemble_service field, an M/H_service_status field, and an SP_indicator field, all of which are repeated by the value of the num_M/H_services field.

The ensemble_id field is an 8-bit unsigned integer that indicates whether the ensemble is a CMM ensemble or an SFCMM ensemble, that is, identifies the associated CMM or SFCMM Ensemble. The value of this field is derived from the parade_id (carried in the Transmission Parameter Channel, TPC, FIG. 44) of the corresponding CMM or SFCMM Parade, by using the parade_id of the associated M/H Parade for the least significant 7 bits, and using "0" for the most significant bit when the M/H Ensemble is carried over the Primary RS Frames and using "1" for the most significant bit when the M/H Ensemble is carried over the Secondary RS Frames. For further details on the TPC, see ATSC N153 Part 2 [31]. The value of ensemble_id of a CMM or SFCMM Ensemble shall not be changed during the period of time where a CMM or SFCMM Service is present and/or announced in the SG.

The ensemble_protocol_version field is a 5-bit unsigned integer that represents the version of this ensemble, specifically its RS Frame payload structure and its M/H Service Signaling Channel structure. The value of this field is set as specified below <table 2>.

TABLE 2

| Version | |
|---|---|
| 0 | The M/H ensemble configuration (the RS Frame payload structure and the M/H Service Signaling Channel configuration) that is defined in this version of this standard |
| 1-31 | Reserved for other M/H ensemble configurations possibly defined in future versions of this standard |

A new value of the ensemble_protocol_version would be triggered by changes to the RS Frame payload structure and/or the M/H Service Signaling Channel structure that cannot be signaled by the signaling mechanisms within the RS Frame payload and the M/H Service Signaling Channel. Examples of the general scope of such possible changes include:

A fundamental change in the way data is packed into the RS Frame payload, such as inserting data column by column instead of row by row, or defining an M/H Transport Packet to consist of two rows rather than one row (to cut TP header overhead in half). A change in the TP (Transport stream) header and perhaps TP packet format, such as adding a TP protocol version field to the TP header, or changing the way stuffing bytes are signaled. A change in the IP address and port used for the Service Signaling Channel, perhaps even placing different tables at multiple different IP addresses or ports. Replacing the current signaling tables (SMT, GAT, etc.) with new versions that do not use MPEG-2 private section syntax, but have some totally different structure such as XML.

The SLT_ensemble_indicator field is a one-bit indicator that indicates whether or not SLT information is carried through this ensemble. That is, this field, when set to "1", indicates that the SLT (Service Labeling Table) is carried in the M/H Service Signaling Channel of this Ensemble.

The GAT_ensemble_indicator field is a one-bit indicator indicating that GAT information is carried within this ensemble. This field, when set to "1", indicates that the GAT (Guide Access Table) is carried in the signaling stream of this ensemble.

The M/H_service_configuration_version field is a 5-bit field that is the version number of the M/H Service Signaling Channel of this M/H Ensemble. The value of this field is modulo 32 and is incremented by 1 whenever a change is made in any of the tables carried within the M/H Service Signaling Channel in this ensemble.

The num_M/H_services field is an 8-bit unsigned integer that represents the number of M/H Services carried through this M/H Ensemble.

For example, if the minor protocol version in the FIC chunk header is changed and the extension field is added to the ensemble loop header, this extension field is added after the num_M/H_services field. As another embodiment, if the num_M/H_services field is included in the M/H service loop, the extension field added to the ensemble loop header is added after the M/H_service_configuration_version field.

The M/H_service_id field of the M/H service loop is a 16-bit unsigned integer that identifies the M/H Service. This integer is unique within the M/H Broadcast. When an M/H Service has components in multiple M/H Ensembles, the set of IP streams of the service in each Ensemble is treated as a separate service for signaling purposes, except when the entries for these services in the FIC all have the same M/H_service_id value. Thus, the same M/H_service_id value may appear in more than one num_ensembles loop and when this happens the M/H_service_id shall represent the overall combined service, thereby maintaining the uniqueness of the M/H_service_id. For any situation in which a receiver presents the value of the MH_service_id to a viewer, it is recommended that the value of MH_service_id be presented in two parts (the higher 8 bits forming the first number and the lower 8 bits forming the last number) separated by an appropriate delimiter.

The multi_ensemble_service field is a two-bit enumerated field that shall identify whether this M/H Service is carried across more than one M/H Ensemble. Also, this field identifies whether the M/H Service can be rendered meaningfully with only the portion of the M/H Service carried through this M/H Ensemble. The value of this field is defined in the following <table 3>.

The M/H_service_status field is a 2-bit enumerated field that shall identify the status of this M/H Service. The most significant bit indicates whether this M/H Service is active (when set to 1) or inactive (when set to 0) and the least significant bit indicates whether this M/H Service is hidden (when set to 1) or not (when set to 0).

TABLE 3

| multi_ensemble_service | Meaning |
|---|---|
| '00' | All the IP streams that form this M/H Service are delivered through this M/H Ensemble. |
| '01' | The IP streams that form this M/H Service are delivered through multiple M/H Ensembles. A meaningful version of this M/H Service can be rendered only using IP stream components delivered through this M/H Ensemble. |
| '10' | The IP streams that form this M/H Service are delivered through multiple M/H Ensembles. No meaningful version of this M/H Service can be rendered with only the IP stream components delivered through this M/H Ensemble. |
| '11' | [Reserved for future ATSC use] |

The SP_indicator field is a 1-bit field indicating that, when set to 1, service protection is applied to at least one of the components needed to provide a meaningful presentation of this M/H Service.

For example, if the minor protocol version in the FIC chunk header is changed and an extension field is added to the M/H service loop, this extension is added after the SP_indicator field.

Stuffing may exist in an FIC-Chunk, to keep the boundary of the FIC-Chunk to be aligned with the boundary of the last FIC-Segment among FIC-segments belong to the FIC chunk. The length of the stuffing is determined by how much space is left after parsing the entire FIC-Chunk payload preceding the stuffing. The number of stuffing bytes is the minimum number needed to make the length of the FIC-Chunk evenly divisible by 35.

FIG. 48 is a diagram showing another embodiment of a syntax structure of an FIC segment header, an FIC chunk header and an FIC payload.

FIG. 48 A shows another embodiment of the syntax structure of the FIC segment header according to a major protocol version. If the major protocol version is present, the syntax of the FIC segment header includes the same fields as the syntax structure of the FIC segment header shown in FIG. 45. In this case, the FIC_chunk_major_protocol_version field may be represented by the format of "01". This may be changed according to design considerations.

FIG. 48 B shows another embodiment of the syntax structure of the FIC chunk header according to a major protocol version. If the major protocol version is present, the syntax of the FIC chunk header includes the same fields as the syntax structure of the FIC chunk header shown in FIG. 46. In this case, the FIC_chunk_major_protocol_version field may be represented by the format of "01", the FIC_chunk_minor_protocol_version field may be represented by the format of "000", and the FIC_chunk_header_extension_length field may be represented by the format of "000". This may be changed according to design considerations.

FIG. 48 C shows another embodiment of the syntax structure of the FIC chunk payload according to a major protocol version. If the major protocol version is present, the syntax of the FIC payload may include the same fields as the syntax structure of the FIC chunk payload shown in FIG. 47, but does not include the CMM ensemble loop.

Accordingly, if the major protocol version is present, the CMM receiver may ignore and skip the SFCMM ensemble and the MH service using the FIC information.

Figure 49:
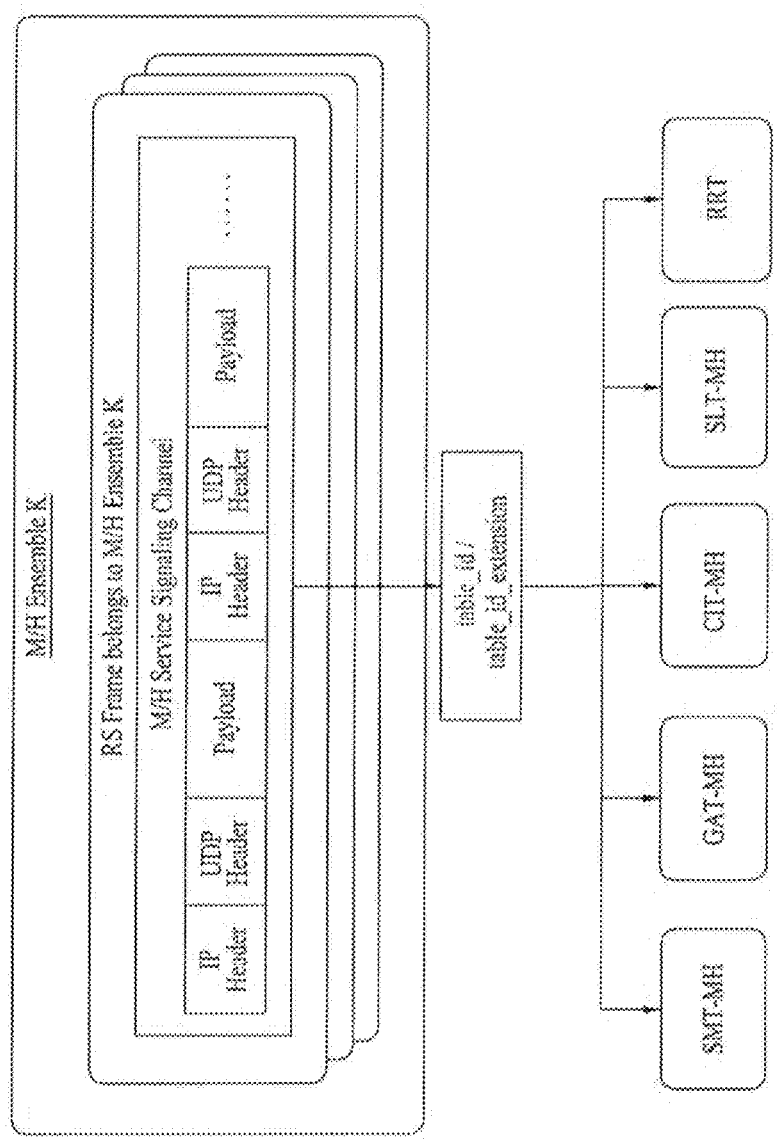
FIG. 49 is a diagram showing content indicating that the M/H Service Signaling tables carried through this M/H Service Signaling Channel shall be differentiated by utilizing table_id and table_id_extension included in the section header of each table.

FIG. 49 shows content indicating that the M/H Service Signaling tables carried through this M/H Service Signaling Channel are differentiated by utilizing table_id and table_id_extension included in the section header of each table.

An M/H Service Signaling Channel for ensemble_protocol_version equal to '00000' is a single IP multicast stream carried in each M/H Ensemble. The M/H Service Signaling Channel for ensemble_protocol_version equal to '00000' shall encapsulate data in UDP datagrams and use the IP destination address 224.0.23.60 (IANA has assigned this as AtscSvcSig) and destination port 4937/udp (IANA has assigned this to atsc-mh-ssc).

For ensemble_protocol_version equal to '00000', an M/H Service Signaling Channel which is unique to a single M/H Broadcast shall use either a unique source address attributed in the global DNS database to the organization which provides the M/H Service Signaling Channel or, in the case of IPv4 datagrams, a source address from the private address range: 10.0.0.0-10.255.255.255, 172.16.0.0-172.31.255.255, 192.168.0.0-192.168.255.255.

The M/H Service Signaling Channel identified with ensemble_protocol_version of '00000' which appears in two or more M/H Broadcasts shall use source addresses attributed in the global DNS database to the organization which provides the Service Signaling Channel.

All the M/H Service Signaling tables, which are listed below, shall only be delivered through the M/H Service Signaling Channel, and no other IP datagrams shall appear in the M/H Service Signaling Channel.
The Service Map Table (SMT-MH)
The Guide Access Table (GAT-MH)
The Cell Information Table (CIT-MH)
The Service Labeling Table (SLT-MH)
The Rating Region Table (RRT)

FIG. 50 is a diagram showing an embodiment of a service map table (SMT) according to the present invention. (FIG. 50 B is a continuous part of FIG. 50 A) The Service Map Table contains attributes for the M/H Services carried in an M/H Ensemble. Any changes in the contents of the SMT-MH (which would reflect changes in the M/H Service line-up or properties) are conveyed in a new SMT-MH carrying an incremented version number. The new SMT-MH is inserted into the data stream of the ensemble at the point at which the changes occur. The information contained in the SMT-MH includes service acquisition information for the IP streams that form each M/H Service, such as destination IP address and destination UDP port number. The set of SMT-MH sections in each ensemble shall include information on all M/H Services that are carried wholly or partially in that ensemble.

The SMT-MH is carried in ATSC-M/H service signaling sections with table_id 0xDB, and shall obey the syntax and semantics of the Generic Table Format (GAT) in FIG. 49.

The following constraints are applied to the delivery of the SMT-MH: For each Ensemble, SMT-MH sections describing all the services of that Ensemble are included in that Ensemble at least once every RS Frame. The SMT-MH sections for each Ensemble are differentiated via the ensemble_id included in the section header.

The SMT may include a table_id field, an SMT_MH_protocol_version field, an ensemble_id field, a current_next_indicator field, a num_MH_services field, an MH_service_id field, a multi_ensemble_service field, an MH_service_status field, an SP_indicator field, a short_MH_service_name_length field, a short_MH_service_name field, an MH_service_category field, a num_components field, an IP_version_flag field, a service_source_IP_address_flag field, a service_destination_IP_address_flag field, a service_source_IP_address field, a service_destination_IP_address field, a component_source_IP_address_flag field, an essential_component_indicator field, a port_num_count field, component_destination_UDP_port_num field, a component_source_IP_address field, a component_destination_IP_address field, a num_component_level_descriptors field, a component_level_descriptor( ) field, a num_MH_service_level_descriptors field, an MH_service_level_descriptor( ) field, a num_ensemble_level_descriptors field 및 an ensemble_level_descriptor( ) field. A detailed explanation of these fields will now be given.

table_id—An 8-bit unsigned integer number that indicates the type of table section being defined. For the Service Map Table for ATSC-M/H (SMT-MH), the table_id is 0xDB.

SMT_MH_protocol_version—An 8-bit unsigned integer whose function is to allow, in the future, this Service Map Table to carry parameters that may be structured differently from those defined in the current protocol. At present, the value for the SMT_protocol_version is zero. Non-zero values of SMT_protocol_version may be used by a future version of this standard to indicate structurally different tables.

ensemble_id—This 8-bit unsigned integer is the Ensemble ID associated with this M/H Ensemble. The value of this field shall match the associated value in the FIC-Chunk.

current_next_indicator—A one-bit indicator, which when set to '1' indicates that the Service Map Table sent is currently applicable. When the bit is set to '0', this indicates that the table sent is not yet applicable and will be the next table to become valid. This standard imposes no requirement that "next" tables (those with current_next_indicator set to '0') must be sent. An update to the currently applicable table is signaled by incrementing the version_number field.

num_MH_services—This 8 bit field shall specify the number of M/H Services in this SMT-MH section.

MH_service_id—A 16-bit unsigned integer that uniquely identifies this M/H Service within the scope of this MH Broadcast. The MH_service_id of a service does not change throughout the life of the service. To avoid confusion, it is recommended that if a service is terminated, then the MH_service_id for the service should not be used for another service until after a suitable interval of time has elapsed. See Annex A for a description of an allocation scheme for MH_service_id values.

multi_ensemble_service—A two-bit enumerated field that shall identify whether the M/H Service is carried across more than one M/H Ensemble. Also, this field shall identify whether or not the M/H Service can be rendered only with the portion of M/H Service carried through this M/H Ensemble. The value of this field is defined in Table 6.8.

MH_service_status—A 2-bit enumerated field that shall identify the status of this M/H Service. The most significant bit shall indicate whether this M/H Service is active (when set to 1) or inactive (when set to 0) and the least significant bit shall indicate whether this M/H Service is hidden (when set to 1) or not (when set to 0). Hidden services are normally used for proprietary applications, and ordinary receiving devices should ignore them.

SP_indicator—A 1-bit field that shall indicate, when set, that service protection is applied to at least one of the components needed to provide a meaningful presentation of this M/H Service.

short_MH_service_name_length—A three-bit unsigned integer that shall indicate the number of byte pairs in the short_service_name field. This value is shown as 'm' in the No. of Bits column for the short_service_name field. When there is no short name for this M/H service, the value of this field is 0.

short_MH_service_name—The short name of the M/H Service, each character of which is encoded per UTF-8 [29]. When there are an odd number of bytes in the short name, the second byte of the last of the byte pair per the pair count indicated by the short_service_name_length field shall contain 0x00.

MH_service_category—A 6-bit enumerated type field that shall identify the type category of service carried in this M/H Service as defined in the table below. When the value of this field is set to the value which is indicated "Informative only", the value of this field is treated as an informative description to the category of service, and the receiver is required to examine the component_level_descriptors( ) of the SMT-MH to identify the actual category of service carried through this M/H Service. Services that have a video and/or audio component will include an NTP time base component.

num_components—This 5-bit field specifies the number of IP stream components in this M/H Service.

IP_version_flag—A 1-bit indicator, which when set to '0' shall indicate that service_source_IP_address, service_destination_IP_address component_destination_IP_address and component_source_IP_address fields are IPv4 addresses. The value of '1' for this field is reserved for possible future indication that service_source_IP_address, service_destination_IP_address component_destination_IP_address and component_source_IP_address fields are for IPv6. Use of IPv6 addressing is not currently defined.

TABLE 4

| MH_service_category | Meaning |
|---|---|
| 0x00 | The service category is not specified by the MH_service_category field. Look in the component_level_descriptor( ) to identify the category of service. |
| 0x01 | Basic TV (Informative only) - Look in the component_level_descriptor( ) to identify the specific category of service. |
| 0x02 | Basic Radio (Informative only) - Look in the component_level_descriptor( ) to identify the specific category of service. |
| 0x03 | RI service - Rights Issuer service as defined in Part #6 [34] of this standard. |
| 0x04 | Not specified by the current version of this standard. |
| 0x05 | Not specified by the current version of this standard. |
| 0x06 | Not specified by the current version of this standard. |
| 0x07 | Not specified by the current version of this standard. |
| 0x08 | Service Guide - Service Guide (Announcement) as defined in Part 4 [46] of this standard. |
| 0x09 | Not specified by the current version of this standard. |
| 0x0A | Not specified by the current version of this standard. |
| 0x0B~0xFF | Reserved for future use. | service_source_IP_address_flag—A 1-bit Boolean flag that shall indicate, when set to '1', that a Service source IP address value for this M/H Service is present.

service_destination_IP_address_flag—A 1-bit Boolean flag that indicates, when set to '1', that a service_destination_IP_address value is present, to serve as the default IP address for the components of this M/H Service.

service_source_IP_address—This field is present if the service_source_IP_address_flag is set to '1' and shall not be present if the service_source_IP_address_flag is set to '0'. If present, this field shall contain the source IP address of all the IP datagrams carrying the components of this M/H Service, except for the IP datagrams of any components where a component_source_IP_address field is present. The conditional use of the 128 bit-long address version of this field serves to facilitate possible use of IPv6 in the future, although use of IPv6 is not currently defined.

service_destination_IP_address—This field is present if the service_destination_IP_address_flag is set to '1' and shall not be present if the service_destination_IP_address_flag is set to '0'. If this service_destination_IP_address is not present, then the component_destination_IP_address field is present for each component in the num_components loop. The conditional use of the 128 bit-long address version of this field facilitates possible use of IPv6 in the future, although use of IPv6 is not currently defined.

component_source_IP_address_flag—A 1-bit Boolean flag that shall indicate, when set to '1', that the component_source_IP_address is present for this component.

essential_component_indicator—A one-bit indicator which, when set to '1', indicates that this component is an essential component for the M/H Service. Otherwise, this field indicates that this component is an optional component.

component_destination_IP_address_flag—A 1-bit Boolean flag that indicates, when set to '1', that the component_destination_IP_address is present for this component.

port_num_count—This field shall indicate the number of destination UDP ports associated with this UDP/IP stream component. Values of port_num_count greater than one are intended only for components that require multiple UDP/IP streams. Each stream of such a component is assigned a base destination port number. The values of the base destination port numbers shall start from the component_destination_UDP_port_num field and shall be assigned sequentially, taking into account that some streams imply usage of more than one UDP port. For example, an RTP stream would cause an increment by two, to allow for the RTCP stream associated with that RTP stream.

component_destination_UDP_port_num—A 16-bit unsigned integer, which represents the destination UDP port number for this UDP/IP stream component. For RTP streams, the value of component_estimation_UDP_port_num is even, and the next higher value shall represent the destination UDP port number of the associated RTCP stream.

component_source_IP_address—This field is present if the component_source_IP_address_flag is set to '1' and shall not be present if the component_source_IP_address_flag is set to '0'. When this field is present, the source address of the IP datagrams carrying this component of the MH Service shall match the address in this field. Note: The conditional use of the 128 bit-long address version of this field facilitates possible use of IPv6 in the future, although use of IPv6 is not currently defined.

component_destination_IP_address—This field is present if the component_destination_IP_address_flag is set to '1' and shall not be present if the component_destination_IP_address_flag is set to '0'. When this field is present, the destination address of the IP datagrams carrying this component of the MH Service shall match the address in this field. When this field is not present, the destination address of the IP datagrams carrying this component shall match the address in the MH_service_destination_IP_address field. The conditional use of the 128 bit-long address version of this field facilitates possible use of IPv6 in the future, although use of IPv6 is not currently defined.

num_component_level_descriptors—This 4 bit field specifies the number of component level descriptors for this component.

component_level_descriptor( )—One or more descriptors providing additional information for this IP stream component may be included.

num_MH_service_level_descriptors—This 4 bit field specifies the number of service level descriptors for this service.

MH_service_level_descriptor( )—Zero or more descriptors providing additional information for this M/H Service may be included.

num_ensemble_level_descriptors—This 4 bit field specifies the number of ensemble level descriptors for this ensemble.

ensemble_level_descriptor( )—Zero or more descriptors providing additional information for the M/H Ensemble which this SMT-MH describes may be included.

FIG. 51 is a diagram showing another embodiment of a service map table (SMT) according to the present invention.

The SMT shown in FIG. 51 may include the same fields as the fields included in the SMT shown in FIG. 50. The SMT may further include an ensemble_id_MSB field, an ensemble_id_type field and an ensemble_id_type loop, if the SFCMM ensemble is an overlay ensemble or a super ensemble. The ensemble_id_MSB field is an identifier indicating whether or not a most significant bit assigned to the ensemble id is changed, and the ensemble_id_type field is an identifier indicating whether the currently carried SFCMM ensemble is an SFCMM ensemble, an overlay ensemble or a super ensemble. The ensemble_id_type loop may include an ensemble_id_LSB field. The ensemble_id_LSB field is an identifier indicating whether or not a least significant bit assigned to the ensemble_id is changed whenever the bit number of the ensemble id type is increased.

FIG. 52 is a diagram showing an embodiment of a cell information table (CIT) according to the present invention. (FIG. 52 B is a continuous part of FIG. 52 A)

The optional Cell Information Table for ATSC-M/H (CIT-MH), when present, provides carrier frequency information on selected transmitters in adjacent cells that are transmitting services which are the same as, or very similar to, services in the M/H Broadcast where the CIT appears. The purpose of this table is to allow a viewer to continue watching the same service, or a very similar service, when traveling between M/H transmitter coverage areas. This table only applies to a Multi-Frequency Network environment, and is deprecated for a Single Frequency Network environment. There are no constraints on the repetition rate of the CIT-MH sections.

The CIT shown in FIG. 52 may include a table_id field, a CIT_MH_protocol_version field, an ensemble_id field, a num_home_cell_transmitters field, a Transmitter_latitude field, a Transmitter_longitude field, a transmitter_AERP field, a transmitter_relative_pattern_depth field, a transmitter_null_positions field, a num_MH_services field, an MH_service_id field, a num_cells field, a transport_stream_id field, a PTC_num field, a cell_ensemble_id field and a cell_MH_service_id field. A detailed explanation of these fields will now be given.

table_id An 8-bit unsigned integer that indicates the type of table section being defined. For the Cell Information Table for ATSC-M/H (CIT-MH), the table_id is 0xDD.

CIT_MH_protocol_version—An 8-bit unsigned integer whose function is to allow, in the future, this Cell Information Table to carry parameters that may be structured differently from those defined in the current protocol. At present, the value of CIT_protocol_version is zero. Non-zero values of CIT_protocol_version may be used by a future version of this standard to indicate structurally different tables.

ensemble_id—This 8-bit unsigned integer is the Ensemble ID associated with this M/H Ensemble. The value of this field shall match the associated value in the FIC-Chunk. See Table 6.5.

num_home_cell_transmitters—An 8-bit unsigned integer that shall give the number of transmitters in the home cell whose location is to be announced.

Transmitter_latitude—latitude of this home cell transmitter, in ten-thousandths of a degree, with positive and negative latitude values conforming to standard conventions.

Transmitter_longitude—longitude of this home cell transmitter, in ten-thousandths of a degree, with positive and negative longitude conforming to standard conventions.

transmitter_AERP—Effective radiated power in dB, adjusted for height of antenna center of radiation.

transmitter_relative_pattern_depth—Depth of the largest null in the antenna azimuth pattern in multiples of 8 dB, rounded down to the next lowest multiplier value. Any value greater than 24 dB is rounded down to 24 dB. A value of '00' may mean no data is available.

transmitter_null_positions—Ordinal direction(s) where the antenna azimuth pattern is 8 dB or more below the peak AERP, as indicated by zeroes in corresponding bit positions. The Northern sector is represented by the MSB; each succeeding bit shall proceed clockwise around the compass with NE represented by the next most significant bit, and continuing until reaching NW, which is represented by the LSB. A value of '1111 1111' may mean no data is available.

num_MH_services—This 8 bit field shall specify the number of M/H Services in this CIT-MH section.

MH_service_id—A 16-bit unsigned integer that shall identify an M/H Service.

num_cells—This 8 bit field shall specify the number of adjacent transmitters, which transmit an MH service the same as, or very similar to, the service identified by MH_service_id.

transport_stream_id—A 16-bit unsigned integer in the range of 0x0000 to 0xFFFF that shall identify an M/H Broadcast carrying an M/H service which is to be considered the same as, or very similar to, the service identified by MH_service_id.

PTC_num—This 8-bit unsigned integer shall represent the physical transmission channel where the M/H Broadcast represented by the transport_stream_id is transmitted, where the mapping from integer values to frequency bands is given by 47CFR73.603 [6].

cell_ensemble_id—This 8-bit unsigned integer is the Ensemble ID associated with the M/H Ensemble which carries the M/H Service identified by the cell_MH_service_id below.

cell_MH_service_id—A 16-bit unsigned integer that shall identify the M/H Service in the M/H Broadcast identified by the transport_stream_id above that is to be considered the same as, or very similar to, the M/H Service identified by the MH_service_id covering this num_cells loop.

FIG. 53 is a diagram showing another embodiment of a cell information table (CIT) according to the present invention.

The CIT shown in FIG. 53 may include the same fields as the CIT shown in FIG. 52. The CIT may further include an ensemble_id_MSB field, an ensemble_id_type field and an ensemble_id_type loop, if the SFCMM ensemble is an overlay ensemble or a super ensemble. The ensemble_id_MSB field is an identifier indicating whether or not a most significant bit assigned to the ensemble id is changed, and the ensemble_id_type field is an identifier indicating whether the currently carried SFCMM ensemble is an SFCMM ensemble, an overlay ensemble or a super ensemble. The ensemble_id_type loop may include an ensemble_id_LSB field. The ensemble_id_LSB field is an identifier indicating whether or not a least significant bit assigned to the ensemble_id is changed whenever the bit number of the ensemble id type is increased.

FIG. 54 is a diagram showing an embodiment of a service label table (SLT) according to the present invention.

If an M/H receiver finds itself in a new geographical area, with no access to SG data, it could perform a very fast frequency scan, looking at only the FIC for each M/H Broadcast it finds, and display to the user a list of available content channels. However, the only information for each content channel in this list would be the MH_service_id.

An M/H receiver in such a situation could also perform a much slower frequency scan, looking at the SMT-MH sections in every M/H Ensemble of every M/H Broadcast it finds, and display to the user a more informative list containing the name and service type of each service, as well as the MH_service_id, and perhaps even the title of the current program in each service.

The optional Service Labeling Table for ATSC-M/H (SLT-MH) is designed to provide a middle ground, whereby such a receiver can perform a relatively fast content channel scan, looking only at the ensemble that carries the SLT-MH in each M/H Broadcast it finds (as signaled in the FIC), and then present a list of the available content channels with the brief name and service type of each content channel, as well as the service ID.

The following constraints apply to the broadcast of the SLT-MH:

SLT-MH sections, if present, are delivered through the M/H Service Signaling Channel of the M/H Ensemble for which the SLT_ensemble_indicator of the FIC-Chunk is set to '1'. If present, the SLT-MH sections are delivered at least once per M/H Frame.

The SLT may include a table_id field, an SLT_MH_protocol_version field, a current_next_indicator field, a num_MH_services field, an MH_service_category field, an MH_service_id field, a short_MH_service_name_length field, a short_MH_service_name field, a num_descriptors field and an MH_service_descriptor( ) field.

These fields will now be described in detail.

table_id—An 8-bit unsigned integer that indicates the type of table section being defined. For the Service Labeling Table for ATSC-M/H (SLT-MH), the table_id is 0xDE.

SLT_MH_protocol_version—An 8-bit unsigned integer whose function is to allow, in the future, this Service Labeling Table to carry parameters that may be structured differently than those defined in the current protocol. At present, the value of SLT_protocol_version is zero. Non-zero values of SLT_protocol_version may be used by a future version of this standard to indicate structurally different tables.

current_next_indicator—A one-bit indicator, which when set to '1' shall indicate that the sent Service Labeling Table is currently applicable. When the bit is set to '0', this indicates that the table sent is not yet applicable and is instead the next table to become valid. This standard imposes no requirement that "next" tables (those with current_next_indicator set to '0') must be sent. An update to the currently applicable table is signaled by incrementing the version_number field.

num_MH_services—This 8 bit field shall specify the number of M/H Services in this SLT-MH section.

MH_service_category—A 6-bit enumerated type field that shall identify the type of service carried in this M/H Service as defined in Table 7.3.

MH_service_id—A 16-bit unsigned integer that shall identify an M/H Service in this M/H Broadcast.

short_MH_service_name_length—A three-bit unsigned integer that shall indicate the number of byte pairs in the short_service_name field. This value is shown as 'm' in the No. of Bits column for the short_service_name field. When there is no short name for this M/H service, the value of this field shall be 0.

short_MH_service_name—The short name of the M/H Service, each character of which is encoded per UTF-8 [29]. When there are an odd number of bytes in the short name, the second byte of the last of the byte pair per the pair count indicated by the short_service_name_length field shall contain 0x00. This name shall match the short name for this M/H Service that appears in the SMT-MH.

num_descriptors—A 4-bit unsigned integer specifying the number of descriptors in the following descriptor loop.

MH_service_descriptor( )—A descriptor providing information about the MH service.

Figure 55:
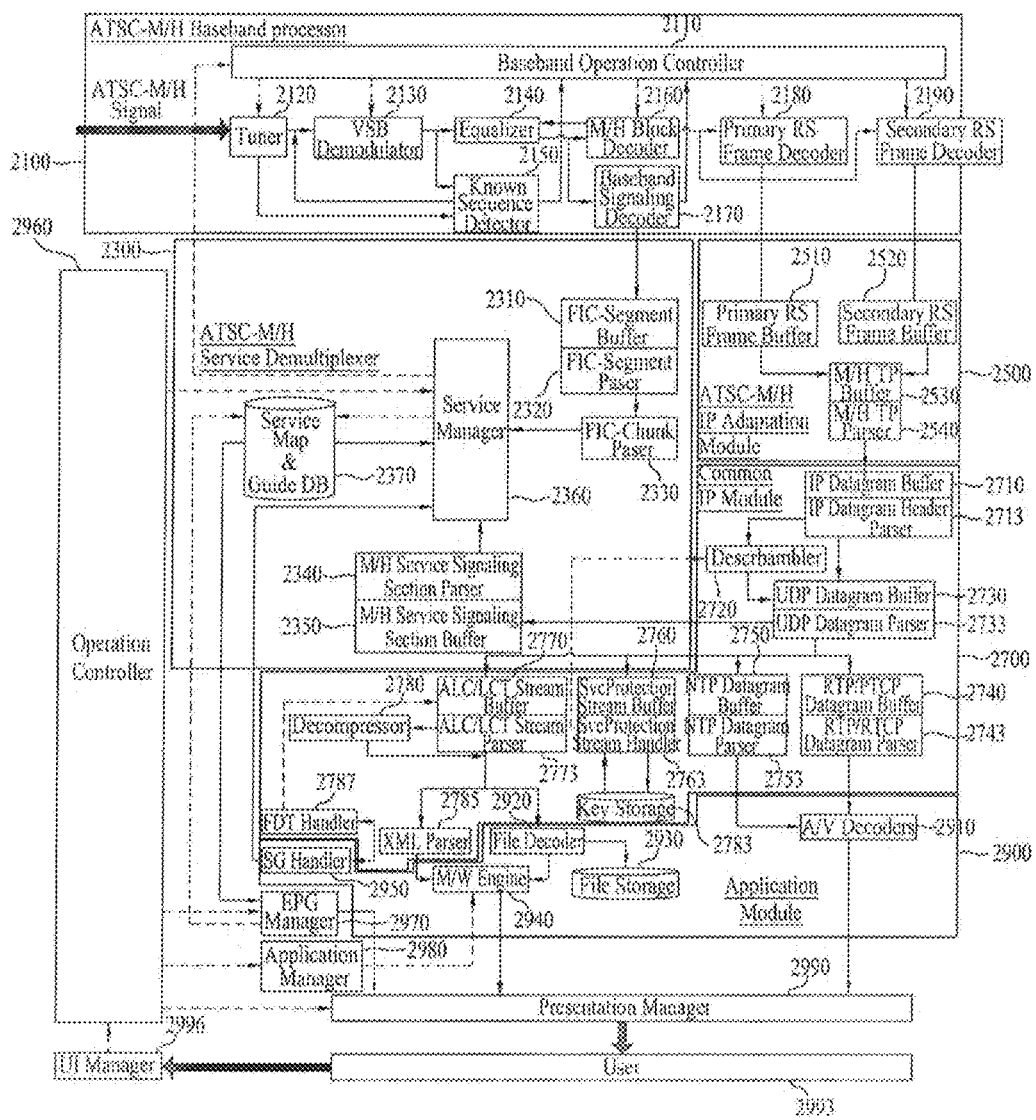
FIG. 55 is a block diagram showing an embodiment of a digital broadcast receiver according to the present invention.

FIG. 55 is a block diagram showing an embodiment of a digital broadcast receiver according to the present invention.

The digital broadcast receiver may include an ATSC-M/H Baseband processor 2100, an ATSC-MH service demultiplexer 2300, an ATSC-MH IP adaptation module 2500, a common IP module 2700 and an application module 2900. The digital broadcast receiver may further include an operation controller 2960, an EPG manager 2970, an application manager 2980, a presentation manager 2990 and an UI manager 2996.

The ATSC-M/H Baseband processor 2100 includes a Baseband Operation Controller 2110, a tuner 2120, a demodulator 2130, an equalizer 2140, a known sequence detector 2150, a block decoder 2160, a baseband signaling decoder 2170, a primary RS frame decoder 2180, and a secondary RS frame decoder 2190.

The Baseband Operation Controller 2110 controls the overall operation of the baseband module of the receiver. All the components of the ATSC-M/H Baseband processor 2100 are controlled by the Baseband Operation Controller 2110.

The tuner 2120 tunes the receiver in order to receive a digital broadcast signal of a specific frequency. The tuner 2120 down-converts the frequency of the received signal into an Intermediate Frequency (IF) signal and outputs the IF signal to the demodulator 2130 and the known sequence detector 2150.

The demodulator 2130 performs automatic gain control, carrier restoration, timing restoration and the like with respect to the digital IF signal of the passing band received from the tuner 2120 so as to form a baseband signal and outputs the baseband signal to the equalizer 2140 and the known sequence detector 2150. The demodulator 2130 may use the symbol streams of the known data received from the known sequence detector 2150 upon timing restoration or carrier restoration. That is, the demodulator 2130 demodulates broadcast data using the result of demodulating the known data of the receiver so as to increase demodulation performance.

The equalizer 2140 receives the signal demodulated by the demodulator 2130, compensates for channel distortion generated during the transmission process, and outputs the signal to the block decoder 2160. The equalizer 2140 can improve equalization performance using the known data symbol streams received from the known sequence detector 2150. In addition, the equalizer can improve equalization performance through feedback of the decoding result of the block decoder 2160.

The known sequence detector 2150 receives input/output data of the demodulator 2130, that is, data before demodulation is performed or partially demodulated data, and detects the location of the known data inserted by the transmitter. The known sequence detector 2150 outputs the detected location information of the known data and the known data sequence decoded at that location to the demodulator 2130 and the equalizer 2140. In addition, the known sequence detector 2150 may output to the block decoder 2160 information for enabling the block decoder 2160 to identify mobile service data subjected to additional encoding at the transmitter and main service data which is not subjected to additional encoding.

The block decoder 2160 performs trellis decoding and block decoding if the data (i.e., signaling data or data in the RS frame) input after channel equalization is performed by the equalizer 2140 has been subjected to both block encoding and trellis encoding, and performs only trellis decoding if the data (i.e., main service data) has been subjected to trellis encoding alone.

The baseband signaling decoder 2170 performs decoding with respect to the signaling data subjected to both block encoding and trellis encoding after channel equalization is performed by the equalizer 2140. At this time, the decoded signaling data includes a transmission parameter. In the embodiment of the present invention, such signaling data may be Transmission Parameter Channel (TPC) data. The transmission parameter included in the signaling data may include information indicating whether the TPC data is changed, that is, updated, information indicating whether the transmitted digital broadcast signal is transmitted through an SFCMM or a CMM, information indicating the number of mobile service data packets of the SFCMM additionally included in one data group, information indicating whether a data block included in each of neighboring data groups forms one SCCC block, and the like.

The primary RS frame decoder 2180 receives the output of the block decoder 2160 and receives only mobile service data subjected to RS encoding and/or CRC encoding. The primary RS frame decoder 2180 performs the inverse process of the RS frame encoder of the transmission system. In addition, the primary RS frame decoder corrects errors in the RS frame and collects a plurality of error-corrected data groups so as to form one RS frame. That is, the primary RS frame decoder 2180 decodes the primary RS frame including data for an actual broadcast service.

The secondary RS frame decoder 2190 receives the output of the block decoder 2160 and receives only the mobile service data subjected to RS encoding and/or CRC encoding. The secondary RS frame decoder 2190 performs the inverse process of the RS frame encoder of the transmission system. In addition, the secondary RS frame decoder corrects errors in the RS frame and collects a plurality of error-corrected data groups so as to form one RS frame. The secondary RS frame decoder 2190 decodes the secondary RS frame including secondary data for a broadcast service. Although the primary RS frame decoder 2180 and the secondary RS frame decoder 2190 are illustrated as being separate, the primary RS frame decoder 2180 and the secondary RS frame decoder 2190 may be included in the RS frame decoder and respectively perform primary RS frame decoding or secondary RS frame decoding.

The ATSC-MH service demultiplexer 2300 includes an FIC segment buffer 2310, an FIC segment parser 2320, an FIC chunk parser 2330, an M/H service signaling section parser 2340, an M/H service signaling section buffer 2350, a service manager 2360 and a service map/guide DB 2370.

The FIC segment buffer 2310 buffers the FIC-segment group in the M/H subframe subjected to deinterleaving and RS decoding, which is received from the baseband signaling decoder 2170.

The FIC segment parser 2320 extracts, parses and processes the header of the FIC segment stored in the FIC segment buffer 2310. Through the value the FIC_chunk_major_protocol_version or the FIC_chunk_minor_protocol_version included in the header of the FIC generated in this process, the CMM receiver ignores the field associated with the SFCMM. Through the value of the FIC_chunk_header_extension_length included in the header of the FIC, the CMM receiver skips the added field in the header.

The FIC chunk parser 2330 restores and parses/processes the FIG chunk data structure in the FIC segments parsed by the FIC Segment Parser 2320.

The M/H service signaling section parser 2340 parses/processes the table sections of the M/H service signaling channel transmitted through the UDP/IP stream.

The M/H service signaling section buffer 2350 buffers the table sections of the M/H service signaling channel processed by the M/H service signaling section parser 2340.

The service manager 2360 configures a service map through the signaling data collected by the FIC Chunk Parser 2330 and the M/H Service Signaling Section Parser 2340, and creates a program guide using a service guide. In addition, the service manager controls the Baseband Operation Controller 2110 so as to receive a desired M/H service according to user input and controls the program guide to be displayed according to user input.

The service map/guide DB 2370 stores the service map and the service guide created by the service manager 2360, and extracts and delivers data associated with a service necessary for each unit according to inputs of the service manager 2360 and the EPG manager 2970.

The ATSC-MH IP adaptation module 2500 includes a primary RS frame buffer 2510, a secondary RS frame buffer 2520, an M/H TP (Transport stream Packet) buffer 2530 and an M/H TP parser 2540.

The primary RS frame buffer 2510 buffers the RS frame received from the primary RS frame decoder 2180 and delivers the RS frame to the M/H TP buffer 2530 in units of frame rows.

The secondary RS frame buffer 2520 buffers the RS frame received from the secondary RS frame decoder and delivers the RS frame to the M/H TP buffer 2530 in units of frame rows. The primary RS frame buffer 2510 and the secondary RS frame buffer 2520 may be physically composed of one buffer.

The M/H TP buffer 2530 extracts and buffers the M/H TP corresponding to each row of the RS frame.

The M/H TP parser 2540 parses the first 2-byte header of the M/H TP and restores an IP Datagram.

The common IP module 2700 includes an IP datagram buffer 2710, an IP datagram header parser 2713, a descrambler 2720, a UDP datagram buffer 2730, a UDP datagram parser 2733, an RTP/RTCP datagram buffer 2740, an RTP/RTCP datagram parser 2743, an NTP datagram buffer 2750, an NTP datagram parser 2753, a SvcProtection stream buffer 2760, a SvcProtection stream handler 2763, an ALV/LCT stream buffer 2770, an ALV/LCT stream parser 2773, a decompressor 2780, a key storage 2783, an XML parser 2785 and an FDT handler 2787.

The IP datagram buffer 2710 buffers the IP datagrams encapsulated and transmitted through the M/H TP.

The IP datagram header parser 2713 restores the IP datagrams and parses the header of each datagram. The operation of the IP datagram header parser 2713 is performed by the service manager 2360.

The descrambler 2720 descrambles the data of a scrambled payload of the received IP datagrams using an encryption key received from the SvcProtection Stream Handler 2763.

The UDP datagram buffer 2730 buffers UDP datagrams transmitted through the IP Datagram.

The UDP datagram parser 2733 restores the UDP datagrams and parses and processes the restored UDP Header.

The RTP/RTCP datagram buffer 2740 buffers datagrams of RTP/RTCP stream transmitted through the UDP/IP Stream.

The RTP/RTCP datagram parser 2743 restores, parses and processes the datagrams of the RTP/RTCP stream.

The NTP datagram buffer 2750 buffers the datagrams of the network time protocol stream transmitted through the UDP/IP stream.

The NTP datagram parser 2753 restores, parses and processes the datagrams of the network time protocol stream.

The SvcProtection stream buffer 2760 buffers data such as a key value for descrambling necessary for a service protection function transmitted through the UDP/IP Stream.

The SvcProtection stream handler 2763 processes the data such as the key value for descrambling necessary for the service protection function. The output of this module is delivered to the descrambler 2720.

The ALV/LCT stream buffer 2770 buffers ALC/LCT data transmitted through the UDP/IP stream.

The ALV/LCT stream parser 2773 restores ALC/LCT data transmitted through the UDP/IP, and parses the header and the header extension of the ALC/LCT.

The decompressor 2780 performs a decompression process if the transmitted file is compressed.

The key storage 2783 stores a key message used for the service protection function restored by the SvcProtection stream handler.

The XML parser 2785 parses an XML document transmitted through ALC/LCT session, and delivers the parsed data to appropriate modules such as the FDT handler 2787 and the SG handler 2950.

The FDT handler 2787 parses and processes a file description table of a FLUTE protocol transmitted through an ALC/LCT session.

The application module 2900 includes an A/V decoder 2910, a file decoder 2920, a file storage 2930, an M/W engine 2940 and an SG (Service Guide) handler 2950.

The A/V decoder 2910 decodes the audio/video data received through the RTP/RTCP datagram parser 2743 for presentation to the user.

The file decoder 2920 decodes the file restored by the ALV/LCT stream parser 2773.

The file storage 2930 stores the file decoded by the file decoder 2920 and, if necessary, provides the file to another module.

The M/W engine 2940 processes data such as the file transmitted through the FLUTE Session and delivers the data to the presentation manager 2990.

The SG (Service Guide) handler 2950 collects and parses the service guide data transmitted in XML format and delivers the service guide data to the EPG manager 2970.

The operation controller 2960 processes the command of the user received through the UI Manager 2996 and controls the manager of the module necessary for processing the command to perform an action.

The EPG manager 2970 manages the display of the EPG according to user input using EPG data transmitted through the service guide handler 2950.

The application manager 2980 manages the processing of application data transmitted in the form of an object, a file, etc.

The presentation manager 2990 processes the data received from the A/V decoder 2910, the M/W engine 2940 and the EPG manager 2950 in order to present the service to the user. Such a process may be performed under the control of the operation controller 2960.

The UI manager 2996 delivers user input to the operation controller 2960 through the user interface and manages the start of the process of a service requested by the user.

The names of the units of the above-described receiver may be changed. In addition, specific modules may be omitted or added in a certain system.

Figure 56:
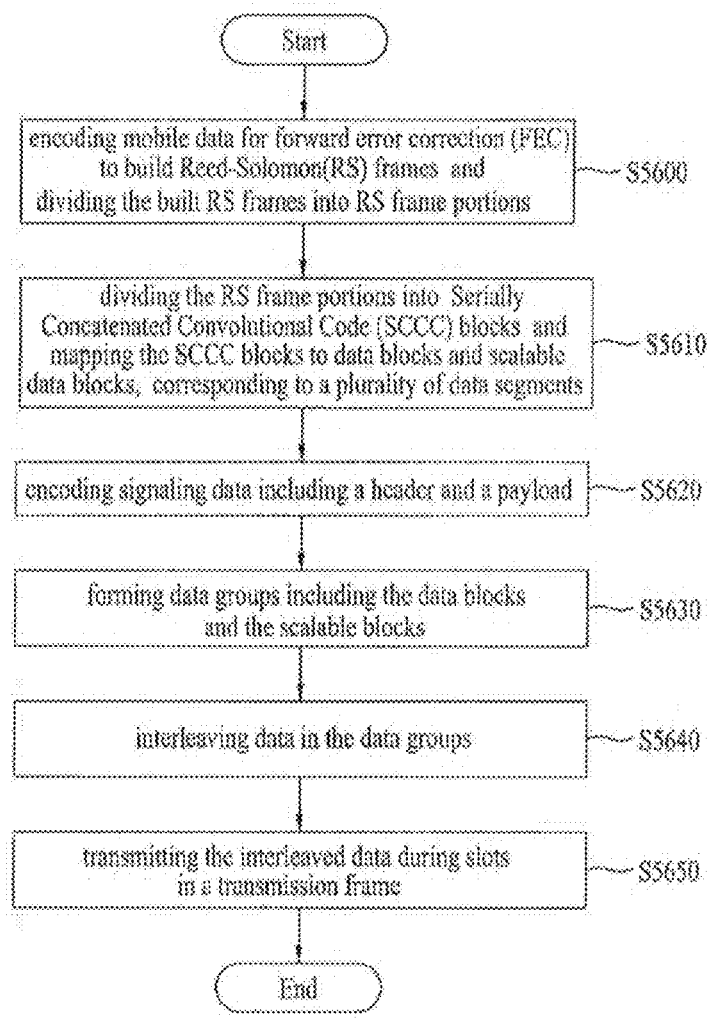
FIG. 56 is a flowchart illustrating an embodiment of a transmission system of the present invention.

FIG. 56 is a flowchart illustrating an embodiment of a transmission system of the present invention.

The encoder 103 encodes mobile data for forward error correction (FEC) to build Reed-Solomon (RS) frames and divides the RS frames into RS frame portions (S5600).

The block processor 104 divides the RS frame portions into Serially Concatenated Convolutional Code (SCCC) blocks and maps the SCCC blocks to data blocks and scalable data blocks, corresponding to a plurality of data segments (S5610). In this case, at least one of the SCCC blocks includes one of the data blocks and one of the scalable blocks.

The signaling encoder 105 encodes signaling data including a header and a payload (S5620).

The group formatter 106 forms data groups including the data blocks and the scalable blocks, wherein specific data blocks of the data blocks in the data groups include the signaling data having information about a number of ensembles representing a collection of services transmitted through the data groups (S5630).

The interleaver 112 interleaves data in the data groups, wherein the interleaved data includes a plurality of data segments, and wherein at least one of the plurality of data segments includes a part of one of the data blocks and a part of one of the scalable data blocks (S5640).

The transmission unit 119 transmits the interleaved data during slots in a transmission frame (S5650).

Figure 57:
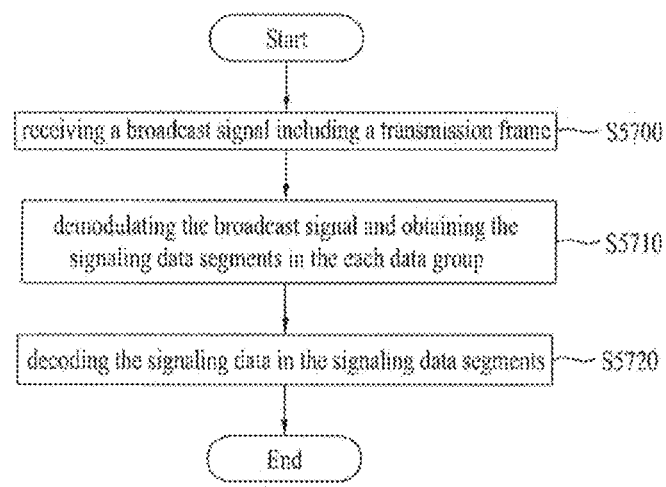
FIG. 57 is a flowchart illustrating an embodiment of a reception system of the present invention.

FIG. 57 is a flowchart illustrating an embodiment of a reception system of the present invention.

The tuner 2120 receives a broadcast signal including a transmission frame (S5700), wherein a parade of data groups in the broadcast signal is received during slots within the transmission frame, each data group including data blocks and scalable blocks, corresponding to a plurality of data segments, wherein at least one of the plurality of data segments includes a part of one of the data blocks and a part of one of the scalable data blocks, wherein specific data blocks of the data blocks in the data groups include the signaling data having information about a number of ensembles representing a collection of services transmitted through each data group, wherein each data group includes signaling data segments having a segment payload.

The demodulator 2130 demodulates the broadcast signal and obtains the signaling data segments in each data group (S5710).

The baseband signaling decoder 2170 decodes the signaling data in the signaling data segments (S5720).

Figure 58:
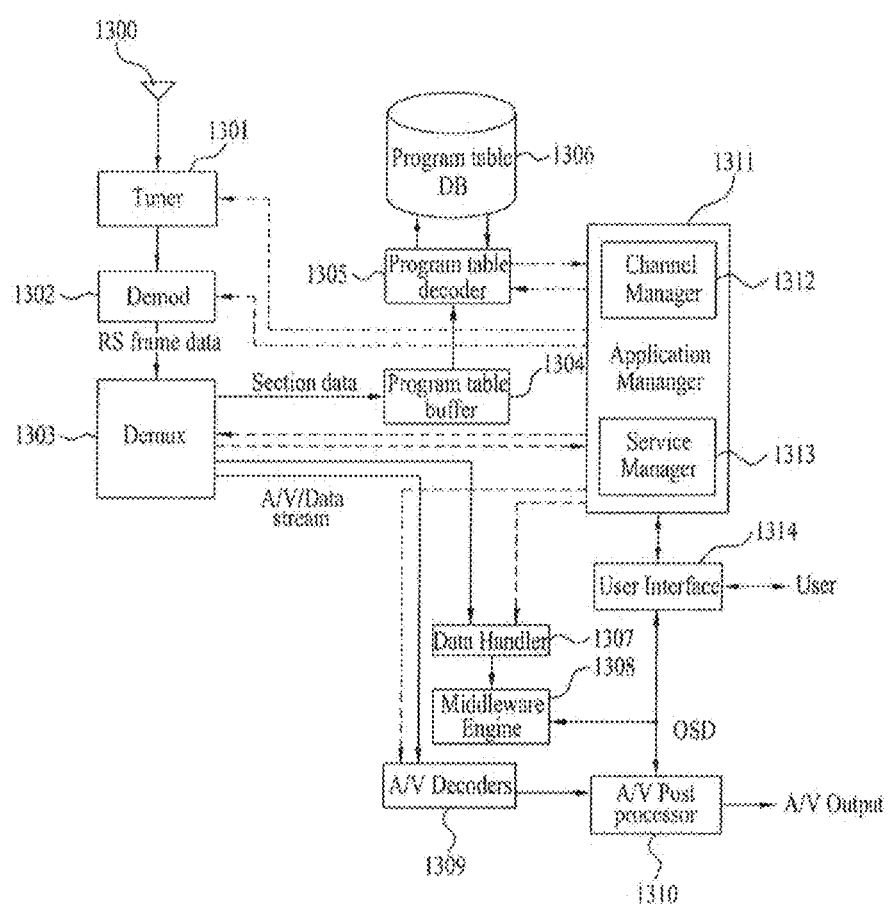
FIG. 58 is a block diagram illustrating a receiving system according to an embodiment of the present invention.

FIG. 58 is a block diagram illustrating a receiving system according to an embodiment of the present invention.

The receiving system of FIG. 58 includes an antenna 1300, a tuner 1301, a demodulating unit 1302, a demultiplexer 1303, a program table buffer 1304, a program table decoder 1305, a program table storage unit 1306, a data handler 1307, a middleware engine 1308, an A/V decoder 1309, an A/V post-processor 1310, an application manager 1311, and a user interface 1314. The application manager 1311 may include a channel manager 1312 and a service manager 1313.

In FIG. 58, solid lines indicate data flows and dotted lines indicate control flows.

The tuner 1301 tunes to a frequency of a specific channel through any of an antenna, a cable, or a satellite and down-converts the frequency to an Intermediate Frequency (IF) signal and outputs the IF signal to the demodulating unit 1302.

In one embodiment of the present invention, the tuner 1301 may select a frequency of a specific mobile broadcasting channel from among broadcasting channels transmitted via the antenna 1300. For example, if it is assumed that the receiving system is a terminal having both a communication function such as a phone function and a broadcast function such as a mobile broadcasting function, the antenna 1300 may be used as a broadcasting antenna, and an additional communication antenna may also be included in the receiving system. That is, the broadcasting antenna may be physically different than the communication antenna. For another example, one antenna may be used as both the broadcasting antenna and the communication antenna. For still another example, a plurality of antennas having different polarization characteristics may be used as a substitute for the broadcasting antenna, so that a multi-path diversity scheme is made available. In this case, although a quality of a received broadcast signal increases in proportion to the number of used antennas, power consumption excessively increases and the size of a space occupied by an overall system also increases. Therefore, it is preferable that a proper number of diversity antennas be used in consideration of the above-mentioned limitations.

Herein, the tuner 1301 is controlled by the channel manager 1312 in the application manager 1311 and reports the result and strength of a broadcast signal of the tuned channel to the channel manager 1312. Data received through the frequency of the specific channel includes main service data, mobile service data, a transmission parameter, and program table information for decoding the main service data and the mobile service data.

The demodulating unit 1302 performs VSB demodulation, channel equalization, etc., on the signal output from the tuner 1301 and identifies and separately outputs main service data and mobile service data. The demodulating unit 1302 will be described in detail in a later.

On the other hand, the transmitter can transmit signaling information (or TPC information) including transmission parameters by inserting the signaling information into at least one of a field synchronization region, a known data region, and a mobile service data region. Accordingly, the demodulating unit 1302 can extract the transmission parameters from the field synchronization region, the known data region, and the mobile service data region.

The transmission parameters may include M/H frame information, sub-frame information, slot information, parade-related information (for example, a parade_id, a parade repeat period, etc.), information of data groups in a sub-frame, RS frame mode information, RS code mode information, SCCC block mode information, SCCC outer code mode information, FIC version information, etc.

The demodulating unit 1302 performs block decoding, RS frame decoding, etc., using the extracted transmission parameters. For example, the demodulating unit 1302 performs block decoding of each region in a data group with reference to SCCC-related information (for example, SCCC block mode information or an SCCC outer code mode) included in the transmission parameters and performs RS frame decoding of each region included in the data group with reference to RS-related information (for example, an RS code mode).

In the embodiment of the present invention, an RS frame including mobile service data demodulated by the demodulating unit 1302 is input to the demultiplexer 1303.

That is, data inputted to the demultiplexer 1303 has an RS frame payload format. More specifically, the RS frame decoder of the demodulating unit 1302 performs the reverse of the encoding process performed at the RS frame encoder of the transmission system to correct errors in the RS frame and then outputs the error-corrected RS frame payload to a data derandomizer. The data derandomizer then performs derandomizing on the error-corrected RS frame payload through the reverse of the randomizing process performed at the transmission system to obtain an RS frame payload.

The demultiplexer 1303 may receive RS frame payloads of all parades and may also receive only an RS frame payload of a parade including a mobile service that the user desires to receive through power supply control. For example, when RS frame payloads of all parades are received, the demultiplexer 1303 can demultiplex a parade including a mobile service that the user desires to receive using a parade_id.

When one parade carries two RS frames, the demultiplexer 1303 needs to identify an RS frame carrying an ensemble including mobile service data to be decoded from a parade containing a mobile service that the user desires to receive. That is, when a received single parade or a parade demultiplexed from a plurality of parades carries a primary ensemble and a secondary ensemble, the demultiplexer 1303 selects one of the primary and secondary ensembles.

In an embodiment, the demultiplexer 1303 can demultiplex an RS frame carrying an ensemble including mobile service data to be decoded using an ensemble_id created by adding one bit to a left position of the parade_id.

The demultiplexer 1303 refers to the header of the mobile service data packet within the RS frame payload belonging to the ensemble including the mobile service data that are to be decoded, thereby identifying when the corresponding mobile service data packet is the signaling table information or the IP datagram of the mobile service data. Alternatively, when the signaling table information and the mobile service data are both configured in the form of IP datagrams, the demultiplexer 1303 may use the IP address in order to identify the IP datagram of the program table information and the mobile service data.

Herein, the identified signaling table information is outputted to the program table buffer 1304. And, audio/video/data streams are separated from the IP datagram of mobile service data that are to be selected among the IP datagrams of the identified mobile service data, thereby being respectively outputted to the A/V decoder 1309 and/or the data handler 1307.

According to an embodiment of the present invention, when the stuff_indicator field within the header of the mobile service data packet indicates that stuffing bytes are inserted in the payload of the corresponding mobile service data packet, the demultiplexer 1303 removes the stuffing bytes from the payload of the corresponding mobile service data packet. Then, the demultiplexer 1303 identifies the program table information and the mobile service data. Thereafter, the demultiplexer 1303 identifies A/V/D streams from the identified mobile service data.

The program table buffer 1304 temporarily stores the section-type program table information and then outputs the section-type program table information to the program table decoder 1305.

The program table decoder 1305 identifies tables using a table_id and a section_length in the program table information and parses sections of the identified tables and produces and stores a database of the parsed results in the program table storage unit 1306. For example, the program table decoder 1305 collects sections having the same table identifier (table_id) to construct a table. The program table decoder 1305 then parses the table and produces and stores a database of the parsed results in the program table storage unit 1306.

The A/V decoder 1309 decodes the audio and video streams outputted from the demultiplexer 1303 using audio and video decoding algorithms, respectively. The decoded audio and video data is outputted to the AN post-processor 1310.

Here, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm can be used as the audio decoding algorithm and at least one of an MPEG 2 video decoding algorithm, an MPEG 4 video decoding algorithm, an H.264 decoding algorithm, an SVC decoding algorithm, and a VC-1 decoding algorithm can be used as the audio decoding algorithm.

The data handler 1307 processes data stream packets required for data broadcasting among data stream packets separated (or identified) by the demultiplexer 1303 and provides the processed data stream packets to the middleware engine 1310 to allow the middleware engine 1310 to be multiplexed them with A/V data. In an embodiment, the middleware engine 1310 is a Java middleware engine.

The application manager 1311 receives a key input from the TV viewer and displays a Graphical User Interface (GUI) on the TV screen in response to a viewer request through a User Interface (UI). The application manager 1311 also writes and reads information regarding overall GUI control of the TV, user requests, and TV system states to and from a memory (for example, NVRAM or flash memory). In addition, the application manager 1311 can receive parade-related information (for example, a parade_id) from the demodulating unit 1302 to control the demultiplexer 1303 to select an RS frame of a parade including a required mobile service. The application manager 1311 can also receive an ensemble_id to control the demultiplexer 1303 to select an RS frame of an ensemble including mobile service data to be decoded from the parade. The application manager 1311 also controls the channel manager 1312 to perform channel-related operations (for example, channel map management and program table decoder operations).

The channel manager 1312 manages physical and logical channel maps and controls the tuner 1301 and the program table decoder 1305 to respond to a channel-related request of the viewer. The channel manager also requests that the program table decoder 1305 parse a channel-related table of a channel to be tuned and receives the parsing results from the program table decoder 1305.

Figure 59:
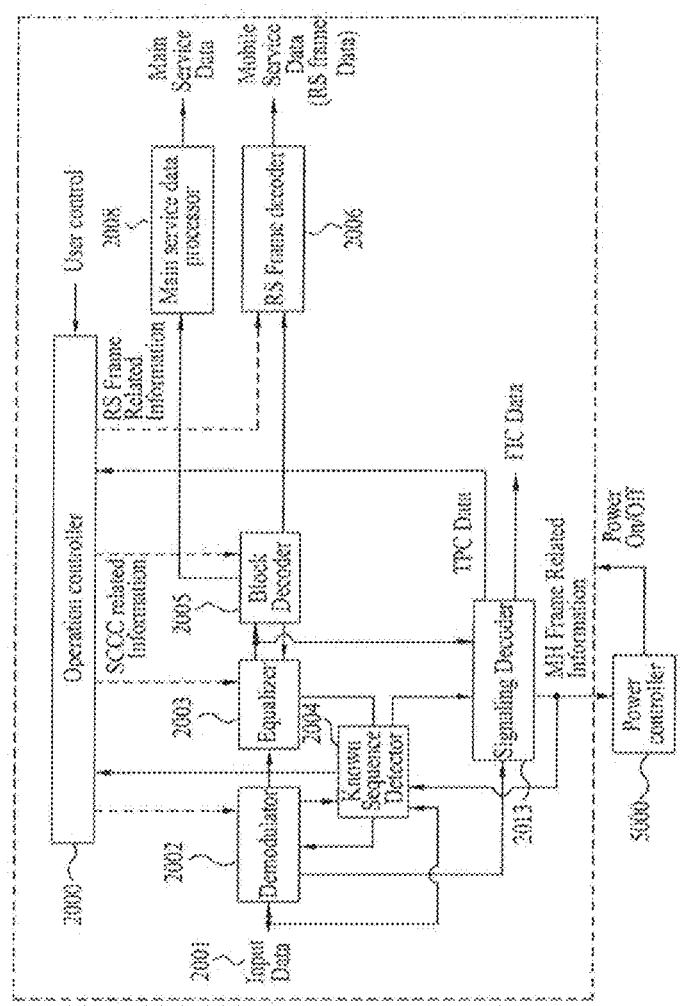
FIG. 59 illustrates an example of a demodulating unit in a digital broadcast receiving system according to the present invention.

FIG. 59 illustrates an example of a demodulating unit in a digital broadcast receiving system according to the present invention.

The demodulating unit of FIG. 59 uses known data information, which is inserted in the mobile service data section and, then, transmitted by the transmitting system, so as to perform carrier synchronization recovery, frame synchronization recovery, and channel equalization, thereby enhancing the receiving performance. Also the demodulating unit may turn the power on only during a slot to which the data group of the designated (or desired) parade is assigned, thereby reducing power consumption of the receiving system.

Referring to FIG. 59, the demodulating unit includes an operation controller 2000, a demodulator 2002, an equalizer 2003, a known sequence detector 2004, a block decoder 2005, and a RS frame decoder 2006. The demodulating unit may further include a main service data processor 2008. The main service data processor 2008 may include a data deinterleaver, a RS decoder, and a data derandomizer. The demodulating unit may further include a signaling decoder 2013. The receiving system also may further include a power controller 5000 for controlling power supply of the demodulating unit.

More specifically, a frequency of a particular channel tuned by a tuner down converts to an intermediate frequency (IF) signal. Then, the down-converted data 2001 outputs the down-converted IF signal to the demodulator 2002 and the known sequence detector 2004. At this point, the down-converted data 2001 is inputted to the demodulator 2002 and the known sequence detector 2004 via analog/digital converter ADC (not shown). The ADC converts pass-band analog IF signal into pass-band digital IF signal.

The demodulator 2002 performs self gain control, carrier recovery, and timing recovery processes on the inputted pass-band digital IF signal, thereby modifying the IF signal to a base-band signal. Then, the demodulator 2002 outputs the newly created base-band signal to the equalizer 2003 and the known sequence detector 2004.

The equalizer (or channel synchronizer) 2003 compensates the distortion of the channel included in the demodulated signal and then outputs the error-compensated signal to the block decoder 2005.

At this point, the known sequence detector 2004 detects the known sequence position information inserted by the transmitting end from the input/output data of the demodulator 2002 (i.e., the data prior to the demodulation process or the data after the demodulation process). Thereafter, the position information along with the symbol sequence of the known data, which are generated from the detected position, is outputted to the operation controller 2000, the demodulator 2002, the equalizer 2003, and the signaling decoder 2013. Also, the known sequence detector 2004 outputs a set of information to the block decoder 2005. This set of information is used to allow the block decoder 2005 of the receiving system to identify the mobile service data that are processed with additional encoding from the transmitting system and the main service data that are not processed with additional encoding.

In addition, although the connection status is not shown in FIG. 59, the information detected from the known sequence detector 2004 may be used throughout the entire receiving system and may also be used in the RS frame decoder 2006.

The data demodulated in the demodulator 2002 or the data equalized in the channel equalizer 2003 is inputted to the signaling decoder 2013. The known data position information detected in the known sequence detector 2004 is inputted to the signaling decoder 2013.

The signaling decoder 2013 extracts and decodes signaling information (e.g., TPC information, and FIC information), which inserted and transmitted by the transmitting end, from the inputted data, the decoded signaling information provides to blocks requiring the signaling information.

More specifically, the signaling decoder 2013 extracts and decodes TPC data and FIC data, which inserted and transmitted by the transmitting end, from the equalized data, and then the decoded TPC data and FIC data outputs to the operation controller 2000, the known sequence detector 2004, and the power controller 5000. For example, the TPC data and FIC data is inserted in a signaling information region of each data group, and then is transmitted to a receiving system.

The signaling decoder 2013 performs signaling decoding as an inverse process of the signaling encoder 105 in FIG. 39, so as to extract TPC data and FIC data. For example, the signaling decoder 2013 decodes the inputted data using the PCCC method and derandomizes the decoded data, thereby dividing the derandomized data into TPC data and FIC data. At this point, the signaling decoder 2013 performs RS-decoding on the divided TPC data, so as to correct the errors occurring in the TPC data. Subsequently, the signaling decoder 2013 deinterleaves the divided FIC data and then performs RS-decoding on the deinterleaved FIC data, so as to correct the error occurring in the FIC data. The error-corrected TPC data are then outputted to the operation controller 2000, the known sequence detector 2004, and the power controller 5000.

The TPC data may also include a transmission parameter which is inserted into the payload region of a packet by the service multiplexer, and then is transmitted to transmitter.

Herein, the TPC data may include RS frame information, SCCC information, M/H frame information, and so on, as shown in FIG. 41. The RS frame information may include RS frame mode information and RS code mode information. The SCCC information may include SCCC block mode information and SCCC outer code mode information. The M/H frame information may include M/H frame index information, and the TPC data may include sub-frame count information, slot count information, parade_id information, SGN information, NoG information, and so on.

At this time, the signaling information area within the data group can be identified using known data information output from the known data detector 2004. The signaling information area is located from the first segment of data block B4 within the data group to a part of the second segment. Namely, in the present invention, 276 (=207+69) bytes of the data block B4 of each data group are assigned to an area for inserting signaling information. In other words, the signaling information area includes 207 bytes of the first segment of the data block B4 and first 69 bytes of the second segment of the data block B4. The first known data sequence (i.e., first training sequence) is inserted into the last two segments of the data block B3, and the second known data sequence (i.e., second training sequence) is inserted into the second and third segments of the data block B4. At this time, since the second known data sequence is received subsequently to the signaling information area, the signaling decoder 2013 can decode the signaling information of the signaling information area by extracting the same from the data output from the demodulator 2002 or the channel equalizer 2003.

More specifically, in the description of the present invention, according to an embodiment of the present invention, the known sequence detector 2004 first extracts known data sequences included in regions A and B within the data group. Herein, the positions of the known data sequences included in regions A and B within the data group are identical to the positions shown in FIG. 19. The demodulator 2002 and the equalizer 2003 of the present invention respectively may use the known data sequences, which are included in regions A and B within the data group, that are first extracted by the known sequence detector 2004, so that the demodulator 2002 and the equalizer 2003 can respectively perform demodulating and channel-equalizing on the mobile data included in the data group. Also, according to the embodiment of the present invention, the signaling decoder 2013 may use the known data sequences included in regions A and B within the data group so as to decode the signaling information. Herein, the decoded signaling information may include TPC data and FIC data. According to the embodiment of the present invention, in case the TPC data and the FIC data indicate information associated to the SFCMM data group, the known sequence detector 2004 extracts known data sequences included in regions C and D within the data group. Most particularly, according to the embodiment of the present invention, the protocol version field of the TPC data may be used for indicating the information associated to the SFCMM data group. Herein, the positions of the known data sequences included in regions C and D within the data group are identical to the positions shown in FIG. 20. In this case, according to the embodiment of the present invention, the equalizer 2003 may perform channel-equalizing by using the known data sequences extracted from regions C and D of the data group.

Figure 60:
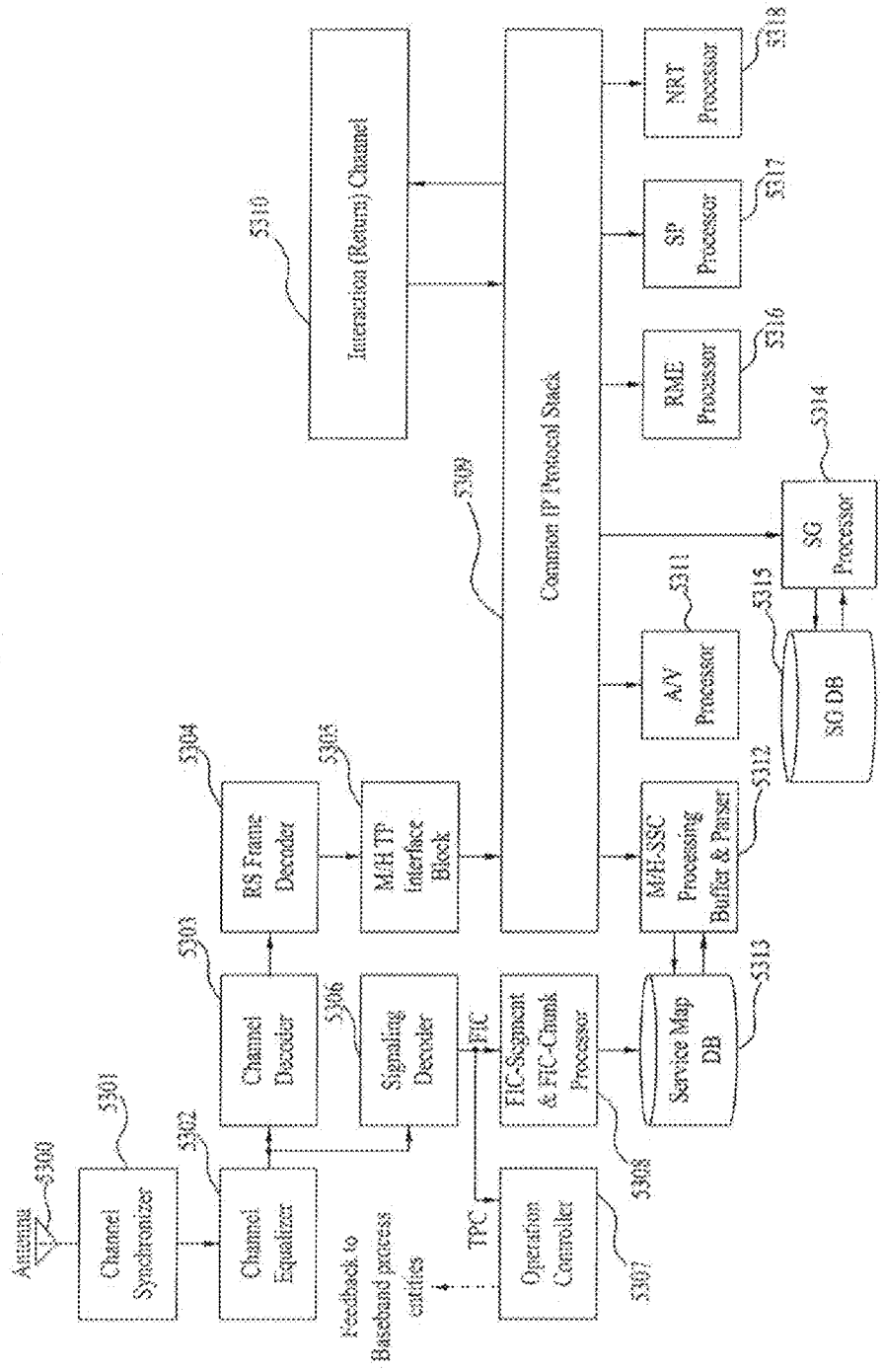
FIG. 60 illustrates a block view showing the structure of a receiving system according to an embodiment of the present invention.

FIG. 60 illustrates a block view showing the structure of a receiving system according to an embodiment of the present invention. The receiving system of FIG. 60 includes an antenna 5300, a channel synchronizer 5301, a channel equalizer 5302, a channel decoder 5303, an RS frame decoder 5304, an M/H TP interface block 5305, a signaling decoder 5306, an operation controller 5307, an FIC processor 5308, a common IP protocol stack 5309, an interaction channel unit 5310, an A/V processor 5311, a service signaling channel (SCC) processor 5312, a first storage unit 5313, a service guide (SG) processor 5314, and a second storage unit 5315. The receiving system may further include a rich media environment (RME) processor 5316, a service protection (SP) processor 5317, and a non-real time (NRT) processor 5318. Also, the receiving system may further include a main service data processing unit. Herein, the main service data processing unit may include a data deinterleaver, an RS decoder, and a data derandomizer.

According to an embodiment of the present invention, the first storage unit 5313 corresponds to a service map database (DB), and the second storage unit 5315 corresponds to a service guide database (DB).

The channel synchronizer 5301 includes a tuner and a demodulator. The tuner tunes a frequency of a specific channel through the antenna 5300, so as to down-convert the tuned frequency to an intermediate frequency (IF) signal, thereby outputting the converted IF signal to the demodulator. Herein, the signal being outputted from the tuner corresponds to a passband digital IF signal.

The demodulator included in the channel synchronizer 5301 uses known data sequences included in a data group and transmitted from the transmitting system, so as to perform carrier wave recovery and timing recovery, thereby converting the inputted pass band digital signal to a baseband digital signal.

For example, among the known data sequences, the channel equalizer 5302 uses a 1st known data sequence, and 3rd to 6th known data sequences to compensate the distortion in a received signal caused by multi path or a Doppler effect. At this point, the channel equalizer 5302 may enhance the equalizing performance by being fed-back with the output of the channel decoder 5303.

The signaling decoder 5306 extracts signaling data (e.g., TPC data and FIC data) from the received signal and decodes the extracted signal data. The decoded TPC data are outputted to the operation controller 5307, and the decoded FIC data are outputted to the FIC processor 5308. According to an embodiment of the present invention, the signaling decoder 5306 performs signaling decoding as an inverse process of the signaling encoder, so as to extract the TPC data and the FIC data from the received signal. For example, the signaling decoder 5306 performs a parallel concatenated convolution code (PCCC) type regressive turbo decoding process on the data corresponding to the signaling information region within the inputted data. Then, the signaling decoder 5306 derandomizes the turbo-decoded signaling data, thereby separating the TPC data and the FIC data from the derandomized signaling data. Additionally, the signaling decoder 5306 performs RS-decoding on the separated TPC data as an inverse process of the transmitting system, thereby outputting the RS-decoded TPC data to the operation controller 5307.

Herein, the TPC data may include RS frame information, SCCC information, M/H frame information, and so on. The RS frame information may include RS frame mode information and RS code mode information. The SCCC information may include SCCC block mode information and SCCC outer code mode information. The M/H frame information may include index information. And, the TPC data may include subframe count information, slot count information, parade_id information, SGN information, NOG information, and so on.

Thereafter, the signaling decoder 5306 performs deinterleaving on the separated FIC data in subframe units and performs RS decoding on the deinterleaved data as an inverse process of the transmitting system, thereby outputting the RS-decoded data to the FIC processor 5308. The transmission unit of the FIC data being deinterleaved and RS-decoded by the signaling decoder 5306 and outputted to the FIC processor 5308 corresponds to FIC segments.

The channel decoder 5303, which is also referred to as a block decoder, performs forward error correction in order to recover meaningful data (e.g., mobile service data) from the received signal. According to an embodiment of the present invention, in order to do so, the channel decoder 5303 uses SCCC-related information (e.g., SCCC block information, SCCC outer code mode information, and so on) included in the signaling data. According to the embodiment of the present invention, if the data being channel-equalized and inputted from the channel equalizer 5302 correspond to data processed with both serial concatenated convolution code (SCCC) type block-encoding and trellis-encoding (i.e., data within the RS frame, signaling data) by the transmitting system, the channel decoder 5303 performs trellis-decoding and block-decoding on the corresponding data as an inverse process of the transmitting system. Alternatively, if the data being channel-equalized and inputted from the channel equalizer 5302 correspond to data processed only with trellis-encoding and not with block-encoding (i.e., main service data), the channel decoder 5303 performs only trellis-decoding on the corresponding data.

By performing RS-CRC decoding on the received data, the RS frame decoder 5304 recovers the RS frame. More specifically, the RS frame decoder 5304 performs forward error correction in order to recover the RS frame. In order to do so, according to an embodiment of the present invention, the RS frame decoder 5304 uses RS-associated information (e.g., RS code mode) among the signaling data.

The M/H TP interface block 5305 extracts M/H TP packets from the RS frame, so as to recover the IP datagram, thereby outputting the recovered IP datagram to the common IP protocol stack 5309. Herein, the M/H TP packets encapsulate the IP datagram. More specifically, the header of each M/H TP packet is analyzed so as to recover the IP datagram from the payload of the corresponding M/H TP packet.

The operation controller 5307 uses the decoded TPC data structure so as to control the operations of various baseband processes. More specifically, the operation controller 5307 receives the TPC data and delivers information, such as M/H frame timing information, information on whether or not a data group exists in a selected parade, position information of known data within the data group, and power control information, to block requiring the respective information.

The FIC processor 5308 collects (or gathers) FIC segments to recover an FIC chunk and stores the recovered FIC chunk in the first storage unit 5313. The FIC chunk includes signaling information required in an ensemble selection process and a mobile (or M/H) service scanning process.

The service signaling channel processor 5312 extracts service signaling channel table sections from the designated IP multicast streams and stores the extracted service signaling channel table sections in the first storage unit 5313. The service signaling channel includes IP level signaling information, which is required for M/H service selection and scanning processes. Herein, the service signaling channel according to the present invention transmits at least one of an SMT, a GAT, an RRT, a CIT, and an SLT. At this point, according to embodiment of the present invention, the access information of the IP datagram transmitting the service signaling channel corresponds to a well-known destination IP address and a well-known destination UDP port number. Therefore, the service signaling channel processor 5312 has a well-known destination IP address and a well-known destination UDP port number, thereby being capable of extracting the IP stream transmitting the service signaling channel, i.e., service signaling data. Then, at least one of the SMT, the GAT, the RRT, the CIT, and the SLT extracted from the service signaling data is recovered and stored in the first storage unit 5313. For example, the first storage unit 5313 stores a service map configured from signaling information collected the FIC processor 5308 and the service signaling channel processor 5312.

The A/V processor 5311 receives the IP datagram from the common IP protocol stack 5309. Then, the A/V processor 5311 separates the audio data and the video data from the received IP datagram and decoded each of the audio data and the video data with a respective decoding algorithm, thereby displaying the decoded data to the screen. For example, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied be used as the audio decoding algorithm, and at least one of an MPEG 2 video decoding algorithm, an MPEG 4 video decoding algorithm, an H.264 decoding algorithm, an SVC decoding algorithm, and a VC-1 decoding algorithm may be applied as the video decoding algorithm.

The SG processor 5314 recovers announcement data and stores the recovered announcement data to the second storage unit 5315, thereby providing a service guide to the viewer.

The interaction (or return) channel unit 5310 provides an uplink from the receiving system through the common IP protocol stack 5309. At this point, the interaction channel should be IP-compatible.

The RME processor 5316 receives an M/H broadcast program or RME data through the common IP protocol stack 5309, the RME data being delivered through the interaction channel. Then, the received M/H broadcast program or RME data are recovered and then processed.

The SP processor 5317 recovers and processes data associated with service protection, which are received through the common IP protocol stack 5309. Then, the SP processor 5317 provides protection to the M/H service depending upon the subscription state of the viewer (or user).

The NRT processor 5318 recovers and processes non-real time data, such as file application.

Channel Synchronizer

Figure 61:
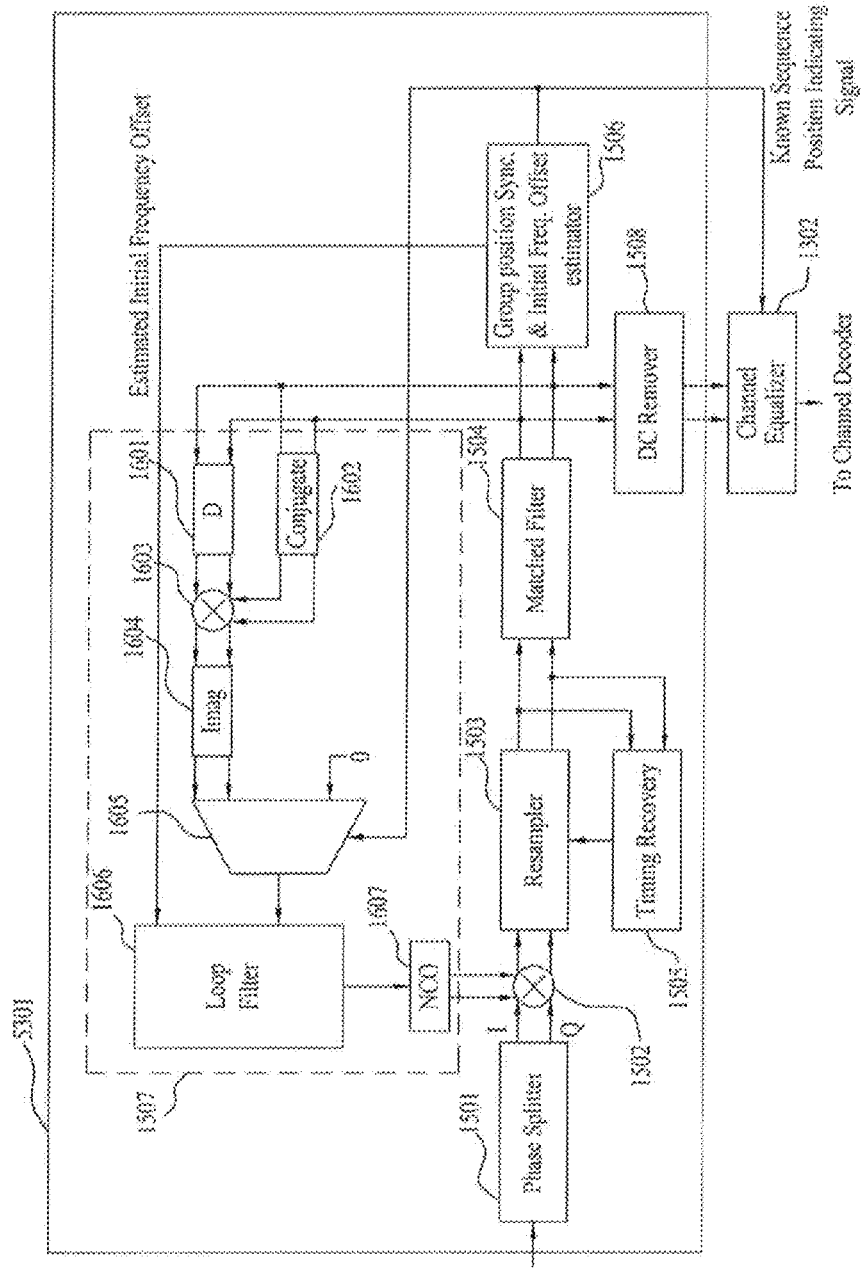
FIG. 61 illustrates a detailed block view of a demodulator included in the channel synchronizer 5301 according to an embodiment of the present invention.

FIG. 61 illustrates a detailed block view of a demodulator included in the channel synchronizer 5301 according to an embodiment of the present invention.

The channel synchronizer 5301 of FIG. 53 may include a phase splitter 1501, a first multiplier 1502, a resampler 1503, a Matched Filter 1504, a Timing Recovery block 1505, a Group Position Synchronization & Initial Frequency offset estimator 1506, a Carrier Recovery block 1507, and a DC remover 1508. According to an embodiment of the present invention, an analog-to-digital converter (not shown) converting a passband analog signal to a passband digital signal may be provided at the front end of the phase splitter 1501. Also, according to an embodiment of the present invention, an automatic gain control (AGC) is performed before carrier recovery and timing recovery.

The carrier recovery block 1507 includes a delay unit 1601, a second multiplier 1603, a carrier frequency offset detector 1604, a multiplexer 1605, a loop filter 1606, and Numerically Controlled Oscillator (NCO) 1607.

Also referring to FIG. 60, the phase splitter 1501 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1502. Herein, the real number signal outputted from the phase splitter 1501 will be referred to as an 'I' signal, and the imaginary number signal outputted from the phase splitter 1501 will be referred to as a 'Q' signal, for simplicity of the description of the present invention.

It is assumed that the signal being outputted from the tuner of the present invention is an intermediate frequency (IF) of 44 MHz. According to another embodiment of the present invention, the signal being outputted from the tuner may also be a zero IF signal (i.e., complex baseband signal). In this case, the zero IF signal is inputted to the first multiplier 1502 bypassing the phase splitter 1501.

The first multiplier 1502 multiplies the I and Q pass band digital signals, which are outputted from the phase splitter 1501, by a digital complex signal outputted from the NCO 1607 of the carrier recovery block 1507, thereby down-converting the I and Q passband digital signals to baseband digital complex signals. At this point, by multiplying the carrier frequency offset being outputted from the carrier recovery block 1507 by the output of the phase splitter 1501, the carrier frequency offset included in the output signal of the phase splitter 1501 is compensated. Thereafter, the baseband digital signals of the first multiplier 1502 are inputted to the resampler 1503.

The resampler 1503 multiplies the signals outputted from the first multiplier 1502 by a sampling clock provided by the timing recovery block 1505, so as to compensate symbol timing errors, thereby outputting the compensated signals to the matched filter 1504 and the timing recovery block 1505.

The matched filter 1504 performs matched filtering on the output signals of the resampler 1503, thereby outputting the signals processed with matched filtering to the Group Position Synchronization & Initial Frequency offset estimator 1506, the Carrier Recovery block 1507, and the DC remover 1508.

The Group Position Synchronization & Initial Frequency offset estimator 1506 detects the place (or position) of the known data sequences that are included in the data group and received. Simultaneously, the Group Position Synchronization & Initial Frequency offset estimator 1506 estimates an initial frequency offset during the known data detection process. In this case, the carrier recovery block 1507 may use the known data sequence position information and initial frequency offset value to estimate the carrier frequency offset with more accuracy, thereby performing compensation. Also, the Group Position Synchronization & Initial Frequency offset estimator 1506 performs group position synchronization. More specifically, the Group Position Synchronization & Initial Frequency offset estimator 1506 extracts the starting position of each data group.

For example, the Group Position Synchronization & Initial Frequency offset estimator 1506 detects the position (or place) of the known data sequence included in the data group. Then, the Group Position Synchronization & Initial Frequency offset estimator 1506 outputs the detected known sequence position indicating signal to the multiplexer 1604 and the channel equalizer 1302 of the carrier recovery block 1507. Furthermore, the Group Position Synchronization & Initial Frequency offset estimator 1506 estimates the initial frequency offset by using the second known data sequence within the data group, which is then outputted to the loop filter 1606 of the carrier recovery block 1507.

The timing recovery block 1505 receives the output of the resampler 1503 so as to detect the timing error. Then, the timing recovery block 1505 outputs a sampling clock being in proportion with the detected timing error to the resampler 1503, thereby controlling the sampling of the resampler 1503.

The DC remover 1508 removes a pilot tone signal (i.e., DC signal), which has been inserted by the transmitting system, from the matched-filtered signal outputted from the matched filter 1504. Thereafter, the DC remover 1508 outputs the processed signal to the channel equalizer 1302.

Known Data Sequence Position and Initial Frequency Offset Estimation

According to an embodiment of the present invention, among the known data sequences included in the data group, a correlation of repeated known data patterns of a second known data sequence is used to detect the position of a known data sequence within the data group and to estimate an initial frequency offset. Particularly, according to an embodiment of the present invention, a partial correlation is used to detect the position of a known data sequence and to estimate an initial frequency offset.

The initial frequency offset includes a rough frequency offset and a finer frequency offset. More specifically, when acquiring carrier frequency acquisition, at first a rough frequency offset is used to reduce a frequency pull-in range, and, then, a finer frequency offset is used to reduce the frequency pull-in range once again.

In the present invention, the second known data sequence within the data group is configured of a first 528 symbol sequence and a second 528 symbol sequence each having the same pattern. More specifically, the 528 pattern is repeated after a data segment synchronization signal of 4 symbols.

In the description of the present invention, the second known data sequence will be referred to as an acquisition training sequence.

The Group Position Synchronization & Initial Frequency offset estimator (or known sequence detector) 1506 uses the repeated known data pattern of the second known data sequence, so as to perform group position synchronization and initial frequency offset estimation. For example, a correlation between the received signal and a second known data sequence, which is pre-known based upon an agreement between the transmitting system and the receiving system, and by finding a maximum correlation value, the group position synchronization may be performed. However, if a frequency offset exists in the received signal, the reliability of a general correlation method, wherein an entire second known data sequence is used to obtain one correlation value, may be degraded. More specifically, as the length of a known data pattern for correlation becomes longer, the possibility of the reliability of a correlation peak value being degraded may increase.

Therefore, according to an embodiment of the present invention, a partial correlation method is used to detect a highly reliable correlation peak value, even when a large frequency offset exists. More specifically, by using the partial correlation method, noise may be reduced.

As described above, in the present invention, by obtaining a partial correlation by dividing (or segmenting) the second known data sequence into two or more parts, a peak value among the correlation value for each part may be obtained. Then, all of the peak correlation values for each part are added so as to calculate the average (or mean) value. Accordingly, the noise included in the received signal is cancelled, thereby reducing the noise.

In order to do so, the second known data sequence is segmented (or divided) into multiple parts, and a correlation between the known data sequence of each part (i.e., reference known data sequence of a corresponding part generated from the receiving system) and the receiving signal is calculated (or obtained) for each part. Thereafter, the partial correlation values obtained for each part are all added. At this point, each of the correlation values obtained for each part corresponds to a squared value (i.e., a magnitude square) having no phase information.

Figure 62A:
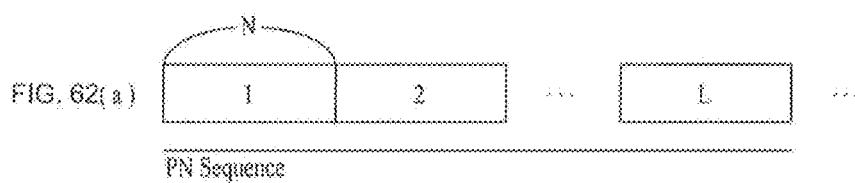
FIGS. 62 (*a*) and 62 (*b*) illustrate a known data symbol sequence and a partial correlation unit according to an embodiment of the present invention.
Figure 62B:
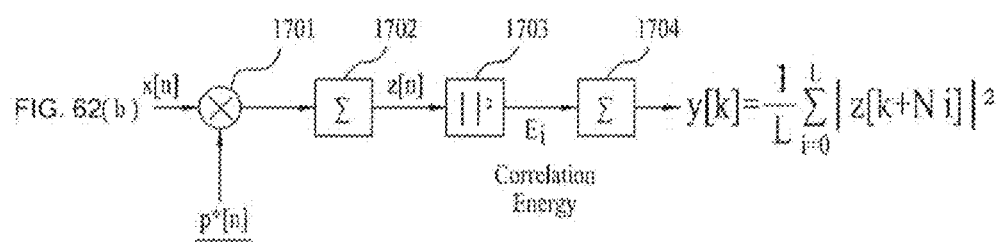

FIG. 62 shows an example of each part being configured of N number of symbols, when the second known data symbol sequence is divided (or segmented) into L number of parts. More specifically, in FIG. 62 (*a*), L represents a number of parts being segmented from the second known data symbol sequence, and N represents the length of each part. Also, * signifies a complex conjugate. In other words, a second known data sequence is divided into L number of parts each having the length of N symbols. Thereafter, the correlation with the received signal is obtained for each part.

FIG. 62 illustrates a conceptual view of a partial correlator according to an embodiment of the present invention. Herein, the partial correlator consists of a multiplier 1701 shifting known data sequences of each corresponding part to the received signal so as to perform complex conjugate multiplication, a first accumulator 1702 accumulating the output of the multiplier 1701 for a period of N symbols, a squarer 1703 calculating a squared value of the output of the first accumulator 1702, and a second accumulator 1704 accumulating the output of the squarer 1703 for a predetermined period of time, thereby calculating an average (or mean) correlation value.

More specifically, the multiplier 1701 shifts the known data sequence of a corresponding part in accordance with the received signal so as to perform complex conjugate multiplication, thereby outputting the multiplied values to the first accumulator 1702. The first accumulator 1702 accumulates the output of the multiplier 1701 for a period of N symbols, thereby outputting the accumulated value to the squarer 1703. The output of the first accumulator 1702 corresponds to correlation values each having a phase and size. The squarer 1703 calculates the squared value of the output of the first accumulator 1702, thereby obtaining the size of the correlation value. The second accumulator 1704 accumulates the outputs of the squarer 1703 during L sections. Then, the second accumulator 1704 divides the accumulated value by L, so as to output the average correlation value of the corresponding part, as shown in Equation 2 below.

$$y[k] = 1/L \sum_{i=0}^{L} |z[k+Ni]|^2 \qquad \text{[Equation 2]}$$

More specifically, by finding a maximum correlation value during a data group period, the Group Position Synchronization & Initial Frequency offset estimator 1506 decides a group synchronization position and a known data sequence position. Also, by suing the partial correlation method, the known sequence detector estimates the initial frequency offset.

Figure 63:
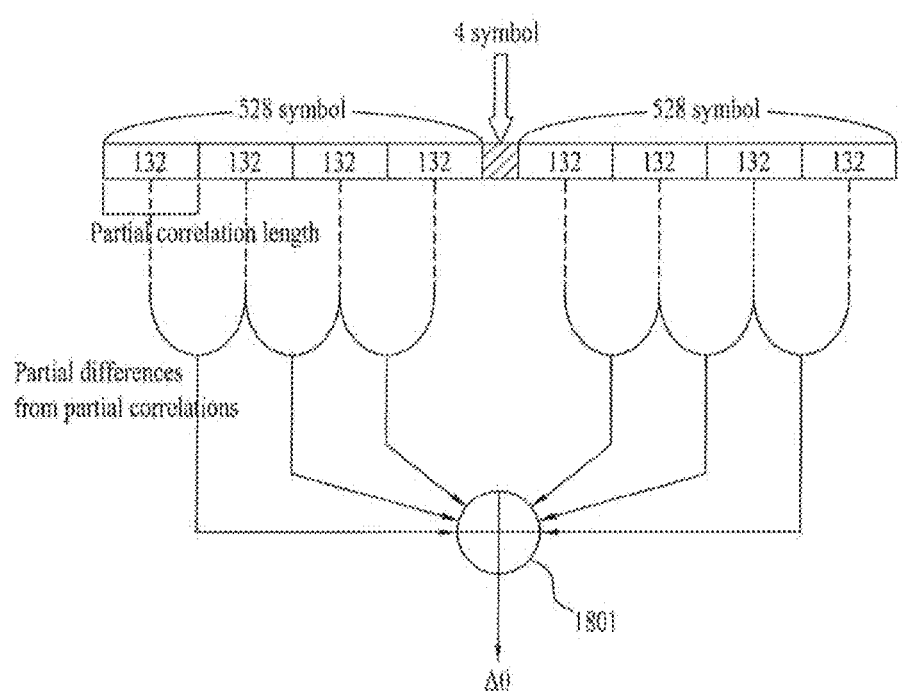
FIG. 63 is a conceptual diagram illustrating a method for roughly estimating an initial frequency offset by dividing a second known data sequence into 8 parts and calculating partial correlation of the 8 parts according to an embodiment of the present invention.

FIG. 63 illustrates an example of estimating a rough initial frequency offset by obtaining partial correlation by dividing (or segmenting) a second known data sequence into 8 parts. When applying this example to FIG. 55, L is equal to 8, and N is equal to 132 symbols. In case of FIG. 56, 8 partial correlators are required to be provided, and 8 peak correlation values may be obtained accordingly.

In this case, at a maximum correlation position, the Group Position Synchronization & Initial Frequency offset estimator 1506 calculates a phase difference between the correlation values of each of the successive parts. Then, the Group Position Synchronization & Initial Frequency offset estimator 1506 uses an adder 1801 to add all of the phase differences for each part, thereby outputting an average phase difference $\Delta\theta$. Subsequently, by using the average phase difference $\Delta\theta$ and the length (N) of each part, the known sequence detector may calculate $\omega 0$ as shown in Equation 3 below.

$$\omega_0 = \frac{\Delta\theta}{N} \qquad \text{[Equation 3]}$$

Herein, $\omega_0 = 2\pi f 0$ f0: Normalized frequency offset
$\Delta\theta$: Average phase difference)
N: Length of each part According to an embodiment of the present invention, in Equation 3, N is equal to 132.

At this point, the rough (or coarse) frequency offset f0 obtained from $\omega 0$ by applying Equation 3 provides a frequency pull-in range of ±80 kHz. A trade-off exists between the frequency pull-in range and a variance of an estimated error associated to a length of the part. More specifically, if the length of a known data pattern for the correlation is short, the frequency pull-in range increases, and the jitter also increases accordingly. On the other hand, if the length of a known data pattern for the correlation is long, the frequency pull-in range decreases, and the jitter also decreases accordingly.

Meanwhile, according to an embodiment of the present invention, a finer frequency offset is estimated by using repeated patterns of the second known data sequence. The second known data sequence is configured of two parts. More specifically, the second known data sequence is configured of a part including a first 528 symbol sequence and another part including a second 528 symbol sequence. Herein, a data segment synchronization signal of 4 symbols exists between the first 528 symbol sequence and the second 528 symbol sequence. This structure allows the finer frequency offset to be estimated by using a Maximum-likelihood algorithm.

Figure 64:
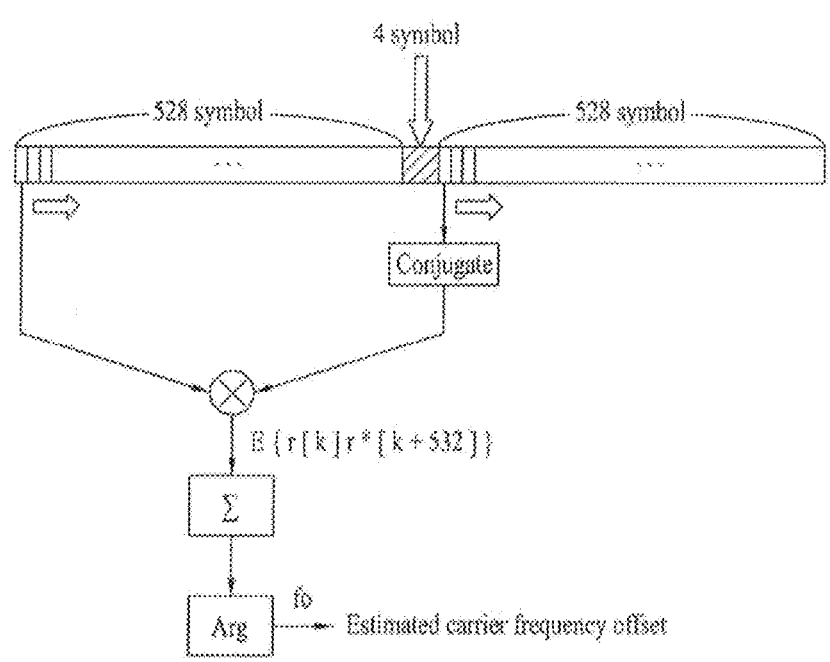
FIG. 64 is a conceptual diagram illustrating a method for precisely estimating a frequency offset using a maximum-likelihood algorithm according to an embodiment of the present invention.
Figure 65:
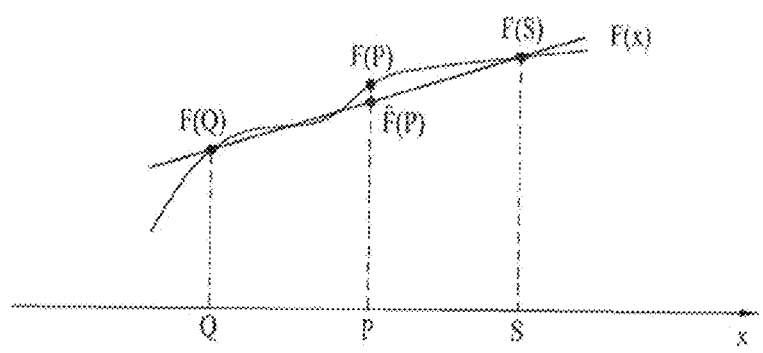
FIG. 65 illustrates an example of linear interpolation.

FIG. 64 illustrates an example of estimating a finer frequency offset by using the Maximum-likelihood algorithm according to the present invention.

At this point, the received signal r[k] may be indicated as shown in Equation 4 below.

$$r[k] = x[k]e^{-j2\pi f_0 T_s k} + n[k] \qquad \text{[Equation 4]}$$

Herein, x[k]: transmitted signal
f0: frequency offset
Ts: symbol duration
n[k]: noise In Equation 4, f0 corresponds to the finer frequency offset.

Also, the correlation between the received signals separated by 532(=528+4) symbols may be obtained (or calculated) by using Equation 5 below.

$$E\{r[k]r^*[k+532]\} = \qquad \text{[Equation 5]}$$
$$E\{(x[k]e^{-j2\pi f_0 T_s k} + n[k])(x^*[k+532]e^{j2\pi f_0 T_s (k+532)} +$$
$$n^*[k+532])\} = \sigma_s^2 e^{j2\pi f_0 T_s \cdot 532}$$

Where, $\sigma_s^2 : E\{|x[k]|^2\}$

More specifically, the partial correlation of the two parts spaced apart by 532 symbols (i.e., each part having the length of 532 symbols) is calculated and then the average value is calculated. Thereafter, after applying an argument, the finer frequency offset can be obtained. The finer frequency offset obtained by applying the Equation 5 provides a frequency pull-in range of ±10 kHz.

In the description of the present invention, the rough frequency offset and the finer frequency offset will be collectively referred to as an initial frequency offset. The initial frequency offset is outputted to the loop filter 1606 of the carrier recovery block 1507.

Meanwhile, according to an embodiment of the present invention, the carrier recovery block 1507 uses a carrier frequency tracking loop, as shown in FIG. 61.

The carrier recovery block 1507 loads an initial frequency offset estimated from the Group Position Synchronization & Initial Frequency offset estimator 1506. Then, the carrier recovery block 1507 tracks the remaining carrier frequency offset.

More specifically, the carrier recovery block 1507 uses a Maximum-likelihood to calculate the correlation of the received successive known data sequences, thereby estimating a carrier frequency offset (or error) using the same method that is used for the initial frequency offset estimation.

In order to do so, the delay unit 1601 of the carrier recovery block 1507 receives the data outputted from the matched filter 1504 in symbol units so as to perform a K symbol delay. Thereafter, the delay unit 1601 outputs the delayed data to the second multiplier 1603.

Also, the output data of the matched filter 1504 is conjugated by the conjugator 1602. Then, the conjugated data are inputted to the second multiplier 1603.

The second multiplier 1603 calculates the correlation value between the known data sequence delayed by K symbols by the delay unit 1601 and the known data sequence conjugated by the conjugator 1602. Thereafter, the second multiplier 1603 outputs the calculated correlation value to the carrier frequency offset detector 1604.

Herein, according to an embodiment of the present invention, K symbols is equal to 13312 symbols (=832*16 symbols). This is because the first known data sequence, and the third to sixth known data sequences are inserted and received at intervals of 16 segments, and also because one segment is configured of 832 symbols.

According to the embodiment of the present invention, the correlation value between the known data sequences spaced apart at an interval of 13312 symbols may be calculated by applying Equation 6 shown below.

$$E\{r[k]r^*[k+13312]\} =$$ [Equation 6]

$$E\{(x[k]e^{-j2\pi f_0 T_s k} + n[k])(x^*[k+13312]e^{j2\pi f_0 T_s (k+13312)} +$$

$$n^*[k+13312])\} = \sigma_s^2 e^{j2\pi f_0 T_s \cdot 13312}$$

Where, $\sigma_s^2 : E\{|x[k]|^2\}$

Herein, x[k]: transmitted signal
f0: carrier frequency offset
Ts: symbol duration
n[k]: noise In Equation 6, f0 corresponds to a carrier frequency offset for tracking.

The carrier frequency offset detector 1604 extracts a carrier frequency offset from the correlation value outputted from the second multiplier 1603, as shown in Equation 6. Then, the extracted carrier frequency offset is outputted to the multiplexer 1605.

In accordance with the Known Sequence Position Indicating Signal from the Group Position Synchronization & Initial Frequency offset estimator 1506, the multiplexer 1605 selects an output of the carrier frequency offset detector 1604 or '0', which is then outputted as the final carrier frequency offset value.

More specifically, by using Known Sequence Position Indicating Signal, the validity of the carrier frequency offset value being outputted from the carrier frequency offset detector 1604 can be known. If the carrier frequency offset value is valid, the multiplexer 1605 selects the output of the carrier frequency offset detector 1604. And, if the carrier frequency offset value is not valid, the multiplexer 1605 selects '0'. Then, the multiplexer 1605 outputs the selection to the loop filter 1606.

The loop filter 1606 adds the output of the multiplexer 1605 to the estimated initial frequency offset, so as to perform baseband pass-filtering. Thereafter, the filtered data are outputted to the NCO 1607.

The NCO 1607 generates a complex signal corresponding to a baseband pass-filtered carrier frequency offset, thereby outputting the generated complex signal to the first multiplier 1502.

Meanwhile, according to an embodiment of the present invention, by turning the power on only in particular slots, i.e., slots having the data groups of a parade allocated thereto, wherein the parade includes a mobile service requested to be received, the channel synchronizer 1301 may reduce power consumption in the receiving system. For this, the receiving system may further include a power controller (not shown), which controls the power supply of the demodulator.

Channel Equalizer

The data demodulated by the channel synchronizer 5301 using the known data are inputted to the channel equalizer 5302. Also, the demodulated data may be inputted to the known sequence detector 1506.

At this point, a data group that is inputted for the equalization process may be divided into region A to region D (or region A to region E), as shown in FIG. 11. More specifically, according to the embodiment of the present invention, region A includes M/H block B4 to M/H block B7, region B includes M/H block B3 and M/H block B8, region C includes M/H block B2 and M/H block B9, and region D includes M/H block B1 and M/H block B10. In other words, one data group is divided into M/H blocks from B1 to B10, each M/H block having the length of 16 segments. Also, a long training sequence (i.e., known data sequence) is inserted at the starting portion of the M/H blocks B4 to B8. Furthermore, two data groups may be allocated (or assigned) to one VSB field. In this case, field synchronization data are positioned in the 37$^{th}$ segment of one of the two data groups.

The present invention may use known data, which have position and content information based upon an agreement between the transmitting system and the receiving system, and/or field synchronization data for the channel equalization process.

The channel equalizer 5302 may perform channel equalization using a plurality of methods. According to the present invention, the channel equalizer 5302 uses known data and/or field synchronization data, so as to estimate a channel impulse response (CIR), thereby performing channel equalization.

Most particularly, an example of estimating the CIR in accordance with each region within the data group, which is hierarchically divided and transmitted from the transmitting system, and applying each CIR differently will also be described herein.

At this point, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data.

For example, the data of the M/H block B3 including the field synchronization data performs channel-equalization using the CIR calculated from the field synchronization data area and the CIR calculated from the first known data area. Also, the data of the M/H blocks B1 and B2 performs channel-equalization using the CIR calculated from the field synchronization data area and the CIR calculated from the first known data area. Meanwhile, the data of the M/H blocks B1 to B3 not including the field synchronization data performs channel-equalization using CIRS calculated from the first known data area and the third known data area.

As described above, the present invention uses the CIR estimated from the known data region in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. FIG. 58 illustrates an example of linear interpolation.

More specifically, in a random function F(x), when given the values F(Q) and F(S) each from points x=Q and x=S, respectively, the approximate value $\hat{F}(P)$ of the F(x) function at point x=P may be estimated by using Equation 7 below. In other words, since the values of F(Q) and F(S) respective to each point x=Q and x=S are known (or given), a straight line passing through the two points may be calculated so as to obtain the approximate value $\hat{F}(P)$ of the corresponding function value at point P. At this point, the straight line passing through points (Q,F(Q)) and (S,F(S)) may be obtained by using Equation 7 below.

$$\hat{F}(x) = \frac{F(S) - F(Q)}{S - Q}(x - Q) + F(Q) \qquad \text{[Equation 7]}$$

Accordingly, Equation 8 below shows the process of substituting p for x in Equation 7, so as to calculate the approximate value $\hat{F}(P)$ of the function value at point P.

$$\hat{F}(P) = \frac{F(S) - F(Q)}{S - Q}(P - Q) + F(Q) \qquad \text{[Equation 8]}$$

$$\hat{F}(P) = \frac{S - P}{S - Q}F(Q) + \frac{P - Q}{S - Q} + F(S)$$

The linear interpolation method of Equation 8 is merely the simplest example of many other linear interpolation methods. Therefore, since any other linear interpolation method may be used, the present invention will not be limited only to the examples given herein.

Alternatively, when a value F(Q) of a function F(x) at a particular point Q and a value F(S) of the function F(x) at another particular point S are known (or given), extrapolation refers to estimating a function value of a point outside of the section between points Q and S. Herein, the simplest form of extrapolation corresponds to linear extrapolation.

Figure 66:
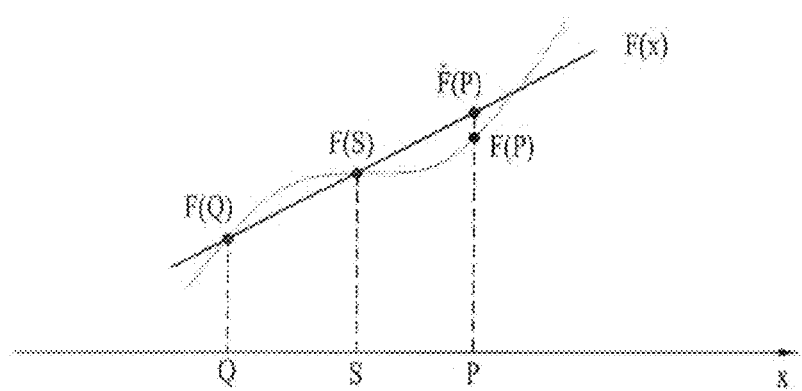
FIG. 66 illustrates an example of linear extrapolation.

FIG. 66 illustrates an example of linear extrapolation. As described above, for linear extrapolation as well as linear interpolation, in a random function F(x), when given the values F(Q) and F(S) each from points x=Q and x=S, respectively, the approximate value $\hat{F}(P)$ of the corresponding function value at point P may be obtained by calculating a straight line passing through the two points.

Herein, linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein FIG. 67 illustrates a block diagram of a channel equalizer according to an embodiment of the present invention.

Figure 67:
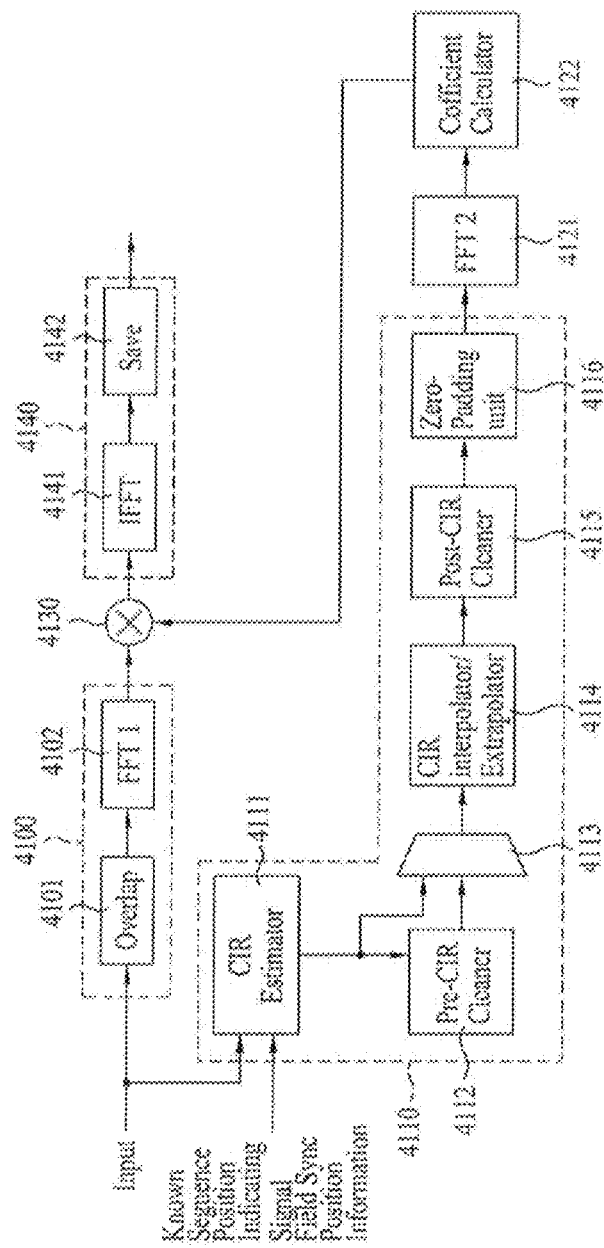
FIG. 67 illustrates an example of a channel equalizer according to an embodiment of the present invention.

Referring to FIG. 67, the channel equalizer includes a first frequency domain converter 4100, a channel estimator 4110, a second frequency domain converter 4121, a coefficient calculator 4122, a distortion compensator 4130, and a time domain converter 4140.

Herein, the channel equalizer may further include a remaining carrier phase error remover, a noise canceller (NC), and a decision unit.

The first frequency domain converter 4100 includes an overlap unit 4101 overlapping input data, and a Fast Fourier Transform (FFT) unit 4102 converting the data output from the overlap unit 4101 to frequency domain data.

The channel estimator 4110 includes a CIR estimator 4111, a first cleaner 4112, a multiplexer 4113, a CIR calculator 4114, a second cleaner 4115 and a zero-padding unit 4116.

Herein, the channel estimator 4110 may further include a phase compensator compensating a phase of the CIR which estimated in the CIR estimator 4111.

The second frequency domain converter 4121 includes a Fast Fourier Transform (FFT) unit converting the CIR output from the channel estimator 4110 to frequency domain CIR.

The time domain converter 4140 includes an IFFT unit 4141 converting the data having the distortion compensated by the distortion compensator 4130 to time domain data, and a save unit 4142 extracting only valid data from the data outputted from the IFFT unit 4141. The output data from the save unit 4142 corresponds to the channel-equalized data.

If the remaining carrier phase error remover is connected to an output terminal of the time domain converter 4140, the remaining carrier phase error remover estimates the remaining carrier phase error included in the channel-equalized data, thereby removing the estimated error.

If the noise remover is connected to an output terminal of the time domain converter 4140, the noise remover estimates noise included in the channel-equalized data, thereby removing the estimated noise.

More specifically, the receiving data are overlapped by the overlap unit 4101 of the first frequency domain converter 4100 at a pre-determined overlapping ratio, which are then outputted to the FFT unit 4102. The FFT unit 4102 converts the overlapped time domain data to overlapped frequency domain data through by processing the data with FFT. Then, the converted data are outputted to the distortion compensator 4130.

The distortion compensator 4130 performs a complex number multiplication on the overlapped frequency domain data outputted from the FFT unit 4102 included in the first frequency domain converter 4100 and the equalization coefficient calculated from the coefficient calculator 4122, thereby compensating the channel distortion of the overlapped data outputted from the FFT unit 4102. Thereafter, the compensated data are outputted to the IFFT unit 4141 of the time domain converter 4140. The IFFT unit 4141 performs IFFT on the overlapped data having the channel distortion compensated, thereby converting the overlapped data to time domain data, which are then outputted to the save unit 4142. The save unit 4142 extracts valid data from the data of the channel-equalized and overlapped in the time domain, and outputs the extracted valid data.

Meanwhile, the received data are inputted to the overlap unit 4101 of the first frequency domain converter 4100 included in the channel equalizer and, at the same time, inputted to the CIR estimator 4111 of the channel estimator 4110.

The CIR estimator 4111 uses a training sequence, for example, data being inputted during the known data section and the known data in order to estimate the CIR. If the data to be channel-equalizing is the data within the data group including field synchronization data, the training sequence using in the CIR estimator 4111 may become the field synchronization data and known data. Meanwhile, if the data to be channel-equalizing is the data within the data group not including field synchronization data, the training sequence using in the CIR estimator 4111 may become only the known data.

For example, the CIR estimator 4111 uses the data received during a known data section and reference known data generated from the receiving system based upon an agreement between the receiving system and the transmitting system, so as to estimate a channel impulse response (CIR). In order to do so, the CIR estimator 4111 is provided with a Known Sequence Position Indicating Signal from the Group Position Synchronization & Initial Frequency offset estimator 1506.

Also, in case of the data group including field synchronization, the CIR estimator 4111 may use the data being received during one field synchronization section and the reference field synchronization data, which generated from the receiving system in accordance with an agreement between the transmitting system and the receiving system, so as to estimate a channel impulse response (CIR_FS). In order to do so, the CIR estimator 4111 may be provided with Field Sync Position Information from the Group Position Synchronization & Initial Frequency offset estimator 1506. The CIR estimator 4111 may estimate a channel impulse response (CIR) by using a well-known least square (LS) method.

In the LS method, a cross correlation value p between known data that have passed through a channel during a known data section and known data already known by a receiving end (or receiver) is calculated, and an auto-correlation matrix R of the known data is also calculated. Thereafter, a matrix operation (or calculation) of $R^{-1} \cdot p$ is performed so that the auto-correlation portion existing in the cross correlation value p between the received data and the initial (or original) known data can be removed, thereby estimating the CIR of the transmission channel.

Also, according to another embodiment of the present invention, the CIR estimator may also perform CIR estimation by using a least mean square (LMS) method. For example, in regions A and B within the data group, the Channel Impulse Response (CIR) is estimated by using the Least Square (LS) method, and, then, channel equalization may be performed. Thereafter, in regions C and D within the data group, the CIR is estimated by using the Least Mean Square (LMS) method, and, then, channel equalization may be performed.

The CIR estimated as described above is outputted to the first cleaner 4112 and the multiplexer 4113. The multiplexer 4113 may either select the output of the first cleaner 4112 or select the output of the CIR estimator 4111 depending upon whether the CIR operator 4114 performs interpolation on the estimated CIR, or whether the CIR operator 4114 performs extrapolation on the estimated CIR. For example, when the CIR operator 4114 performs interpolation on the estimated CIR, the multiplexer 4113 selects the output of the CIR estimator 4111. And, when the CIR operator 4114 performs extrapolation on the estimated CIR, the multiplexer 4113 selects the output of the first cleaner 4112.

The CIR operator 4114 performs interpolation or extrapolation on the estimated CIR and then outputs the interpolated or extrapolated CIR to the second cleaner 4115.

More specifically, the CIR estimated from the known data includes a channel element that is to be obtained as well as a jitter element caused by noise. Since such jitter element deteriorates the performance of the equalizer, it preferable that a coefficient calculator 4122 removes the jitter element before using the estimated CIR. Therefore, according to the embodiment of the present invention, each of the first and second cleaners 4113 and 4115 removes a portion of the estimated CIR having a power level lower than the predetermined threshold value (i.e., so that the estimated CIR becomes equal to '0'). Herein, this removal process will be referred to as a "CIR cleaning" process.

The CIR calculator 4114 performs CIR interpolation by multiplying CIRs estimated from the CIR estimator 4111 by each of coefficients, thereby adding the multiplied values. At this point, some of the noise elements of the CIR may be added to one another, thereby being cancelled. Therefore, when the CIR calculator 4114 performs CIR interpolation, the original (or initial) CIR having noise elements remaining therein. In other words, when the CIR calculator 4114 performs CIR interpolation, the estimated CIR bypasses the first cleaner 4113 and is inputted to the CIR calculator 4114. Subsequently, the second cleaner 4115 cleans the CIR interpolated by the CIR interpolator-extrapolator 4114.

Conversely, the CIR calculator 4114 performs CIR extrapolation by using a difference value between two CIRs, so as to estimate a CIR positioned outside of the two CIRs. Therefore, in this case, the noise element is rather amplified. Accordingly, when the CIR calculator 4114 performs CIR extrapolation, the CIR cleaned by the first cleaner 4113 is used. More specifically, when the CIR calculator 4114 performs CIR extrapolation, the extrapolated CIR passes through the second cleaner 4115, thereby being inputted to the zero-padding unit 4116.

When a second frequency domain converter (or Fast Fourier Transform (FFT2)) 4121 converts the CIR, which has been cleaned and outputfrom the second cleaner 4115, to a frequency domain, the length and of the input CIR and the FFT size may not match (or be identical to one another). In other words, the CIR length may be smaller than the FFT size. In this case, the zero-padding unit 4116 adds a number of zeros '0's corresponding to the difference between the FFT size and the CIR length to the input CIR, thereby outputting the processed CIR to the second frequency domain converter (FFT2) 4121. Herein, the zero-padded CIR may correspond to one of the interpolated CIR, extrapolated CIR, and the CIR estimated in the known data section.

The second frequency domain converter 4121 outputs the converted CIR to the coefficient calculator 4122.

The coefficient calculator 4122 uses the frequency domain CIR being outputted from the second frequency domain converter 4121 to calculate the equalization coefficient. Then, the coefficient calculator 4122 outputs the calculated coefficient to the distortion compensator 4130. Herein, for example, the coefficient calculator 4122 calculates a channel equalization coefficient of the frequency domain that can provide minimum mean square error (MMSE) from the CIR of the frequency domain, which is outputted to the distortion compensator 4130.

The distortion compensator 4130 performs a complex number multiplication on the overlapped data of the frequency domain being outputted from the FFT unit 4102 of the first frequency domain converter 4100 and the equalization coefficient calculated by the coefficient calculator 4122, thereby compensating the channel distortion of the overlapped data being outputted from the FFT unit 4102.

Block Decoder

Meanwhile, if the data being inputted to the block decoder 5303, after being channel-equalized by the equalizer 5302, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 5303 are then outputted to the RS frame decoder 5304. More specifically, the block decoder 5303 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 5303 outputs the processed data to the RS frame decoder 5304. Herein, the removal of the data may be performed before the block decoding process, or may be performed during or after the block decoding process.

Meanwhile, the data trellis-decoded by the block decoder 5303 are outputted to the data deinterleaver of the main service data processor. At this point, the data being trellis-decoded by the block decoder 5303 and outputted to the data deinterleaver may not only include the main service data but may also include the data within the RS frame and the signaling information. Furthermore, the RS parity data that are added by the transmitting system after the pre-processor may also be included in the data being outputted to the data deinterleaver.

According to another embodiment of the present invention, data that are not processed with block decoding and only processed with trellis encoding by the transmitting system may directly bypass the block decoder 5303 so as to be outputted to the data deinterleaver. In this case, a trellis decoder should be provided before the data deinterleaver.

More specifically, if the inputted data correspond to the data having only trellis encoding performed thereon and not block encoding, the block decoder 5303 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 5303 outputs a soft decision value with respect to the inputted data.

In other words, if the inputted data correspond to data being processed with block encoding by the block processor and being processed with trellis encoding by the trellis encoding module, in the transmitting system, the block decoder 5303 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 5303 to maximize its performance of decoding externally encoded data, the decoder of the internal code should output a soft decision value.

Figure 68:
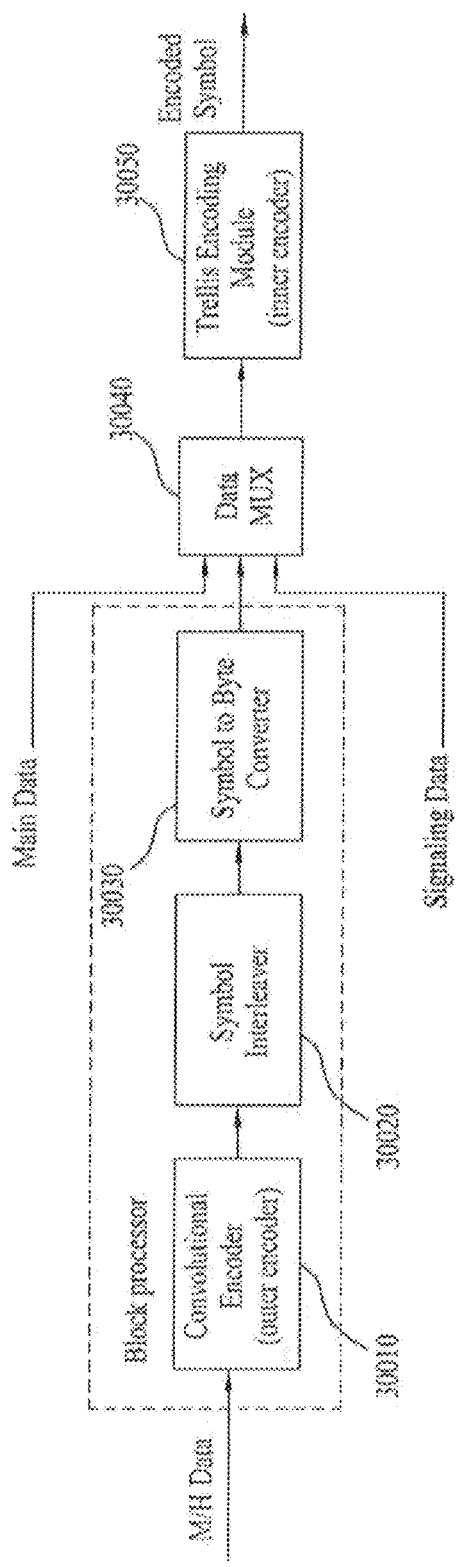
FIG. 68 illustrates a serial concatenated convolution code (SCCC) coding process according to an embodiment of the present invention.

FIG. 68 illustrates SCCC encoding process according to an embodiment of the present invention.

The SCCC encoding process is related with Convolutional Encoder 30010, Symbol Interleaver 30020, Symbol to Byte Converter 30030, Data MUX 30040 and Trellis Encoding Module 30050.

A SCCC Decoder can decode both the main trellis code and the M/H convolutional code, considering that they are effectively concatenated with each other at the transmitter through the symbol interleaver 30020 and the data mux module 30040 as shown in FIG. 30. the data mux module 30040, shown as a single block, actually consists of a number of processors including the Group formatter, the Packet formatter, the Packet mux, the RS encoder, the data interleaver, the byte to symbol converter and the 12-way symbol demultiplexer in the 12-way trellis encoder.

Figure 69:
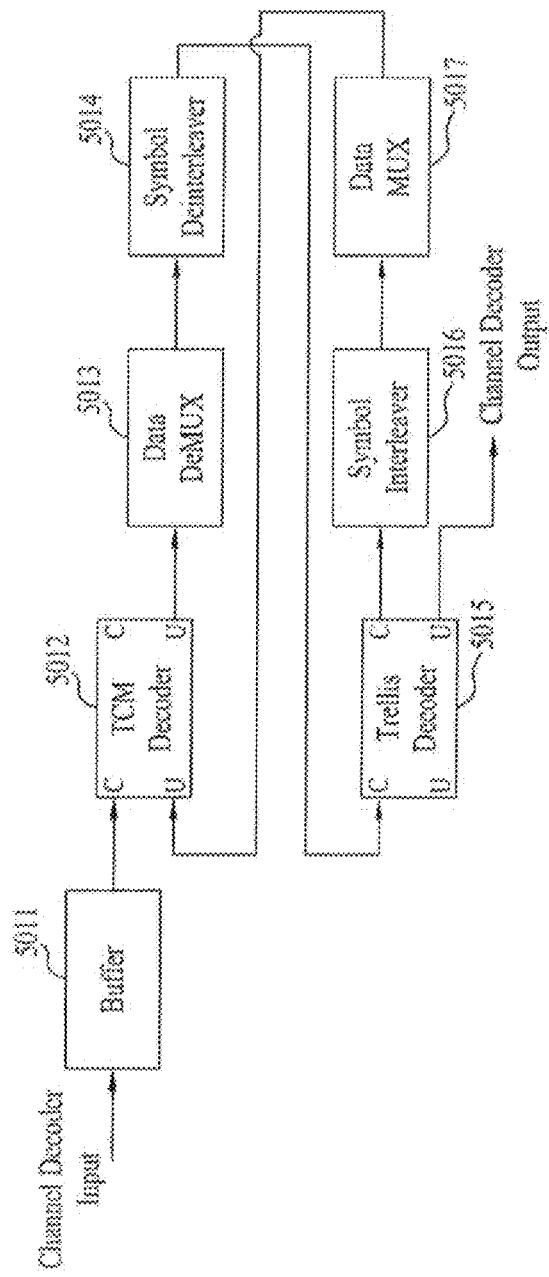
FIG. 69 illustrates a detailed block view showing a block decoder according to an embodiment of the present invention.

FIG. 69 illustrates a detailed block view showing a block decoder 5303 according to an embodiment of the present invention. The block decoder 5303 includes an input buffer 5011, a Trellis Code Modulation (TCM) decoder 5012, a data demultiplexer 5013, a symbol deinterleaver 5014, a symbol decoder 5015, a symbol interleaver 5016, and a data multiplexer 5017. The TCM decoder 5012 is referred to as an inner decoder and the symbol decoder 5015 is referred to as an outer decoder or a trellis decoder. The block decoder 5303 according to the embodiment of the present invention performs SCCC block decoding in SCCC block units on the inputted data. In FIG. 62, 'U' and 'C' marked on the TCM decoder 5012 and the symbol decoder 5015 respectively indicate 4 ports of soft input soft output (SISO).

The input buffer 5011 temporarily stores values of mobile service data symbols (i.e., including RS parity data symbols that were added during RS frame encoding, and CRC data symbols) being channel-equalized and outputted from the channel equalizer 5011 in SCCC block units. Thereafter, the input buffer 5011 repeatedly outputs the stored values to the TCM decoder 5012.

Also, among the symbol values being outputted from the channel equalizer 5302, input symbol values of section do not include any mobile service data symbol (i.e., including RS parity data symbols that were added during RS frame encoding, and CRC data symbols) values bypass the input buffer 5011 without being stored. More specifically, since only trellis-decoding is performed on the input symbol value of sections that are not processed with SCCC block encoding, the input buffer 5011 directly outputs such input to the TCM decoder 5012 without performing any temporary storing or repeated outputting processes.

The input buffer 5011 refers to information associated to SCCC being outputted from the operation controller 5307 or the signaling decoder 5308, e.g., the SCCC block mode and SCCC outer code mode, so as to control the storage and output of the input data.

In correspondence with the 12-way trellis encoder, the TCM decoder 5012 includes a 12-way Trellis Coded Modulation (TCM) decoder. Herein, 12-way trellis-decoding is performed on the input symbol value as an inverse process of the 12-way trellis-encoder.

More specifically, the TCM decoder 5012 receives as many output symbol values of the input buffer 5011 and soft-decision values being fed-back through the data multiplexer 5017 as each SCCC blocks, so as to perform TCM decoding on each symbol.

At this point, the soft-decision values that are fed-back are matched to be in a one-to-one correspondence with a number of symbol positions corresponding to the number of SCCC blocks being outputted from the input buffer 5011, so that the matched soft-decision values can be inputted to the TCM decoder 5012 based upon the control of the data multiplexer 5017. More specifically, the symbol values being outputted from the input buffer 5011 and the turbo-decoded and inputted data are matched to one another in accordance with the same position within the respective SCCC block, thereby being outputted to the TCM decoder 5012. For example, if the turbo-decoded data correspond to the third symbol value within the SCCC block, the corresponding turbo-decoded data are matched with the third symbol value within the SCCC block being outputted from the input buffer 5011, thereby being outputted to the TCM decoder 5012.

In order to do so, the data multiplexer 5017 controls the system so that the input buffer 5011 can store the corresponding SCCC block data while the iterative turbo decoding is being performed. And, by using a delay method, the data multiplexer 5017 also controls the system so that the soft-decision value (e.g., LLR) of the output symbol of the symbol interleaver 5016 can be matched, so as to be in a one-to-one correspondence, with the symbol value of the input buffer 5011 corresponding to the same position (or location) within the block of the output symbol, thereby being inputted to the TCM decoder of the corresponding way. At this point, in case of a symbol value that is not block decoded, since the corresponding symbol value is not turbo decoded, a null bit is inputted in the matched output position (or location).

After performing this process for a predetermined number of iteration of turbo decoding, the data of the next SCCC block is stored in the input buffer 5011 and then outputted, so as to repeat the turbo-decoding process.

The output of the TCM decoder 5012 signifies the reliability of the symbols being inputted to the trellis encoder of the transmitting system with respect to the transmitted symbols. For example, since the 2-bit input of the trellis encoding module of the transmitting system corresponds to one symbol, a Log Likelihood Ratio (LLR) between the likelihood (or probability) of one bit being '1' and the likelihood (or probability) of another bit being '0' may be respectively outputted (bit-unit output) for the upper bit and the lower bit. The Log Likelihood Ratio (LLR) signifies a log value on a ratio between the likelihood value of the input bit being '1' and the likelihood value of the input bit being '0'. Alternatively, a log likelihood ratio of the likelihood value of 2 bits, i.e., one symbol being "00", "01", "10", and "11" may be outputted (symbol-unit output) for all four combinations (00,01,10,11). This eventually corresponds to the soft-decision value of the received symbol, which indicates the reliability of the bits that were inputted to the trellis encoder. Herein, a Maximum A posteriori Probability (MAP), a Soft-Out Viterbi Algorithm (SOVA) may be used as the decoding algorithm of each TCM decoder included in the TCM decoder 5012.

The data demultiplexer 5013 identifies the soft-decision values corresponding mobile service data symbols (i.e., including RS parity data added when performing RS frame encoding, and CRC data symbols) from the output of the TCM decoder 5012 and outputs the identified soft-decision values to the symbol deinterleaver 5014. The data demultiplexer 5013 then performs an inverse process of a reordering process of a mobile service data symbol generated from an intermediate step, wherein the output symbols output from the block processor of the transmitting system are input to the trellis encoding module (e.g., when the symbols pass through the group formatter, the data deinterleaver, the packet formatter, and the data interleaver). The data demultiplexer 5013 then performs reordering of the process order of soft decision values corresponding to the mobile service data symbols and outputs the processed mobile service data symbols to the symbol deinterleaver 5014.

This is because a plurality of blocks exists between the block processor and the trellis encoding module, and because, due to these blocks, the order of the mobile service data symbols being outputted from the block processor and the order of the mobile service data symbols being inputted to the trellis encoding module are not identical to one another. More specifically, the data demultiplexer 5013 reorders (or rearranges) the order of the mobile service data symbols being outputted from the outer TCM decoder 5012, so that the order of the mobile service data symbols being inputted to the symbol deinterleaver 5014 matches the order of the mobile service data symbols outputted from the block processor of the transmitting system. The reordering process may be embodied as one of software, middleware, and hardware.

The symbol deinterleaver 5014 performs symbol deinterleaving on the soft decision values of data symbols being reordered and output from the data demultiplexer 5013 as an inverse process of the symbol interleaver included in the transmitting system. The size of the SCCC block used by the symbol deinterleaver 5014 during the symbol deinterleaving process is identical to the interleaving size (i.e., B) of an actual symbol of the symbol interleaver included in the transmitting system. This is because turbo decoding is performed between the TCM decoder 5012 and the symbol decoder 5015.

The input and output of the symbol interleaver 5014 all corresponds to soft-decision value and the deinterleaved soft-decision values are outputted to the symbol decoder 5015.

The symbol decoder 5015 has 4 memory states. If the symbol decoder is in a ½ coding rate mode, the memory states are changed in accordance with an input LLR set respective to a symbol. More specifically, in case of data being ½-rate encoded and outputted, the output LLR of the symbol deinterleaver 5014 is directly outputted to the symbol decoder 5015.

However, if the symbol decoder is in a ¼ coding rate mode, i.e., in case of data being ¼-rate encoded and outputted from the symbol encoder of the transmitting system, the memory states are changed in accordance with 2 input LLR sets respective to 2 successive symbols. Therefore, 2 input LLR sets should be merged into one LLR set during the input stage of the symbol decoder 5015. In the present invention, the merged LLR set may be obtained by adding first input LLRs and second input LLRs. If $Li(x)$ is defined as an input LLR value having a condition of 'x', the merged LLR set may be expressed by using Equation 9 shown below.

$$Li(\text{merged nibble}='0000')=Li(\text{first symbol}='00')+Li(\text{second symbol}='00')$$

$$Li(\text{merged nibble}='0001')=Li(\text{first symbol}='00')+Li(\text{second symbol}='01')$$

$$Li(\text{merged nibble}='0010')=Li(\text{first symbol}='00')+Li(\text{second symbol}='10')$$

$$Li(\text{merged nibble}='0011')=Li(\text{first symbol}='00')+Li(\text{second symbol}='11')$$

$Li$(merged nibble='0100')=$Li$(first symbol='01')+$Li$
   (second symbol='00')

$Li$(merged LLR='1111')=$Li$(first symbol='11')+$Li$
   (second symbol='11')   [Equation 9]

Meanwhile, as the opposite of the input LLR processing, the processing of the LLR that is to be outputted from the symbol decoder 5015 is divided into 2 symbol LLRs in the ¼-code rate mode, as shown in Equation 10 below, thereby being outputted.

$Lo$(first symbol='00')=Maximum Probability whose
   LLR is from the sets {$Lo$(merged
   nibble='00$XY$')+Delta}

$Lo$(first symbol='01')=Maximum Probability whose
   LLR is from the sets {$Lo$(merged
   nibble='01$XY$')+Delta}

$Lo$(first symbol='10')=Maximum Probability whose
   LLR is from the sets {$Lo$(merged
   nibble='10$XY$')+Delta}

$Lo$(first symbol='11')=Maximum Probability whose
   LLR is from the sets {$Lo$(merged
   nibble='00$XY$')+Delta}

$Lo$(second symbol='00')=Maximum Probability
   whose LLR is from the sets {$Lo$(merged
   nibble='$XY$00')+Delta}

$Lo$(second symbol='01')=Maximum Probability
   whose LLR is from the sets {$Lo$(merged
   nibble='$XY$01')+Delta}

$Lo$(second symbol='10')=Maximum Probability
   whose LLR is from the sets {$Lo$(merged
   nibble='$XY$10')+Delta}

$Lo$(second symbol='11')=Maximum Probability
   whose LLR is from the sets {$Lo$(merged
   nibble='$XY$00')+Delta}.   [Equation 10]

Herein, X and Y are the arbitrary selected digits from digit 0 or 1. Also, according to an embodiment of the present invention, a correction term 'Delta' value is calculated from an IETF RFC 3926 "FLUTE—File Delivery over Unidirectional Transport".

The symbol decoder 5015 outputs 2 types of soft decision values. One type corresponds to a soft-decision value matched with an output symbol of the symbol decoder (hereinafter referred to as a first soft-decision value). The other type corresponds to a soft-decision value matched with an input symbol of the symbol decoder (hereinafter referred to as a second soft-decision value). The first soft-decision value represents a reliability of the output symbol, i.e., two bits, of the symbol encoder. A Log Likelihood Ratio (LLR) between the likelihood (or probability) of one bit being '1' and the likelihood (or probability) of another bit being '0' may be output (bit-unit output) for the upper bit and the lower bit, which configure a symbol. Alternatively, a log likelihood ratio of the likelihood value of 2 bits, i.e., one symbol being "00", "01", "10", and "11" may be output (symbol-unit output) for all combinations. The first soft-decision value is fed-back to the TCM decoder 5012 through the symbol interleaver 5016 and the data multiplexer 5017. The second soft-decision value represents a reliability of the input symbol of the symbol encoder of the transmitting system. The second soft-decision value is expressed as a Log Likelihood Ratio (LLR) between the likelihood (or probability) of one bit being '1' and the likelihood (or probability) of another bit being '0' and output to the RS frame decoder 1304. A Maximum A posteriori Probability (MAP) or a Soft-Out Viterbi Algorithm (SOVA) may be used as the decoding algorithm of the symbol decoder 5015.

At this point, when the first soft-decision value being outputted from the symbol decoder 5015 is in a ¼ coding rate mode, the first soft-decision value is divided into 2 symbol LLRs, as shown in Equation 9, so as to be outputted to the symbol interleaver 5016.

For example, when the input/output unit of the symbol decoder 5015 corresponds to symbol units, 16 ($2^4$=16) different types of soft-decision values (LLRs) are inputted to the symbol decoder 5015. At this point, the 16 ($2^4$=16) different types of soft-decision values (i.e., LLRs) being inputted to the symbol decoder 5015 correspond to results of adding the respective first input LLR and the respective second input LLR.

If ¼-rate coding is performed by the symbol encoder, the symbol decoder 5015 receives the LLR respective to the 16 different symbols and performs symbol decoding. Thereafter, the symbol decoder 5015 may output the LLR respective to the 16 different symbols as the first soft-decision value. Alternatively, the symbol decoder 5015 may receive the LLR respective to 4 bits and performs symbol decoding. Thereafter, the symbol decoder 5015 may output the LLR respective to the 4 bits as the first soft-decision value.

And, if ½-rate coding is performed by the symbol encoder, the symbol decoder 5015 receives the LLR respective to the 4 different symbols and performs symbol decoding. Thereafter, the symbol decoder 5015 may output the LLR respective to the 4 different symbols as the first soft-decision value. Alternatively, the symbol decoder 5015 may receive the LLR respective to 2 bits and performs symbol decoding. Thereafter, the symbol decoder 5015 may output the LLR respective to the 2 bits as the first soft-decision value.

According to an embodiment of the present invention, the symbol interleaver 5016 performs symbol interleaving on the first soft-decision value being outputted from the symbol decoder 5015, thereby outputting the symbol-interleaved first soft-decision value to the data multiplexer 5017. Herein, the output of the symbol interleaver 5020 also becomes a soft-decision value. According to another embodiment of the present invention, the symbol interleaver 5016 performs symbol interleaving on the first soft-decision value being outputted from the symbol decoder 5015, thereby outputting the symbol-interleaved first soft-decision value to the data multiplexer 5017.

Figure 70:
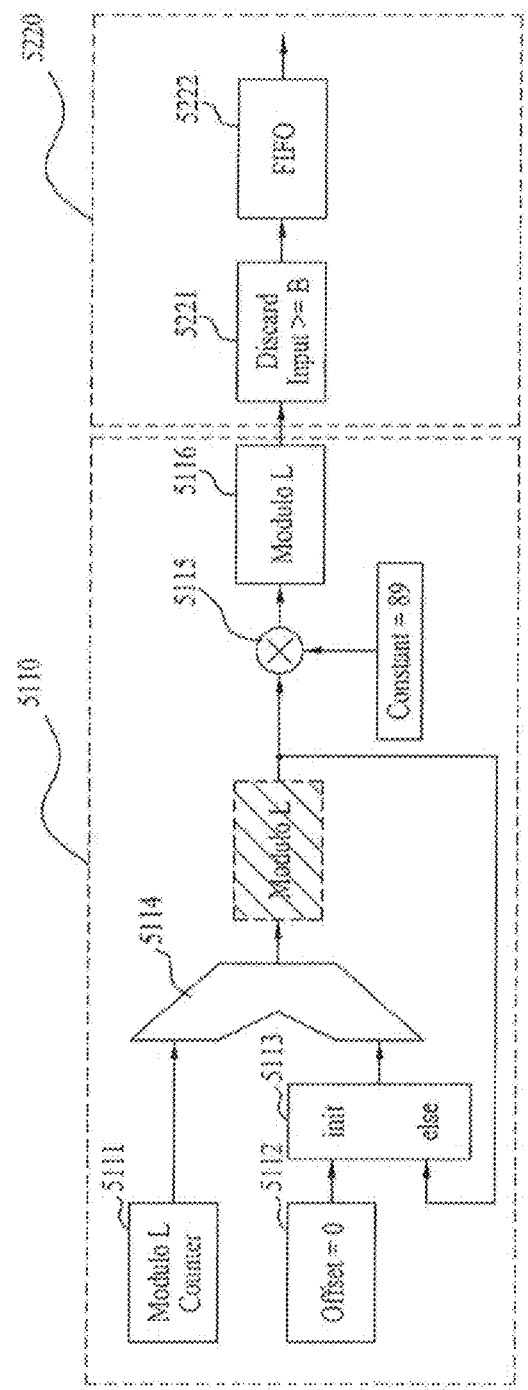
FIG. 70 is a block diagram illustrating a pattern generator of a symbol interleaver according to an embodiment of the present invention.

If the SCCC block mode is '00', a data group is configured of 10 SCCC blocks. And, if the SCCC block mode is '01', a data group is configured of 5 SCCC blocks. At this point, the symbol interleaving pattern of the 15 SCCC blocks are different from one another. Therefore, in order to store all symbol interleaving patterns, a memory having a very large capacity (e.g., ROM) is required. FIG. 70 illustrates a block view showing the structure of a symbol interleaver according to the present invention, wherein the symbol interleaver can perform symbol interleaving without requiring a memory, such as ROM. More specifically, when the SCCC block is inputted, symbol interleaved data may be directly outputted without having to use a memory, such as ROM.

The symbol interleaver 5016 of FIG. 70 includes a pattern generator 5110 and a pattern output unit 5220. The pattern generator 5110 may include a modulo counter 5111, a multiplexer 5113, an accumulator 5114, a multiplier 5115, and a modulo operator 5116. The pattern output unit 5220 may include a data remover 5221 and a buffer 5222. Herein, a modulo operation may be further included between the accumulator 5114 and the multiplier 5115. Also, the multiplier 5115 may be configured of multiple adders (or shifters).

In FIG. 70, B represents a Block length in symbols (e.g., SCCC block length) being inputted for symbol interleaving. And, L corresponds to a symbol unit block length actually being interleaved y the symbol interleaver 5016. At this point, L=2 m (wherein m is an integer), wherein L should satisfy the condition of L≥B.

The modulo counter 5111 performs sequential counting starting from 0 to L. The accumulator 5114 receives a count value of the modulo counter 5111 starting from 0. The multiplexer 5113 selects a constant when starting the symbol interleaving process on an SCCC block. Thereafter, the multiplexer 5113 is fed-back with the output of the accumulator 5114, thereby outputting the feedback to the accumulator 5114. In this case, an initial offset value of symbol interleaving is equal to 0.

The accumulator 5114 adds the output of the modulo counter 5111 and the output of the multiplexer 5113 and, then outputs the added value to the multiplier 5113.

The multiplier 5115 multiplies the output of the accumulator 5114 by a constant 89, thereby outputting the multiplied result to the modulo operator 5116. The modulo operator 5116 performs a modulo L operation on the output of the multiplier 5115, thereby outputting the processed data to the pattern output unit 5220. According to an embodiment of the present invention, the modulo operator 5116 uses a bitwise mask function to perform the modulo L operation. For example, when the L value is equal to 210, and when only the lower 10 bits among the output of the multiplier 5115 are outputted from the modulo operator 5116 and inputted to the pattern output unit 5220, the modulo L operation is performed.

When the output value is equal to or greater than B, the data remover 5221 of the pattern output unit 5220 discards the input value and outputs the processed data to the buffer 5222. According to an embodiment of the present invention, the buffer 5222 is configured to have a First Input First Output (FIFO) structure. The buffer 5222 condenses the remaining values that have not been discarded by the data remover 5221 and then stores the condensed values, which are then outputted in accordance with the stored order. Therefore, the first output B outputted from the buffer 5222 corresponds to the symbol interleaving pattern P(i). At this point, the index i value of the symbol interleaving pattern P(i) increases from 0 to B−1. If the modulo counter 5111 continues to be operated, and when the next output B is collected from the buffer 5222, the symbol interleaving pattern at this point becomes the inverse order of the symbol interleaving pattern P(i). More specifically, the index i value of the symbol interleaving pattern P(i) decreases from B−1 to 0.

Therefore, when the initial offset is set to an L/2 value and not to '0', and when symbol interleaving is started, the first B output becomes an inverse order of the interleaving pattern P(i). In this case, the initial offset value of symbol interleaving becomes an L/2 value.

If 0 is used as the initial offset value, the $L^{th}$ value being fed-back from the accumulator 5114 becomes (L−1)*L/2, and the modulo L of the feedback value is L/2.

For example, when the initial offset value is set to 0, the symbol interleaving pattern P(i) may be obtained. When the initial offset value is set to an L/2 value, an inverse order of the interleaving pattern P(i) (i.e., a symbol deinterleaving pattern P(i)−1 may be obtained from the beginning. For example, when the symbol deinterleaver 5014 sets an L/2 value as the initial offset value and the symbol interleaver 5016 sets '0' as the initial offset value, only one symbol interleaving pattern P(i) is used to perform both the symbol deinterleaving and symbol interleaving processes.

Alternatively, when only one initial offset is set, and when the modulo operator 5111 performs a counting process up to 2L, a symbol interleaving pattern and a symbol deinterleaving pattern may be generated by using a single initial offset.

FIG. 64 illustrates an example of a symbol interleaving pattern generated when the offset value is equal to 0 according to the present invention. In the example shown in FIG. 64, L is equal to 12000, and the SCCC block length is equal to 16384. Herein, the output pattern in an index starting from 12000 to 23999 corresponds to an inverse order of the output pattern in an index starting from 0 to 11999.

Also, since interleaving and deinterleaving are inverse processes of one another, the interleaving pattern P(i) and the deinterleaving pattern P(i)−1 are not required to be separately generated by the block decoder 5303. More specifically, symbol interleaving and deinterleaving operations may both be performed by using only the symbol interleaving pattern P(i).

Figure 72A:
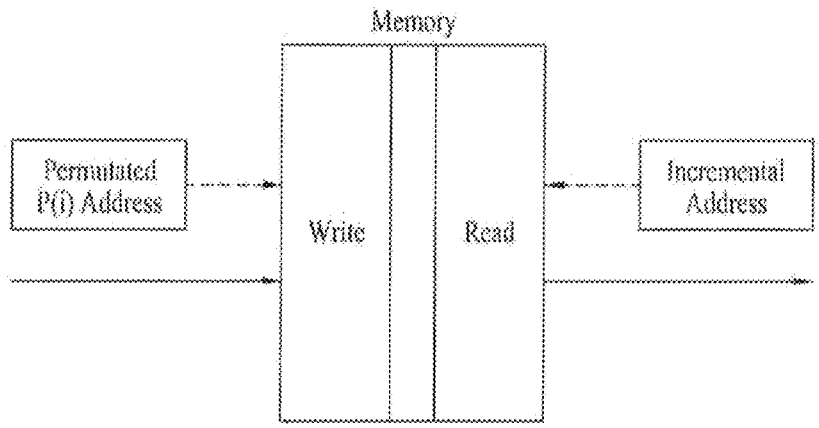
FIGS. 72 (*a*) and 72 (*b*) illustrate a conceptual diagram illustrating a process for performing the symbol interleaving using only a symbol interleaving pattern P(i) according to an embodiment of the present invention.
Figure 72B:
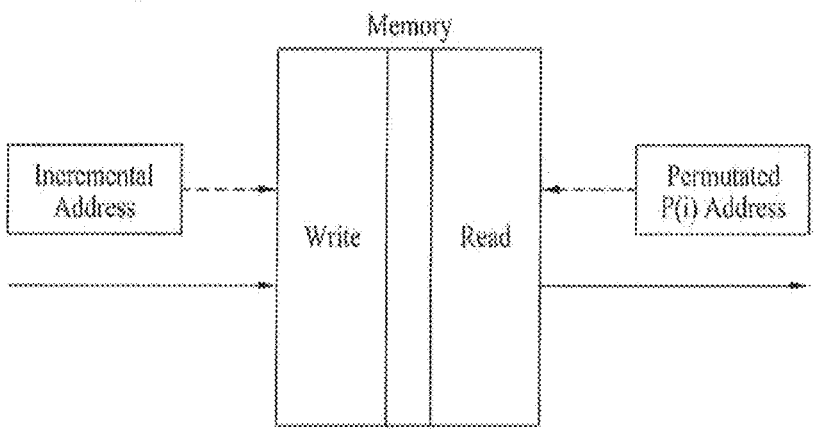

FIG. 72 shows an exemplary process of performing symbol interleaving by using only the symbol interleaving pattern P(i). And, FIG. 72 (*b*) shows an exemplary process of performing symbol deinterleaving by using only the symbol interleaving pattern P(i).

In FIG. 72 (*a*), the symbol interleaving process is as described below.

1a. An interleaving pattern P(i) is generated.
1 b. The $i^{th}$ input data symbol is written in location i of the memory.
1c. Starting from location i of the memory, an ith output data symbol is read.

When the processes 1a to 1c are performed from 0 to B−1, the symbol interleaving process for one SCCC block is completed. Herein, the memory may correspond to a buffer 5222.

In FIG. 72 (*b*), the symbol deinterleaving process is as described below.

2a. An interleaving pattern P(i) is generated.
2b. The ith input data symbol is written in location i of the memory.
2c. Starting from location P(i) of the memory, an ith output data symbol is read.

When the processes 2a to 2c are performed from 0 to B−1, the symbol deinterleaving process for one SCCC block is completed. Herein, the value of i ranges from 0 to B−1.

More specifically, in FIG. 72 (*a*) and FIG. 72 (*b*), step 1b and step 2c access the same address of the memory, and step 1c and step 2b access the same address of the memory.

Therefore, after reading previous data starting from a specific location (or position) of the memory, when current data are written in the corresponding location (or position), the symbol interleaver 5016 and the symbol deinterleaver 5014 may use a single permutation memory so as to perform symbol interleaving and symbol deinterleaving. More specifically, since an address of the memory can be shared during the symbol interleaving and symbol deinterleaving processes, the memory size may be reduced.

As described above, in the present invention, only one symbol interleaving pattern is used to perform symbol interleaving and symbol deinterleaving, thereby having the effect of reducing the memory size.

More specifically, the data multiplexer 5017 of the block decoder 5303 reorders (or rearranges) the output order of the symbol interleaver 5016 in accordance with the processing order of the symbol generated from an intermediate step (e.g., the group data formatter, the packet formatter, the data interleaver). Thereafter, the data multiplexer 5017 outputs the processed symbols to the TCM decoder 5012. Herein, the reordering process of the data multiplexer 5017 may be embodied as at least one of software, middleware, and hardware.

The soft-decision values being outputted from the symbol interleaver 5016 are matched to be in a one-to-one correspondence with mobile service data symbol positions corresponding to the number of SCCC blocks being outputted from the input buffer 5011. Then, the matched soft-decision values are inputted to the TCM decoder 5012. At this point, since a main service data symbol or an RS parity symbol, known data symbol, signaling information data, and so on, of the main service data do not correspond to mobile service data symbols, the data multiplexer 5017 inserts null data in the corresponding location (or position), thereby outputting the processed data to the TCM decoder 5012. Also, each time the symbols of the SCCC blocks are turbo-decoded, since there is no value being fed-back from the symbol interleaver 5016 at the beginning of the first decoding process, the data multiplexer 5017 inserts null data in all symbol positions including a mobile service data symbol, thereby transmitting the processed data to the TCM decoder 5012.

The second soft-decision values being outputted from the symbol decoder 5015 are inputted to the RS frame decoder 5304. For example, the symbol decoder 5015 does not output any second soft-decision value until turbo decoding is performed for a predetermined number of repetition (or iteration) times (e.g., M number of times). Thereafter, when M number of turbo-decoding processes on one SCCC block is all performed, the second soft-decision value of that specific point is outputted to the RS Frame decoder 5304. More specifically, after performing turbo-decoding for a predetermined number of times, the soft decision value of the symbol decoder 5015 is outputted to the RS frame decoder 5304. And, thus, the block decoding process on one SCCC block is completed.

In the present invention, this will be referred to as an iterative turbo decoding process for simplicity.

At this point, the number of iterative turbo decoding performed between the TCM decoder 5012 and the symbol decoder 5015 may be defined by considering hardware complexity and error correction performance. Accordingly, when the number of iterative turbo decoding increases, the error correction can be enhanced. However, this case disadvantageous in that the hardware may also increase.

RS Frame Decoder

Figure 73:
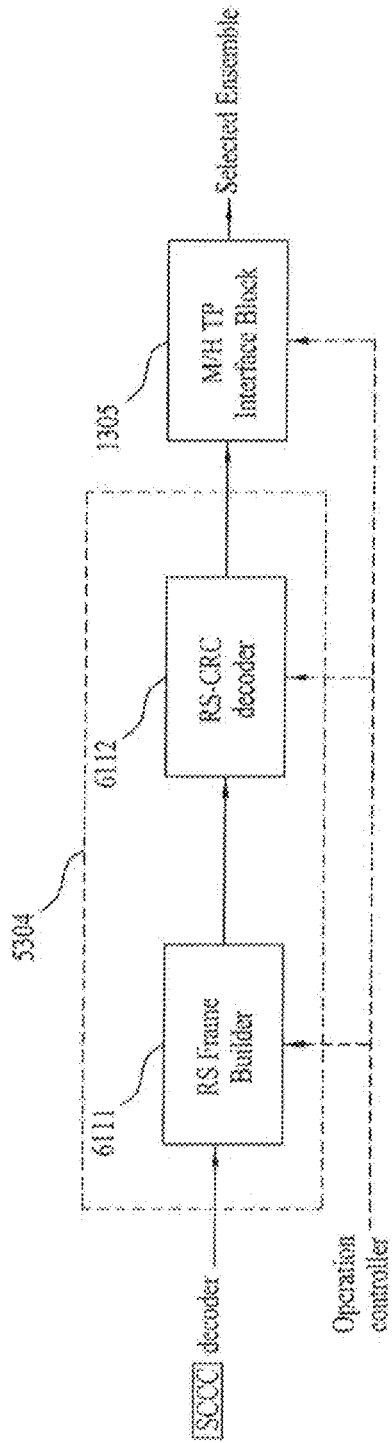
FIG. 73 illustrates a structure of a Reed Solomon (RS) frame decoder according to an embodiment of the present invention.

FIG. 73 illustrates a structure of an RS frame decoder according to an embodiment of the present invention.

RS frame decoder 5304 includes RS Frame builder 6111, RS-CRC Decoder 6112 and M/H TP Interface block 5305.

As shown in FIG. 73, an RS Frame decoder 5304 processes a particular M/H ensemble. Ensemble selected by upper layer request. An RS Frame Builder 6111 collects data from the selected Ensemble and builds an RS frame corresponding to the selected Ensemble. An RS-CRC decoder detects and corrects errors in the completed RS frame. An M/H TP interface block 5305 derandomizes the data to undo the effects of the M/H randomizer at the transmitter, and finally outputs M/H TPs.

A RS Frame Decoder 5304 builds an RS Frame, detects errors on each row of the RS frame by CRC decoding, corrects errors by erasure RS decoding with error location information from CRC decoding and SCCC decoding on each column of the RS frame, and outputs M/H TPs (Transport Packets) with marked error indication fields.

Figure 74:
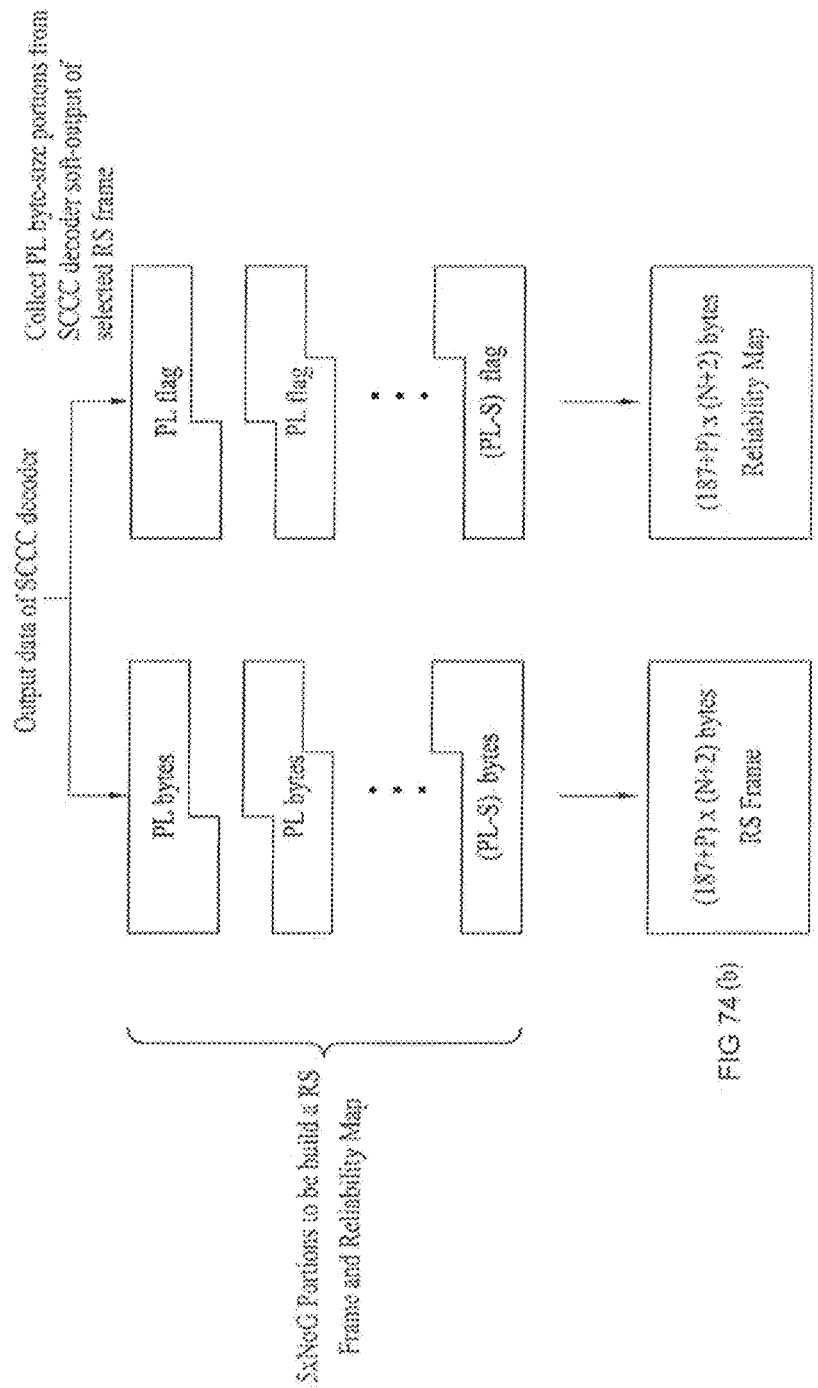
FIGS. 74 (*a*) and 74 (*b*) illustrate that when, when an RS frame mode value is equal to '00', an exemplary process of grouping several portions being transmitted to a parade, thereby forming an RS frame and an RS frame reliability map.

FIG. 74 illustrates, when the RS frame mode value is equal to '00', an exemplary process of grouping several portion being transmitted to a parade, thereby forming an RS frame and an RS frame reliability map.

More specifically, the RS frame decoder 2006 receives and groups a plurality of mobile service data bytes, so as to form an RS frame. According to the present invention, in transmitting system, the mobile service data correspond to data RS-encoded in RS frame units. At this point, the mobile service data may already be error correction encoded (e.g., CRC-encoded). Alternatively, the error correction encoding process may be omitted.

It is assumed that, in the transmitting system, an RS frame having the size of (N+2)×(187+P) bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 74(*a*), thereby forming an RS frame having the size of (N+2)×(187+P) bytes. At this point, when stuffing bytes (S) are added to at least one portion included in the corresponding RS frame and then transmitted, the stuffing bytes are removed, thereby configuring an RS frame and an RS frame reliability map. For example, when S number of stuffing bytes are added to the corresponding portion, the S number of stuffing bytes are removed, thereby configuring the RS frame and the RS frame reliability map.

Herein, when it is assumed that the block decoder 5303 outputs a soft decision value for the decoding result, the RS frame decoder 5304 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. Subsequently, the RS frame reliability map is used on the RS frames so as to perform error correction.

Figure 75:
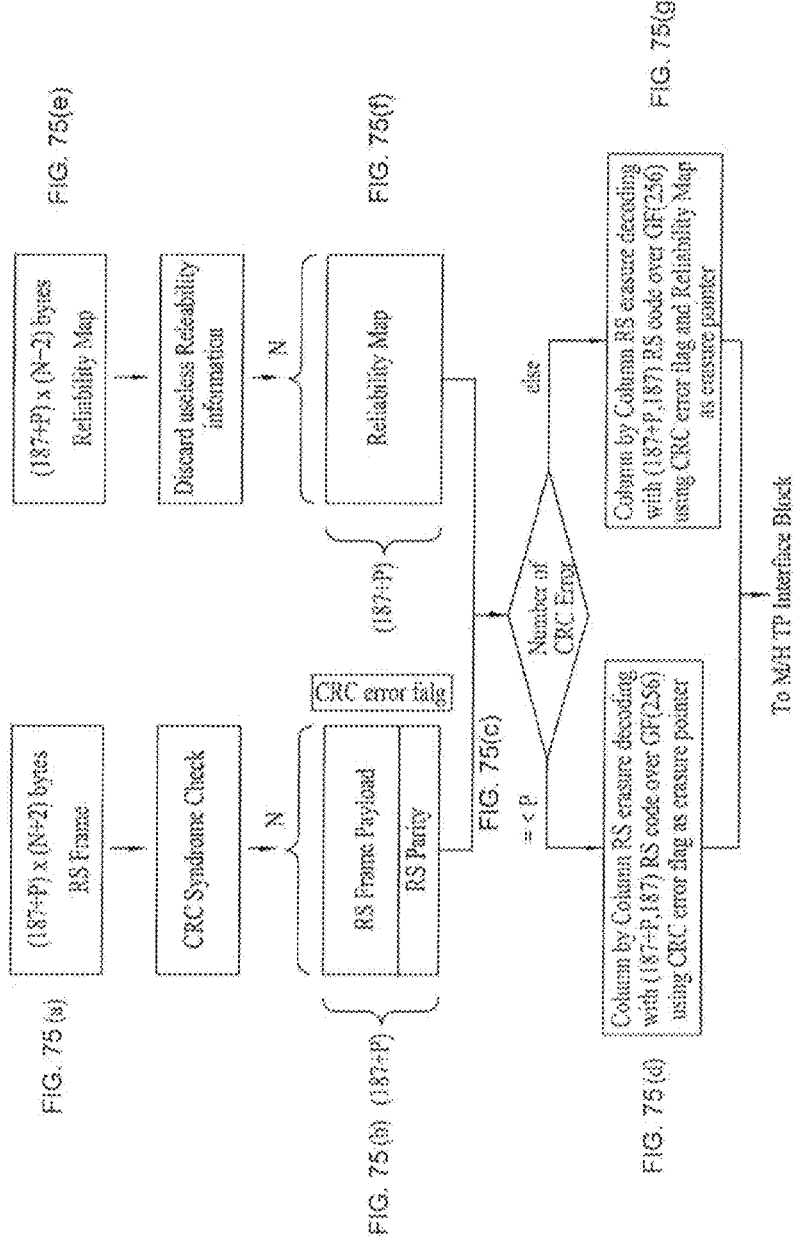
FIGS. 75 (*a*), 75 (*b*), 75 (*c*), 75 (*d*), 75 (*e*), 75 (*f*) and 75 (*g*) illustrate an example of an error correction decoding process according to an embodiment of the present invention.
Figure 76:
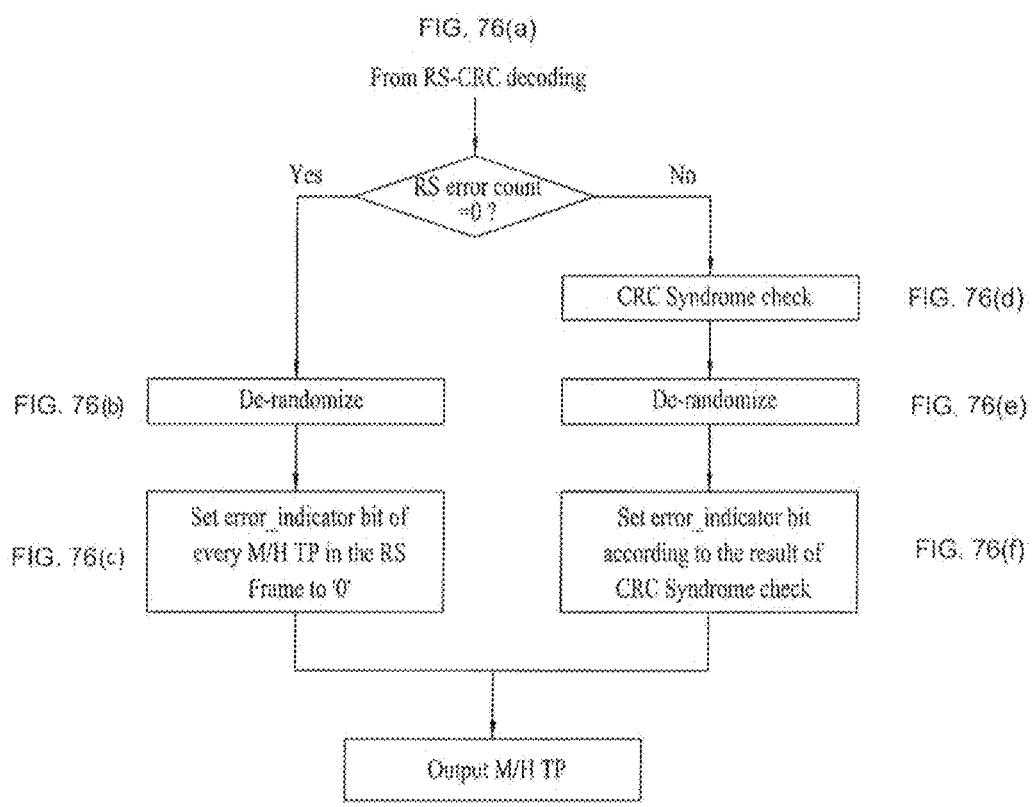
FIGS. 76 (*a*), 76 (*b*), 76 (*c*), 76 (*d*), 76 (*e*) and 76 (*f*) illustrate an example of an error correction decoding process according to an embodiment of the present invention.

FIG. 75 and FIG. 76 illustrate an error correction decoding process according to an embodiment of the present invention.

According to an embodiment of the present invention, in case of FIG. 75, a CRC syndrome check process is performed once again on the CRC-RS decoded RS frame. And, the result of the CRC syndrome check process is marked in an error_indicator field within each M/H service data packet configuring the payload of the RS frame. Thereafter, the marked result is outputted for A/V decoding. For example, the error_indicator field of the M/H service data packet having an error existing therein is marked as '1', and the error_indicator field of the M/H service data packet having no error existing therein is marked as '0'. According to the embodiment of the present invention, if the error_indicator field value of all M/H service data packets within the RS frame payload is set to '0' and transmitted by the transmitting system, then based upon the CRC syndrome check result, only the error_indicator fields of the M/H service data packet rows are marked as '1'.

Thus, the probability of malfunctioning in blocks receiving and processing M/H service data packets (e.g., M/H TP interface block 5305) in later processes may be reduced. For example, the M/H TP interface block 5305 may discard any M/H service data packet having the error_indicator field marked as '1' without using the corresponding M/H service data packet. Accordingly, since the probability of malfunctioning in the M/H TP interface block 5305 can be reduced, the overall performance of the receiving system may be enhanced.

More specifically, when a (N+2)×(187+P)-byte size RS frame and a (N+2)×(187+P)-bit size RF frame reliability map are configured, as shown in FIG. 75 (*a*) and FIG. 75 (*e*), a CRC syndrome check is performed on the RS frame, so as to check whether or not an error has occurred in each row. Subsequently, the presence or absence of an error is marked on a CRC error flag corresponding to each row, as shown in FIG. 75 (*b*). At this point, since the portion of the reliability map corresponding to the CRC checksum as no applicability, the corresponding portion is removed (or deleted or discarded), so that only N×(187+P) number of reliability information remains, as shown in FIG. 75 (*f*).

As described above, after performing the CRC syndrome check, (187+P, 187)-RS decoding is performed on N number of columns. At this point, RS-decoding is performed on only N number of columns excluding the last 2 columns from the overall (N+2) number of columns because the last 2 columns are configured only of CRC checksum and also because the transmitting system did not perform RS-encoding on the last 2 columns.

At this point, depending upon the number of errors marked on the CRC error flag, either an erasure decoding process is performed or a general RS-decoding process is performed.

For example, when the number of rows including CRC error is less than or equal to a maximum number of errors correctable by RS erasure decoding (according to the embodiment of the present invention, the maximum number is '48'), (235,187)-RS erasure decoding is performed on the RS frame having (18+P) number of N-byte rows, i.e., the RS frame having 235 N-byte rows in a column direction, as shown in FIG. 75 (*d*). However, when the number of rows including CRC error is greater than the maximum number of errors (i.e., 48 errors) correctable by RS erasure decoding, RS erasure decoding cannot be performed. In this case, error correction may be performed through a general RS-decoding process. Herein, the present invention may further enhance the error correcting ability by using the reliability map, which was generated when configuring the RS frame, from a soft decision value.

More specifically, the RS frame decoder compares the absolute value of the soft decision value of the block decoder 5303 with the pre-determined threshold value, so as to determine the reliability of the bit value decided by the code of the corresponding soft decision value. Also, 8 bits, each being determined by the code of the soft decision value, are grouped to form one data byte.

Accordingly, the reliability information on this one data byte is indicated on the reliability map. Therefore, as shown in FIG. 75(*c*), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points.

Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column.

For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column.

As described above, the present invention may apply the process of FIG. 75 (*d*) or the process of FIG. 75 (*g*), so as to perform error correction decoding on N number of columns excluding the last 2 columns within the RS frame.

After performing error correction decoding on the N number of columns, the number of RS errors is counted as shown in FIG. 76 (*a*).

At this point, if an error did not occur in any of the columns, or if all errors have been corrected in process of FIG. 75 (*d*) or process of FIG. 75 (*g*), i.e., if the number of RS errors is equal to '0', this indicates that there is no error in the (N+187)-byte RS frame payload configuring the M/H service data packet within the corresponding RS frame. Herein, as shown in FIG. 76 (*b*), derandomizing is performed on the (N+187)-byte RS frame payload as an inverse process of the transmitting system. Thereafter, when outputting each M/H service data packet (i.e., M/H TP packet) of the derandomized RS frame payload to the M/H TP interface block 5305, the output is performed by setting the value of the error_indicator field within the M/H service data packet to '0' (i.e., indicating that there is no error), as shown in FIG. 76 (*c*). More specifically, the value of the error_indicator field within each of the M/H service data packets configuring the RS frame payload is equally set to '0'.

Meanwhile, even though RS-decoding is performed, errors in N number of columns may all remain without being corrected. In this case, the number of RS errors is not equal to '0'.

In this case, as shown in FIG. 76 (*d*), a CRC syndrome check is performed once again on the RS-decoded RS frame, thereby checking once again whether or not an error exists in 187 rows.

The CRC syndrome check is repeated in FIG. 76 (*d*) because, although RS-decoding has not been performed on the last 2 columns (i.e., CRC checksum data) of the RS frame, RS-decoding has been performed on the N number of columns including M/H service data packet. Accordingly, the effects (or influence) of the error corrected by RS-decoding may be verified and reflected (or applied).

More specifically, after performing CRC-RS decoding, when the present invention repeats the CRC syndrome check process once again on each row, as shown in FIG. 76 (*d*), and derandomizes the RS frame payload processed with CRC syndrome checking, as shown in FIG. 76 (*e*), and when the present invention outputs the derandomized RS frame payload, the present invention marks the CRC syndrome check result in the error_indicator field of the M/H service data packet configuring the corresponding row, as shown in FIG. 76 (*f*).

For example, when performing the CRC syndrome check once again, if it is determined that there is not CRC error in the RS frame, the value of the error_indicator field within each M/H service data packet of the derandomized RS frame payload is equally set to '0'.

When performing the CRC syndrome check once again, if it is determined that a CRC error exists in a specific row of the RS frame, for example, the second and third rows of the RS frame, the values of the error_indicator field within the second and third M/H service data packets of the derandomized RS frame payload are marked to be equal to '1', and the value of the error_indicator field within the remaining M/H service data packets is equally marked to be equal to '0'.

The present invention is provided with a number (=M) of RS frame decoders aligned in parallel, wherein the number corresponds to the number of parades included in one M/H frame. Herein, the RS frame decoder may be configured by being provided with a multiplexer connected to the input end of each of the M number of RS frame decoders, so as to multiplex a plurality of portions, and a demultiplexer connected to the output end of each of the M number of RS frame decoders.

Signaling Decoding

The signaling decoder 5306 extracts and decodes signaling information (e.g., TPC and FIC information), which was inserted and transmitted by the transmitting system, from the received (or inputted) data. Thereafter, the signaling decoder 5306 provides the decoded signaling information to the block(s) requiring such information.

More specifically, the signaling decoder 5306 extracts and decodes TPC data and FIC data, which were inserted and transmitted by the transmitting system, from the equalized data. Then, the signaling decoder 5306 outputs the TPC data to the operation controller 5307, and the signaling decoder 5306 outputs the FIC data to the FIC processor 5308. For example, the TPC data and the FIC data are inserted in the signaling information region of each data group, thereby being received.

At this point, the signaling information area within the data group may be known by using the known data position information that is outputted from the known sequence detector 1506. The signaling information area corresponds to the area starting from the first segment to a portion of the second segment of M/H block B4 within the data group. More specifically, in the present invention, 276(=207+69) bytes of the M/H block B4 within each data group are allocated to an area for inserting the signaling information. In other words, the signaling information area is configured of 207 bytes corresponding to the first segment of M/H block B4 and of the first 69 bytes of the second segment of M/H block B4. Additionally, the first known data sequence (i.e., first training sequence) is inserted in the last 2 segments of M/H block B3, and the second known data sequence (i.e., second training sequence) is inserted in the second and third segments of M/H block B4. At this point, since the second known data sequence is inserted after the signaling information area and then received, the signaling decoder 5306 may extract and decode signaling information of the signaling information area from the data being outputted from the channel synchronizer 5301 or the channel equalizer 5302.

Figure 77:
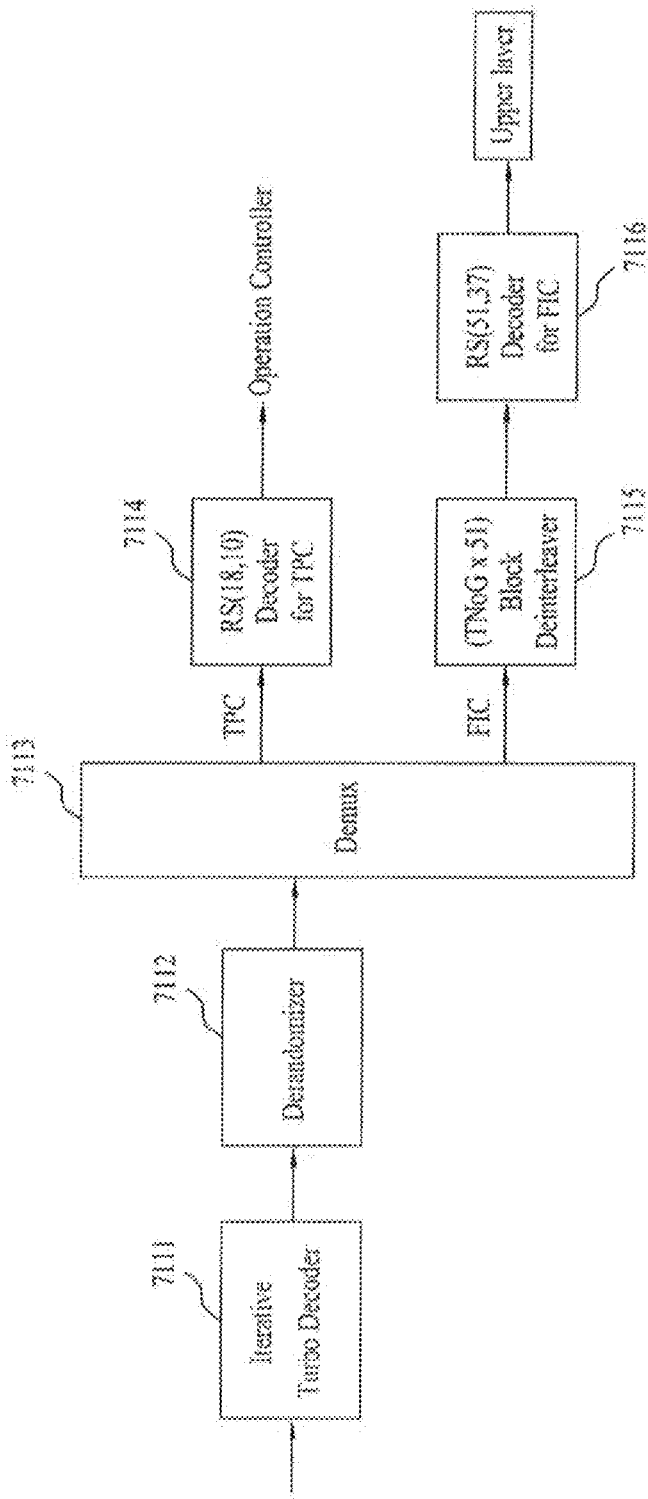
FIG. 77 illustrates a block view of the signaling decoder according to an embodiment of the present invention.

FIG. 77 illustrates a block view of the signaling decoder 5306 according to an embodiment of the present invention. The signaling decoder 5306 performs iterative turbo decoding and RS-decoding on the data of the signaling information region among the equalized data. Thereafter, the transmission parameter (i.e., TPC data) obtained as a result of the above-described process is outputted to the operation controller 5307, and the FIC data are outputted to an upper layer.

For this operation, the signaling decoder 5306 may include an iterative turbo decoder 7111, a derandomizer 7112, a demultiplexer 7113, an RS decoder 7114, a block deinterleaver 7115, and an RS decoder 7116.

Figure 78:
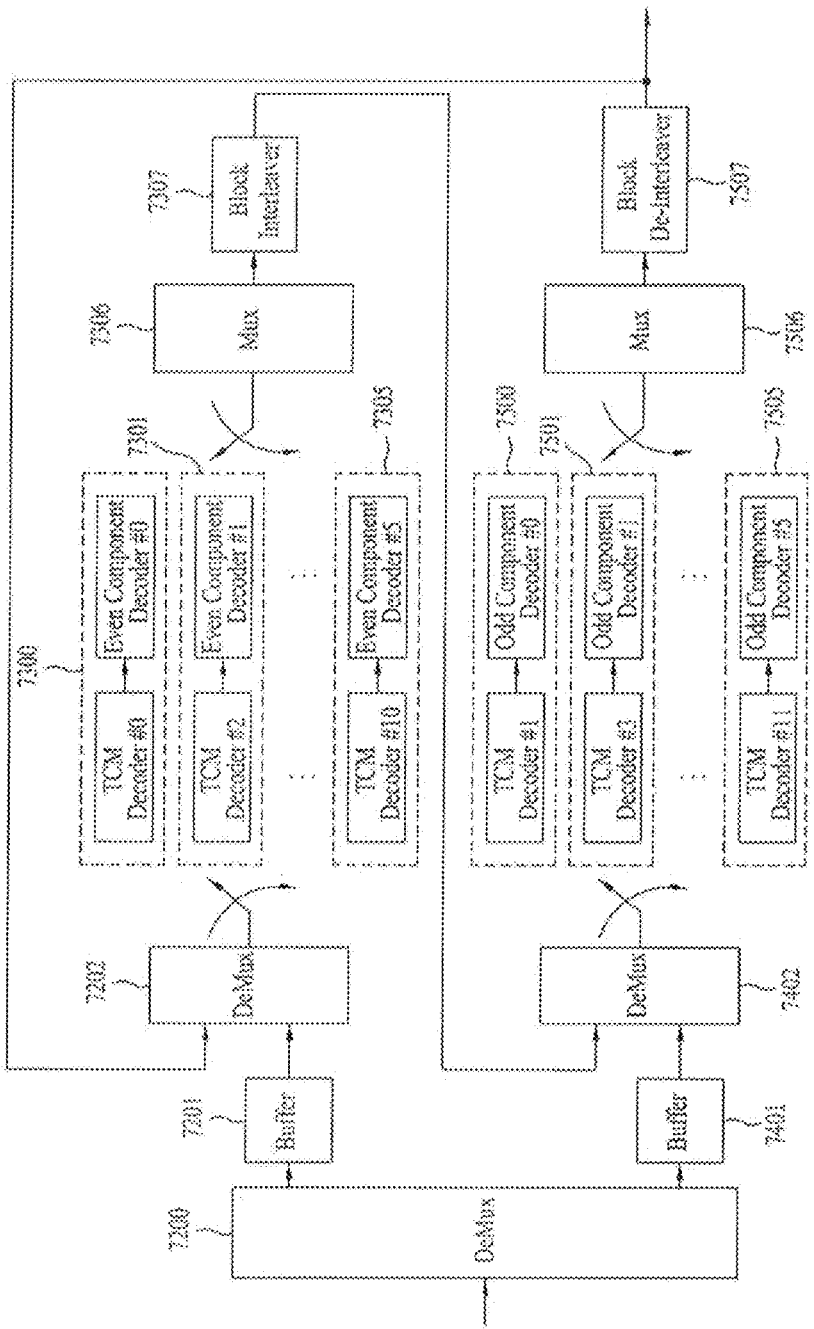
FIG. 78 is a detailed block diagram illustrating an iterative turbo decoder according to an embodiment of the present invention.

FIG. 78 is a detailed block diagram illustrating the iterative turbo decoder 7111. Referring to FIG. 78, upon receiving the signaling information area's data from among the equalized data, a demultiplexer (DeMux) 7200 discriminates symbols corresponding to respective branches of the signaling encoder of the transmission system, and outputs the discriminated symbols to buffers 7201 and 7401, respectively.

The buffers 7201 and 7401 store input data corresponding to the signaling information area, and respectively repeatedly output the stored input data to the demultiplexers 7202 and 7402 during the turbo decoding process.

In accordance with one embodiment of the present invention, it is assumed that output data of the even encoder in the signaling encoder of the transmission system is processed to be input to $0^{th}$, $2^{nd}$, . . . , $10^{th}$ trellis encoders (i.e., even number trellis encoders), and output data of the odd encoder 575 is processed to be input to $1^{st}$, $3^{rd}$, . . . , $11^{th}$ trellis encoders. In this case, the demultiplexer 7202 outputs output data of the buffer 7201 to a trellis decoder (i.e., TCM decoder) corresponding to the even number trellis encoder. The demultiplexer 7202 receives data fed back from the block deinterleaver 7507, and outputs the feed-back data to the same trellis decoder (i.e., TCM decoder) corresponding to the even number trellis encoder.

In this case, output data of each trellis decoder (TCM decoder) corresponds to a log likelihood ratio (LLR) value. The LLR value is a result from taking a logarithm of a soft decision value. More specifically, the LLR value corresponds to a log likelihood ratio (LLR) between a likelihood of input bit being equal to '1' and a likelihood of input bit being equal to '0'. An initial value of the LLR is set to zero. The LLR value is transferred to the even component decoder corresponding to the even component encoder contained in the signaling encoder of the transmission system. Input/output (I/O) data of the even component decoder is such an LLR value as well. In this case, since a single even number trellis decoder interoperates with a single even component decoder, an even component encoder and an even number trellis encoder are considered as a single encoder (effective component encoder). Hence, the even number trellis decoder and the even component decoder can be merged into a single effective component decoder. In the case where the two decoders configure a single decoder, decoding performance will be enhanced although complexity increases due to the increased number of states.

Output signals of the even component decoders 7300 to 7305 are sequentially transferred to the multiplexer 7306 and are then transferred to the block interleaver 7307. The block interleaver 7307 has the same configuration as a block interleaver used for the signaling encoder of the transmitting side.

The LLR value block-interleaved by the block interleaver 7307 is fed back to the demultiplexer 7402. The demultiplexer 7402 outputs the LLR value to a corresponding trellis decoder (i.e., TCM decoder) from among six trellis decoders, and at the same time transmits output data of the buffer 2401 to the trellis decoder. For example, provided that the LLR value fed back from the block deinterleaver 7507 is an LLR value of the first decoder 7500, the demultiplexer 7402 outputs this feed-back LLR value and the output data of the buffer 7401 to the trellis decoder of the first decoder 7500.

The above-mentioned rules are equally applied to the demultiplexer 7202. The odd number trellis decoder and the odd component decoder can be operated in the same manner as in the even number trellis decoder and the even component decoder. Likewise, the odd number trellis decoder and the odd component decoder can be implemented as a single effective component decoder.

Output signals of the odd number decoders 7500 to 7505 are sequentially transferred to the multiplexer 7506, and are then forwarded to the block deinterleaver 7507. The block deinterleaver 7507 is an inverse process of the block interleaver. Thus, the LLR value block-deinterleaved by the block deinterleaver 7507 is input to the demultiplexer 7202 to accomplish the iterative turbo decoding.

After the iterative turbo decoding has been repeatedly performed at a predetermined level, the iterative turbo-decoded result is output to the derandomizer 7112.

At this point, in the above-mentioned iterative turbo decoding process, the even and odd decoders must have trellis diagram information of a corresponding encoder. Each of the encoders shown in FIGS. 79(a) and 79(b) has five memories D0 to D4 so as to obtain 32 states (i.e., $2^5$ states). However, the number of states acquired when start states of all the signaling information areas are constant may be limited to the number of only some states among a total of 32 states. That is, if it is assumed that a start state of the effective component encoder is limited to a specific state, the effective component encoder may have a smaller number of states as compared to 32 states.

For example, all memories of the even/odd component encoders of the iterative turbo encoder (i.e., PCCC encoder) are each set to zero at the beginning of each signaling information area of a single data group. Because the signaling information area just follows a first known data sequence (i.e., $1^{st}$ training sequence) and the first known data sequence is designed to allow all memories in each of the twelve trellis encoders to have a state of zero at the end of the first known data sequence. As a result, the respective memories of the effective component encoder always start from a state '00000'. That is, all memories of the effective component encoder are each set to a state of zero at the beginning of the signaling information area. In this way, provided that all memories of the effective component encoders in the signaling information area start from the state '00000', the data encoding can be achieved using only specific states among 32 states although data of the signaling information area is considered to be random.

The signaling information area ranges from a first segment of an M/H block 'B4' of a data group to some parts of a second segment thereof. That is, 276 (=207+69) bytes of the M/H block 'B4' of each data group are assigned to an area for inserting signaling information. In other words, the signaling information area is composed of 207 bytes corresponding to a first segment of the M/H block 'B4' and first 69 bytes of a second segment thereof. In addition, the first known data sequence (i.e., the first training sequence) is inserted into the last 2 segments of an M/H block 'B3', and a second known data sequence (i.e., the second training sequence) is inserted into second and third segments of an M/H block 'B4'. In this case, the second known data sequence is located just behind the signaling information area. Third to sixth known data sequences (i.e., third to sixth training sequences) are respectively inserted into the last 2 segments of the M/H blocks B4, B5, B6, and B7.

Figure 79:
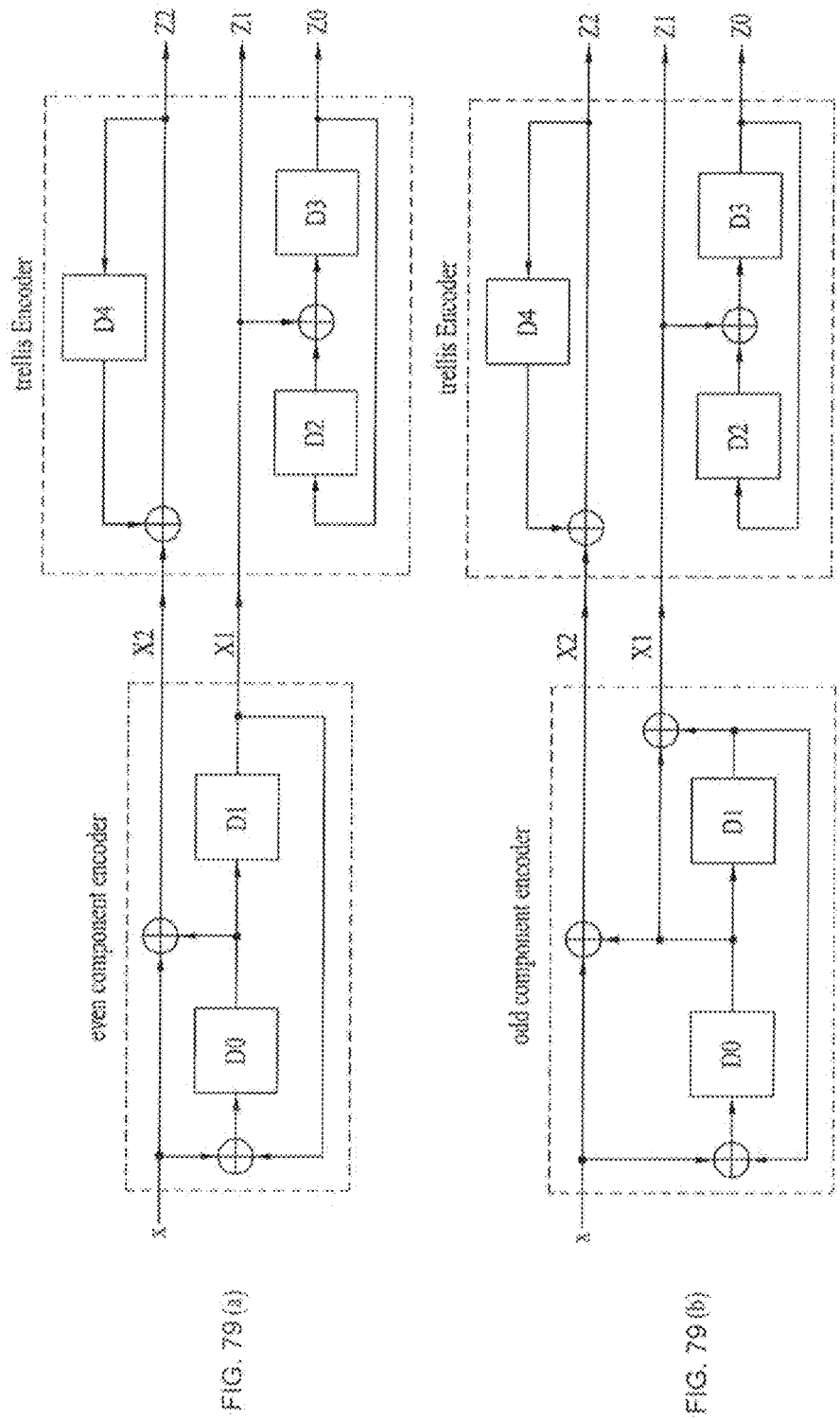
FIG. 79(*a*) illustrates an exemplary case in which a trellis encoder is serially concatenated with an even component encoder, and FIG. 79(*b*) illustrates an exemplary case in which a trellis encoder is serially concatenated with an odd component encoder.

FIG. 79(a) illustrates an exemplary case in which a trellis encoder is serially concatenated with the even component encoder.

In fact, although a plurality of blocks are located between the even component encoder and the trellis encoder, the receiving system considers two blocks to be concatenated with each other, so that it decodes data. In other words, the trellis encoder performs precoding on the high-order bit 'X2' generated from the even component encoder, and outputs the precoded result as a most significant bit 'Z2'. In addition, the trellis encoder performs trellis-encoding on the low-order bit 'X1', so that it outputs the trellis-encoded result as two output bits Z1 and Z0.

FIG. 79(b) illustrates an exemplary case in which a trellis encoder is serially concatenated with the odd component encoder.

In fact, although a plurality of blocks are located between the even component encoder and the trellis encoder, the receiving system considers two blocks to be concatenated with each other, so that it decodes data. The trellis encoder performs precoding on the high-order bit 'X2' generated from the odd component encoder, and outputs the precoded result as a most significant bit 'Z2'. In addition, the trellis encoder performs trellis-encoding on the low-order bit 'X1', so that it outputs the trellis-encoded result as two output bits Z1 and Z0.

Figure 80:
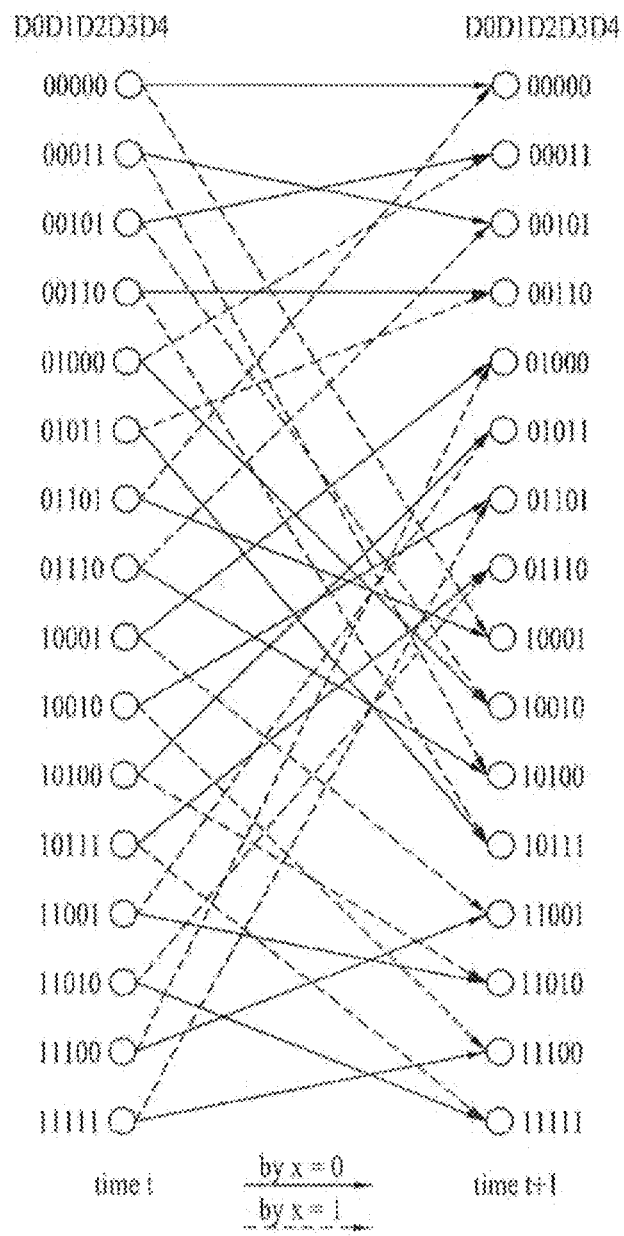
FIG. 80 is a trellis diagram including states capable of being acquired when a start state for an even decoder is set to '00000'.
Figure 81:
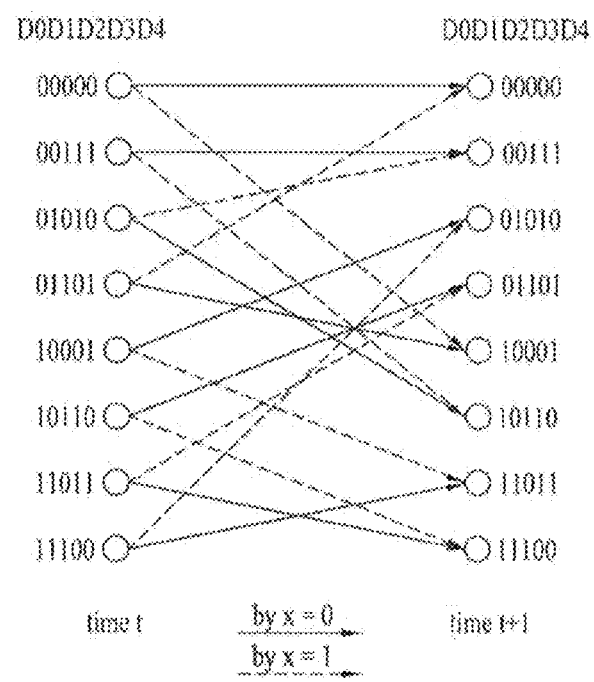
FIG. 81 is a trellis diagram including states capable of being acquired when a start state for an odd decoder is set to '00000'.

FIG. 80 is a trellis diagram including states capable of being acquired when a start state for the even decoder is set to '00000'. FIG. 80 is a trellis diagram including states capable of being acquired when a start state for the odd decoder is set to '00000'

For example, if it is assumed that the even component encoder and the trellis encoder are regarded as a single encoder (i.e., a single effective component encoder) in the same manner as in FIG. 79(a), only 16 states from among 32 states are effective as shown in FIG. 80. For another example, if it is assumed that the odd component encoder and the trellis encoder are regarded as a single encoder (i.e., a single effective trellis encoder) in the same manner as in FIG. 79(b), only 8 states are effective as shown in FIG. 80.

In this way, in the case where the component encoder and the trellis encoder are implemented as a single effective component encoder and then the encoding of data is carried out in the single effective component encoder, the number of states to be selected from among 32 states for the above-mentioned encoding process is changed according to the component encoder structures. In this case, states to be used for the encoding process are changed according to which one of states is used as a start state.

For example, if it is assumed that the odd component encoder and the trellis encoder are regarded as a single effective component encoder in the same manner as in FIG. 79(b), the number of states to be used for the encoding is 8. In addition, if it is assumed that memories of the effective component encoder shown in FIG. 79(b) are designed to always start from the state '00000' in the signaling information area, the above 8 states become '00000', '00111', '01010', '01101', '10001', '10110', '11011', and '11100', respectively.

In this way, since only some states from among a total of states are used when the transmission system encodes data of the signaling information area, the iterative turbo decoder 7111 of the signaling decoder 1306 can perform turbo decoding of data using only the effective states, thereby greatly reducing complexity of the turbo decoder.

Meanwhile, the derandomizer 7112 performs derandomizing of the iterative turbo-decoded data, and outputs the derandomized result to the demultiplexer 7113. The demultiplexer (Demux) 7113 discriminates between TPC data composed of 18 bytes and FIC data composed of 51 bytes on the basis of the derandomized data.

Here, the TPC data is output to the RS decoder 7114 corresponding to an RS (18, 10) of a GF 256. The RS decoder 7114 receives a result of hard decision from the iterative turbo decoder 7111 so as to perform general RS decoding, or the RS decoder 7114 receives the result of soft decision from the iterative turbo decoder 7111 so as to perform RS erasure decoding. TPC data (i.e., transmission parameter information) error-corrected by the RS decoder 7114 is output to the operation controller 5307. In this case, the RS decoder 7114 further transmits the decision result to the operation controller 5307, so that it prevents the occurrence of operational failure which may be generated from misjudgment of the transmission parameter.

Also, since some information of the TPC data is repeatedly transmitted to each group, decoding performance can be improved using such a feature. For example, in case of FEC mode information such as SCCC or RS, since information of next M/H frame is repeatedly transmitted to three sub frames at the rear of one M/H frame, even though decoding is successfully performed once within the three subframes, there is no problem in receiving the next M/H frame.

The FIC data discriminated by the demultiplexer 7113 is output to a (TNoG×51) block deinterleaver 7115. The block deinterleaver 7115 is an inverse process of the (TNoG×51) block interleaver of the signaling encoder of the transmitting side.

For example, the (TNoG×51) block interleaver of the transmitting side is a variable-length block interleaver, and interleaves FIC data contained in each subframe in units of a (TNoG (columns)×51 (rows)) block. In this case, 'TNoG' is indicative of a total number of data groups allocated to a subframe contained in a single M/H frame.

The FIC data block-deinterleaved by the block deinterleaver 7115 is input to the RS decoder 7116 corresponding to the RS (51, 37) of the GF 256. In the same manner as in the RS decoder 7114 for TPC data, the RS decoder 7116 is able to use both the hard decision value and the soft decision value, and FIC data error-corrected by the RS decoder 7116 is output to the FIC processor 5308.

Meanwhile, TNoG value required by the block deinterleaver 7115 can be acquired from the TPC data output from the RS decoder 7114. To this end, the block deinterleaver 7115 includes a controller.

However, since TNoG of next M/H frame is transmitted to three subframes at the rear of one M/H frame, information of TNoG of the current subframe may not be obtained through TPC data decoding. For example, if the broadcast receiver is turned on at the third subframe (sub-frame #2) and starts to perform FIC decoding to obtain channel information, and performs FIC block deinterleaving using TNoG within the TPC data, the broadcast receiver cannot decode the FIC data until it reaches the next M/H frame.

Accordingly, the present invention suggests a method for decoding FIC data by acquiring TNoG even without using RS-decoded TPC data.

FIG. 82 illustrates a detailed embodiment of a process of extracting TNoG in accordance with the present invention.

The process of acquiring TNoG according to the present invention may be performed by the signaling decoder 5306, or may be performed by the operation controller 5307. According to one embodiment of the present invention, TNoG is acquired by the signaling decoder 5306. In particular, according to one embodiment of the present invention, a controller is provided at the block deinterleaver 7115 within the signaling decoder 1306, and acquires TNoG. This is only one example, and the controller may be provided outside the block deinterleaver 7115.

In other words, if a command to start FIC decoding is input, the signaling decoder 5306 searches start of next subframe. For example, it is supposed that a command to start FIC decoding is input at the middle of the n−1th subframe within one M/H frame as shown in FIG. 82 (*a*). In this case, start of the nth subframe is searched.

Namely, if the command to start FIC decoding is input, in order to extract start of the subframe, it is identified whether a data group exists in a corresponding slot. For example, 16 slots are assigned to one subframe. At this time, since known data exist in the data group, it is identified whether the data group exists in the corresponding slot as shown in FIG. 82 (*b*) through correlation between a pre-determined pattern of known data and received data. As another example, information as to whether the data group exists in the corresponding slot may be provided from the operation controller 5307.

At this time, if it is identified whether the data group exists in the corresponding slot, the signaling decoder 5306 performs turbo decoding, signaling derandomizing, and demultiplexing for data of the signaling information area within the data group to split TPC data, and performs RS decoding for the split TPC data. Then, the signaling decoder 5306 acquires a slot number from the RS-decoded TPC data as shown in FIG. 82 (*d*).

The slot number becomes 0 at a start slot of each sub frame, and has a value of 15 at the last slot of the corresponding subframe. Accordingly, start of the subframe can be identified by using the slot number.

In other words, the signaling decoder 1306 repeatedly performs the signaling decoding process until the slot number having a value of 0 is detected from the TPC data. If the data group within the subframe is assigned and transmitted as shown in FIG. 82 (*a*) and the command to start FIC decoding is input at the middle of the n−1th subframe, start of the nth subframe is detected through the signaling decoding process. If the start of the subframe is detected, the group counter value is reset to 0.

If start of the nth subframe is detected through the above process, the signaling decoder 5306 detects a data group from the nth sub frame.

The presence of the data group may be identified using the correlation between the known data pattern and the received data, or may be provided from the operation controller 5307.

If the data group is detected, the group counter value increases by 1 as shown in FIG. 82 (*f*). The turbo decoder 7111 and the derandomizer 7112 perform turbo decoding and derandomizing for data of the signaling information area within the data group. Subsequently, the demultiplexer 7113 performs demultiplexing for the derandomized data to split TPC data from FIC data, and the RS decoder 7114 performs RS decoding for the split TPC data. The slot number is acquired from the RS-decoded TPC data. Also, the split FIC data (i.e., 51 bytes) are stored in a buffer (not shown) of the block deinterleaver 7115.

The steps are performed whenever the data group is detected from the subframe to increase the group counter value by 1, and the buffer of the block deinterleaver 7115 stores the split FIC data by the demultiplexer 7113.

This process is performed until the end of the subframe is detected. According to one embodiment of the present invention, the end of the subframe is detected using the slot number. According to another embodiment of the present invention, the end of the subframe is detected using the field synchronizing counter value such as FIG. 82 (*e*).

If the end of the subframe is identified, TNoG is calculated using the group counter value.

The TNoG value is applied to the FIC data stored in the buffer of the block deinterleaver 7115 to perform block deinterleaving. The block deinterleaved FIC data are input to the RS decoder 7116 and then RS-decoded by the RS decoder 7116. In case of FIG. 82 (*g*) and FIG. 82 (*h*), turbo decoding and derandomizing are performed for the FIC data included in each data group of the nth sub frame for the nth subframe interval and then stored in the buffer of the block deinterleaver 7115. The TNoG calculated is applied to the FIC data of the nth subframe stored in the buffer of the block deinterleaver 7115 to perform block deinterleaving, RS decoding is performed for the block deinterleaved FIC data.

Meanwhile, the end of the subframe may be detected using either the slot number such as FIG. 82 (*d*) or the field synchronizing counter value such as FIG. 82 (*e*).

In other words, if the slot number acquired from the RS-decoded TPC data becomes 0, it means that a new subframe starts. Accordingly, if the slot number becomes 0, it is determined that the previous subframe has ended. In this case, since the group counter value increases by 1, the value obtained by subtracting 1 from the group counter value becomes the TNoG value.

However, next subframe is the first subframe of new M/H frame, and data group may not exist in next M/H frame due to PRC. Under the circumstances, if the end of the subframe is detected using the slot number, TNoG cannot be identified until M/H frame where data group exists is detected, whereby FIC decoding time may be delayed. In this case, start of the subframe can be determined using the new slot number, and the number of field synchronization values can be counted to identify the end of the subframe. This is because that eight field synchronization values in one subframe and field synchronization values are transmitted regardless of the presence of the data group. For example, if the field synchronization counter value is 8, it is determined as the end of the subframe. In this case, the group counter value becomes the TNoG value. The field synchronization values can also be detected through correlation.

As described above, the transmitting system, the receiving system, and the method of transmitting broadcast signals, the method of receiving broadcast signals according to the present invention have the following advantages.

This invention extends a region for mobile service data in a slot. Thus, the transmitter can transmit more mobile service data.

This invention has an advantage enhancing the reception performance of a broadcast signal at a reception system, and a method for processing a broadcast signal by inserting additional known data in regions C, D and E.

In the present invention, it is possible to signal mapping information between an ensemble and a mobile service using an FIC chunk, to segment the FIC chunk into FIC segment units, and to transmit the segments through an FIC, thereby performing fast service acquisition in a reception system.

In the present invention, it is possible to transmit a plurality of FIC segments segmented from an FIC chunk through one subframe or a plurality of subframes so as to prevent the FIC segments from being wasted if the amount of data of the FIC chunk is less or greater than the amount of data of FIC segments transmitted through one subframe.

In the present invention, it is possible to transmit protocol version information of an FIC chunk corresponding to an FIC segment through a header of the FIC segment so as to accurately restore the FIC chunk using the FIC segments configured by the protocol version in a reception system even when FIC chunks of different protocol versions coexist in one M/H frame.

In the present invention, it is possible to transmit identification information identifying whether signaling information transmitted through a payload of an FIC segment through a header of the FIC segment is signaling information of a current M/H frame or signaling information of a next M/H frame so as to accurately restore an FIC chunk using the FIC segments of the M/H frame in a reception system even when an FIC chunk for signaling ensemble configuration information of the current M/H frame and an FIC chunk for signaling ensemble information of the next M/H frame coexist in one M/H frame.

In the present invention, it is possible to secure robust resilience to errors encountered when mobile service data is transmitted through a channel, to determine whether or not additional mobile data packets are included using signaling information in a receiver, and to secure compatibility if the additional packets are not present.

In the present invention, it is possible to receive mobile service data without error even when faced with poor channel quality due to ghosts and noises, by including an additional mobile data block in a data group.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for transmitting a broadcast signal, the method comprising;
    generating service data and scalable service data of a service, the service data and the scalable service data are carried by collections of data streams;
    generating first signaling data including first information identifying one of the collections of the data streams,
    wherein the identified collection includes a service signaling channel carrying second signaling data, the second signaling data including attributes for the service,
    wherein the service signaling channel is a dedicated channel identified by pre-assigned value;
    encoding the service data, the scalable service data and the first signaling data; and
    transmitting the encoded service data, the encoded scalable service data and the encoded first signaling data,
    wherein the second signaling data includes second information and third information,
    the second information identifying the identified collection, wherein a value of the second information is matched with the first information in the first signaling data,
    the third information identifying data streams carrying the service data or the scalable service data of the service within the identified collection.

2. The method of claim 1, wherein the third information includes source IP addresses and destination IP addresses for the data streams carrying the service data or the scalable service data of the service.

3. The method of claim 1, wherein the method further comprises:
    forming a group including data structures, the data structures carrying the encoded service data and the encoded scalable service data,
    wherein one of the data structures includes the encoded first signaling data.

4. The method of claim 1, wherein the second signaling data includes name information of the service.

5. An apparatus for receiving a broadcast signal, the apparatus comprising:
    a receiving unit that receives first signaling data, service data and scalable service data of a service, the service data and the scalable service data are carried by collections of data streams;
    a demodulating unit that demodulates the first signaling data, the service data and the scalable service data;
    a first decoder that decodes the demodulated first signaling data including first information identifying one of the collections of the data streams,
    wherein the identified collection includes a service signaling channel carrying second signaling data, the second signaling data including attributes for the service,
    wherein the service signaling channel is a dedicated channel identified by pre-assigned value;
    a parser that parses the second signaling data; and
    a second decoder that decodes the service data and the scalable service data,
    wherein the second signaling data includes second information and third information, the second information identifying the identified collection, wherein a value of the second information is matched with the first information in the first signaling data, the third information identifying data streams carrying the service data or the scalable service data of the service within the identified collection.

6. The apparatus of claim 5, wherein the third information includes source IP addresses and destination IP addresses for the data streams carrying the service data or the scalable service data of the service.

7. The apparatus of claim 5, wherein the second signaling data includes name information of the service.

* * * * *